United States Patent
Yamanaka

(10) Patent No.: US 7,183,229 B2
(45) Date of Patent: Feb. 27, 2007

(54) SEMICONDUCTOR THIN FILM FORMING METHOD, PRODUCTION METHODS FOR SEMICONDUCTOR DEVICE AND ELECTROOPTICAL DEVICE, DEVICES USED FOR THESE METHODS, AND SEMICONDUCTOR DEVICE AND ELECTROOPTICAL DEVICE

(75) Inventor: Hideo Yamanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/182,784

(22) PCT Filed: Dec. 7, 2001

(86) PCT No.: PCT/JP01/10733

§ 371 (c)(1),
(2), (4) Date: Aug. 1, 2002

(87) PCT Pub. No.: WO02/47137

PCT Pub. Date: Jun. 13, 2002

(65) Prior Publication Data

US 2003/0013280 A1 Jan. 16, 2003

(30) Foreign Application Priority Data

Dec. 8, 2000 (JP) ............................. 2000-373826

(51) Int. Cl.
*H01L 21/00* (2006.01)
*F25B 3/30* (2006.01)

(52) U.S. Cl. ................ 438/795; 392/411; 257/E21.475

(58) Field of Classification Search ................ 438/795; 392/411
See application file for complete search history.

(56) References Cited

U.S. PATENT DOCUMENTS 4,330,363 A * 5/1982 Biegesen et al. ............. 117/54

(Continued)

FOREIGN PATENT DOCUMENTS

JP 57-068014 4/1982

(Continued)

*Primary Examiner*—W. David Coleman
(74) *Attorney, Agent, or Firm*—Sonnenschein Nath & Rosenthal LLP

(57) ABSTRACT

An object of the present invention is to provide a method for easily forming a polycrystalline semiconductor thin-film, such as polycrystalline silicon having high crystallinity and high quality, or a single crystalline semiconductor thin-film at inexpensive cost, the crystalline semiconductor thin-film having a large area, and to provide an apparatus for processing the method described above. In forming a polycrystalline (or single crystalline) semiconductor thin-film (7), such as a polycrystalline silicon thin-film, having high crystallinity and a large grain size on a substrate (1), or in forming a semiconductor device having the polycrystalline (or single crystalline) semiconductor thin-film (7) on the substrate (1), a method comprises forming a low-crystallization semiconductor thin-film (7A) on the substrate (1), and subsequently heating and cooling this low-crystallization semiconductor thin-film (7A) to a fusion, a semi-fusion, or a non-fusion state by flash lamp annealing to facilitate the crystallization of the low-crystallization semiconductor thin-film, whereby a polycrystalline (single crystalline) semiconductor thin-film (7) is obtained. A method for forming the semiconductor device and an apparatus for processing the methods are also disclosed.

9 Claims, 57 Drawing Sheets

U.S. PATENT DOCUMENTS

| | | | | |
|---|---|---|---|---|
| 4,649,261 A | * | 3/1987 | Sheets | 219/390 |
| 5,073,698 A | | 12/1991 | Stultz | 219/405 |
| 5,079,187 A | * | 1/1992 | Asmus et al. | 438/708 |
| 5,174,881 A | * | 12/1992 | Iwasaki et al. | 204/298.25 |
| 5,194,401 A | * | 3/1993 | Adams et al. | 438/765 |
| 5,357,172 A | * | 10/1994 | Lee et al. | 315/167 |
| 5,577,157 A | * | 11/1996 | Sopori | 392/416 |
| 5,627,081 A | * | 5/1997 | Tsuo et al. | 438/57 |
| 5,642,017 A | * | 6/1997 | Hush | 315/169.3 |
| 5,698,486 A | * | 12/1997 | Fung et al. | 502/37 |
| 5,753,542 A | | 5/1998 | Yamazaki et al. | 438/162 |
| 5,796,116 A | * | 8/1998 | Nakata et al. | 257/66 |
| 5,814,835 A | * | 9/1998 | Makita et al. | 257/64 |
| 5,827,773 A | * | 10/1998 | Voutsas | 438/488 |
| 5,962,869 A | | 10/1999 | Yamazaki et al. | 257/49 |
| 6,074,901 A | | 6/2000 | Ohtani et al. | 438/166 |
| 6,162,667 A | | 12/2000 | Funai et al. | 438/166 |

FOREIGN PATENT DOCUMENTS

| | | |
|---|---|---|
| JP | 57-183020 | 11/1982 |
| JP | 60-102728 | 6/1985 |
| JP | 62-035512 | 2/1987 |
| JP | 63-271922 | 11/1988 |
| JP | 63-278217 | 11/1988 |
| JP | 2-275622 | 11/1990 |
| JP | 02-283036 | 11/1990 |
| JP | 5-094995 | 4/1993 |
| JP | 5-218367 | 8/1993 |
| JP | 5-291294 | 11/1993 |
| JP | 5299339 | 11/1993 |
| JP | 7-078759 | 3/1995 |
| JP | 7-106247 | 4/1995 |
| JP | 7-211636 | 8/1995 |
| JP | 7-226374 | 8/1995 |
| JP | 7-297122 | 11/1995 |
| JP | 7307286 | 11/1995 |
| JP | 8-195494 | 7/1996 |
| JP | 2000-311857 | 11/2000 |

* cited by examiner

FIG. 1
FIRST EMBODIMENT
<PROCESS FLOW FOR MANUFACTURING MOSTFT>
FORMATION OF SUBSTRATE-PROTECTION FILM
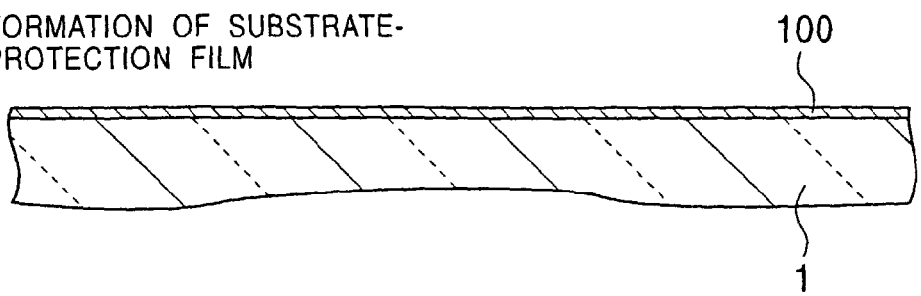
(1)
FORMATION OF LOW-CRYSTALLIZATION SILICON THIN-FILM, AND FORMATION OF PROTECTIVE, REFLECTION-REDUCING SILICON OXIDE FILM (NOT SHOWN, HEREAFTER, THE SAME AS ABOVE)
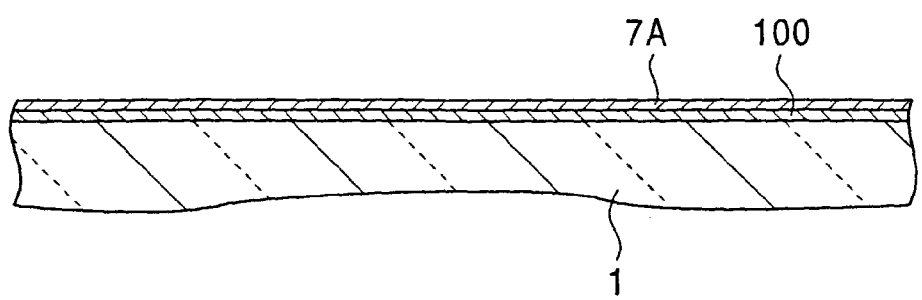
(2)
FORMATION OF POLYCRYSTALLINE SILICON THIN-FILM HAVING LARGE GRAIN SIZE BY FLASH LAMP ANNEALING
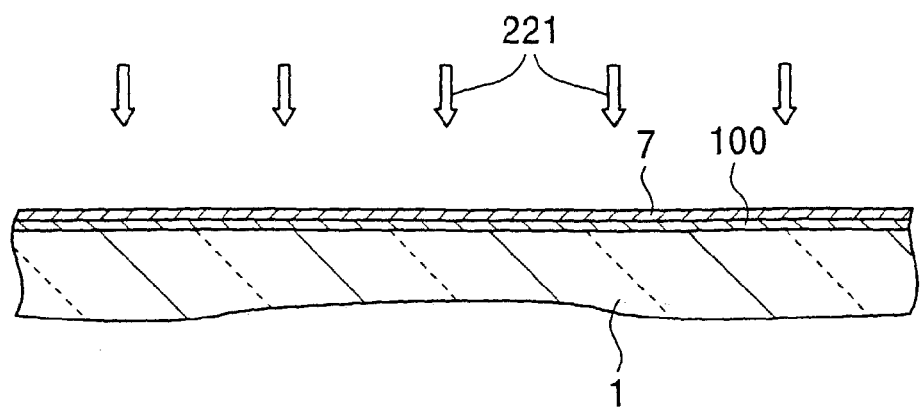
(3)

FIG. 2
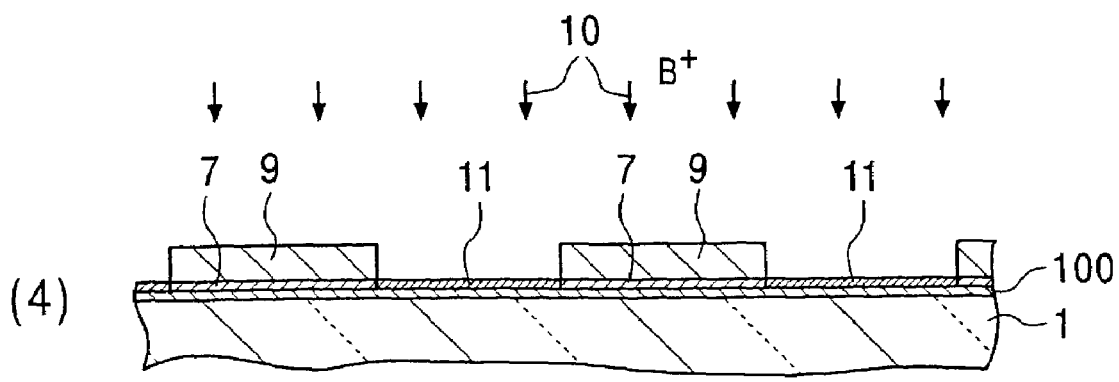
(4) REMOVAL OF PROTECTIVE, REFLECTION-REDUCING SILICON OXIDE FILM, AND CONTROL OF DOPANT CONCENTRATION IN CHANNEL REGION OF n-TYPE MOSTFT
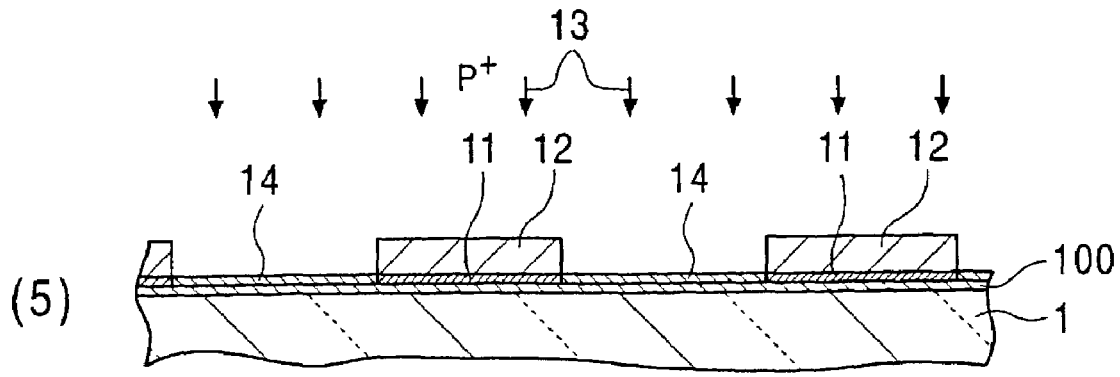
(5) CONTROL OF DOPANT CONCENTRATION IN CHANNEL REGION OF p-TYPE MOSTFT

FIG. 3
FORMATION OF GATE INSULATING FILM, AND FORMATION OF PHOSPHORUS-DOPED POLYCRYSTALLINE SILICON FILM FOR GATE ELECTRODE
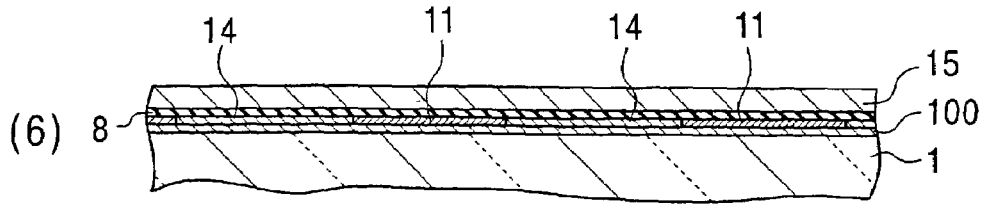
FORMATION OF GATE ELECTRODE
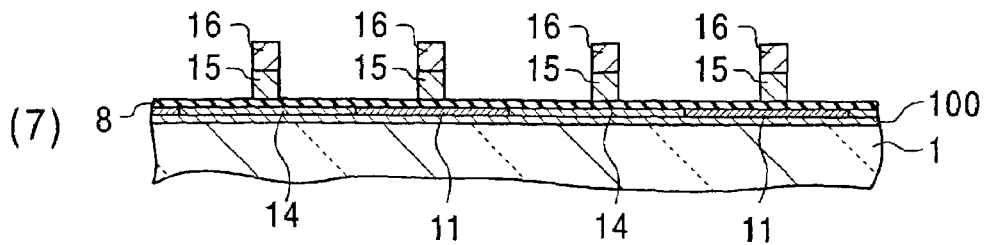
FORMATION OF INSULATING FILM ON GATE ELECTRODE SURFACE
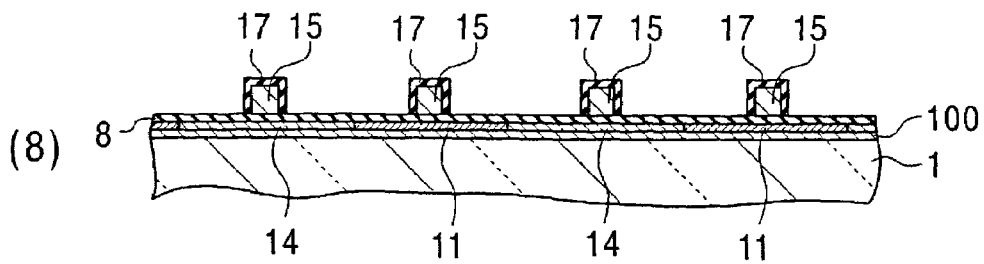
FORMATION OF SOURCE AND DRAIN REGIONS OF n-TYPE MOSTFT
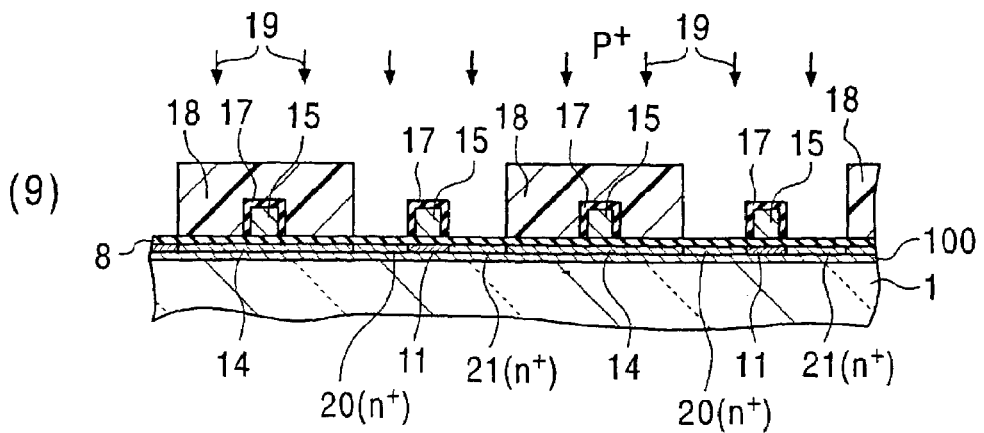

FIG. 4
FORMATION OF SOURCE AND DRAIN REGIONS OF p-TYPE MOSTFT, AND ANNEALING FOR ION ACTIVATION
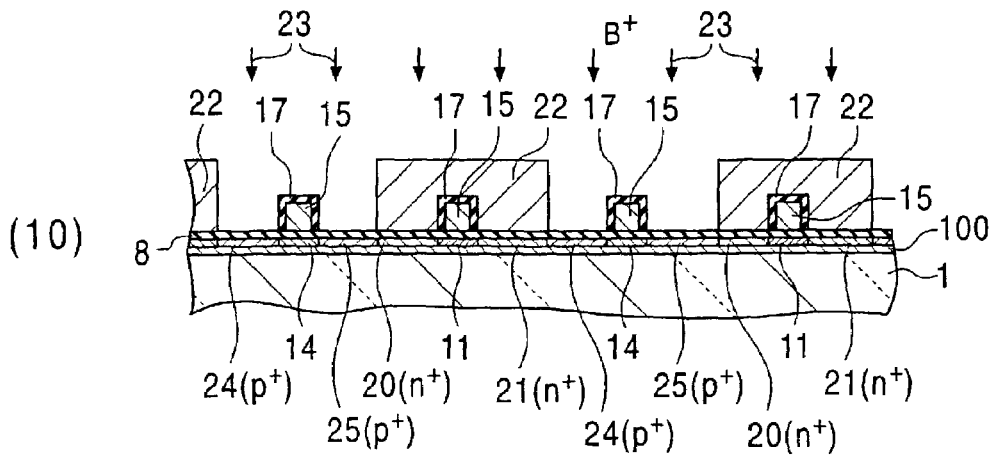
FORMATION OF OVERCOAT INSULATING FILM (LAMINATED FILM OF SILICON OXIDE FILM, PSG FILM, AND SILICON NITRIDE FILM)
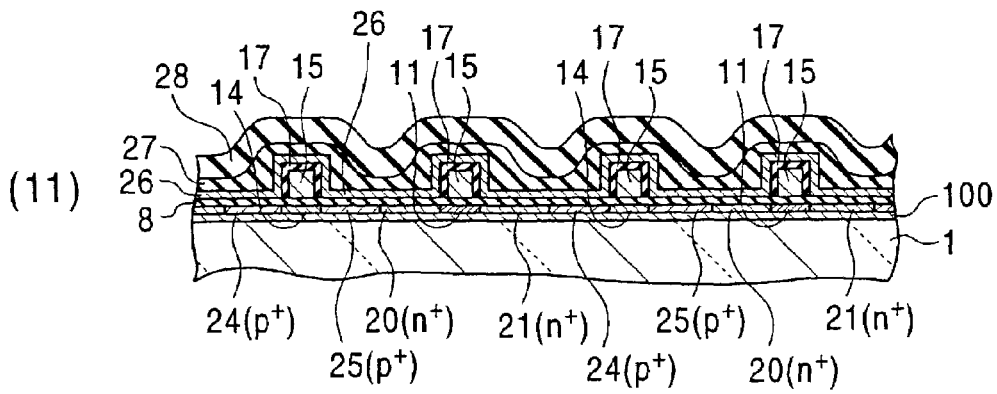
FORMATION OF CONTACT WINDOWS, FORMATION OF ELECTRODES, AND HYDROGENATING AND SINTERING TREATMENT
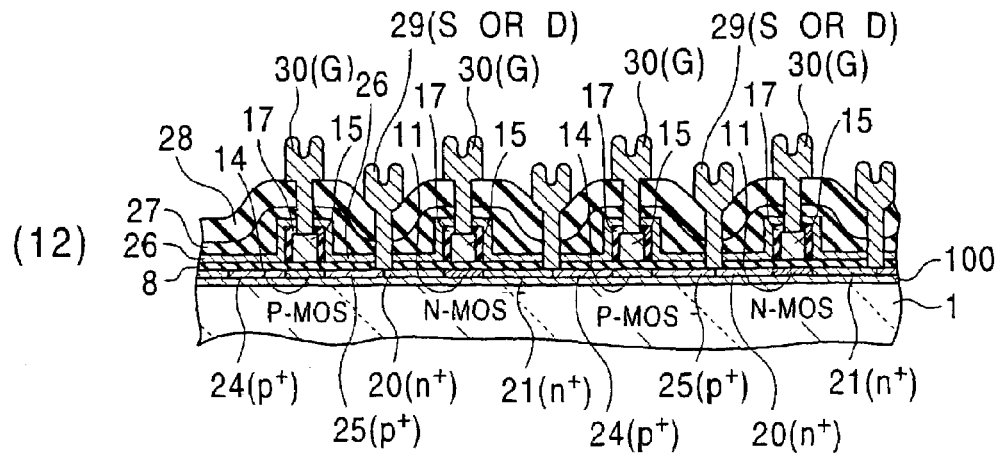

FIG. 7

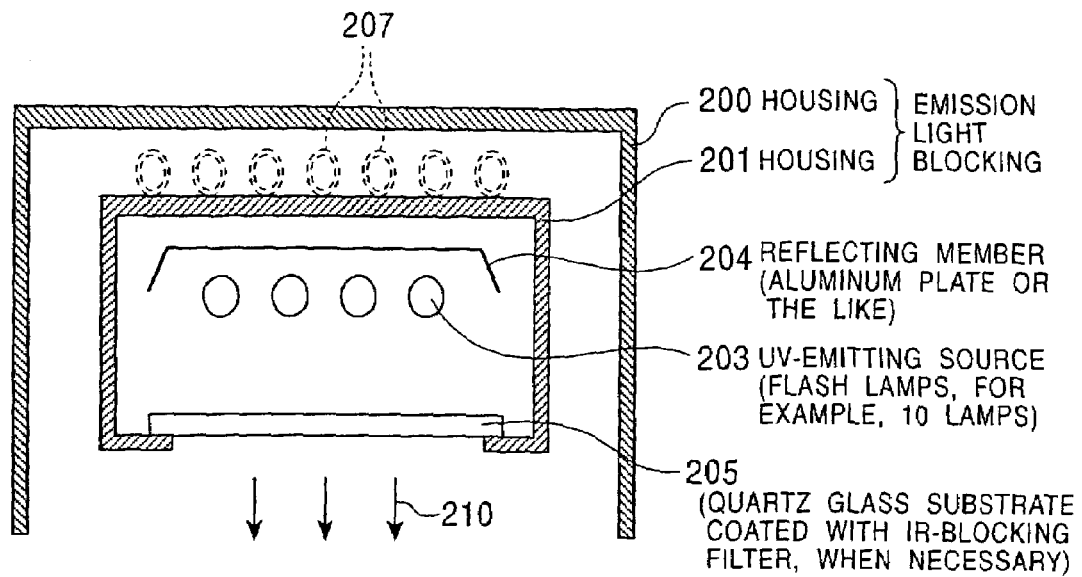

- 207
- 200 HOUSING ⎫ EMISSION LIGHT
- 201 HOUSING ⎭ BLOCKING
- 204 REFLECTING MEMBER (ALUMINUM PLATE OR THE LIKE)
- 203 UV-EMITTING SOURCE (FLASH LAMPS, FOR EXAMPLE, 10 LAMPS)
- 205 (QUARTZ GLASS SUBSTRATE COATED WITH IR-BLOCKING FILTER, WHEN NECESSARY)
- 210

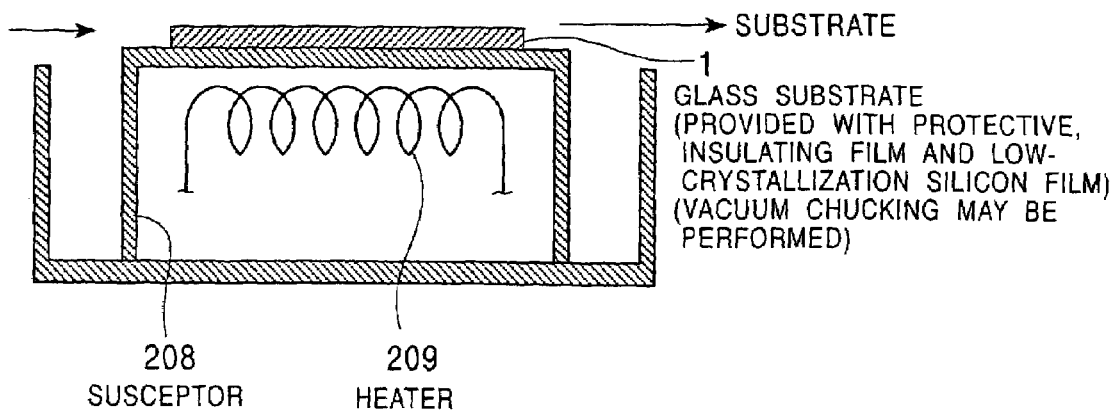

- SUBSTRATE
- 1 GLASS SUBSTRATE (PROVIDED WITH PROTECTIVE, INSULATING FILM AND LOW-CRYSTALLIZATION SILICON FILM) (VACUUM CHUCKING MAY BE PERFORMED)
- 208 SUSCEPTOR
- 209 HEATER

EXAMPLE OF EMISSION SPECTRUM
OF XENON FLASH LAMP

※ IN ORDER TO RELATIVELY INCREASE SPECTRAL INTENSITY
IN UV REGION HAVING WAVELENGTH OF 400 nm OR LESS (1) THE CASE IN WHICH LAMP HAVING
THE SAME SHAPE IS USED:
DISCHARGE AFTER CHARGING BEING PERFORMED
AT HIGHER VOLTAGE (2) THE CASE IN WHICH CHARGING VOLTAGE IS CONSTANT:
DISCHARGE AFTER INDUCTANCE BEING DECREASED

FIG. 10

<FLASH EMISSION METHOD>

(1) SIMULTANEOUS FLASH EMISSION FOR ENTIRE AREA

SIMULTANEOUS FLASH EMISSION PERFORMED FOR ENTIRE AREA IN THE STRUCTURE SHOWN IN FIG. 7

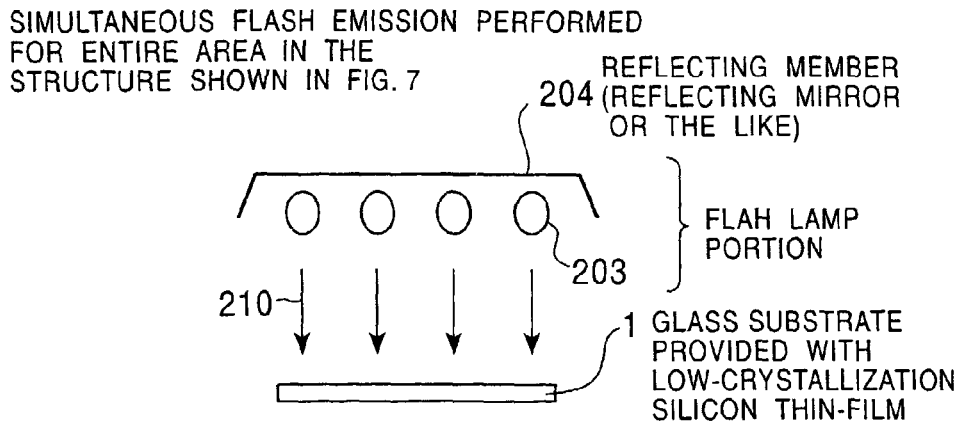

(2) FLASH EMISSION PERFORMED BY GALVANOMETER SCANNING

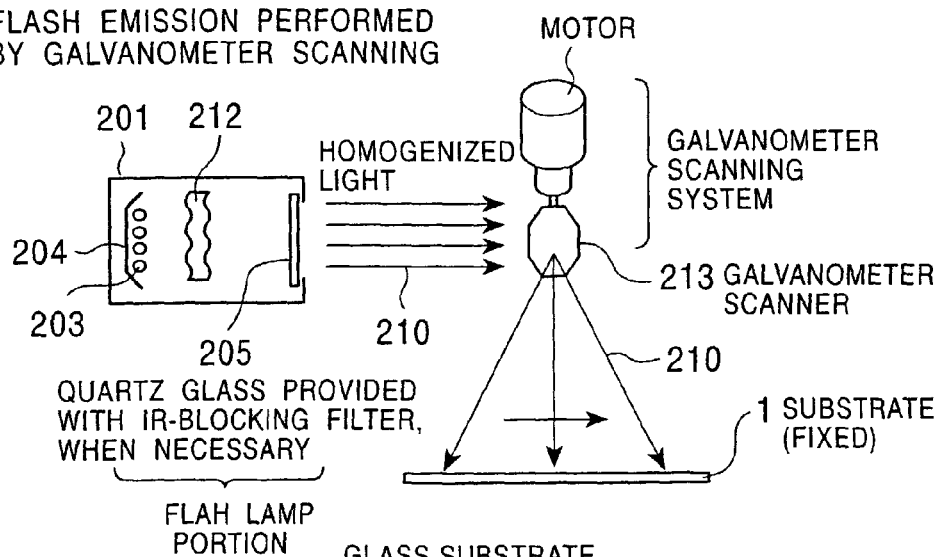

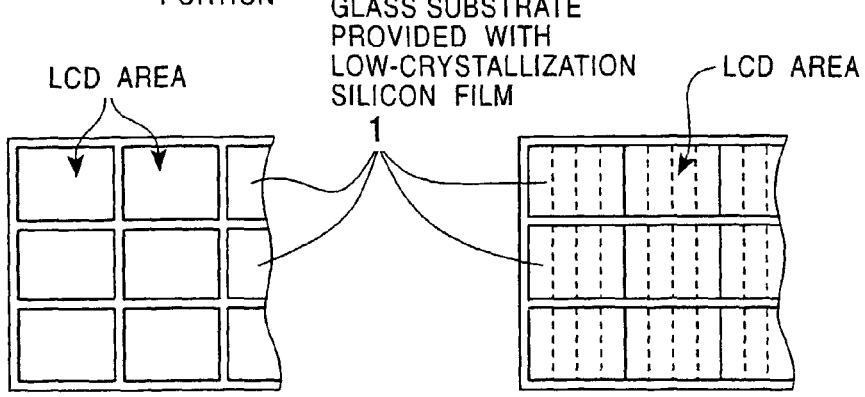

FLASH EMISSION IS PERFORMED ONCE OR REPEATEDLY FOR ONE LCD AREA AND IS THEN MOVED TO NEXT LCD AREA

FLASH EMISSION IS PERFORMED FOR ONE LCD AREA BY OVERLAP SCANNING AND IS THEN MOVED TO NEXT LCD AREA

FIG. 12

<EXAMPLES OF POWER SUPPLY CIRCUITS>

(1) TWO SETS EACH HAVING TWO LAMPS CONNECTED IN SERIES ARE CONNECTED TO CORRESPONDING POWER SUPPLIES, AND LIGHT IS SYNCHRONOUSLY EMITTED FROM FOUR LAMPS IN PARALLEL.

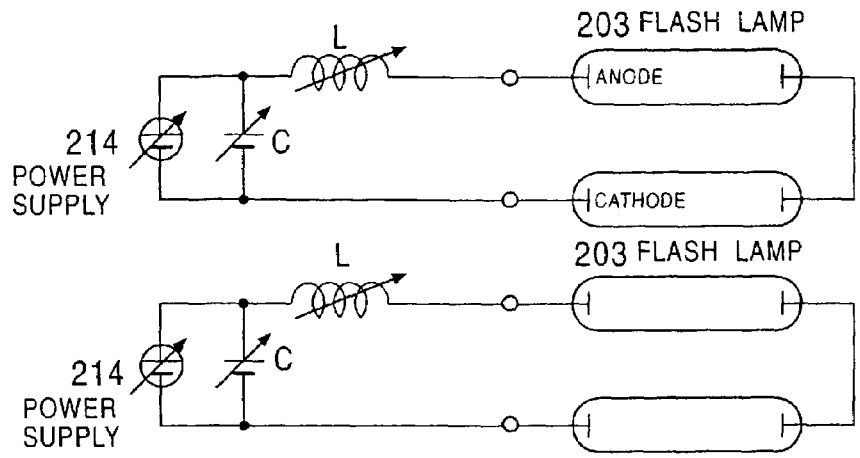

(2) LAMPS EACH CONNECTED TO CORRESPONDING POWER SUPPLY, AND LIGHT IS SIMULTANEOUSLY EMITTED FROM LAMPS BY SYNCHRONOUS TRIGGERING.

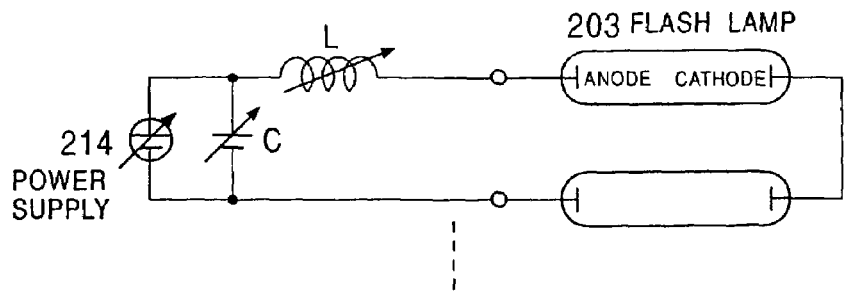

(3) LAMPS CONNECTED IN SERIES ARE CONNECTED TO ONE POWER SUPPLY, AND LIGHT IS SIMULTANEOUSLY EMITTED FROM LAMPS.

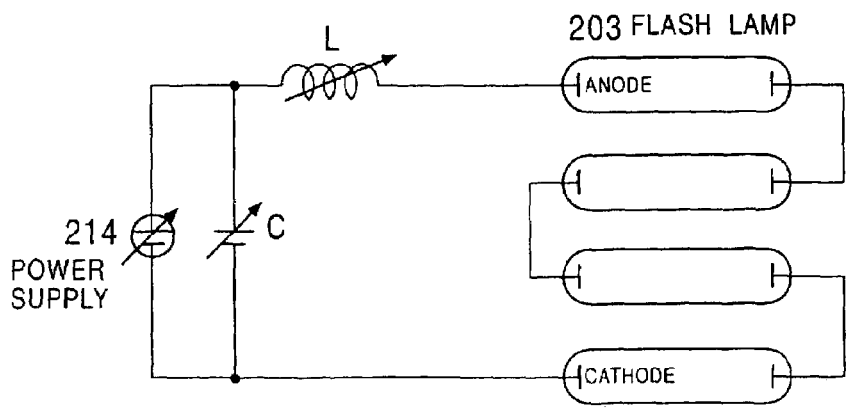

※ L, C, AND POWER SUPPLY ARE OPTIONALLY VARIABLE.

FIG. 13
(1) STRAIGHT LIGHT-EMITTING TUBE
(EXAMPLE) 10 mm IN DIAMETER AND 150 mm IN LENGTH
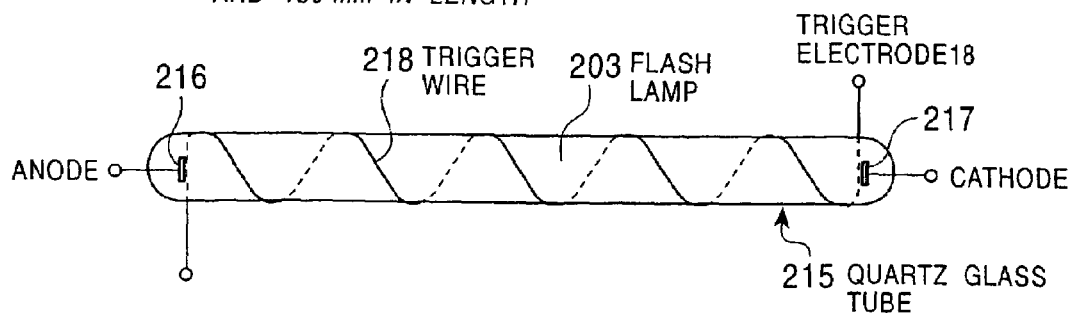
(2) IMPROVED PARALLEL PLATE LIGHT-EMITTING TUBE
(EXAMPLE) 150 mm IN LENGTH, 100 mm IN WIDTH, AND 10 mm IN HEIGHT
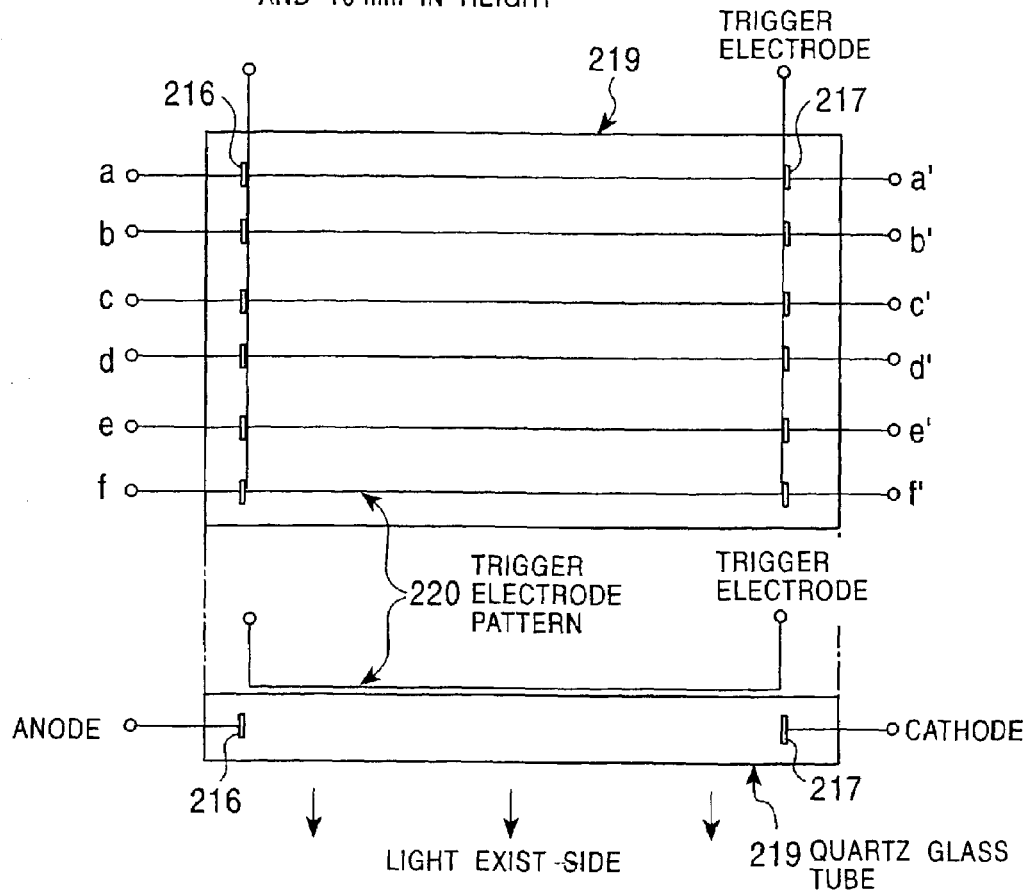
※ IN STEAD OF TRIGGER ELECTRODE THIN-FILM PATTERN, TRIGGER ELECTRODE ASSEMBLY SUCH AS TRIGGER WIRE MAY BE PROVIDED

<CLUSTER METHOD>

C/S: CASSETTE STATION
R: ROBOT/LOADING CHAMBER

FIG. 17
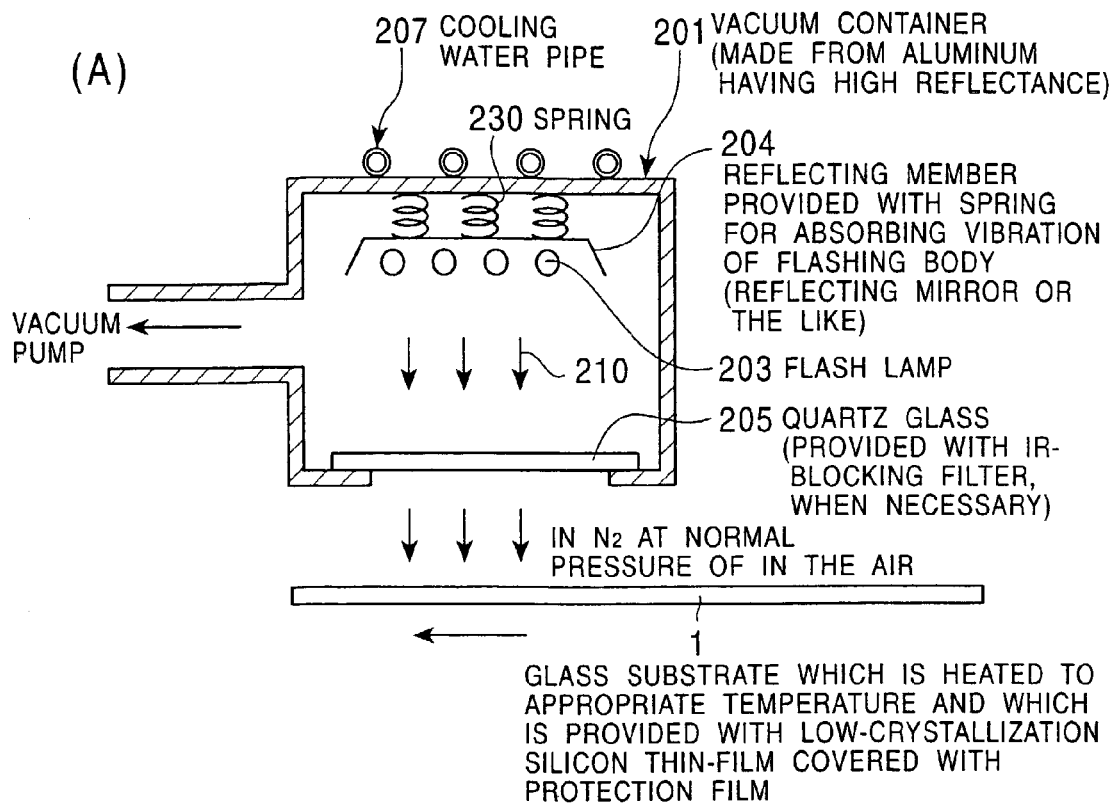
(A)
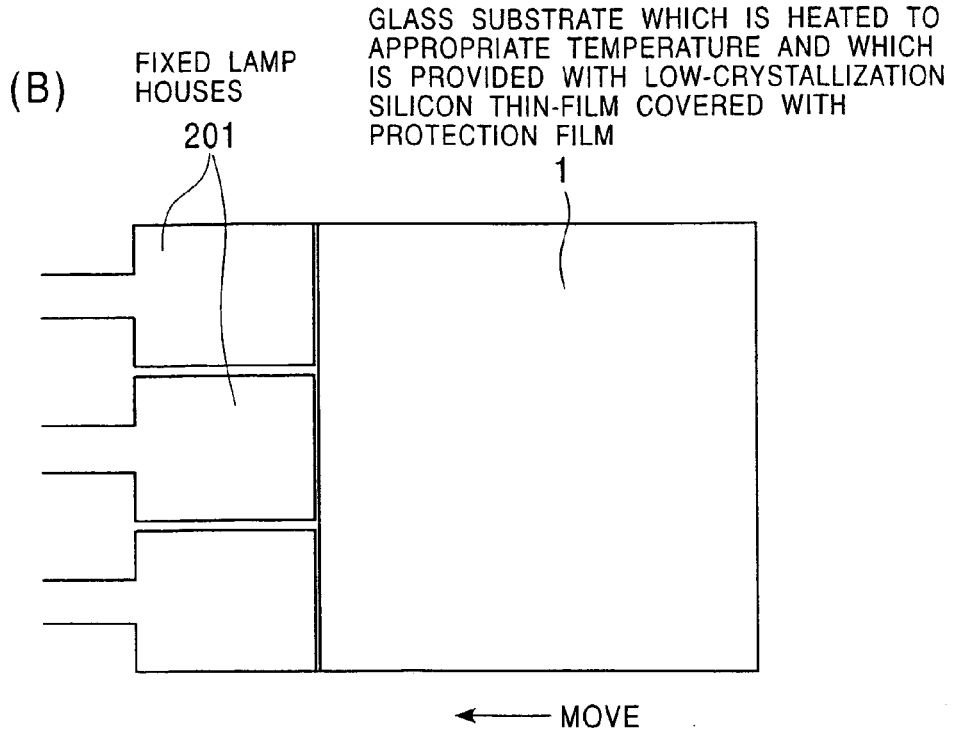
(B)

FIG. 18

FLASH EMISSION PERFORMED IN TIME INTERVAL DIFFERENCE MODE BY SWITCHING MEANS OR THE LIKE (a) THE CASE IN WHICH STEP AND REPEAT OPERATION IS PERFORMED AFTER EACH FLASH EMISSION

EXAMPLE) IRRADIATION AREA IN GLASS SUBSTRATE OF 1m BY 1m BEING DIVIDED INTO NINE

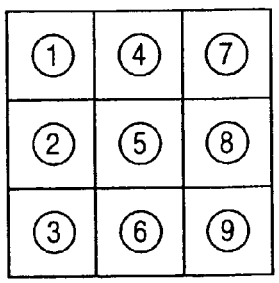

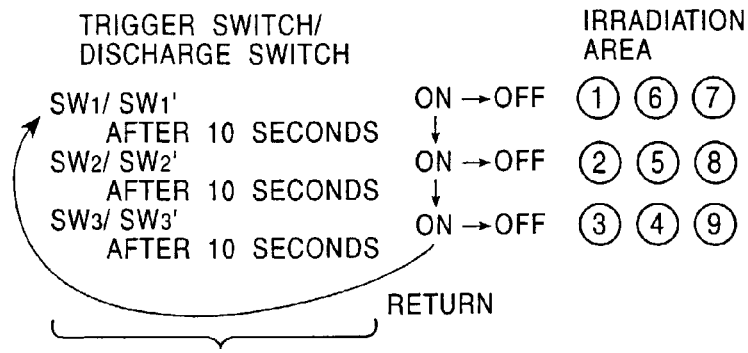

ASSUMING THAT CHARGING TIME OF CHARGING CAPACITOR IS 20 SECONDS AND THAT STEP AND REPEAT TACT IS LESS THAN 10 SECONDS

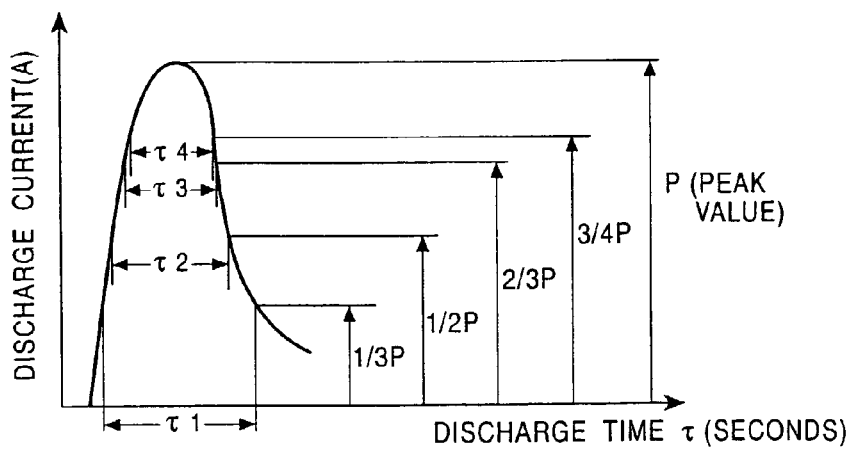

$\tau 1$ = 1/3 PULSE WIDTH = 1/3 TIME SPAN = TIME SPAN BETWEEN POINT OF 1/3 OF PEAK VALUE ON ASCENDING CURVE, STARTING FROM ZERO, OF CURRENT AND POINT OF 1/3 OF PEAK VALUE ON DESCENDING CURVE THEREOF    EXAMPLE) 1.5 MILLISECONDS OR MORE $\tau 2$ = 1/2 PULSE WIDTH = 1/2 TIME SPAN = TIME SPAN BETWEEN POINT OF 1/2 OF PEAK VALUE ON ASCENDING CURVE, STARTING FROM ZERO, OF CURRENT AND POINT OF 1/2 OF PEAK VALUE ON DESCENDING CURVE THEREOF    EXAMPLE) 1.0 MILLISECONDS OR MORE $\tau 3$ = 2/3 PULSE WIDTH = 2/3 TIME SPAN = TIME SPAN BETWEEN POINT OF 2/3 OF PEAK VALUE ON ASCENDING CURVE, STARTING FROM ZERO, OF CURRENT AND POINT OF 2/3 OF PEAK VALUE ON DESCENDING CURVE THEREOF    EXAMPLE) 0.8 MILLISECONDS OR MORE $\tau 4$ = 3/4 PULSE WIDTH = 3/4 TIME SPAN = TIME SPAN BETWEEN POINT OF 3/4 OF PEAK VALUE ON ASCENDING CURVE, STARTING FROM ZERO, OF CURRENT AND POINT OF 3/4 OF PEAK VALUE ON DESCENDING CURVE THEREOF    EXAMPLE) 0.5 MILLISECONDS OR MORE

FIG. 19

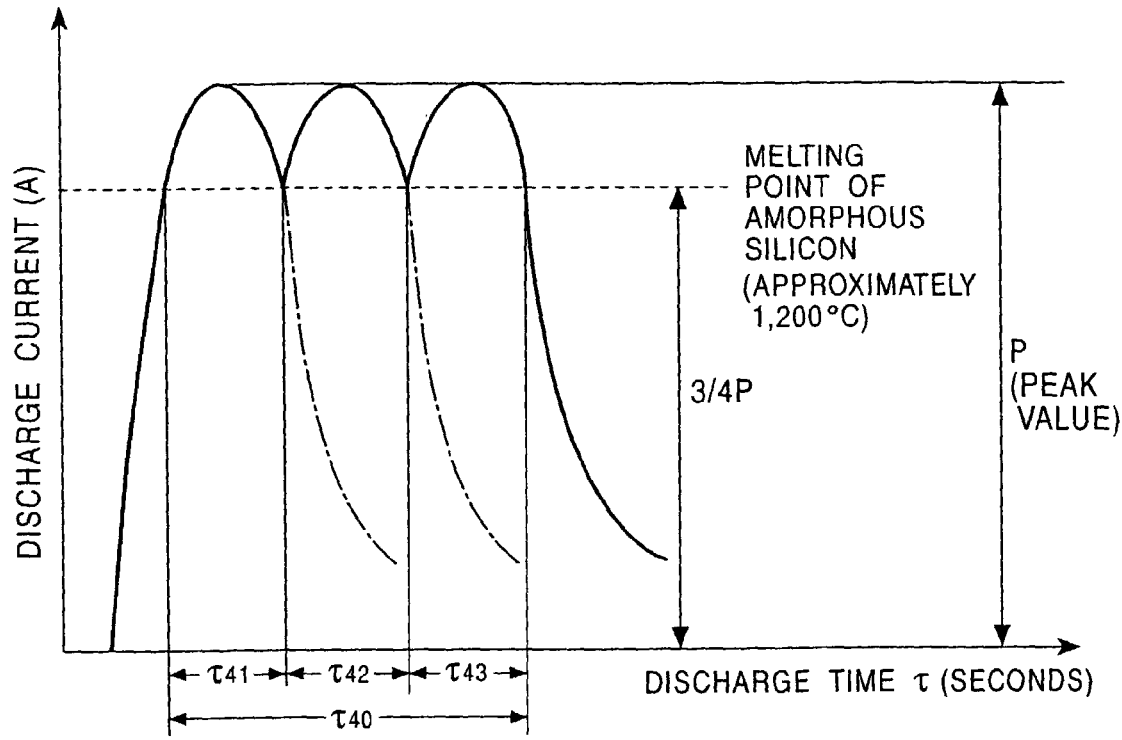

(b) THE CASE IN WHICH FLASH EMISSION IS REPEATEDLY PERFORMED FOR THE SAME REGOIN

τ41: TIME SPAN BETWEEN POINT AT WHICH DISCHARGE CURRENT, WHICH IS INCREASED FROM ZERO DUE TO DISCHARGE OF CHARGING CAPACITOR C1, REACHES 3/4 OF THE PEAK VALUE AND POINT AT WHICH DISCHARGE CURRENT IS SUBSEQUENTLY DECREASED TO 3/4 OF PEAK VALUE (PULSE WIDTH)

τ42: TIME SPAN BETWEEN POINT AT WHICH DISCHARGE CURRENT, WHICH IS INCREASED FROM ZERO DUE TO DISCHARGE OF CHARGING CAPACITOR C2, REACHES 3/4 OF PEAK VALUE AND POINT AT WHICH DISCHARGE CURRENT IS SUBSEQUENTLY DECREASED TO 3/4 OF PEAK VALUE (PULSE WIDTH)

τ43: TIME SPAN BETWEEN POINT AT WHICH DISCHARGE CURRENT, WHICH IS INCREASED FROM ZERO DUE TO DISCHARGE OF CHARGING CAPACITOR C3, REACHES 3/4 OF PEAK VALUE AND POINT AT WHICH DISCHARGE CURRENT IS SUBSEQUENTLY DECREASED TO 3/4 OF PEAK VALUE (PULSE WIDTH)

<IN THE CASE IN WHICH PREHEATING IS PERFORMED BY FLASH EMISSION>

※ IMPROVEMENT IN UNIFORMITY OF POLYCRYSTALLIZATION AND SINGLE CRYSTALLIZATION

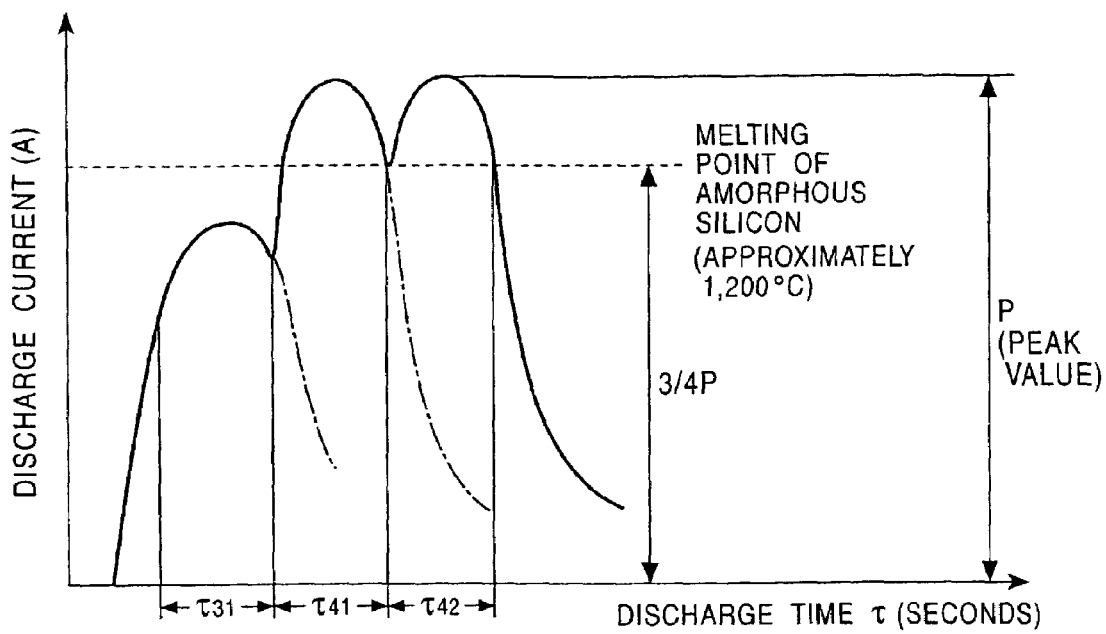

$\tau_{31}$: TIME SPAN BETWEEN POINT AT WHICH DISCHARGE CURRENT,W HICH IS INCREASED FROM ZERO DUE TO DISCHARGE OF CHARGING CAPACITOR C1, REACHES LEVEL IN THE RANGE OF 2/3 TO LESS THAN 3/4 OF 3/4 (MELTING POINT) OF PEAK VALUE IN $\tau_{41} = \tau_{42}$ AND POINT AT WHICH DISCHARGE CURRENT IS SUBSEQUENTLY DECREASED, WITHOUT REACHING MELTING POINT, TO ABOVE LEVEL IN THE RANGE OF 2/3 TO LESS THAN 3/4 (PULSE WIDTH)

$\tau_{41}$: TIME SPAN BETWEEN POINT AT WHICH DISCHARGE CURRENT, WHICH IS INCREASED FROM ZERO DUE TO DISCHARGE OF CHARGING CAPACITOR C2, REACHES 3/4 OF PEAK VALUE AND POINT AT WHICH DISCHARGE CURRENT IS SUBSEQUENTLY DECREASED TO ABOVE 3/4 (PULSE WIDTH)

$\tau_{42}$: TIME SPAN BETWEEN POINT AT WHICH DISCHARGE CURRENT, WHICH IS INCREASED FROM ZERO DUE TO DISCHARGE OF CHARGING CAPACITOR C3, REACHES 3/4 OF PEAK VALUE AND POINT AT WHICH DISCHARGE CURRENT IS SUBSEQUENTLY DECREASED TO S ABOVE 3/4 (PULSE-WIDTH)

FIG. 22

<THE CASE IN WHICH SLOW COOLING IS PERFORMED BY FLASH EMISSION>

※IMPROVEMENT IN CRYSTALLINITY AND GRAIN SIZE OF POLYCRYSTALLINE MATERIAL AND IN CRYSTALLINITY OF SINGLE CRYSTALLINE MATERIAL

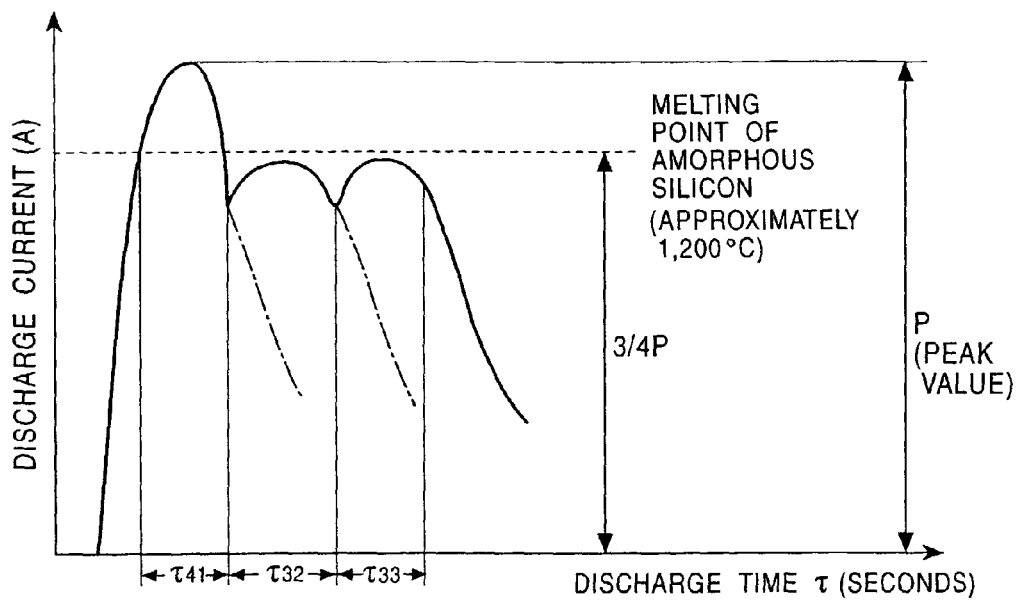

$\tau_{41}$: TIME SPAN BETWEEN POINT AT WHICH DISCHARGE CURRENT, WHICH IS INCREASED FROM ZERO DUE TO DISCHARGE OF CHARGING CAPACITOR $C_1$, REACHES 3/4 OF PEAK VALUE AND POINT AT WHICH DISCHARGE CURRENT IS SUBSEQUENTLY DECREASED TO ABOVE 3/4 (PULSE WIDTH)

$\tau_{32}$: TIME SPAN BETWEEN POINT AT WHICH DISCHARGE CURRENT, WHICH IS INCREASED FROM ZERO DUE TO DISCHARGE OF CHARGING CAPACITOR $C_2$, REACHES LEVEL IN RANGE OF 2/3 TO LESS THAN 3/4 OF 3/4 (MELTING POINT) OF PEAK VALUE IN $\tau_{41}$ AND POINT AT WHICH DISCHARGE CURRENT IS SUBSEQUENTLY DECREASED, WITHOUT REACHING 3/4 (MELTING POINT), TO ABOVE LEVEL IN THE RANGE OF 2/3 TO LESS THAN 3/4 (PULSE WIDTH)

$\tau_{33}$: TIME SPAN BETWEEN POINT AT WHICH DISCHARGE CURRENT, WHICH IS INCREASED FROM ZERO DUE TO DISCHARGE OF CHARGING CAPACITOR $C_3$, REACHES LEVEL IN THE RANGE OF 2/3 TO LESS THAN 3/4 OF 3/4 (MELTING POINT) OF PEAK VALUE IN $\tau_{41}$ AND POINT AT WHICH DISCHARGE CURRENT IS SUBSEQUENTLY DECREASED, WITHOUT REACHING 3/4 (MELTING POINT), TO ABOVE LEVEL IN THE RANGE OF 2/3 TO LESS THAN 3/4 (PULSE WIDTH)

FIG. 23

CIRCUIT CONFIGURATION IN WHICH FLASH EMISSION IS PERFORMED IN TIME DIFFERENCE INTERVAL MODE BY SWITCHING MEANS

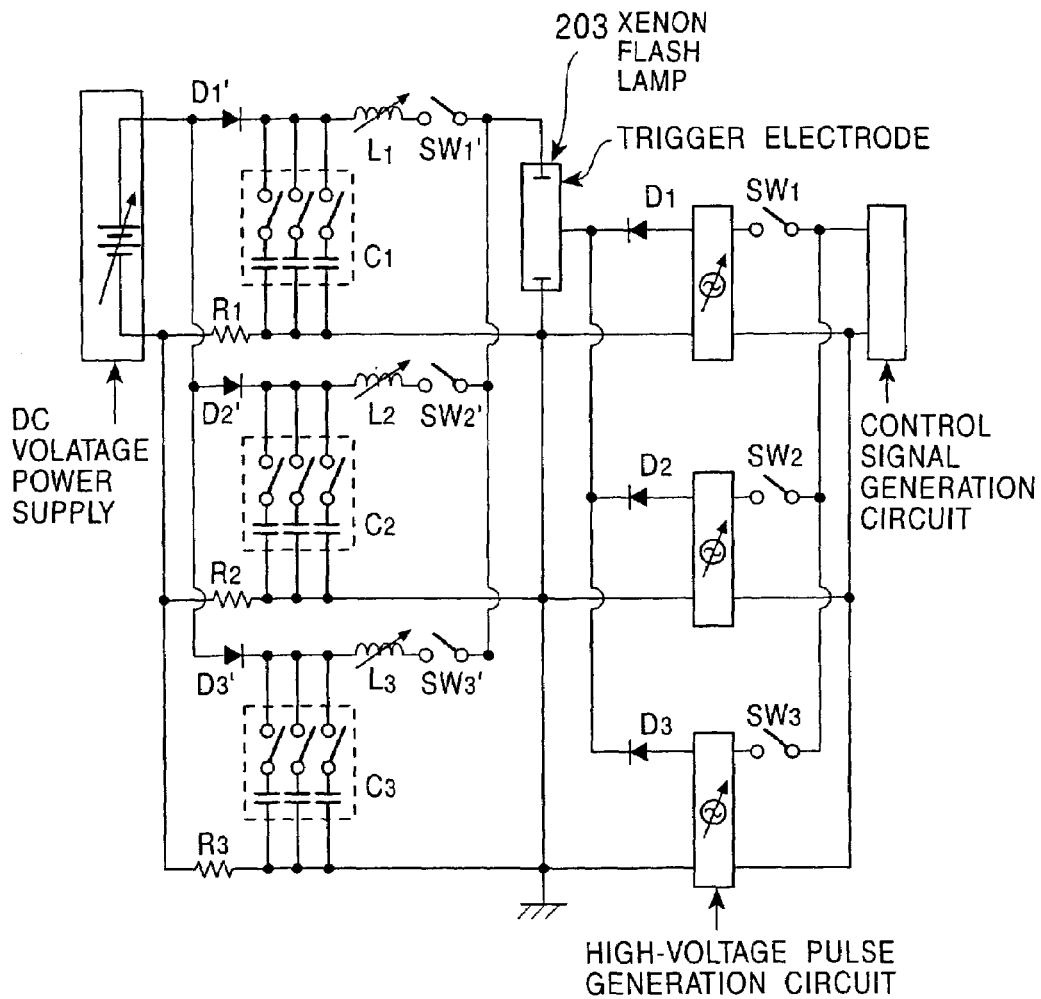

- $L_1, L_2, L_3$: INDUCTANCE OF AIR-CORE COIL FOR CONTROLLING PEAK VALUE OF CURRENT IN DISCHARGE (μH)

- $C_1, C_2, C_3$: CHARGING CAPACITOR CAPABLE OF CHANGING TOTAL STATIC CAPACITANCE BY SWITCHING (μF)

- $R_1, R_2, R_3$: RESISTANCE FOR SUPPRESSING CHARGING CURRENT (Ω)

- $D_1', D_2', D_3'$: PREVENTING CURRENT IN DISCHARGE FROM FLOWING INTO DC VOLTAGE POWER SUPPLY

- $D_1, D_2, D_3$: PREVENTING CURRENT FROM FLOWING INTO OTHER HIGH-VOLTAGE PULSE GENERATION CIRCUIT WHILE HIGH-VOLTAGE PULSE IS APPLIED

- $SW_1, SW_2, SW_3$: SWITCHING MEANS FOR CONTROLLING ON/OFF OF HIGH-VOLTAGE PULSE

- $SW_1', SW_2', SW_3'$: SWITCHING MEANS FOR CONTROLLING ON/OFF IN DISCHARGE COOPERATIVE WITH $SW_1$, $SW_2$, AND $SW_3$

PARTICLES CONTAINING POLYCRYSTALLINE SILICON

MEASUREMENT TERMINAL (Al ELECTRODE)

SILICON PARTICLE (LUMP) SIMILAR TO SINGLE CRYSTAL

FIG. 31
(1) APPLICATION OF MAGNETIC FIELD
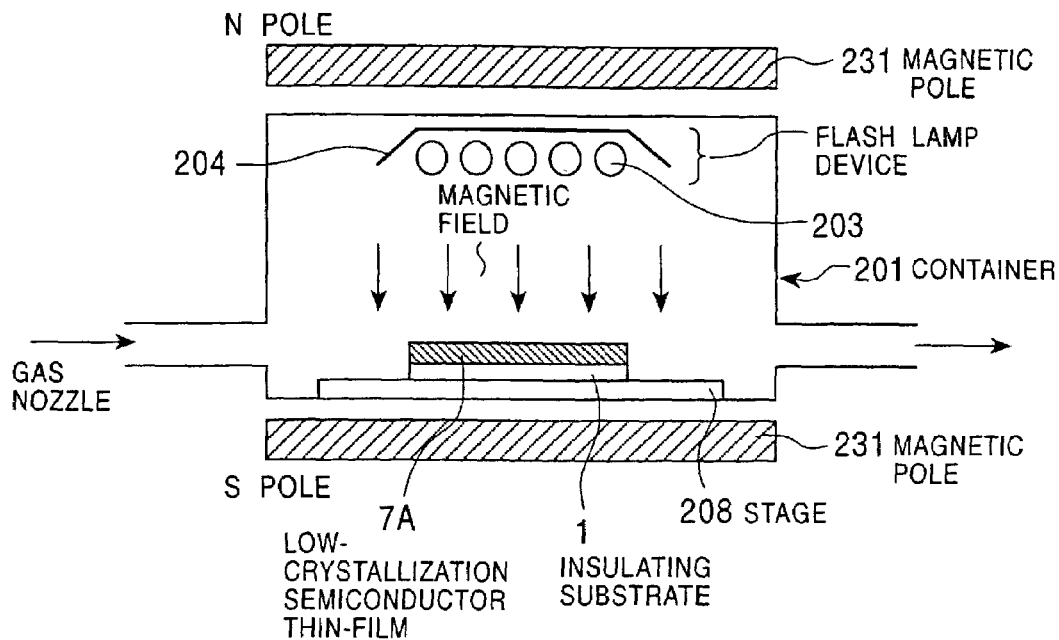
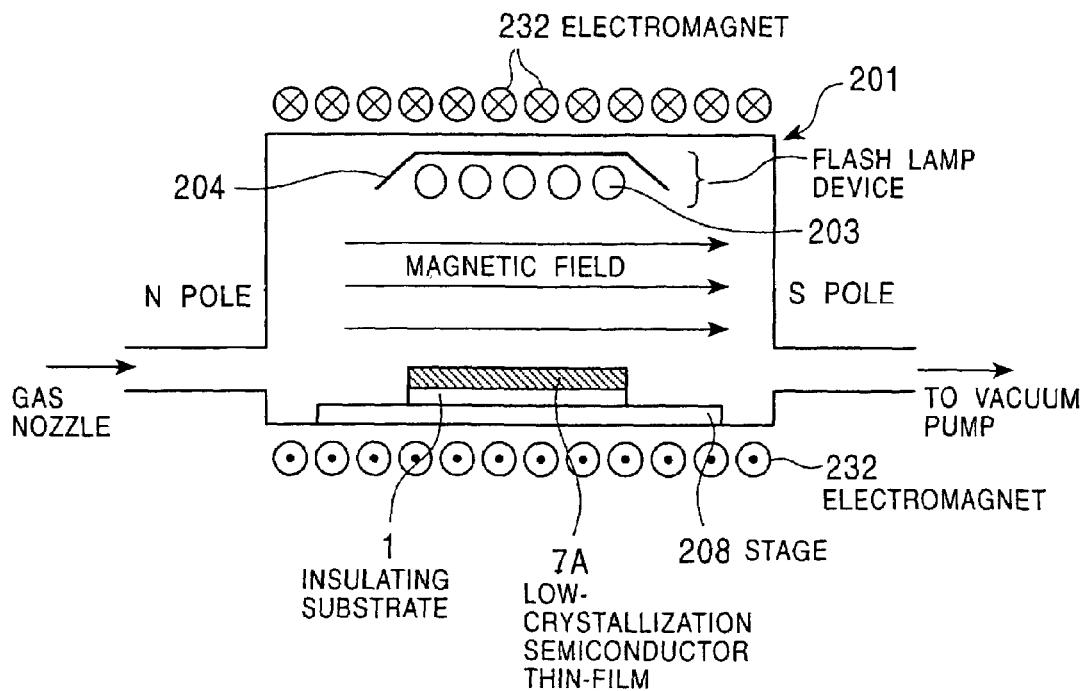

(2) APPLICATION OF ELECTRIC FIELD (3) APPLICATION OF MAGNETIC FILED AND ELECTRIC FIELD

FIG. 36
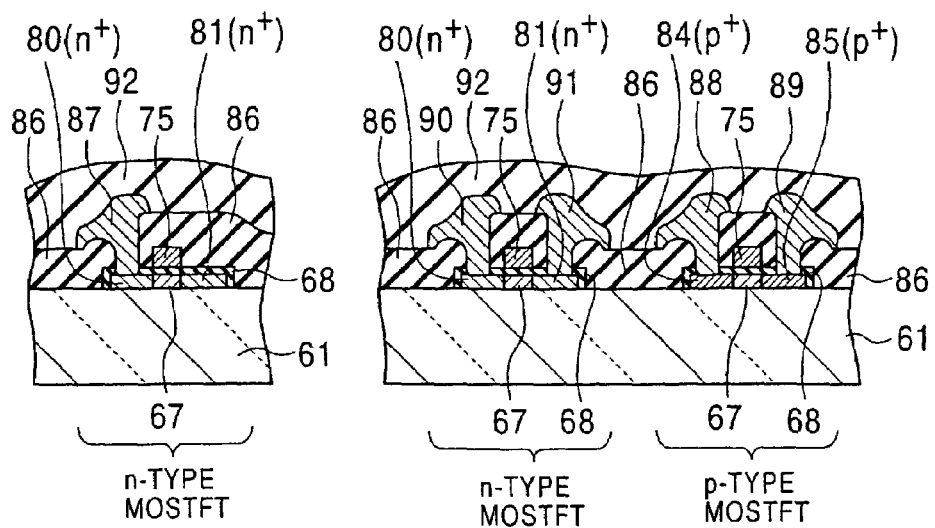
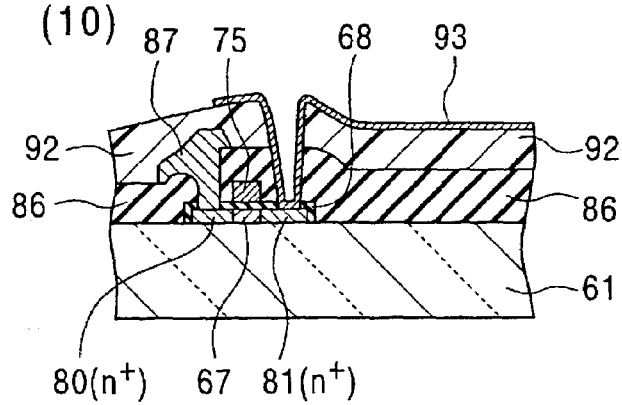
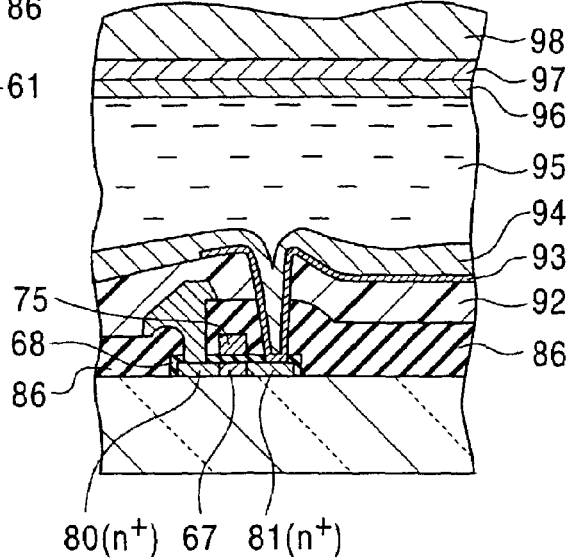
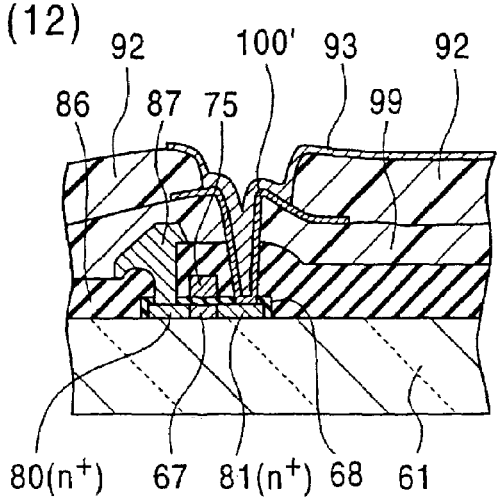

FIG. 40
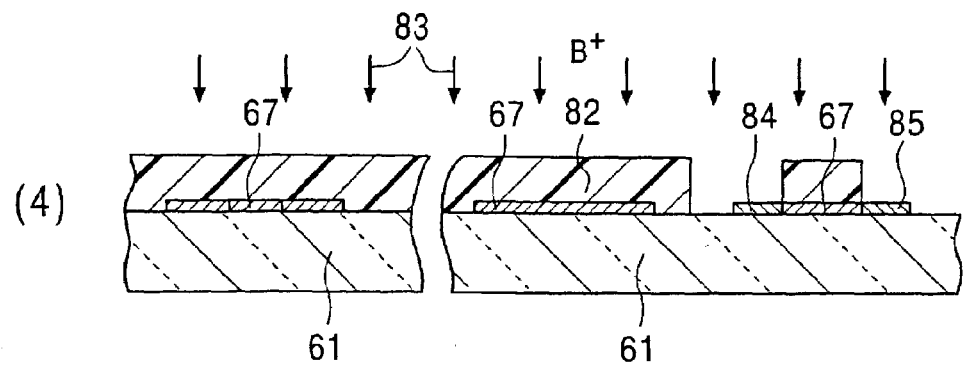
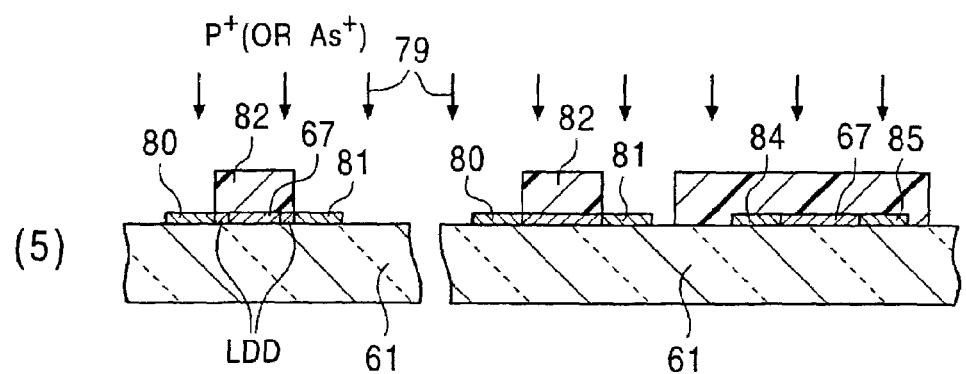
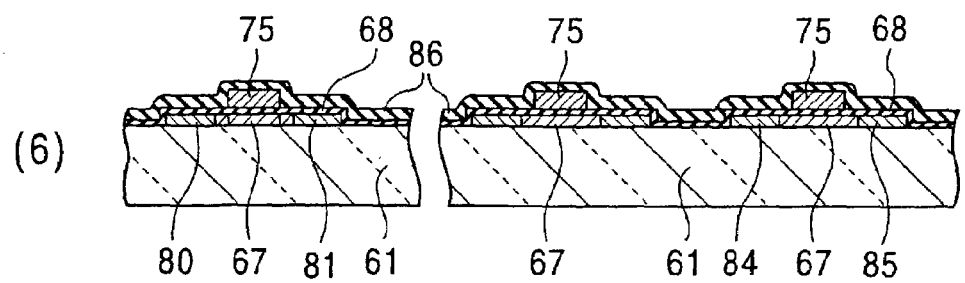
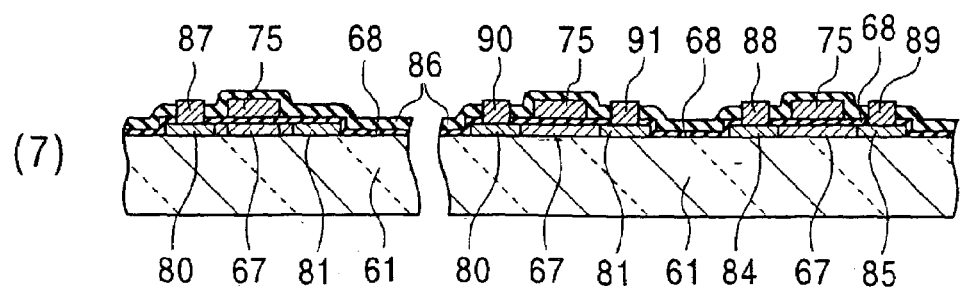

FIG. 41
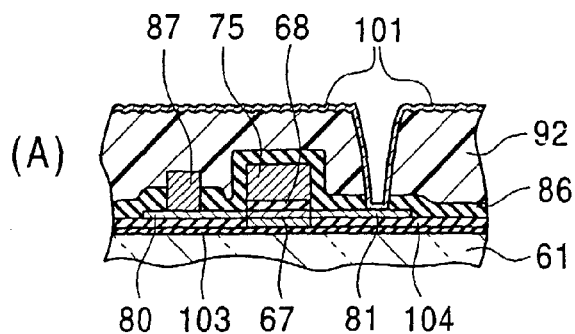
<DISPLAY PORTION>
(REFLECTIVE TYPE)
(A)
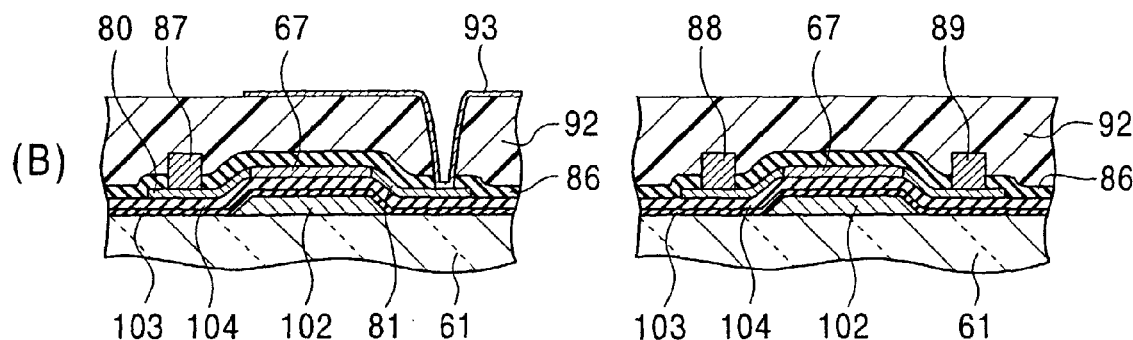
(B)
<PERIPHERAL DRIVING CIRCUIT PORTION>
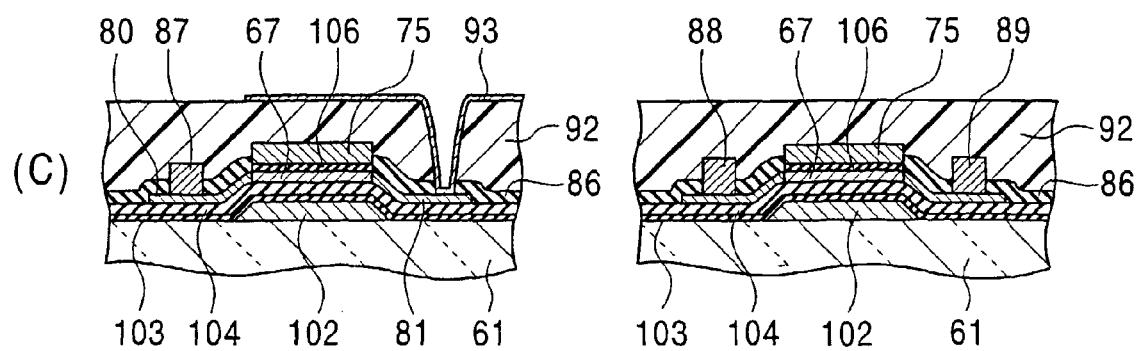
(C)

FIG. 43
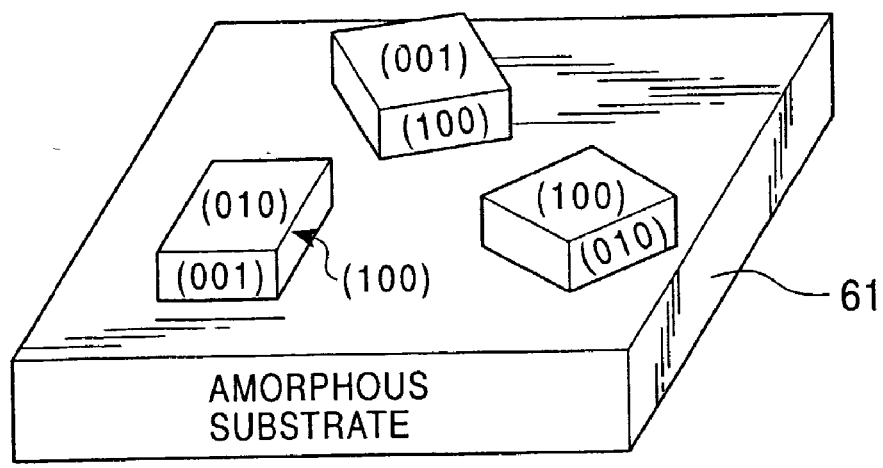
(a)
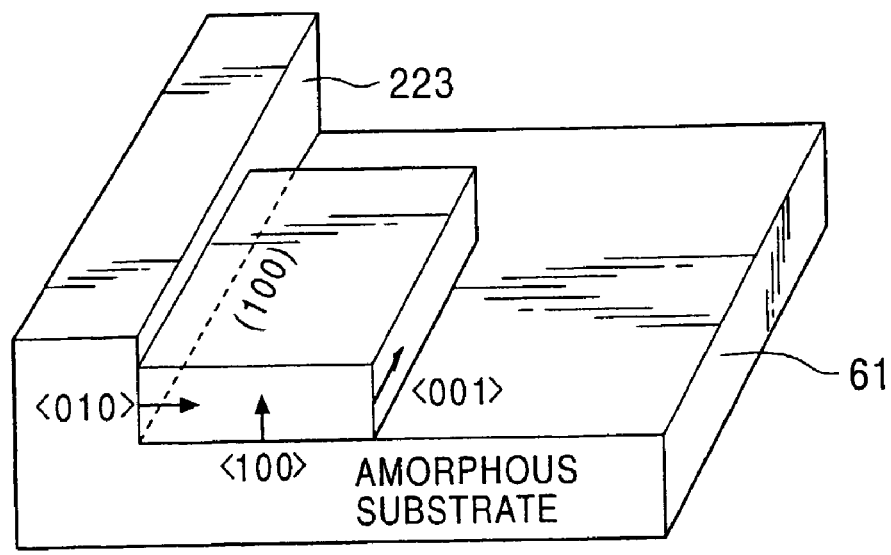
(b)

FIG. 44
(a)
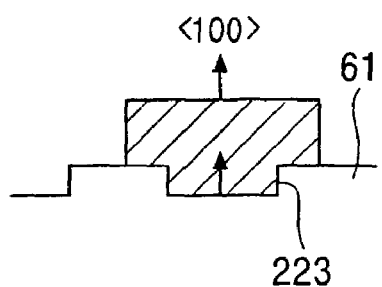
(b)
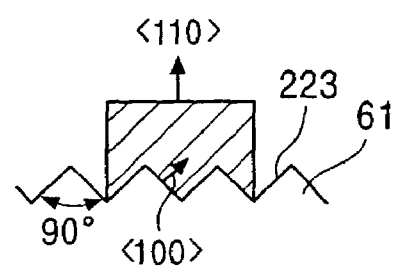
(c)
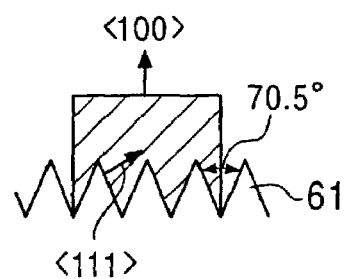
(d)
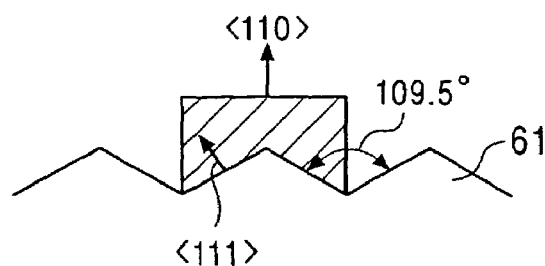
(e)
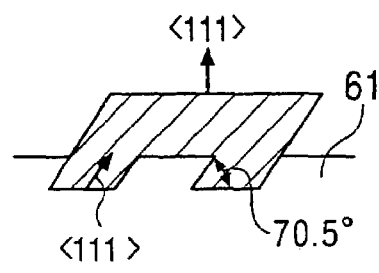
(f)
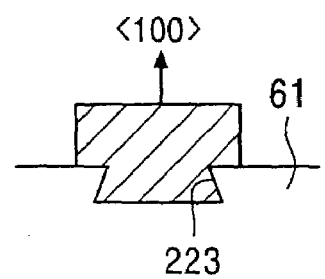

FIG. 52
(5)
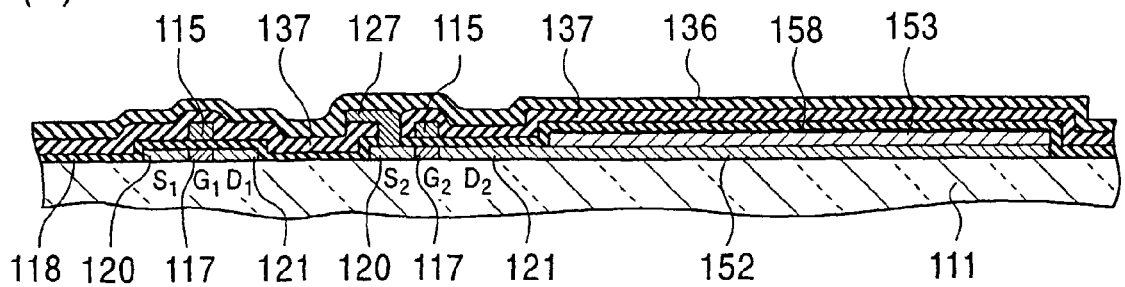
(6)
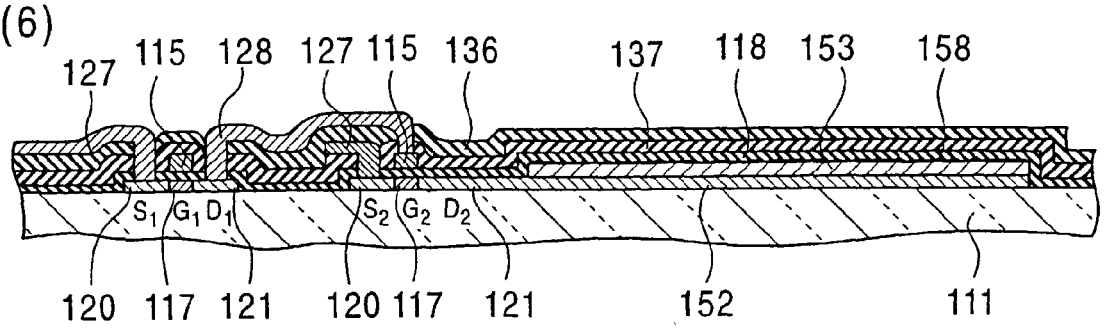
(7)
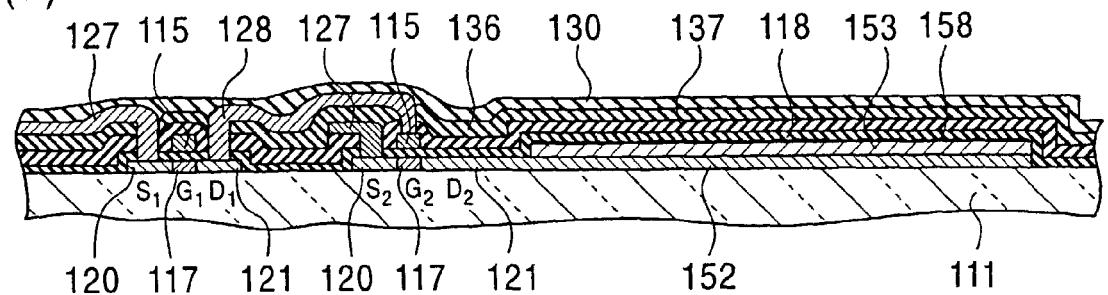
(8)
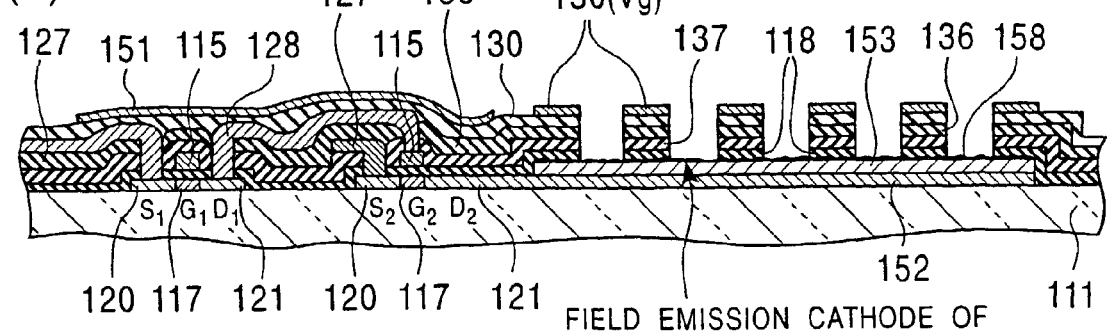

FIG. 55
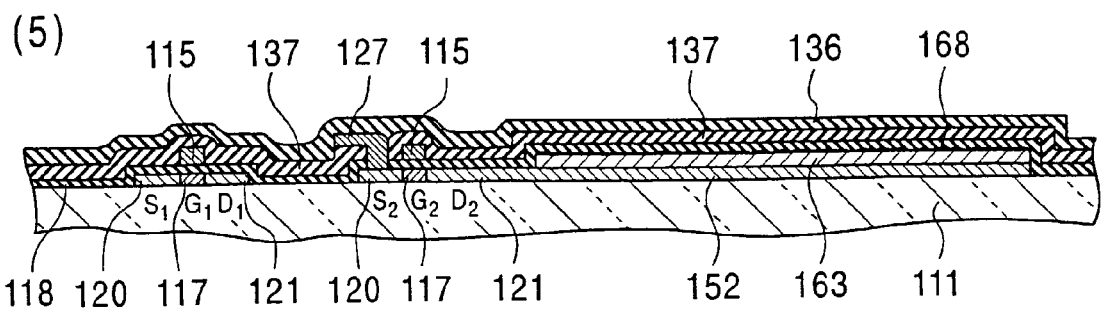
(5)
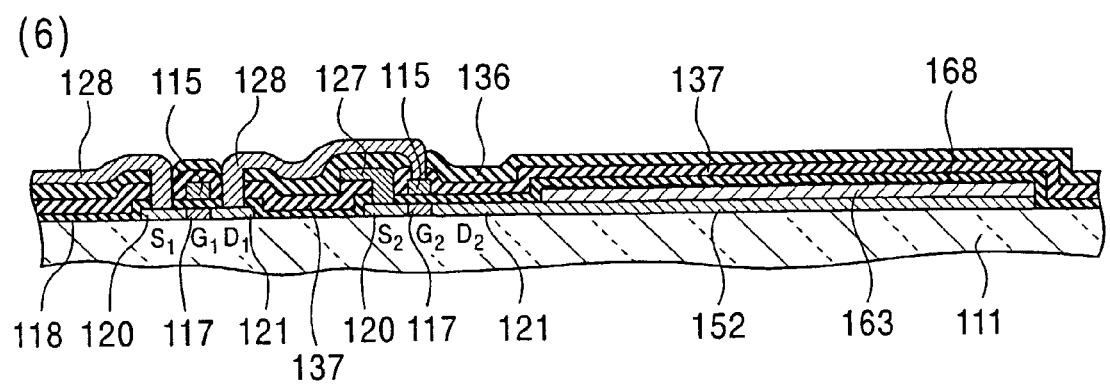
(6)
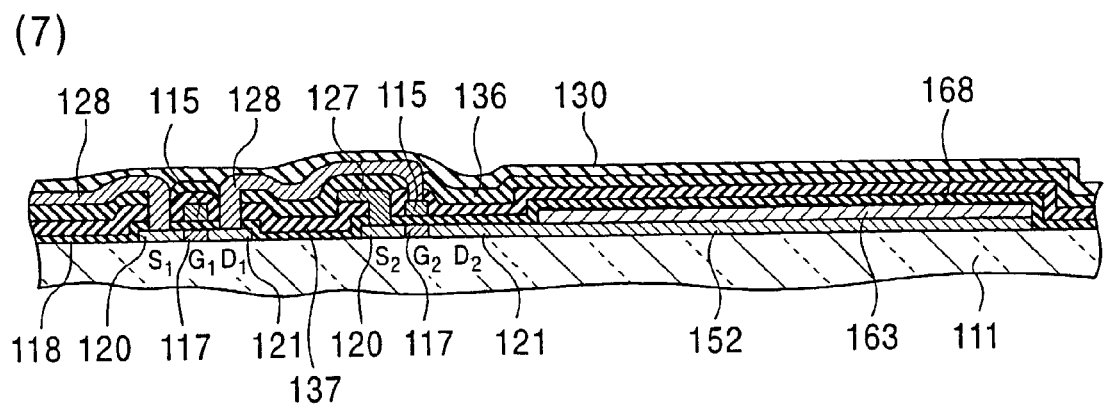
(7)
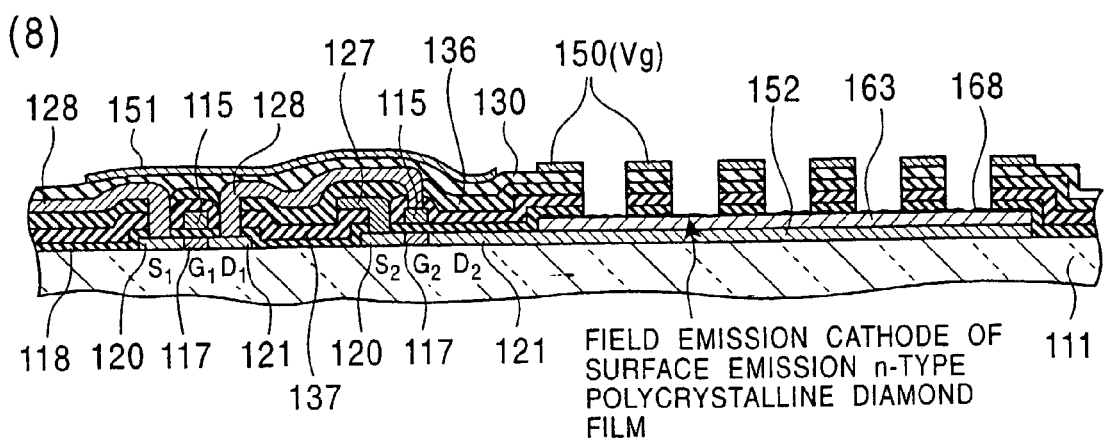
(8)

SEMICONDUCTOR THIN FILM FORMING METHOD, PRODUCTION METHODS FOR SEMICONDUCTOR DEVICE AND ELECTROOPTICAL DEVICE, DEVICES USED FOR THESE METHODS, AND SEMICONDUCTOR DEVICE AND ELECTROOPTICAL DEVICE

BACKGROUND OF THE INVENTION

The present invention relates to methods and apparatuses for growing polycrystalline or a single crystalline semiconductor thin-film, such as polycrystalline silicon, single crystalline silicon, or the like, on a substrate, to methods and apparatuses for manufacturing semiconductor devices and electrooptic devices having the polycrystalline or the single crystalline semiconductor thin-film on the substrate, and to the semiconductor devices and the electrooptic devices.

BACKGROUND ART

Heretofore, when a source, a drain, and a channel region of a MOSFET (Metal-Oxide-Semiconductor Field Effect Transistor),such as a MOSTFT (Thin Film Transistor=thin-film insulating gate type field effect transistor) are formed, vapor-phase growth, such as plasma CVD (CVD: Chemical Vapor Deposition), reduced-pressure CVD, or catalytic CVD, solid-phase growth, liquid-phase growth, excimer laser anneal, and the like have been used.

As disclosed in Japanese Unexamined Patent Application Publication Nos. 7-131030 and 9-116156, and Japanese Examined Patent Application Publication No. 7-118443, by simply performing high-temperature anneal or excimer laser anneal (ELA) for amorphous or microcrystalline silicon films formed by plasma CVD, reduced-pressure CVD, or the like to form polycrystalline silicon films, improvement in carrier mobility has been performed: however, according to this method, a carrier mobility of approximately up to 80 to 120 $cm^2/V \cdot sec$ has been only obtained.

However, since the electron mobility of a MOSFET using a polycrystalline silicon film obtained by performing ELA for an amorphous silicon-film formed by plasma CVD is approximately 100 $cm^2/V \cdot sec$, and higher integration density can also be satisfied, in recent years, an LCD (Liquid Crystal Device) which uses polycrystalline silicon MOSTFTs and which is integrated with driving circuits has attracted attention (see Japanese Unexamined Patent Application Publication No. 6-242433). By using excimer laser annealing which is a method for performing fusion and crystallization by irradiating a sample with short wavelength and short pulse laser such as XeCl excimer laser, polycrystallization of amorphous silicon films can be-performed by laser light emission without damaging glass substrates, and high throughput can be expected.

However, according to the above method for manufacturing the polycrystalline MOSFET using ELA, since crystallization speed is high in the order of nanoseconds, the diameter of obtained crystal grains is approximately up to 100 nm. As a result, even when a method is performed in which substrate temperature is heated to approximately 400° C. while short wavelength and short pulse laser is emitted, and in which hydrogen, oxygen, and the like which inhibit the crystal growth are sufficiently removed so as to control the solidification speed, it has been difficult to obtain crystals having a grain size of 500 nm or more. Accordingly, energy sufficient to grow crystals has been given by performing laser emission at least two times, such as 5 times or 30 times or more, so as to form polycrystalline silicon films having a large grain size. However, there have been a number of problems, such as unstable excimer laser output, poor productivity, increase in cost of apparatus due to increased size thereof, lower yield, degradation in quality, and the like, and in particular, when a large glass substrate having a size of 1 meter by 1 meter is used, the problems mentioned above become more serious, and as a result, it becomes more difficult to improve performance and quality and to reduce cost.

In recent years, in Japanese Unexamined Patent Application Publication No. 11-97353, a method has been proposed in which a catalytic element (Ni, Fe, Co, or the like) which facilitates crystallization is diffused in an amorphous silicon film by heat treatment at 450 to 600° C. for 4 to 12 hours so as to form a crystalline silicon film. However, according to this method, since the catalytic element remains in the crystalline silicon film thus formed, in order to remove (gettering) this catalytic element, as disclosed in Japanese Unexamined Patent Application Publication No. 8-339960, there have been proposed a method for performing heat treatment in an atmosphere containing halogen elements such as chlorine; a method for selectively adding phosphorus to a crystalline silicon film and then performing heat treatment; and after a crystalline silicon film containing a catalytic element is irradiated with laser light or intensive light to allow the catalytic element to diffuse easily, a method for absorbing the catalytic element by an element which is selectively added. However, the process is complicated, sufficient gettering effect cannot be obtained, semiconductor properties of the silicon film are degraded, and the stability and the reliability of elements thus formed are degraded.

In addition, according to a method for manufacturing a polycrystalline silicon MOSTFT by a solid-state growth, since annealing at 600° C. or more for ten and several hours and formation of a gate $SiO_2$ by thermal oxidation at approximately 1,000° C. must be performed, semiconductor device manufacturing equipment must be used. Accordingly, the substrate size is up to a wafer size of 8 to 12 inches in diameter, and a synthetic quartz glass which is expensive and which is heat resistance must be used. Hence, it is difficult to reduce cost, and the applications are limited to EVF and data/AV projectors.

Recently, a catalytic CVD method which is a thermal CVD method capable of forming a polycrystalline silicon film, a silicon nitride film, or the like on an insulating substrate such as a glass substrate at a low temperature has been developed (see Japanese Examined Patent Application Publication Nos. 63-41314 and 8-250438), and studies for practical use thereof has been actively performed. In a catalytic CVD method, without performing anneal for crystallization, a carrier mobility of approximately 30 $cm^2/V \cdot sec$ has been obtained; however, the value mentioned above is not large enough to manufacture superior MOSTFTs. In addition, when a polycrystalline silicon film is formed on a glass substrate, amorphous silicon in an initial transition state (a thickness of 5 to 10 nm) may be easily formed depending on film-forming conditions, and when a bottom-gate MOSTFT is formed, it is difficult to obtain desired carrier mobility. In general, in an LCD which uses polycrystalline silicon MOSTFTs and which is integrated with driving circuits, bottom-gate MOSTFTs are preferably formed in view of yield and productivity; however, the problem described above has been still serious.

An object of the present invention is to provide a method for easily forming a polycrystalline or a single crystalline semiconductor thin-film, such as polycrystalline silicon or the like, having high crystallinity, superior quality, and a large area at low cost, and to provide an apparatus for performing the method described above.

Another object of the present invention is to provide a method for manufacturing a semiconductor device, such as MOSTFT, having the polycrystalline or the single crystalline semiconductor thin-film described above as a constituent element; a method for manufacturing an electrooptic device; apparatuses for performing the methods mentioned above; and the semiconductor device and the electrooptic device.

SUMMARY OF THE INVENTION

In forming a polycrystalline or a single crystalline semiconductor thin-film on a substrate, or in forming a semiconductor device having a polycrystalline or a single crystalline semiconductor thin-film on a substrate, a method for forming a semiconductor thin-film or for manufacturing a semiconductor device, according to the present invention, comprises a first step of forming a low-crystallization semiconductor thin-film on the substrate, and a second step of heating and cooling the low-crystallization semiconductor thin-film to a fusion, a semi-fusion, or a non-fusion state by flash lamp annealing to facilitate the crystallization of the low-crystallization semiconductor thin-film.

In addition, as an apparatus for performing the method of the present invention, the present invention provides a forming apparatus for forming a polycrystalline or a single crystalline semiconductor thin-film or a manufacturing apparatus for manufacturing a semiconductor device, in which the apparatus comprises first means for forming a low-crystallization semiconductor thin-film on the substrate, and second means for heating and cooling the low-crystallization semiconductor thin-film to a fusion, a semi-fusion, or a non-fusion state by flash lamp annealing to facilitate the crystallization of the low-crystallization semiconductor thin-film.

In addition, the present invention provides an electrooptic device which comprises a cathode or an anode, which is provided under each of organic or inorganic electroluminescent layers for individual colors and which is connected to a drain or a source of a MOSTFT composed of the polycrystalline or the single crystalline semiconductor thin-film, wherein active elements including the MOSTFT and a diode are covered with the cathode, or the cathode or the anode is provided on and between the organic or the inorganic electroluminescent layers for individual colors so as to cover the entire surface.

In addition, the present invention also provides an electrooptic device in which each emitter of a field emission display (FED) device is connected to a drain of a MOSTFT formed of the polycrystalline or the single crystalline semiconductor thin-film via the polycrystalline or the single crystalline semiconductor thin-film and is formed of an n-type polycrystalline semiconductor film, a polycrystalline diamond film, a carbon thin-film which may or may not contain nitrogen, a number of protruding structures (for example, carbon nanotube) formed on a surface of a carbon thin-film which may or may not contain nitrogen, or the like, which is formed on the polycrystalline or the single crystalline semiconductor thin-film.

According to the present invention, since a polycrystalline or a single crystalline semiconductor thin-film is formed by forming a low-crystallization semiconductor thin-film on a substrate and subsequently by heating and cooling the low-crystallization semiconductor thin-film to a fusion, a semi-fusion, or a non-fusion state by flash lamp annealing to facilitate the crystallization of the low-crystallization semiconductor thin-film, the significant advantages (1) to (10) described below can be obtained.

(1) By flash lamp annealing in which flash emission can be performed once or repeatedly in an optional short period of time in the range of microseconds to milliseconds, high emission energy is given to a low-crystallization semiconductor thin-film such as low-crystallization silicon so that the semiconductor thin-film is heated and cooled to a fusion, a semi-fusion state, or a non-fusion state, and hence, a polycrystalline semiconductor thin-film such as a polycrystalline silicon thin-film having a large grain size, high carrier mobility, and high quality, or a single crystalline semiconductor thin-film is obtained, whereby the productivity is significantly increased, and considerable cost reduction can be realized.

(2) In flash lamp annealing, by combining an optional number of lamps with a flash discharge mechanism therefor, for example, ① the entire large area of 1,000 mm×1,000 mm may be simultaneously irradiated once or repeatedly as required with flash emission light, ② flash emission light which is condensed and homogenized to have a square emission area of 200 mm×200 mm may be scanned by a galvanometer scanner, and when necessary, flash emission may be performed by overlap scanning, or ③ under the conditions in which the emission position of flash emission light which is condensed and homogenized to have a square emission area of 200 mm×200 mm is fixed, and a substrate is moved in a step & repeat manner, flash emission may be performed and, when necessary, may be performed by overlap scanning. As described above, since the substrate or flash emission light can be moved in an optional direction at an optional speed, heating and cooling rate can be controlled, an optional large area of a low-crystallization silicon thin-film or the like can be converted into a polycrystalline or a single crystalline thin-film in an extremely short time, and hence, significantly high productivity and considerable cost reduction can be realized.

(3) Since flash emission light is condensed and homogenized to have an optional strip, rectangular, square, or circular form and is then emitted, the emission intensity, that is, fusion efficiency and throughput, is improved, and variation in carrier mobility can be decreased by improvement in uniformity of crystallization.

(4) By repeating a method in which a low-crystallization silicon film or the like is formed on a polycrystalline silicon film or the like crystallized by flash lamp annealing, and crystallization is again performed by flash lamp annealing, a polycrystalline silicon film or the like, which has a large grain size, high carrier mobility, and high quality, can be formed in a laminated shape having a thickness in the order of micrometers. Accordingly, in addition to MOSLSIs, high performance and high quality bipolar LSIs, CMOS sensors, CCD area/linear sensors, solar cells, and the like can be formed.

(5) Since adjustment of wavelength (change of an enclosed gas, change of discharge conditions, use of an IR-reducing or an IR-blocking filter, or the like) and control of emission intensity, emission time, and the like in flash lamp annealing can be easily performed in accordance with the film thickness of a low-crystallization semiconductor thin-film, a heat resistant temperature of a substrate such as glass, a desired grain size (carrier mobility), and the like, a polycrystalline silicon film or the like having high carrier mobility and high quality can be reproducibly obtained at a high productivity rate.

(6) Lamps used for flash lamp annealing, such as xenon lamps, xenon-mercury lamps,-krypton lamps, krypton-mercury lamps, xenon-krypton lamps, xenon-krypton-mercury lamps, and metal halide lamps, which can withstand repeated light emission, are much inexpensive than an excimer laser oscillator of an excimer laser annealing apparatus using XeCl, KrF, or the like, have a longer life, and require easier maintenance, and hence, considerable cost reduction can be achieved.

(7) Since a flash lamp annealing apparatus primarily composed of flash lamps and a discharge circuit has a simple structure compared to that of an excimer laser annealing apparatus, it is inexpensive, and hence, cost reduction can be realized.

(8) Since excimer laser annealing performed by XeCl, KrF, or the like uses a pulse oscillating laser in the order of nanoseconds, there has been a problem of output stability, and hence, there have been variation in energy distribution in an irradiation area, variation in quality of obtained crystallized semiconductor films, and variation in element performance between TFTs. Accordingly, a method in which excimer laser pulse is emitted many times, such as 5 times or 30 times, is performed while a temperature of approximately 400° C. is applied; however, properties of crystallized semiconductor films and TFT elements vary due to the emission variation, and the cost is increased by decrease in productivity rate caused by decrease in throughput. In contrast, in flash lamp annealing, as described in the above (2), since the entire large area of, for example, 1,000 mm×1,000 mm can be simultaneously irradiated with flash emission light using a pulse in the range of microseconds to milliseconds, variation in energy distribution in the irradiation area, variation in quality of obtained crystallized semiconductor films, and variation in element performance between TFTs are small, and cost reduction can be realized by a high productivity rate caused by high throughput.

(9) In particular, when an IR-blocking or an IR-reducing filter which at least blocks or reduces infrared, such as color filter glass (IR-absorbing filter) containing an IR-absorbing material, such as powdered copper or powdered iron; a cold mirror/cold filter coated with an infrared reflection film such as an ITO film; or a filter composed of both filters mentioned above (an IR-absorbing filter coated with an IR-reflecting film, or the like) is used, since flash lamp annealing by intensive ultraviolet rays can be performed at a low temperature (200 to 400° C.), a low strain point glass, such as aluminosilicate glass or borosilicate glass, or a heat resistant resin such as polyimide, which is inexpensive and can be formed into a large size, may be used, and hence, reduction in weight and cost can be achieved.

(10) In addition to a top gate type, since a polycrystalline semiconductor film or a single crystalline semiconductor film having high carrier mobility can be used for forming a bottom gate type, a dual gate type, and a back gate type MOSTFTs, for example, high speed, high current density semiconductor devices, electrooptic devices, and highly efficient solar cells can be formed using this high performance semiconductor films. For example, there may be mentioned silicon semiconductor devices, silicon semiconductor integrated circuit devices, field emission display (FED) devices, silicon-germanium semiconductor devices, silicon-germanium semiconductor integrated circuit devices, silicon carbide semiconductor devices, silicon carbide semiconductor integrated circuit devices, III-V and II-VI compound semiconductor devices, III-V and II-VI compound semiconductor integrated circuit devices, polycrystalline or single crystalline diamond semiconductor devices, polycrystalline or single crystalline diamond semiconductor integrated circuit devices, liquid crystal display devices, electroluminescent (organic or inorganic) display devices, light-emitting polymer display devices, light-emitting diode display devices, light sensor devices, CCD area/linear sensor devices, CMOS sensor devices, and solar cells.

In the present invention, as defined later, the low-crystallization semiconductor thin-film described above primarily has the structure primarily composed of an amorphous material, a microcrystalline material (generally having a grain size of 10 nm or less), an amorphous material containing a microcrystalline component, a microcrystalline material containing an amorphous component, or a polycrystalline material containing amorphous and microcrystalline components, and the polycrystalline semiconductor thin-film described above is obtained by removing the amorphous component from the above low-crystallization semiconductor thin-film and has the structure primarily composed of a polycrystalline material having a large grain size (generally, the grain size is several hundred nanometers or more) and also containing a microcrystalline component. In addition to single crystalline semiconductor such as single crystalline silicon, the single crystalline semiconductor thin-film described above is a concept including single crystalline compound semiconductor (such as single crystalline gallium arsenide) and single crystalline silicon-germanium, and the single crystal is defined as a concept including a single crystal containing subgrains or transformation. Furthermore, the polycrystalline diamond film described above is defined as a crystalline diamond film which does not substantially contain amorphous diamond but microcrystalline and polycrystalline diamond.

BRIEF DESCRIPTION OF THE DRAWINGS

FIG. 1 includes cross-sectional views of a process for manufacturing a MOSTFT sequentially shown by steps according to a first embodiment of the present invention.

FIG. 2 includes cross-sectional views of the manufacturing process sequentially shown by steps according to the first embodiment.

FIG. 3 includes cross-sectional views of the manufacturing process sequentially shown by steps according to the first embodiment.

FIG. 4 includes cross-sectional views of the manufacturing process sequentially shown by steps according to the first embodiment.

FIG. 7 is a schematic cross-sectional view of a flash lamp annealing apparatus according to the first embodiment.

FIG. 10 includes schematic cross-sectional views, side views, and plan views of various flash lamp annealing apparatuses according to the first embodiment.

FIG. 12 includes schematic views of various flash lamps according to the first embodiment.

FIG. 13 includes front views and a plan view showing examples of flash lamps provided with a trigger electrode according to the first embodiment.

FIG. 17 includes a schematic cross-sectional view and a plan view showing another example of a flash lamp annealing apparatus according to the first embodiment.

FIG. 18 includes a view and a graph for illustrating one flash emission mode of flash lamp annealing according to the first embodiment.

FIG. 19 is a graph for illustrating another mode according to the first embodiment.

FIG. 21 is a graph showing another mode according to the first embodiment.

FIG. 22 is a graph showing still another mode according to the first embodiment.

FIG. 23 is an equivalent circuit diagram of a charge and discharge circuit of the flash lamp according to the first embodiment.

FIG. 31 includes schematic cross-sectional views showing another example of a flash lamp annealing apparatus according to the first embodiment.

FIG. 36 includes cross-sectional views of the manufacturing process sequentially shown by steps according to the second embodiment.

FIG. 40 includes cross-sectional views of the manufacturing process sequentially shown by steps according to the second embodiment.

FIG. 41 includes cross-sectional views showing various MOSTFTs of the LCD according to the second embodiment.

FIG. 43 includes schematic views for illustrating graphoepitaxial growth according to the second embodiment.

FIG. 44 includes schematic cross-sectional views showing various step shapes according to the second embodiment.

FIG. 52 includes cross-sectional views of the manufacturing process sequentially shown by steps according to the fourth embodiment.

FIG. 55 includes cross-sectional views of the manufacturing process sequentially shown by steps according to the fourth embodiment.

DETAILED DESCRIPTION OF THE PRESENTLY PREFERRED EMBODIMENTS

Figure 5:
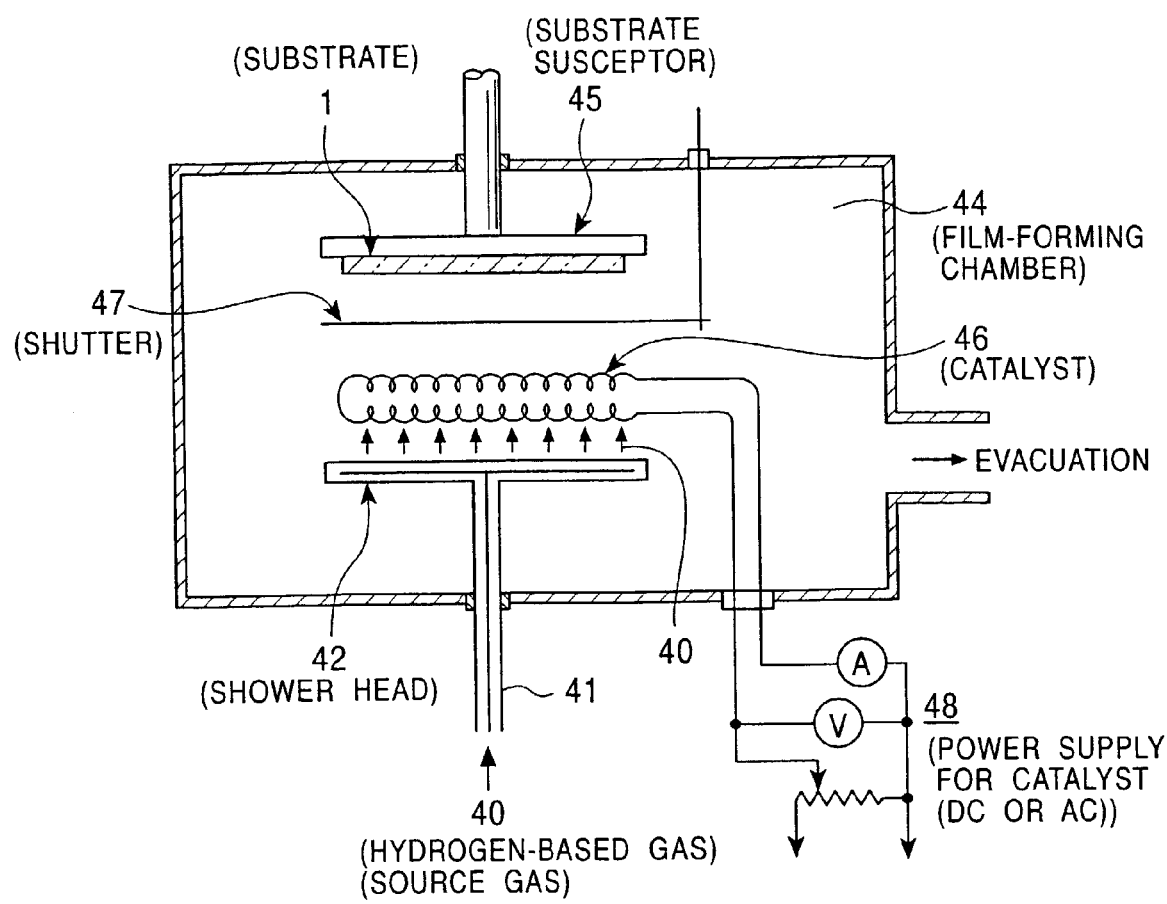
FIG. 5 is a schematic cross-sectional view of a catalytic CVD apparatus, which is placed in one state, used for manufacturing according to the first embodiment.

In the present invention, the low-crystallization semiconductor thin-film may be formed by vapor-phase growth such as catalytic CVD, plasma CVD, or the like, and as a source gas used therefor, for example, there may be mentioned a silicon hydride or a derivative thereof; a mixture of silicon hydride or a derivative thereof and a gas containing hydrogen, nitrogen, germanium, carbon, or tin; a mixture of silicon hydride or a derivative thereof and a gas which contains a dopant including a Group III or a Group V element of the periodic table; and a mixture of silicon hydride or a derivative thereof, a gas containing hydrogen, nitrogen, germanium, carbon, or tin, and a dopant including a Group III or a Group V element of the periodic table.

By using the source gases described above, the low-crystallization semiconductor thin-film may be formed which is composed of an amorphous silicon film, an amorphous silicon film containing microcrystalline silicon, a microcrystalline silicon (microcrystalline silicon containing amorphous silicon) film, a polycrystalline silicon film containing amorphous silicon and microcrystalline silicon, an amorphous germanium film, an amorphous germanium film containing microcrystalline germanium, a microcrystalline germanium (microcrystalline germanium containing amorphous germanium) film, a polycrystalline germanium film containing amorphous germanium and microcrystalline germanium, an amorphous silicon germanium film represented by $Si_xGe_{1-x}$ (0<x<1), an amorphous carbon film, an amorphous carbon film containing microcrystalline carbon, a microcrystalline carbon (microcrystalline carbon containing amorphous carbon) film, a polycrystalline carbon film containing amorphous carbon and microcrystalline carbon, an amorphous silicon carbide film represented by $Si_xC_{1-x}$ (0<x<1), or an amorphous gallium arsenide film represented by $Ga_xAs_{1-x}$ (0<x<1). This low-crystallization semiconductor thin-film is preferably formed of an amorphous component as an primary component, and when a microcrystalline component is contained, microcrystals having a grain size of 10 nm or less, which will be used as a seed for crystal growth, are preferably dispersed in the thin-film.

Subsequently, during or after the growth of this low-crystallization semiconductor thin-film, when an appropriate amount (for example, the total amount is $10^{17}$ to $10^{22}$ atoms/cc, and is preferably $10^{18}$ to $10^{20}$ atoms/cc) of at least one Group IV element, such as tin, germanium, or lead, is added to the thin-film, and when flash lamp annealing is then preformed in the state described above, crystallization of this low-crystallization semiconductor thin-film is facilitated when it is crystallized. In addition, for example, irregularities present at the grain boundaries in the polycrystalline semiconductor thin-film thus formed can be decreased, film stress thereof can be decreased, and hence, a high quality polycrystalline semiconductor thin-film having high carrier mobility can be easily obtained. This Group IV element may be contained in the low-crystallization semiconductor thin-film by adding to the source gas as a gas component or by using ion implantation or ion doping. In addition, after silicon or germanium ions are ion-implanted into a microcrystalline semiconductor thin-film formed by reduced-pressure CVD or the like at a dose rate of, for example, $1\times10^{15}$ atoms/cm$^2$ to form amorphous silicon, flash lamp annealing may be performed to form a polycrystalline silicon thin-film having a large grain size or a single crystalline thin-film.

Each concentration of oxygen, nitrogen, and carbon in the polycrystalline semiconductor thin-film having a large grain size or the single crystalline semiconductor thin-film of the present invention is $1\times10^{19}$ atoms/cm$^2$ or less, or preferably $5\times10^{18}$ atoms/cm$^2$ or less, and the concentration of hydrogen is preferably 0.01 atomic percent or more. In addition, the minimum concentration region of sodium measured by SIMS is preferably $1\times10^{18}$ atoms/cm$^2$ or less.

The low-crystallization semiconductor thin-film such as a low-crystallization silicon is converted into the polycrystalline semiconductor thin-film such as a polycrystalline silicon having a large grain size by the flash lamp annealing described above. In addition to that, after a recess portion provided with a step having a predetermined shape and predetermined dimensions is formed in an element-forming region of the substrate, the low-crystallization silicon thin-film, which may or may not contain at least one Group IV element such as tin, is formed on the substrate including the recess portion described above, and the flash lamp annealing is performed so that graphoepitaxial growth occurs using the corners of the bottom corners of the recess portion as a seed, whereby the low-crystallization silicon thin-film can be converted into a single crystalline silicon thin-film.

Furthermore, after a material layer composed of, for example, crystalline sapphire, having good lattice matching properties with single crystalline silicon is formed in a predetermined element-forming region of the substrate, the low-crystallization silicon thin-film, which may or may not contain at least one Group IV element such as tin, is formed on this material layer, and the flash lamp annealing is then performed so that heteroepitaxial growth occurs using the material layer as a seed, whereby the low-crystallization silicon thin-film described above can be converted into a single crystalline silicon thin-film. The surface or the like of the single crystalline silicon thin-film formed by the graphoepitaxial or the heteroepitaxial growth described above may be processed by CMP (Chemical Mechanical Polishing) or selective etching or the like so that a single crystalline silicon thin-film having a predetermined thickness and area is formed, the thin-film having islands formed thereon, and when necessary, an SCSOS substrate, such as an SCSOG substrate, may be formed by forming a gate insulating film or a protection film by high temperature oxidation, low temperature and high pressure annealing, or CVD. The SCSOS is single crystal semiconductor (silicon) on substrate, and the SCSOS is single crystal semiconductor (silicon) on glass.

By repeating this flash lamp annealing and the formation of the low-crystallization semiconductor thin-film so as to form a laminate, a polycrystalline or a single crystalline semiconductor thick film in the order of micrometers may be formed. That is, after a polycrystalline semiconductor thin-film having a large grain size or a single crystalline semiconductor thin-film is formed in first flash lamp annealing, on this thin-film thus formed, a low-crystallization semiconductor thin-film is formed and is then converted into a polycrystalline semiconductor thin-film having a large grain size or a single crystalline semiconductor thin-film by second flash lamp annealing, which is performed in a manner similar to the above, using the underlying polycrystalline semiconductor thin-film having a large grain size or the single crystalline semiconductor thin-film as a seed, and the steps described above are repeated as required, thereby forming a laminate, having a thickness in the order of micrometers, composed of the polycrystalline semiconductor thin-films having a large grain size or the single crystalline semiconductor thin-films. When the laminate is formed, since lamination is sequentially performed using the underlying polycrystalline semiconductor thin-film having a large grain size or the single crystalline semiconductor thin-film as a seed, a polycrystalline semiconductor thin-film having a large grain size or a single crystalline semiconductor thin-film, which is formed closer to the top surface of the laminate, has higher crystallinity and higher purity. In this process, it is important to avoid the formation of low-oxidation films on the surface crystallized by annealing or the adhesion of contaminants (impurities) thereto.

In order to avoid the formation of low-oxidation films and the adhesion of contaminants, and in order to improve productivity, it is preferable that the step of forming the low-crystallization semiconductor thin-film and the flash lamp annealing step be continuously or sequentially performed in accordance with, for example, an in-line (continuous chamber) method (linear type or rotation type), a multiple chamber method, or a cluster method in an apparatus in which means (plasma CVD, catalytic CVD, sputtering, or the like) and an annealer are provided.

Among those mentioned above, the cluster method (1) or (2) described below is more preferable.

(1) A cluster type integrated apparatus is an apparatus in which a step of forming a low-crystallization semiconductor thin-film in a CVD portion, a step of crystallizing the thin-film by flash lamp annealing in an annealer portion, a step of returning the annealed thin-film to the CVD portion, a step of forming a low-crystallization semiconductor thin-film on this annealed thin-film, and a step of crystallizing this thin-film by flash lamp annealing in the annealer portion are repeatedly performed.

(2) A cluster type integrated apparatus is an apparatus in which a step of forming a substrate-protection film (a laminate of silicon oxide and silicon nitride, or the like) in a CVD-1 portion, a step of forming a low-crystallization semiconductor thin-film in a CVD-2 portion, a step of adding a Group IV element in an ion doping/ion implanting portion when necessary, a step of crystallizing the thin-film by flash lamp annealing in an annealer portion, and a step of forming a gate insulating film (a silicon oxide film or the like) in a CVD-3 portion are continuously performed.

In addition, in the steps described above, before flash lamp annealing is again performed, for example, the polycrystalline semiconductor thin-film is processed by plasma discharge using hydrogen or a hydrogen-containing gas or is processed by hydrogen-based active species or the like generated by a catalytic reaction (that is, by plasma or catalytic AHA (Atomic Hydrogen Anneal) treatment) so that cleaning of the surface of the polycrystalline semiconductor thin-film and/or removal of oxide films are performed, and after the low-crystallization semiconductor thin-film is formed, the flash lamp annealing is preferably performed. In the case described above (or also in another case), in particular, flash lamp annealing is preferably performed in a hydrogen or a hydrogen-containing gas atmosphere under a reduced pressure or in a vacuum.

That is, the conditions (1) and (2) described below are particularly preferable.

(1) Before film formation is performed by CVD, by performing plasma treatment with a hydrogen-based carrier gas or catalytic AHA treatment without supplying source gases, contaminants (low-oxidation films, moisture, oxygen, nitrogen, carbon dioxide, and the like) adhered to a surface of a polycrystalline silicon thin-film formed by a first flash lamp annealing are removed so as to clean the interface, and a remaining amorphous silicon component is etched, thereby forming a polycrystalline silicon thin-film having high crystallinity. Accordingly, by using this polycrystalline silicon thin-film as a seed, a low-crystallization silicon thin-film formed on this clean interface is converted into a high quality polycrystalline semiconductor thin-film having a large grain size or a high quality single crystalline semiconductor thin-film, thereby forming a laminate.

(2) In order to prevent oxidation and nitridation, flash lamp annealing is performed in a hydrogen or a hydrogen-based gas atmosphere under a reduced-pressure or in a vacuum. As the atmosphere, hydrogen or a mixture of hydrogen and an inert gas (argon, helium, krypton, xenon, neon, or radon) is used, and the gas pressure is in the range of 1.33 Pa to less than atmospheric pressure and is preferably in the range of 133 Pa to $4 \times 10^4$ Pa. The degree of vacuum is in the range of 1.33 Pa to less than atmospheric pressure and is preferably in the range of 13.3 Pa to $1.33 \times 10^4$ Pa. However, when an insulating protection film (a silicon oxide film, a silicon nitride film, a silicon oxinitride film, a laminated film composed of silicon oxide and silicon nitride, a laminated film composed of silicon oxide, silicon nitride, and silicon oxide, or the like) is provided on the surface of a low-crystallization semiconductor thin-film, or when continuous operation is not performed, flash lamp annealing may be performed in an air or a nitrogen atmosphere at atmospheric pressure.

When flash lamp annealing is performed in a hydrogen or a hydrogen-containing gas atmosphere under a reduced pressure, gas molecules, which form the atmospheric gas and which have a high specific heat and a significant thermal cooling effect, collide with the thin-film surface and take the heat from the thin-film when being removed. Accordingly, areas where the temperature is low are locally formed, crystal nuclei are generated in these areas, and crystal growth may be facilitated in some cases. In the case described above, when an atmospheric gas is a hydrogen gas or a mixture of hydrogen and an inert gas (He, Ne, Ar, or the like), the gasp pressure is set in the range of 1.33 Pa to less than atmospheric pressure and is preferably set in the range of 133 Pa to $4 \times 10^4$ Pa. The reason for this is that the effect and advantages mentioned above can be reliably obtained by the movement of hydrogen molecules or the like having a high specific heat.

In addition, when flash lamp annealing is performed, the substrate is preferably heated to a strain point thereof or less by using a resistor heater, an infrared lamp, or the like. A heat resistant resin substrate composed of polyimide or the like or a glass substrate having a low strain point, such as borosilicate glass or alumina silicate glass, is heated to 200 to 500° C. and is preferably heated to 300 to 400° C., and a heat resistant substrate such as quartz glass or crystallized glass is heated to 200 to 800° C. and is preferably heated to 300 to 600° C.

As methods for performing flash lamp annealing, there are: (1) a simultaneous flash emission in which the entire large area is simultaneously irradiated at least once with flash emission light; (2) a scanning emission in which the same area is scanned at least once with flash emission light; and (3) a step and/or repeat emission in which, while the substrate is relatively moved in a step mode and/or in a repeat mode with respect to flash emission light, flash emission is performed at least once. In particular, the operations are described below. When necessary, scanning may be performed in an overlapping manner so that the same area may be irradiated with flash emission light once or repeatedly as required.

(1) Simultaneous Flash Emission

For example, a substrate having a large area of 1,000 mm by 1,000 mm is simultaneously irradiated with flash emission light once or repeatedly as required.

(2) Flash Emission by Galvanometer Scanning

A substrate is fixed, and flash emission light, which is condensed and is homogenized to have a square shape of, for example, 200 mm by 200 mm, is scanned in the same region once or repeatedly as required.

(3) Flash Emission in a Step & Repeat Mode

The position of flash emission light, which is condensed and homogenized to have a square shape of, for example, 200 mm by 200 mm, is fixed, and the substrate is moved precisely in the X and the Y directions so that the same region is irradiated with flash emission light once or repeatedly as required.

Flash lamps can repeatedly emit light in a flashing manner. For example, xenon lamps, xenon-mercury lamps, xenon-krypton lamps, krypton lamps, krypton-mercury lamps, xenon-krypton-mercury lamps, and metal halide lamps may be preferably used.

Emission light from a flash lamp is preferably controlled at least to have an emission spectrum in the ultraviolet wavelength region (when necessary, increase in substrate temperature may be prevented by using an IR-blocking filter or an IR-reducing filter, which blocks or reduces at least infrared rays, such as a color filter glass (IR-absorbing filter) containing an IR-absorbing material such as powdered copper, powdered iron, or phosphoric acid; a cold mirror/cold filter which is coated with an IR-reflecting film such as an ITO film; or a filter (such as an IR-absorbing filter coated with an IR-reflecting film) formed of the films described above laminated to each other). In addition, a light-emitting apparatus containing a light source lamp which emits ultraviolet rays or the like and a flash discharge mechanism may be used, the flash discharge mechanism being able to optionally control a peak discharge current supplied to the flash lamp in flash lamp annealing, the time span thereof, and a repeating speed of lamp emission.

Figure 8:
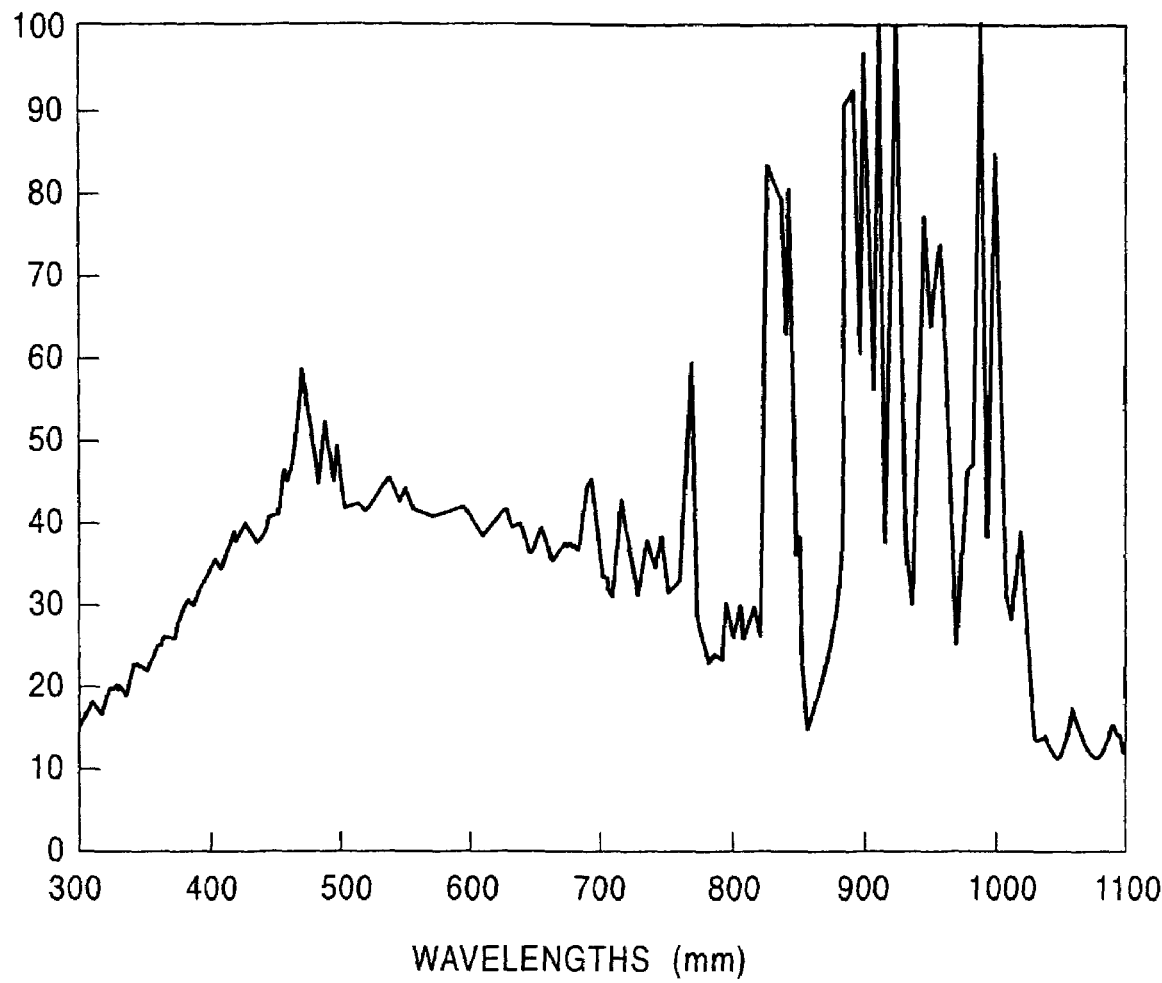
FIG. 8 is a graph showing spectral properties of the flash lamp according to the first embodiment.

For example, when a lamp having the same shape as the xenon flash lamp having an emission spectrum shown in FIG. 8, and when a capacitor is discharged after being charged at a higher voltage, the peak value of a discharge current waveform in discharge is increased, and as a result, spectral intensity in the ultraviolet region having a wavelength of 400 nm or less is relatively increased. In addition, when the voltage for charging the capacitor is constant, ⅓ pulse width is decreased and the peak value of a discharge current waveform is increased with decrease in inductance, and as a result, spectral intensity in the ultraviolet region having a wavelength of 400 nm or less is relatively increased.

In order to facilitate the polycrystallization so as to form a large grain size (high carrier mobility) and single crystallization by the graphoepitaxial and heteroepitaxial growth described above, since silicon once fused is preferably cooled slowly, a flashing time (pulse width) and the peak value in flash lamp annealing, and the repeating speed and frequency for lamp emission are optionally controlled. In particular, since longer ⅓ pulse width gives a better result, it is set to, for example, 1 millisecond or more and is preferably 1.5 milliseconds or more. In addition, it is preferable that the ⅓ pulse width be optionally changed in accordance with a method for manufacturing a low-crystallization semiconductor thin-film, the thickness thereof, the irradiation area, the shape thereof, and the like.

A flash lamp source apparatus of the present invention may have at least one of the structures (1) to (4) described below.

(1) A reflecting member is provided in a housing, which contains a lamp therein, and is at the earth potential, and when necessary, minute irregularities are formed on the surface of the reflecting member mentioned above. In particular, in a metal housing which is at the earth potential and which is cooled by a circulating coolant (pure water or the like), the reflecting member (aluminum plate or the like) is provided, and minute irregularities (blast treatment, etching, or the like) may be formed on the surface of the reflecting member so as to obtain uniform illumination of reflected light by diffused reflection.

(2) A lamp and a reflecting member are provided in a housing having shading properties, and when necessary, flash emission light may be allowed to pass through a transparent member having IR-absorbing properties or IR-blocking properties. In particular, the flash lamp, the reflecting member, and the like are provided in a metal housing having the shading properties, and when necessary, the light is efficiently emitted in a predetermined direction via an IR-blocking filter or an IR-reducing filter, which blocks or reduces at least infrared rays, such as a color filter glass (IR-absorbing filter) containing an IR-absorbing material such as powdered copper, powdered iron, or phosphoric acid; a cold mirror/cold filter which is coated with an IR-reflecting film such as an ITO film; or a filter (for example, a filter formed of an IR-absorbing filter coated with an IR-reflecting film) formed of the films described above laminated to each other.

(3) A lamp and a reflecting member are provided in a housing, and flash emission light reflected and condensed and flash emission light passing in the forward direction are transmitted through a condensing lens or a light homogenizer. In particular, in the case in which irradiation is performed by flash light in a band form, a concave condensing and reflecting member, which is cooled by a circulating coolant (pure water or the like), is placed at the rear side of a plurality of flash lamps, flash emission light reflected and condensed and flash emission light passing in the forward direction are further condensed by a condensing lens located at the front side, thereby forming flash emission light in a band form having improved illumination. In addition, in the case in which the entire large area is simultaneously irradiated with flash emission light in a square form or in a rectangular form, a reflecting member, which is cooled by a circulating coolant (pure water or the like), is placed at the rear side of a plurality of flash lamps, flash emission light reflected and flash emission passing forward are processed by a light uniformer (light homogenizer or the like), thereby improving the uniformity in illumination. In the case described above, when necessary, the light may transmitted through the IR-reducing filter or the IR-blocking filter. In addition, this light uniformer (light homogenizer or the like) may be coated with an IR-reflecting film.

(4) A reflecting member and a housing are cooled by a circulating coolant such as pure water.

In addition, a trigger electrode is preferably provided on the external wall of a lamp used for flash lamp annealing (trigger method). In the case described above, it is preferable that a flash lamp be formed as a parallel plate light-emitting tube, that a pair or plural pairs of counter electrodes be disposed in this light-emitting tube, and a thin-film pattern for forming the trigger electrode or a trigger electrode assembly be formed for at least one pair of the counter electrodes on the external wall of the light-emitting bulb tube.

In addition, plural pairs of counter electrodes are provided in a straight light-emitting tube, and the trigger electrode assemblies or the thin-film patterns for forming the trigger electrodes may be provided on the external wall of this light-emitting tube between these counter electrodes.

A method for turning on a flash lamp is different from that for a general incandescent lamp, and since a gas such as xenon enclosed in the lamp is electrically insulating material, an electrical path (streamer) in which a current flows is formed beforehand on the inside wall of the lamp by breaking the insulation using a trigger voltage generated by a specific high-voltage generating circuit. Charges charged and stored beforehand in a main discharging capacitor by a DC current are discharged along this path, and hence, the lamp is turned on. There are two lamp turning-on modes, one mode is a method (simmer method) in which, when a lamp is repeatedly turned on, a small standby current is always supplied for maintaining an electrical path in order to easily perform turning-on so that main discharge can be easily performed, and the other mode is a method (trigger method) in which without using a standby current, a high voltage is applied at each turning-on operation to break the insulation of a gas enclosed so that the lamp is turned on. In each method described above, a flash discharge mechanism (a DC power supply, a capacitor for storing charges, a coil for controlling a current waveform in discharging, a flash lamp, and the like), which can flash light once or repeatedly, is provided.

Both methods may be applied to the present invention. Concerning the trigger method, in a conventional flash lamp structure, two electrodes is disposed in the vicinities of both ends of a straight light-emitting tube made of, for example, quartz glass 10 mm in diameter and 150 mm in length so as to oppose each other, and a trigger electrode assembly is provided on the external wall of the light-emitting tube; however, according to the present invention, in addition to the structure described above, the structure may also be used in which a pair or plural pairs of electrodes are provided in the vicinities of both ends of, for example, a parallel plate light-emitting tube 150 mm long, 100 mm wide, and 10 mm high so as to oppose each other and in which thin-film patterns for trigger electrodes or trigger electrode assemblies are provided on the external wall of the light-emitting tube. In the case described above, by processing (blast, etching, or the like) the wall surface (inside, outside, or both sides) of the light-emitting tube formed of quartz glass to form minute irregularities, the uniformity in illumination of the flash emission light may be improved. In addition, in the case of a parallel plate light-emitting tube, each distance between a plurality of cathodes, each distance between a plurality of the anodes, and each distance between trigger metal wires or the patterns for the trigger electrodes are preferably equivalent to each other.

In the parallel plate (rectangular parallelepiped) light-emitting tube, since the structure is formed in which a pair or plural pairs of electrodes are provided in the vicinities of both ends of, for example, a parallel plate light-emitting tube 150 mm long, 100 mm wide, and 10 mm high so as to oppose each other and in which thin-film patterns for trigger electrodes or trigger electrode assemblies are provided on the external wall of the light-emitting tube, the flash emission area can be increased, and the uniformity of illumination of the emission light can be performed. In addition, in the case in which a parallel plate light-emitting tube and a straight light-emitting tube are formed of quartz glass, by processing (blast, etching, or the like) the wall surface (inside, outside, or both sides) of the light-emitting tube to form minute irregularities thereon, the uniformity in illumination of the flash emission light may be obtained. In addition, as the lamp shape, a U shape, a spiral shape (a mosquito coil shape), a spiral and concentric shape may be used.

When minute irregularities are formed, as described above, on the external wall of a bulb or a rectangular parallelepiped of a flash lamp (see Utility Model No. 2555672) which is formed by steps of providing a transparent conductive film on the external bulb wall, providing a spiral metal wire having spring properties on the film mentioned above, one end of the metal wire being freed, and fixing the other end thereof on the film with a conductive paint, the uniformity in illumination of flash emission light and the adhesion of the transparent conductive film are improved, the adhesion of the spiral metal wire having the spring properties is also improved, and hence, stable light emission and a longer life can be achieved.

For example, although a parallel plate light-emitting tube 150 mm long, 100 mm wide, and 10 mm high has a light emission area ten times that of a straight light-emitting tube 150 mm long and 10 mm in diameter, since the flash emission can be performed at a low power consumption as a whole, the efficiency is high, the cost is low, the exchange frequency is low, and hence, cost reduction can be realized.

In the case described above, when a transparent conductive film or a metal film is patterned to form trigger electrode wires in parallel at the opposite surface side of the parallel plate light-emitting tube from the light exist side, variation in discharge among the plurality pairs of electrodes can be decreased, and as a result, stable light emission and a longer life can be achieved.

When a reflecting member which is being cooled is provided at the rear side of the light-emitting tube, the temperature does not become high during operation, functions of the reflecting member are not degraded, the lamp performance is stabilized, and the conditions inside the housing are not degraded since undesired gases are not generated, whereby stable light emission and a longer life can be achieved.

In addition, when a plurality of lamps is used for the flash lamp annealing described above and is disposed in parallel in plan view, at least two lamps are connected to each other in series and are connected to a corresponding power supply, each lamp is connected to a corresponding power supply, or all the lamps are connected in series and are connected to a common power supply, whereby the plurality of the lamps may simultaneously emit light when being synchronously triggered.

In addition, it is preferable that flash lamps be contained in a vacuum container and that a reflecting member be fixed in the vacuum container with a vibration-absorbing material provided therebetween.

In addition, after an insulating protection film, such as a silicon oxide film, a silicon nitride film, a silicon oxinitride film, a laminated film composed of silicon oxide and silicon nitride, or a laminated film composed of silicon oxide, silicon nitride, and silicon oxide, having an appropriate thickness is formed on the surface of the low-crystallization semiconductor thin-film described above, the flash lamp annealing described above is preferably performed in the state described above. For example, when the flash lamp annealing is performed by flash emission for the low-crystallization semiconductor thin-film or the low-crystallization semiconductor thin-film provided with the insulating protection film, the flash emission is preferably performed on the top surface or the bottom surface, or is simultaneously performed on the top and the bottom surfaces (however, when the irradiation is performed at the side except the top surface side, the substrate is transparent (which allows light having a wavelength of 400 nm or less to pass therethrough).

In the case described above, it is preferable that islands each having a desired area and a desired shape be formed on the low-crystallization semiconductor thin-film or the low-crystallization semiconductor thin-film covered with the protecting insulation film and that the flash emission be performed in a nitrogen at atmospheric pressure or in an air or be performed in a hydrogen or a hydrogen-containing gas atmosphere under a reduced pressure or in a vacuum (these conditions may also be used for those of other flash emission).

In order to suppress increase in substrate temperature, to decrease film stress, to prevent the occurrence of cracking in the film due to instantaneous expansion of a gas contained (hydrogen or the like) therein, and to form large grain size by slow cooling, it is more preferable that islands having a desired area and a desired-shape be formed by patterning on the low-crystallization semiconductor thin-film covered with the protecting insulation film, and that the flash lamp annealing be performed in the state described above.

In addition, the flash lamp annealing is preferably performed under the influence of a magnetic field and/or an electric field.

In flash lamp annealing, when the substrate is heated to a strain point thereof or less or is preferably heated to a temperature in the range of 300 to 500° C., dehydrogenation of the low-crystallization semiconductor thin-film in annealing, improvement in crystalline uniformity, decrease in stress of the film and the substrate, improvement in emission energy efficiency, increase in throughput, and the like can be realized. In this connection, before flash lamp annealing is performed, heat treatment (for example, at 420 to 450° C. for 30 minutes) for dehydrogenation of the low-crystallization semiconductor thin-film may be performed.

From the polycrystalline or the single crystalline semiconductor thin-film obtained by the flash lamp annealing, channel, source, and drain regions of MOSTFTs, diodes, wires, resistors, capacitors, electron-emitting elements or the like may be formed. In this case, after the formation of the channel, source, and drain regions, diodes, resistors, capacitors, wires, electron-emitting elements, and the like, when this flash lamp annealing is performed for the regions thereof, recrystallization and activation of n-type and p-type dopants in the films can be performed. In addition, when flash lamp annealing is performed after the regions described above are patterned (formation of islands) so as to have a desired area and a desired shape, substrate damage (cracking, breaking, or the like) caused by an increase in temperature can be prevented, and in addition, chipping in the film caused by a rapid increase in temperature can also be prevented.

The present invention is suitably used for forming thin-films for use in silicon semiconductor devices, silicon semiconductor integrated circuit devices, silicon-germanium semiconductor devices, silicon-germanium semiconductor integrated circuit devices, III-V and II-VI compound semiconductor devices, III-V and II-VI compound semiconductor integrated circuit devices, silicon carbide semiconductor devices, silicon carbide semiconductor integrated circuit devices, polycrystalline or single crystalline diamond semiconductor devices, polycrystalline or single crystalline diamond semiconductor integrated circuit devices, liquid crystal display devices, organic or inorganic electroluminescent (EL) devices, field emission display (FED) devices, light-emitting polymer display devices, light-emitting diode display devices, CCD area/linear sensor devices, CMOS or MOS sensor devices, solar cells, and the like.

For example, from this thin-film, a top gate type, a bottom gate type, a dual gate type, or a back gate type MOSTFT are formed, and electrooptic display devices, such as liquid crystal display devices, organic EL display devices, and FED display devices, including a peripheral driving circuit, an image signal processing circuit, a memory circuit, and the like, which are formed of the MOSTFTs described above, can be obtained.

In the case described above, when semiconductor devices, electrooptic display devices, solid-phase imaging devices, or the like having an internal circuit and a peripheral circuit are manufactured, channel, source, and drain regions of MOSTFTs forming at least one of these circuits may be formed by using the polycrystalline or single crystalline semiconductor thin-film, and the peripheral driving circuit, image signal processing circuit, memory circuit, and the like may be integrated with each other.

In addition, an EL element structure may be formed in which a cathode or an anode connected to the drain or the source of the MOSTFT is provided under each of organic or inorganic electroluminescent layers (EL layers) for individual colors.

In this case, when the cathode covers active elements such as the MOSTFT and diode, in the structure in which the anodes are provided at the upper side, in addition to increase in light emission area, the generation of leakage current caused by emission light incident on the active element can be prevented due to the shading effect of the cathode. In addition, when the cathode or the anode is provided on the entire surfaces of the individual organic or inorganic EL layers for individual colors and therebetween, since the entire surface is covered with the cathode or the anode, the degradation of the organic EL layers having inferior moisture resistance and the oxidation of the electrodes are prevented, and hence, longer life, higher quality, and higher reliability can be obtained. In addition, since heat dissipating effect is improved when the entire surface is covered with the cathode, the change in structure (fusion or recrystallization) of an organic EL thin-film caused by heat generation is decreased, longer life, higher quality, and higher reliability can be obtained. Accordingly, full color organic EL layers having high accuracy and high quality can be formed with high productivity, and hence, cost reduction can be achieved.

In addition, when a black mask layer composed of chromium, chromium dioxide, or the like is formed between the organic or inorganic EL layers for individual colors, light leakage between colors or between pixels is prevented, and the contrast can be improved.

When the present invention is applied to a field emission display (FED) device, it is preferable that the emitter (electric field emission cathode) be connected to the drain of the MOSTFT via the polycrystalline or single crystalline semiconductor thin-film and, in addition, be formed of an n-type polycrystalline semiconductor film grown on the polycrystalline or single crystalline semiconductor thin-film described above, a polycrystalline diamond film, a carbon thin-film which may or may not contain nitrogen, or a number of minute protruding structures (for example, carbon nanotube) formed on a surface of a carbon thin-film which may or may not contain nitrogen.

In this case, when a metal shielding film (when this film is formed of the same material and in the same step as those for forming a gate lead electrode of the FED, it is advantageous since the process can be simplified) at the earth potential is formed above the active elements, such as the MOSTFT or a diode, with an insulating film therebetween, the formation of undesired inversion layer in an active element located under the insulating layer, this formation being caused by positive charges, accumulated on the insulating layer, of gases in an airtight container which are positively ionized by electrons emitted from the emitter can be prevented, and abrupt increase of emitter current caused by an excess current flow via this inversion layer can also be prevented. In addition, the generation of leakage current caused by electrons and holes generated in the gate channel of the MOSTFT, the electrons and holes being generated by light emitted from a fluorescent body by collision with electrons emitted from the emitter, can also be prevented.

The present invention also provides a method for forming a semiconductor thin-film and a method for manufacturing a semiconductor device, and the method mentioned above comprises a first step of forming a low-crystallization semiconductor thin-film, which may or may not contain at least one Group IV element such as tin, on a substrate; a second step of performing pre-baking in which the substrate is heated to a strain point thereof or less; a third step of heating and cooling the low-crystallization semiconductor thin-film to a fusion, a semi-fusion, or a non-fusion state to facilitate the crystallization thereof by flash lamp annealing in assist-baking in which the substrate is heated to the strain point thereof or less; and a fourth step of performing post-baking in which the crystallized semiconductor thin-film is heated until the temperature thereof is decreased at least to the stain point of the substrate or less.

In the method described above, the low-crystallization semiconductor thin-film and the flash lamp annealing described above are as defined previously, and the individual heat treatment described above are important by the following reasons (these definition and the importance are also applied to those in the methods described below).

<Pre-Baking>

When flash lamp annealing is performed while gases (oxygen, nitrogen, carbon dioxide gas, and the like) or moisture adhere to the low-crystallization semiconductor thin-film, and gases (hydrogen gas or the like generated in film formation by plasma CVD) formed in film formation are contained therein, stress defects caused by abrupt increase in film and substrate temperature, such as film peeling and film cracking by expansion and explosion of hydrogen gas, and substrate damage (glass crystallization and the like) occur. In order to prevent the defects described above, the factors causing the defects are removed by pre-baking.

The pre-baking is performed at a temperature in the range of from room temperature to the strain point of the substrate, for example, 300 to 500° C., by heating means such as resistor heater, halogen lamp, or the like. A baking time is preferably optimized in consideration of a film thickness and film quality of the low-crystallization semiconductor thin-film determined by film-forming conditions (vapor-phase growth, sputtering, deposition, or the like); a material and size of the substrate; and the like, and the baking time is preferably set to, for example, 5 to 20 minutes.

In addition, heat treatment may be performed beforehand in a different heating apparatus at a dehydrogenation temperature (approximately 420° C.) for amorphous silicon thin-films formed by plasma CVD; however, by the reason described above, it is naturally understood that the pre-baking in the flash lamp annealing apparatus must be performed.

<Assist-Baking>

When the low-crystallization semiconductor thin-film is fused by an abrupt increase in film temperature by flash emission for an ultra short time, such as 1.5 milliseconds, stress damages, such as film peeling, film cracking, substrate cracking, or substrate chipping, are likely to occur due to temperature difference between the substrate and the fused silicon. Accordingly, in order to decrease the stress damage by decreasing the temperature difference, the substrate is preferably maintained at a predetermined temperature during flash emission.

In the assist-baking, the temperature is maintained in the range of from room temperature to the strain temperature of the substrate, for example, 300 to 500° C., and the flash lamp annealing conditions are optimized in consideration of a film thickness and film quality of the low-crystallization semiconductor thin-film determined by film-forming conditions (vapor-phase growth, sputtering, deposition, or the like); a material and size of the substrate; and the like.

<Post-Baking>

Flash lamp annealing for an ultra short time such as 1.5 milliseconds in assist-baking, which heats and cools the low-crystallization semiconductor thin-film to a fusion, a semi-fusion, or a non-fusion state, facilitates the crystallization thereof, and in addition, when slow cooling is performed, improvement in crystallinity and TFT properties can be expected by formation of a larger crystal grain size, decrease in film stress, and the like.

In contrast, when quenching is performed, stress damages, such as film peeling, film cracking, substrate cracking, or substrate chipping, are likely to occur due to temperature difference between the substrate and the fused silicon. Accordingly, in order to decrease the thermal stress by decreasing this large temperature difference, after flash lamp annealing, the substrate and the crystallized semiconductor thin-film are preferably maintained at least for a certain period of time, such as 1 to 10 minutes, until the temperature thereof is decreased to the pre-baking or assist-baking temperature.

Accordingly, sequential operation may be performed, that is, one heating apparatus capable of performing various baking purposes is prepared; the pre-baking temperature, the assist-baking temperature, and post-baking temperature are set to the same temperature as the dehydrogenating temperature (approximately 420° C.) of amorphous silicon thin-film formed by plasma CVD; flash lamp annealing is performed after pre-baking is performed for the predetermined time; and the substrate is taken out after being maintained for a predetermined time, such as 1 to 10 minutes.

As the substrate, there may be mentioned low strain point glass substrates (borosilicate glass, aluminosilicate glass, reinforced glass, or the like), high strain point glass substrates (synthetic quartz glass, fused quartz glass, crystallized glass, or the like), heat resistant resin substrates (polyimide or the like), ceramic substrates, metal or ceramic substrates coated with an insulating film, silicon or compound semiconductor substrates coated with an insulating film, and the like. These mentioned above may be selectively used, as required.

In the method described above, it is preferable that the first step, the second step, the third step, and the fourth step be repeatedly performed.

In addition, the emission time (⅓ pulse width) of flash lamp annealing suitably for the pre-baking, assist-baking, and post-baking of the substrate is 0.1 microseconds or more and is preferably 0.5 to 3 milliseconds.

That is, in flash lamp annealing for crystallization, flash emission conditions are preferably determined in consideration of heat resistance of the substrate, desired electron/hole mobility (including crystal grain size), and the like. In the case of heat resistant glass, such as quartz glass or crystallized glass, when the emission time is set as long as possible, for example 1.5 to 3 milliseconds, the crystal grains become larger since fused silicon is slowly cooled, and for example, crystallized silicon thin-film having high electron/hole mobility can be obtained.

In contrast, in the case of low strain point glass, such as borosilicate glass, aluminosilicate glass, or reinforced glass, or a heat resistant resin such as polyimide, the emission time must be set, for example 0.5 to 1.5 milliseconds, in consideration of a balance between prevention of substrate damage and desired electron/hole mobility (including crystal grain size). In addition, in flash lamp annealing for ion activation, since heating time for silicon in non-fusion state (for example, at 700 to 1,000° C.) is preferable, the emission time (for example, 3 milliseconds or more) is preferably set as long as possible.

Furthermore, the present invention provides methods (a) to (r) or devices described below.

(a) A method for manufacturing an electrooptic device, which comprises a step of patterning a low-crystallization semiconductor thin-film which may or may not contain at least one Group IV element such as tin so that irradiation areas and shapes thereof in active and passive element regions in a pixel display portion and in active and passive element regions in a peripheral circuit portion are equivalent to each other; a step of subsequently performing appropriate flash lamp annealing of the substrate in pre-baking, assist-baking, and post-baking; and a step of, when necessary, patterning each crystallized region to have a predetermined area and predetermined dimensions.

In the method described above, the crystallization level of the low-crystallization semiconductor thin-film by flash lamp annealing is proportional to the thickness and the irradiation area thereof. That is, since the absorption of flash emission light energy is increased with increasing thickness and irradiation area, crystallization is facilitated.

Accordingly, in order to uniform the crystallization level in display devices such as an LCD, an organic El (electroluminescence), or the like, it is necessary that, in addition to the thicknesses, the irradiation areas and the sizes of the low-crystallization-semiconductor thin-films, which correspond to the pixel display portion and peripheral circuit portion, be equivalent to each other by common lithographic and etching techniques. For example, TFT regions in the pixel display portion and the peripheral circuit portion are formed to be equivalent to each other, and in addition, areas of diodes, resistors, and the like in the peripheral circuit are formed to be equivalent to each other. In addition, after this flash lamp annealing, each crystallized region is preferably patterned so as to ensure areas and shapes on which optional TFTs, diodes and resistors are formed.

(b) A method for manufacturing an electrooptic devices, which comprises a step of patterning a low-crystallization semiconductor thin-film, which may or may not contain at least one Group IV element such as tin, so that irradiation areas and shapes thereof in active and passive element regions in a peripheral circuit portion is larger than those in active and passive element regions in a pixel display portion; a step of subsequently performing appropriate flash lamp annealing of the substrate in pre-baking, assist-baking, and post-baking; and a step of, when necessary, patterning each crystallized region to have a predetermined area and predetermined dimensions.

In the case of LCD panels of projectors, as the measure against leakage current of a pixel display TFT caused by light leakage of intensive incident light, it may be preferable in some cases when a voltage driving TFT in the pixel display portion is formed of an amorphous or a microcrystalline silicon film having low mobility and when a current driving TFT in the peripheral circuit portion is formed of a polycrystalline or a single crystalline silicon film having high mobility.

Accordingly, by performing flash lamp annealing after the irradiation areas and the sizes of the individual TFT, diode, and resistor regions in the peripheral circuit portion are patterned larger than that of the TFT regions in the pixel display region by common lithographic and etching techniques, the low-crystallization semiconductor thin-films in the individual TFT, diode, and resistor regions in the peripheral circuit portion are preferably converted into the polycrystalline or the single crystalline silicon films having high mobility, and the low-crystallization semiconductor thin-film in the pixel display region is preferably converted into an amorphous or a microcrystalline silicon film having low mobility. In addition, after this flash lamp annealing, the individual regions thus crystallized are preferably patterned so as to have areas and shapes of predetermined TFTs, diodes, and resistors.

(c) A method for manufacturing a semiconductor substrate or a semiconductor device, which comprises a step of forming a recess portion in a predetermined element-forming region of a substrate, the recess portion being provided with a step having a predetermined shape and predetermined dimensions, or after a laminate of an oxide-based insulating film-1, a nitride-based insulating film-1, and an oxide-based insulating film-2 or a laminate (for example, $SiO_2$-1/SiN-1/$SiO_2$-2) of the oxide-based insulating film-1, the nitride-based insulating film-1, the oxide-based insulating film-2, and a nitride-based insulating film-2 is formed on the substrate, a step of forming a recess portion in a predetermined element-forming region of the former oxide-based insulating film-2 or the latter nitride-based insulating film-2, the recess portion being provided with a step having a predetermined shape and predetermined dimensions; a step of forming a low-crystallization semiconductor thin-film which may or may not contain at least one Group IV element such as tin and, when necessary, a reflection-reducing, protective, insulating film on the substrate including the recess portion; a step of forming a single crystalline semiconductor thin-film at least in the recess portion in accordance with graphoepitaxial growth using a bottom corner of the step as a seed by appropriate flash lamp annealing of the substrate in pre-baking, assist-baking, and post-baking; a step of processing the surface of this single crystalline semiconductor thin-film by CMP (Chemical Mechanical Polishing) or by selective etching so as to form a single crystalline semiconductor thin-film having a predetermined thickness and area, the single crystalline semiconductor thin-film having islands formed thereon; and a step of, when necessary, forming an SCSOS (Single Crystal Semiconductor (Silicon) On Substrate, for example, SCSOG (Single Crystal Semiconductor (Silicon) On Glass)) substrate provided with a gate insulating film or an insulating protection film by high temperature thermal oxidation, low temperature and high pressure annealing (including subcritical water reaction or supercritical water reaction described later: hereafter, the same as above), CVD, or the like.

(d) A method for manufacturing a semiconductor substrate or a semiconductor device, which comprises a step of forming, when necessary, a laminate (for example, $SiO_2$-1/ $SiN$-2/$SiO_2$-2) of the oxide-based insulating film-1, the nitride-based insulating film-1, and the oxide-based insulating film-2 on a substrate; a step of forming a material layer (for example, a crystalline sapphire thin-film) having good lattice matching properties with a single crystalline semiconductor on the laminate; a step of forming a low-crystallization semiconductor thin-film which may or may not contain at least one Group IV element such as tin and, when necessary, a reflection-reducing, protective, insulating film on this material layer; a step of forming a single crystalline semiconductor thin-film in accordance with heteroepitaxial growth using this material layer as a seed by appropriate flash lamp annealing of the substrate in pre-baking, assist-baking, and post-baking; a step of processing the surface of this single crystalline semiconductor thin-film by CMP or by selective etching so as to form a single crystalline semiconductor thin-film having a predetermined thickness; and a step of, when necessary, forming an SCSOS substrate, such as an SCSOG substrate, provided with a gate insulating film or an insulating protection film formed by high temperature thermal oxidation, low temperature and high pressure annealing, CVD, or the like.

In these (c) and (d) methods, by performing CMP or selective etching of the reflection reducing, protective insulating film and the surface of the single crystalline semiconductor thin-film thus formed, an SCSOS such as an SCSOG substrate provided with a single crystalline silicon film having a desired thickness and area. In addition, in both methods (c) and (d), after this CMP or selective etching, when a gate insulating film or a protection film is formed by high temperature oxidation, low temperature and high pressure annealing, CVD, or the like, MOSLSIs (Large Scale Integration), BiCMOS LSIs, Bipolar LSIs, and the like can be manufactured.

In the step described above, in order to prevent contamination by impurities from the substrate, a nitride-based insulating film (silicon nitride film, silicon oxinitride film, or the like) having an appropriate thickness must be formed over the entire surface of the substrate in some cases; however, in this case, in order to improve the adhesion between the substrate and the nitride-based insulating film, an oxide-based insulating film (silicon oxide film or the like) having an appropriate thickness must be provided between the substrate and the nitride-based insulating film.

Furthermore, as the substrate, there may be mentioned low strain point glass substrates (borosilicate glass, aluminosilicate glass, reinforced glass, or the like); high strain point glass substrates (synthetic quartz glass, fused quartz glass, crystallized glass, or the like); heat resistant resin substrates (polyimide or the like); metal substrates (iron, copper, aluminum, alloys such as stainless steel, or the like); ceramic substrates; metal substrates, low strain point glass substrates, heat resistant resin substrates, or ceramic substrates coated with a high melting point metal (titanium, tantalum, molybdenum, tungsten, alloys thereof, such as a molybdenum-tantalum alloy, or the like) or/and a metal silicide ($WSi_2$, $MoSi_2$, $TiSi_2$, $TaSi_2$, $CoSi$, $Pd_2Si$, $Pt_2Si$, $CrSi_2$, $NiSi$, $RhSi$ or the like); silicon substrates; compound semiconductor substrates; or the like.

(e) A method for manufacturing a single crystalline semiconductor thin-film or a single crystalline semiconductor device, which comprises a step of forming an n-type or/and a p-type doped region (such as source/drain or source/gate channel/drain) in the single crystalline semiconductor thin-film of the SCSOS substrate, such as an SCSOG substrate, formed according to the above (c) or (d) by ion implantation or ion doping; and a step of activating doped ions by appropriate flash lamp annealing of the substrate in pre-baking, assist-baking, and post-baking by using at least an IR-reducing or an IR-blocking film.

(f) A method for manufacturing a single crystalline semiconductor thin-film or a single crystalline semiconductor device, which comprises a step of forming an n-type or/and p-type doped regions (such as source/drain or source/gate channel/drain) in a single crystalline semiconductor thin-film of a crystalline semiconductor (Si, SiGe, SiC, GaAs, or the like) substrate, such as an SOI (Silicon on Insulator) substrate by ion implantation or ion doping; and a step of activating dopant ions by appropriate flash lamp annealing of the substrate in pre-baking, assist-baking, and post-baking by using at least an IR-reducing or an IR-blocking filter.

In the near future, in a silicon MOSLSI having a 0.07-μm node, the junction depth at the source and the drain will be decreased to 10 to 15 nm. However, according to a current annealing (RTA: Rapid Thermal Anneal) technique using a tungsten-halogen lamp, since the emission time is long such as in the order of several seconds, n-type or/and p-type dopants are thermally diffused, and it has been difficult to form a shallow junction. Hence, it has been believed that a junction depth of up to 20 nm is a technical limitation.

However, in flash lamp annealing of the present invention, since ion activation can be performed by heating in a non-fusion state using an xenon lamp for an emission time in the order of several milliseconds, such as 1 to 5 milliseconds, the technical limitation can be overcome, and hence, an ultra-shallow junction depth of 20 nm or less can be realized.

However, since flash emission light of this xenon lamp has an emission spectrum having an intensive peak at a wavelength of 800 to 1,000 nm in the infrared region, a heating temperature of a silicon layer varies due to a large variation in intensive light absorption in this region, the degree of ion activation of implanted n-type or/and p-type dopants and the thermal diffusion level thereof are likely to vary, and hence, it has been relatively difficult to form a shallower junction depth with good repeatability. Accordingly, as described above, during appropriate flash lamp annealing of the substrate in a non-fusion state in pre-baking, assist-baking, and post-baking, an intensive emission peak in a region having a wavelength of 800 to 1,000 nm is reduced or cut by using at least an IR-reducing or an IR-blocking filter so as to perform controlled heating of a silicon layer by irradiation with ultraviolet rays with or without visible rays, which are in a stable flash emission region, ion activation can be performed while thermal diffusion level of implanted n-type or/and p-type dopants is controlled, and hence, a ultra-shallow junction depth can be formed. In the steps described above, the conditions of the pre-baking, assist-baking, and post-baking can be optionally determined in consideration of a substrate material or the like; however, a temperature of 300 to 500° C. is preferable.

As the method for forming SOI substrates, for example, there may be mentioned a SIMOX method (a method for forming an SOI substrate by performing ion implantation of oxygen ions into a single crystalline silicon substrate followed by annealing at a temperature of 1,300 to 1,400° C., which is very close to the melting point), a wafer bonding method (a method for forming an SOI substrate by polishing one surface of bonded and thermally oxidized-single crystalline silicon substrates), a SMART CUT method (a method for forming an SOI substrate by a step of performing ion implantation of hydrogen ions into one thermally oxidized single crystalline silicon substrate followed by bonding with another substrate and thermal oxidation, and a step of removing said another substrate so as to obtain the hydrogen ion implanted single crystalline silicon layer), or an ELT-RAN method (a method for forming an SOI substrate by performing epitaxial silicon growth on a porous silicon substrate followed by thermal oxidation, a step of bonding the epitaxial silicon to a supporting substrate followed by thermal oxidation, a step of separating the epitaxial silicon using a water jet method, and a step of performing selective etching, annealing in a hydrogen atmosphere, and the like. It is naturally understood that all the methods described above may be used for the present invention.

(g) A method for manufacturing a polycrystalline or a single crystalline semiconductor thin-film, or a polycrystalline or a single crystalline semiconductor device, which comprises a step of forming an n-type or/and a p-type doped region (such as source/drain or source/gate channel/drain) in a polycrystalline or single crystalline semiconductor thin-film on a substrate, which is crystallized by laser {near-ultraviolet (UV) and/or far-ultraviolet (DUV) laser (such as, excimer laser, higher harmonic light wave modulated near-ultraviolet (UV) and/or far-ultraviolet (DUV) laser by non-linear optical effect), visible ray laser, near-infrared and/or far-infrared laser, or the like} annealing, by ion implantation or ion doping; and a step of activating dopant ions by appropriate flash lamp annealing of the substrate in pre-baking, assist-baking, and post-baking by using at least an IR-reducing or an IR-blocking filter.

(h) A method for manufacturing a polycrystalline semiconductor thin-film, or a polycrystalline semiconductor device, which comprises a step of forming an n-type or/and a p-type doped region (such as source/drain or source/gate channel/drain) in a polycrystalline semiconductor thin-film on a substrate by ion implantation or ion doping, the semiconductor thin-film being crystallized by solid-phase growth; and a step of activating doped ions by appropriate flash lamp annealing of the substrate in pre-baking, assist-baking, and post-baking by using at least an infrared-reducing or an infrared-blocking filter.

(i) A method for manufacturing a polycrystalline or a single crystalline semiconductor thin-film, or a polycrystalline or a single crystalline semiconductor device, which comprises a step of forming an n-type or/and a p-type doped region (such as source/drain or source/gate channel/drain) in a polycrystalline or a single crystalline semiconductor thin-film on a substrate by ion implantation or ion doping, the crystalline semiconductor thin-film being crystallized by a condensing lamp annealing; and a step of activating doped ions by appropriate flash lamp annealing of the substrate in pre-baking, assist-baking, and post-baking by using at least an infrared-reducing or an infrared-blocking filter.

(j) A method for manufacturing a semiconductor thin-film or a semiconductor device, which comprises a first step of forming a low-crystallization semiconductor thin-film, which may or may not contain at least one Group IV element such as tin, on a substrate; a second step of forming an n-type or/and a p-type doped region (such as source/drain or source/gate channel/drain) in the low-crystallization semiconductor thin-film by ion implantation or ion doping; a third step of performing pre-baking in which the substrate is heated to a strain point thereof or less; a fourth step of heating and cooling the low-crystallization semiconductor thin-film to a fusion, a semi-fusion, and a non-fusion state by flash lamp annealing in assist-baking, in which the substrate is heated to the strain point thereof or less, to facilitate the crystallization and to active the dopant at the same time; and a fifth step of performing post-baking in which the substrate is heated until the temperature thereof is decreased to the strain point thereof or less.

(k) A method for manufacturing a semiconductor thin-film or a semiconductor device, which comprises a first step of forming a low-crystallization semiconductor thin-film, which may or may not contain at least one Group IV element such as tin, on a substrate; a second step of performing pre-baking in which the substrate is heated to a strain point thereof or less; a third step of heating and cooling the low-crystallization semiconductor thin-film to a fusion, a semi-fusion, and a non-fusion state by flash lamp annealing in assist-baking, in which the substrate is heated to the strain point thereof or less, to crystallize the low-crystallization semiconductor thin-film; a fourth step of performing post-baking in which the substrate is heated until the temperature thereof is decreased to the strain point thereof or less; a fifth step of forming an n-type or/and a p-type doped region (such as source/drain or source/gate channel/drain) in the formed polycrystalline or single crystalline semiconductor thin-film by ion implantation or ion doping; and a sixth step of heating the substrate in a non-fusion state by appropriate flash lamp annealing in pre-baking, assist-baking, and post-baking to activate the doped ions by using at least an infrared-reducing or an infrared-blocking filter.

(l) A method for manufacturing a semiconductor thin-film or a semiconductor device, which comprises a step of forming a shading underlying film having highly absorptive properties or highly reflective properties with respect to flash emission light passing through a reflection-reducing, protective, insulating film and a low-crystallization semiconductor thin-film, the underlying film having thermal and electrical conductivities higher than those of the substrate; a step of forming, when necessary, an electrical insulating buffer film having transmission or shading properties on the underlying film; a step of forming a low-crystallization semiconductor thin-film which may or may not contain at least one Group IV element such as tin on the buffer layer at least in the underlying film region; a step of forming, when necessary, a reflection-reducing, protective, insulating film on the semiconductor thin-film; and a step of heating and cooling the low-crystallization semiconductor thin-film to a fusion, a semi-fusion, or a non-fusion state by appropriate flash lamp annealing of the substrate in pre-baking, assist-baking, and post-baking to facilitate the crystallization.

In the case of a bottom gate TFT, a back gate TFT, a dual gate TFT, or the like, a high thermal conductive and electrical conductive material, which is heated by absorbing flash emission light passing through the reflection reducing, protective, insulating film and the low-crystallization semiconductor thin-film, may be used as the underlying film, and for example, there may be mentioned a coloring metal (chromium, copper, or the like), a high melting point metal (titanium, tantalum, molybdenum, tungsten, an alloy thereof, such as a molybdenum-tantalum alloy, or the like), or a metal silicide ($WSi_2$, $MoSi_2$, $TiSi_2$, $TaSi_2$l CoSi, $Pd_2Si$, $Pt_2Si$, $CrSi_2$, NiSi, or RhSi). In this case, since the substrate temperature is increased to a relatively high level, a high strain point (heat resistant) glass such as quartz glass or crystallized glass, or a ceramic may be suitably used as the substrate material.

In addition, a high thermal conductive and electrical conductive material, such as a white color metal {aluminum, an aluminum alloy (1%-silicon-containing aluminum), silver, nickel, platinum, or the like}, a laminated film of white color metal/a high melting point metal (aluminum/molybdenum or the like), which reflects flash emission light passing through the reflection-reducing, protective, insulating film and the low-crystallization semiconductor thin-film, may be used as the underlying film. In this case, since the substrate temperature is increased to a relatively low level, a low strain point glass, such as borosilicate glass, aluminosilicate glass, or reinforced glass, or a heat resistant resin such as polyimide may be suitably used as a material for the substrate; however, a high strain point (heat resistant) glass, such as quartz glass or crystallized glass, a ceramic, or the like may also be used.

In addition, in order to prevent reaction between the underlying film and the low-crystallization semiconductor thin-film caused by flash lamp annealing, the buffer film is formed; however, when the underlying film is formed of a material which does not react with fused low-crystallization semiconductor thin-film, the buffer film may be omitted. For example, when the underlying film is formed of aluminum coated with an insulating film formed by anodizing, a high melting point metal (a Mo—Ta alloy or the like), or the like, it is not necessary to form the buffer film.

As the buffer film, an electrical insulating silicon oxide film, silicon oxinitride film, silicon nitride film, laminated film of silicon oxide and silicon nitride, laminated film of silicon nitride and silicon oxide, laminated film of silicon oxide, silicon nitride, and silicon oxide, or the like may be used.

When a low strain point glass, such as borosilicate glass or aluminosilicate glass, fused quartz glass, crystallized glass, or a heat resistant resin is used for the substrate, in order to prevent the diffusion of impurities (Na ions or the like) from the substrate, a silicon nitride-based film, such as a silicon oxinitride film, a silicon nitride film, a laminated film of silicon oxide and silicon nitride, a laminated film of silicon nitride and silicon oxide, or a laminated film of silicon oxide, silicon nitride, and silicon oxide, is preferably used.

When being processed by flash emission, since the low-crystallization semiconductor thin-film on the underlying film is heated by its own properties of absorbing emission light and by the heating and heat-storing effect of the underlying film, fusion of the thin-film is facilitated, and the fused silicon flows out, so that it is difficult to form a polycrystalline or a single crystalline silicon thin-film on the underlying film. Accordingly, by forming the low-crystallization semiconductor thin-film only in the underlying film region, the fused silicon is prevented from flowing out, and the polycrystalline or the single crystalline silicon thin-film is preferably formed only on the underlying film region.

In addition, when the underlying film is patterned into the shape having an area equivalent to or larger than that of the low-crystallization semiconductor thin-film, which may or may not contain at least one Group IV element such as tin, and having protruding portions which protrude linearly, thermal dissipation of the low-crystallization semiconductor thin-film in a fusion, a semi-fusion, or a non-fusion state by flash lamp annealing preferably occurs using the protruding portions of the underlying film so as to form nuclei for crystal growth, and hence, the entire semiconductor thin-film may be crystallized in an optional crystal-orientation.

In the case described above, since the thermal dissipation is more effectively performed at the linearly projecting portions than the other parts, and conditions (formation of species or nuclei), which may start recrystallization, are prepared thereby, the entire low-crystallization semiconductor thin-film may be converted into a polycrystalline semiconductor thin-film having a large grain size or a single crystalline semiconductor thin-film, each having an optional crystal orientation.

In addition, after the low-crystallization semiconductor thin-film which may or may not contain at least one Group IV element such as tin is patterned into the shape having an area equivalent to or smaller than that of the underlying film and having minute projecting portions in the protruding portions of the underlying film, the entire low-crystallization semiconductor thin-film in a fusion, a semi-fusion, or a non-fusion state by the flash lamp annealing may be crystallized in an optional orientation by using the minute projecting portions as nuclei for crystal growth.

In this case, as in the case described above, since thermal dissipation is more effectively performed at the minute protruding portions than the other parts, and conditions (formation of species or nuclei), which may start recrystallization, are prepared thereby, the entire low-crystallization semiconductor thin-film may be converted into a polycrystalline semiconductor thin-film having a large grain size or a single crystalline semiconductor thin-film, each having an optional crystal orientation.

In addition, the underlying film is preferably used at an optional potential (no potential, earth potential, gate potential of TFT, or the like) via the linear protruding portions.

In addition, the reflection-reducing, protective, insulating film is an electrical insulating film that at least allows ultraviolet rays to pass therethrough and may also be used as a gate insulating film.

As the electrical insulating film which at least allows ultraviolet rays to pass therethrough, for example, there may be mentioned silicon oxide film, a silicon nitride film, a silicon oxinitride film, a laminated film of silicon oxide and silicon nitride, a laminated film of silicon nitride and silicon oxide, or a laminated film of silicon oxide, silicon nitride, and silicon oxide, and as the gate insulating film, for example, there may be mentioned silicon oxide film, a silicon nitride film, a silicon oxinitride film, a laminated film of silicon oxide and silicon nitride, a laminated film of silicon nitride and silicon oxide, or a laminated film of silicon oxide, silicon nitride, and silicon oxide.

(m) A method for manufacturing a semiconductor thin-film or a semiconductor device, which comprises a step of, when a low-crystallization semiconductor thin-film, which may or may not contain at least one Group IV element such as tin, is crystallized by heating to a fusion or a semi-fusion state and cooling by flash lamp annealing performed in an oxidizing atmosphere, simultaneously forming an oxide-based insulating film (silicon oxide, silicon oxinitride, or the like) on a surface of this polycrystalline or single crystalline semiconductor thin-film, wherein this oxide-based film is used as a gate insulating film or a protection film.

(o) A method for manufacturing a semiconductor thin-film or a semiconductor device, which comprises a step of forming an oxide-based insulating film (silicon oxide film, silicon oxinitride film, or the like) in a high pressure and low temperature oxidizing atmosphere (air, oxygen, ozone, steam, NO, $N_2O$, or the like) at a pressure in the range of 0.1 to 30 MPa and at a temperature in the range of room temperature to a strain point of a substrate on a polycrystalline or single crystalline semiconductor thin-film, which may or may not contain at least one Group IV element such as tin, formed on a low strain point glass, a high strain point glass, or a heat resistant resin substrate by flash lamp annealing, wherein this oxide-based film is used as a gate insulating film or a protection film.

In the above method (o), by the reasons (1) to (2) described below, it is preferable that, on the polycrystalline or the single crystalline semiconductor thin-film, which may or may not contain at least one Group IV element such as tin, formed on the low strain point glass, the high strain point glass, or the heat resistant resin substrate by flash lamp annealing, an oxide-based insulating film be formed by a subcritical water reaction or a supercritical water reaction, which is one type of high pressure and low temperature annealing, and be used as a gate insulating film or a protection film.

Subcritical water reaction: reaction with hot water (subcritical water) at a temperature and a pressure lower than the critical point (374° C. and 22 MPa) of water Supercritical water reaction: reaction with supercritical water in a state over the critical point (374° C. and 22 MPa) of water (1) According to these reactions, a superior gate insulating film and interface can be formed, crystal defects of the polycrystalline or the single crystalline thin-film are decreased, the $V_{th}$ and S value of a TFT are improved, and in addition, yield and reliability of the TFT is improved.

(2) When a gate insulating film (such as a $SiO_2$ film) is formed by high temperature oxidation (for example, at 1,050° C. for 60 minutes), a warpage of 100 to 150 μm is generated in a quartz wafer 8" in diameter and approximately 800 μm thick for TFT, and this warpage of the wafer causes the defects (i) to (v) described below.

(i) Troubles such as unstable vacuum chucking are likely to occur in photolithographic or etching operation.

(ii) Variation in focus at the central and peripheral portion causes variation in accuracy, and problems of decreases in yield and quality may arise frequently.

(iii) Gap between a TFT substrate and a counter substrate, in which liquid crystal is enclosed, is difficult to control when the two substrate are bonded with each other, variation in gap of a liquid crystal layer occurs frequently, and problems of decreases in yield and quality caused by decrease in light transmittance and contrast may arise.

(iv) Since flaws are frequently formed on the back surface of a liquid crystal driving (TFT) substrate, optical polishing of the back surface must be performed, resulting in an increase in cost.

(v) When the quartz glass size is increased, for example, from 8 to 12 inch in diameter, the warpage is further increased, the problems described above become more serious, and as a result, the yield, quality, and productivity may be easily decreased.

In contrast, in the above method (o), since the gate insulating film (such as $SiO_2$ film) is formed by a high pressure and low temperature subcritical water reaction or supercritical water reaction, the wafer does not warp and the problems described above are solved, and hence, significant cost reduction can be achieved by improvement in yield, quality, and productivity.

(p) A method for manufacturing a semiconductor thin-film or a semiconductor device, which comprises a step of forming an oxide-based insulating film (silicon oxide film, silicon oxinitride film, or the like) by performing high temperature thermal oxidation in an oxidizing atmosphere (air, oxygen, ozone, steam, NO, $N_2O$, or the like) of a polycrystalline or a single crystalline semiconductor thin-film, which may or may not contain at least one Group IV element such as tin, formed on a high strain point glass by flash lamp annealing, wherein this oxide-based insulating film is used as a gate insulating film or a protection film.

(q) A method for manufacturing a semiconductor thin-film or a semiconductor device, which comprises a step of forming an oxide-based insulating film (silicon oxide film, silicon oxinitride film, or the like) by performing high temperature thermal oxidation in an oxidizing atmosphere (air, oxygen, ozone, steam, NO, $N_2O$, or the like) of a polycrystalline or a single crystalline semiconductor thin-film, which may or may not contain at least one Group IV element such as tin, which is formed on a high strain point glass by flash lamp annealing, and which is provided with a reflection-reducing, protective, insulating film, wherein this oxide-based insulating film is used as a gate insulating film or a protection film.

(r) A method for manufacturing a semiconductor thin-film or a semiconductor device, which comprises a step of modifying at least one of an insulating film and a polycrystalline or a single crystalline semiconductor thin-film, which may or may not contain at least one Group IV element such as tin, formed by flash lamp annealing by heat treatment (steam annealing) at a temperature in the range of room temperature to a strain point of a substrate in an atmosphere containing water vapor at a partial pressure of 13.33 Pa to a saturated vapor pressure.

In this method, in order to modify the insulating film by neutralizing positive charges caused by defects or impurities in the insulating film thus formed so as to make a flat band voltage at the negative side to be closer to 0 V side, heat treatment (steam annealing) is performed at a temperature in the range of room temperature to the strain point of the substrate in an atmosphere containing water vapor at a partial pressure of 13.33 Pa to a saturated vapor pressure. In this method, in consideration of a material and size of the substrate, and film thicknesses, film qualities, and the like of the insulating film and the polycrystalline or the single crystalline semiconductor thin-film, a heating time in the range of, for example, 10 to 60 minutes, is determined.

Next, preferred embodiments of the present invention will be described in more detail.

First Embodiment

Referring to FIGS. 1 to 33, a first embodiment of the present invention will be described.

In this embodiment, the present invention is applied to a top gate type polycrystalline silicon CMOS (Complementary MOS) TFT.

<Catalytic CVD Method and Apparatus therefor>

A catalytic CVD method used for this embodiment will first be described. In the catalytic CVD method, reacting gases composed of a hydrogen-based carrier gas and a source gas such as a silane gas are brought into contact with a heated catalyst such as tungsten so as to impart high energy to radicals depositing species, precursors thereof, hydrogen-based active species such as activated hydrogen ions, and subsequently, a low-crystallization semiconductor thin-film such as microcrystalline silicon containing amorphous silicon is deposited on a substrate by vapor-phase growth.

Figure 6:
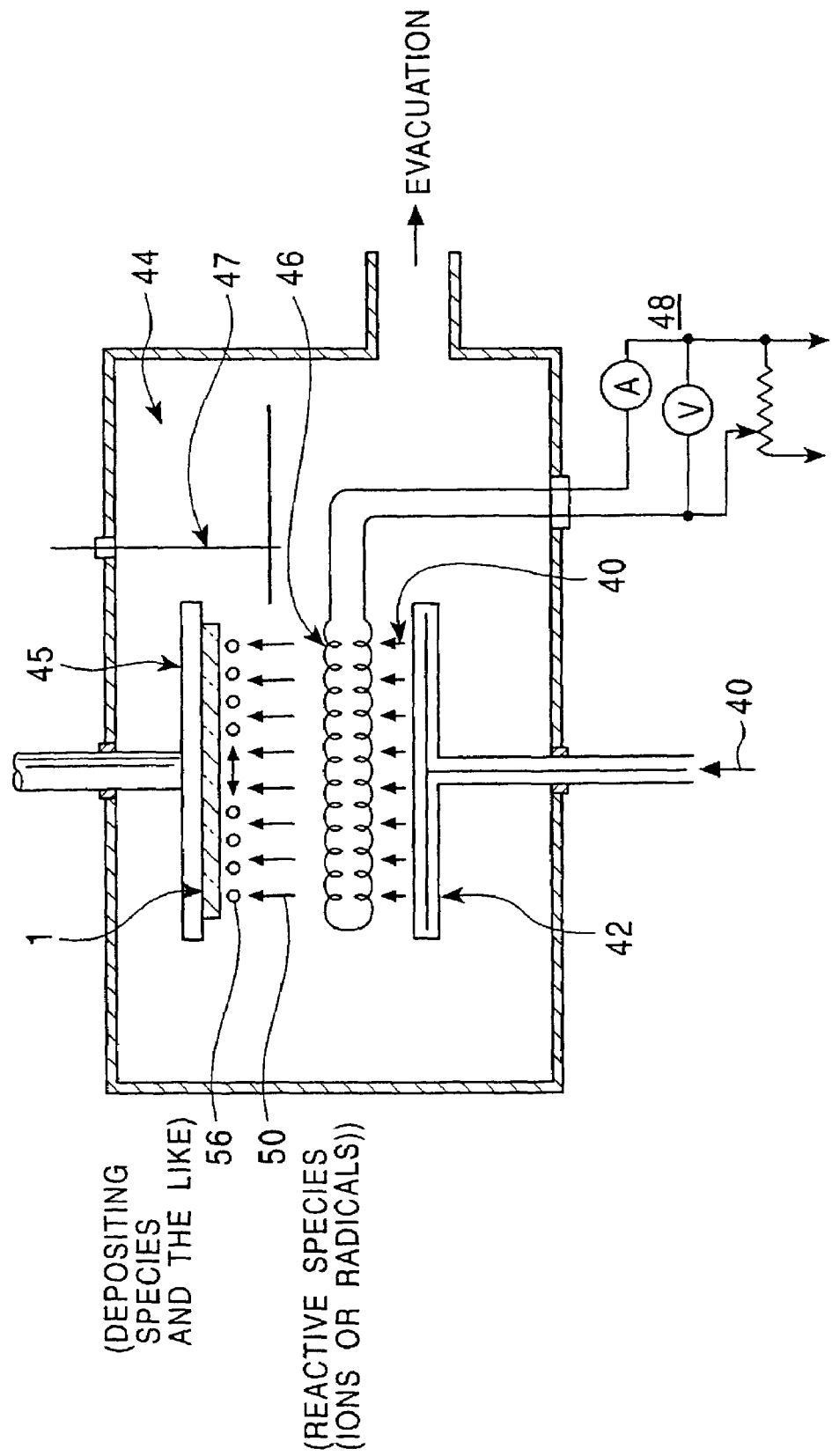
FIG. 6 is a schematic cross-sectional view of the apparatus, which is placed in another state, according to the first embodiment.

This catalytic CVD may be performed by using an apparatus as shown in FIGS. 5 and 6.

According to this apparatus, a gas composed of a hydrogen-based carrier gas and a source gas 40 (in addition, when necessary, a doping gas such as $B_2H_6$, $PH_3$, or $SnH_4$ are contained) such as hydrogenated silicon (such as, monosilane) is supplied to a film-forming chamber 44 from a supplying pipe 41 via an inlet (not shown) of a shower head 42. Inside the film-forming chamber 44, there are provided a susceptor 45 for holding a substrate 1 such as glass, the shower head 42 having superior heat resistance (material desirably having a melting point equivalent to or higher than that of a catalyst 46), the catalyst 46 such as tungsten in the form of, for example, spiral, and a shutter 47 capable of opening and closing. In addition, although not shown in the figure, magnetic shielding is provided between the susceptor 45 and film-forming chamber 44, and the film-forming chamber 44 is provided at the back of a front chamber in which pre-process is performed and is evacuated by turbo-molecular pump or the like via a valve.

In addition, the substrate 1 is heated by heating means, such as heating wires, provided in the susceptor 45, and the catalyst 46 is heated to, for example, the melting point or less (in particular, 800 to 2,000° C., and in the case of tungsten, approximately 1,600 to 1,800° C.) as a resistance wire and is activated. Both ends of the catalyst 46 are connected to a DC or an AC power supply 48 for catalyst, and the catalyst is heated to a predetermined temperature by electrical power supplied by this power supply.

In order to perform the catalytic CVD method, when the apparatus is in the sate shown in FIG. 5, the degree of vacuum inside the film-forming chamber 44 is evacuated to $1.33 \times 10^{-4}$ to $1.33 \times 10^{-6}$ Pa, 100 to 200 sccm of, for example, a hydrogen-based carrier gas is supplied therein, the catalyst is heated to a predetermined temperature for activation, and the source gas 40 (and, when necessary, including an appropriate amount of doping gas such as $B_2H_6$ or $PH_3$) composed of 1 to 20 sccm of hydrogenated silicon (such as monosilane) is supplied from the supplying pipe 41 via the inlet 43 of the shower head 42 so that the gas pressure is set to 0.133 to 13.3 Pa, for example, 1.33 Pa. In these steps, as the hydrogen-based carrier gas, a gas composed of hydrogen and an appropriate amount of an inert gas, such as hydrogen, hydrogen+argon, hydrogen+helium, hydrogen+neon, hydrogen+xenon, or hydrogen+krypton, may be used (hereafter, the same as above).

Next, as shown in FIG. 6, the shutter 47 is opened, at least a part of the source gas 40 is brought into contact with the catalyst 46 so as to be catalytically decomposed, and by a catalytic decomposition reaction or/and thermal decomposition reaction, clusters (that is, depositing species, precursors thereof, hydrogen-based radicals, and the like) of reactive species, such as ions or radicals of silicon, having a high energy are formed. Reactive species 50, such as ions, radicals, or the like, thus formed are formed into a predetermined film, such as microcrystalline silicon containing amorphous silicon, at high energy by vapor-phase growth on the substrate 1 at a temperature of 200 to 800° C. (for example, 300 to 400° C.).

Without generating plasma, since high energy is applied to the reactive species by the catalytic effect of the catalyst 46 and thermal energy thereof, the source gas can be efficiently converted into reactive species, and deposition can be uniformly performed on the substrate 1 by thermal CVD.

In addition, even when a substrate temperature is decreased, since energy of depositing species is high, a desired high quality film can be obtained. Accordingly, the substrate temperature can be further decreased, a large size and inexpensive insulating substrate (a low strain point glass substrate, such as borosilicate glass or aluminosilicate glass, or a heat resistant resin substrate such as polyimide) can be used, and from this point of view, cost reduction can also be realized.

In addition, since plasma is not generated, it is naturally understood that there have been no damages caused by plasma, the film thus formed has a low stress, and in addition, compared to a plasma CVD method, a significantly simple and inexpensive apparatus can be realized.

In this case, operation can be performed under reduced pressure (for example, 0.133 to 1.33 Pa) and atmospheric pressure; however, compared to a reduced-pressure apparatus, a simple and inexpensive atmospheric apparatus can be realized. In addition, by using this atmospheric apparatus, compared to the case of conventional atmospheric CVD, a high quality film having superior density, uniformity, and adhesion can be obtained. In addition, in the case described above, since throughput of the atmospheric type is larger than that of the reduced-pressure type, the productivity is high, and as a result, cost reduction can be achieved.

In the catalytic CVD described above, although the substrate temperature is increased by radiation heat of the catalyst 46, a heater for heating the substrate or cooling means 51 therefor may be provided when necessary, as described above. In addition, the catalyst has a spiral shape (in addition to this, a mesh, a wire, or a porous plate may also be used); however, a plurality of catalysts (for example, two to three catalysts) is preferably provided in the gas flow direction so as to increase a contact area with the gas. In this CVD, since the substrate 1 is disposed on the bottom surface of the susceptor 45 and above the shower head 42, particles generated in the film-forming chamber 44 do not fall on the substrate 1 and adhere to the film formed thereon.

<Flash Lamp Annealing and Apparatus therefor>

FIG. 7 shows an apparatus (annealer) for performing flash lamp annealing by way of example. According to this, in an external housing 200 for blocking emission light, an internal housing 201 (both housings are purged with $N_2$) similar to the above is placed, a plurality of flash lamps 203, for example 10 lamps, enclosing a xenon gas or the like are contained in the internal housing as a source of ultraviolet rays, and in addition, at the rear side thereof, a reflecting mirror 204 is provided to enhance the emission intensity. In addition, by using a condensing uniformer (not shown in this figure), which is composed of lenses, mirrors, and the like, and which is provided between the lamps 203 and the insulating substrate 1 (provided with a low-crystallization silicon thin-film), emission light may be condensed and homogenized into a strip shape {for example, (500 to 600 mm)×(1 to 10 mm)}, a rectangular shape {for example, (10 to 100 mm)×(200 to 300 mm)}, a square shape (for example, 100×100 mm), or circular shape (for example, 100 to 300 mm in diameter) for flash emission so as to decrease variation in emission intensity and improve productivity by increases in fusion efficiency and throughput. The substrate 1 is heated beforehand to a strain temperature thereof or less by the heater 209 in the susceptor 208. The reflecting member (reflecting mirror or the like) 204 may be provided with minute irregularities on the surface thereof so as to uniform the illuminance of reflected light by diffused reflection.

In addition, an IR-reducing or an IR-blocking filter 205 which reduces or blocks at least infrared rays, such as a color filter glass (IR-absorbing filter) containing an IR-adsorbing material, such as powdered copper, powdered iron, phosphoric acid, or the like; a cold mirror/cold filter coated with an IR-reflecting film such as an ITO film; or a filter (such as an IR-adsorbing filter coated with an IR-reflecting filter) formed by combining both materials described above with each other, may be provided between the lamps 203 and the insulating substrate 1 so as to suppress increase in substrate temperature. The rear surface of the housing 201 may be controlled by, for example, cooling water pipes 207 in which a circulating cooling media flows so that the temperature is not unnecessarily increased. Accordingly, the reflecting functions of the reflecting plate 204 may be maintained, and the light emission of the lamps may be stabilized.

In the lamp 205, as described below, when a high-voltage pulse generated by a flash discharge mechanism is applied, dielectric breakdown of a gas such as xenon enclosed in the lamp occurs in a moment, electrical energy stored in a capacitor is emitted thereby in an extremely short time (in the range of microseconds to milliseconds), and at this time, flash by intensive arc discharge is emitted. This flash is absorbed in a low-crystallization silicon thin-film and is converted into heat, and the silicon thin-film is fused.

In the step described above, light 210 emitted from the lamp 205 has, for example, a spectral distribution shown in FIG. 8 and has a wavelength having an emission intensity corresponding to a absorption wavelength (ultraviolet region, approximately 400 nm or less) of the low-crystallization silicon. In addition, the spectrum of the emission light 210 may be controlled by, for example, cutting a long wavelength component; however, when a long wavelength component to some extent is included, the substrate is heated by this wavelength component, and as a result, large grain size may be formed due to slow cooling in some cases.

Figure 25:
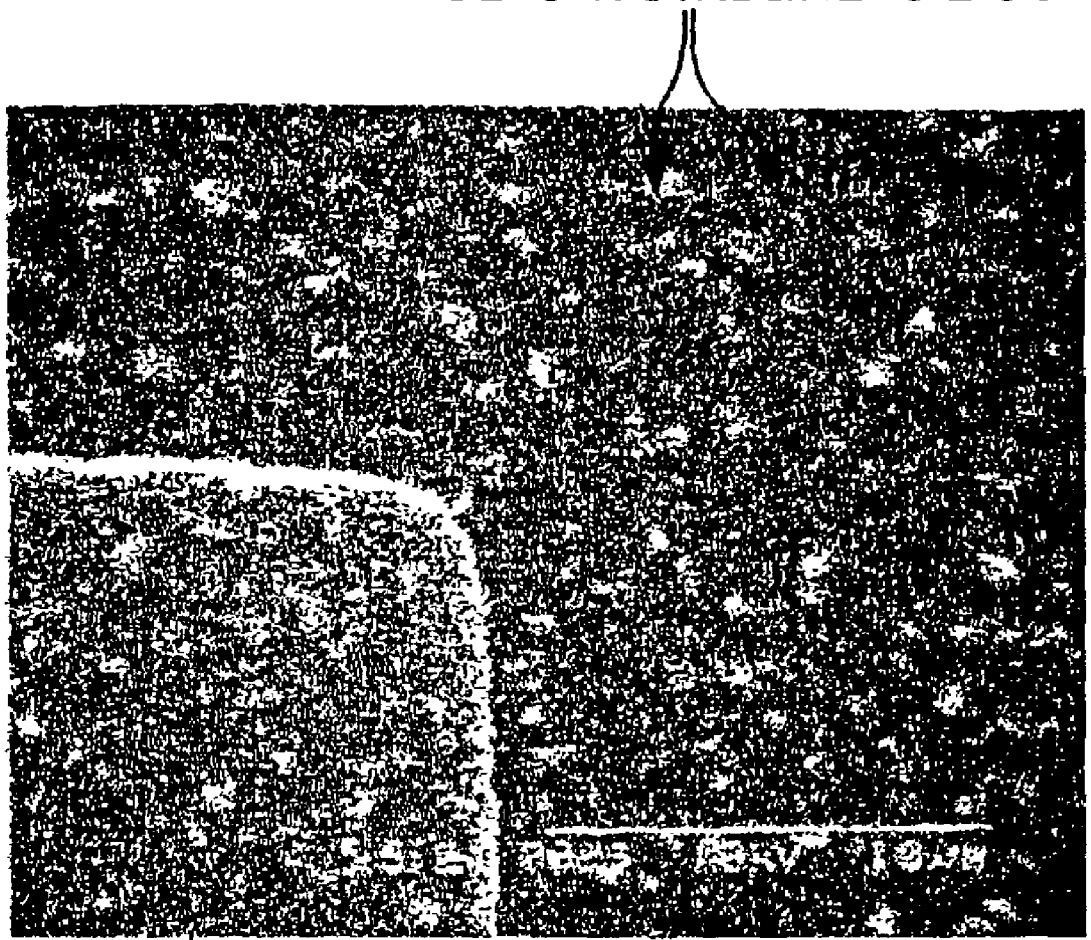
FIG. 25 is a SEM photograph of sample A according to the first embodiment.
Figure 26:
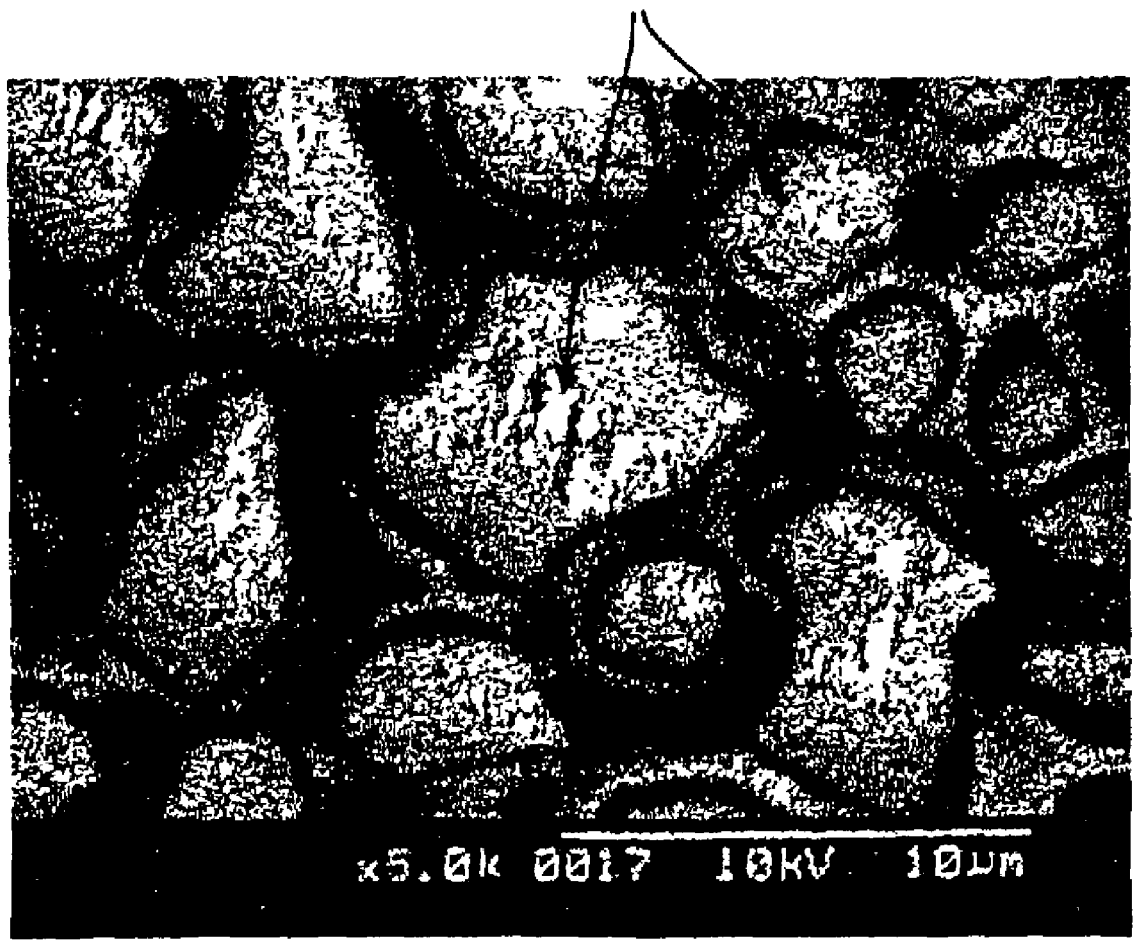
FIG. 26 is a SEM photograph of sample B according to the first embodiment.

For example, FIGS. 25 and 26 are SEM (scanning electron microscope) pictures of a polycrystalline silicon thin-film formed by flash lamp annealing according to the present invention, and it is understood that large polycrystalline silicon grains having a size of several micrometers described above are present. These pictures will be described later in detail.

Figure 9:
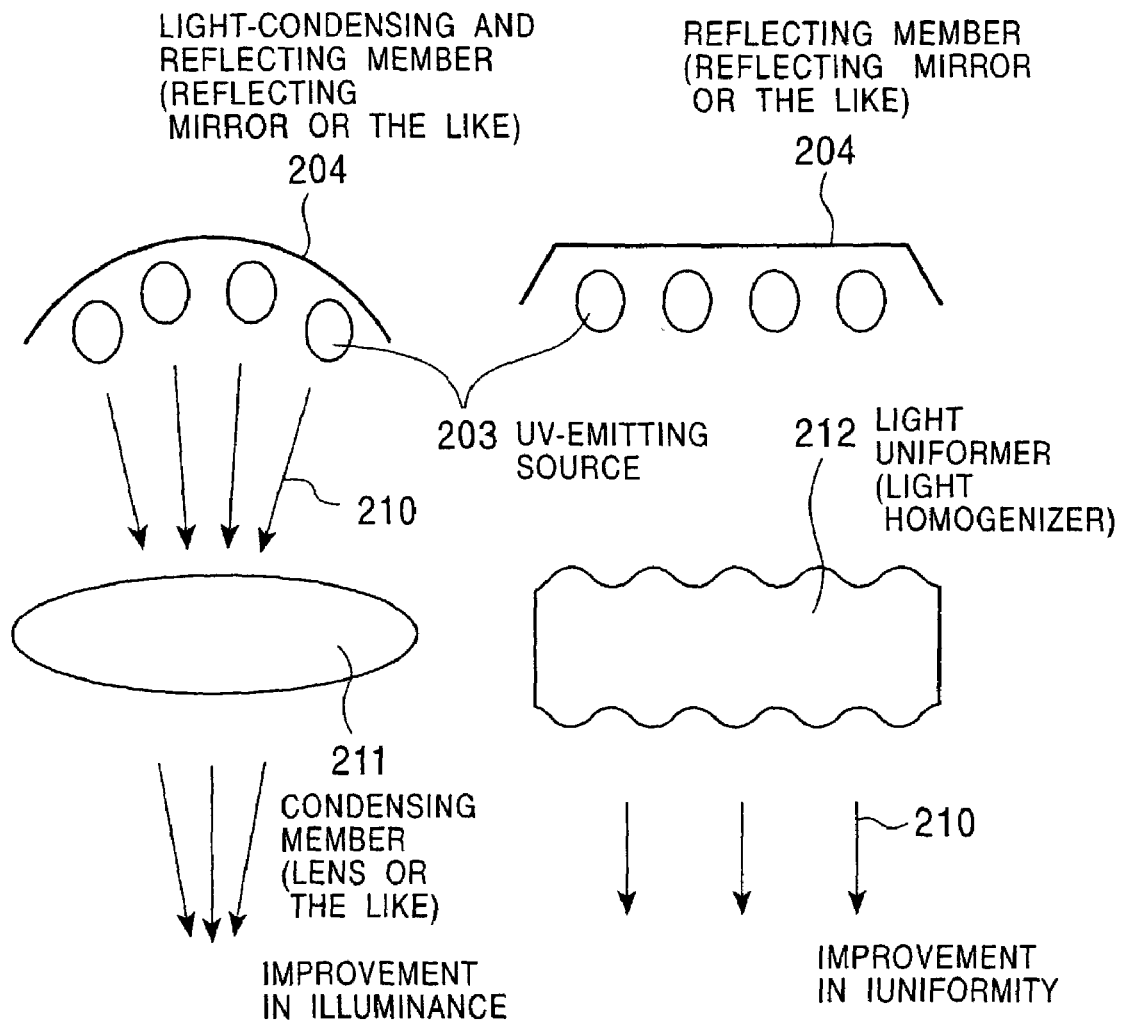
FIG. 9 includes schematic cross-sectional views of a part of the flash lamp annealing apparatus according to the first embodiment.
Figure 11:
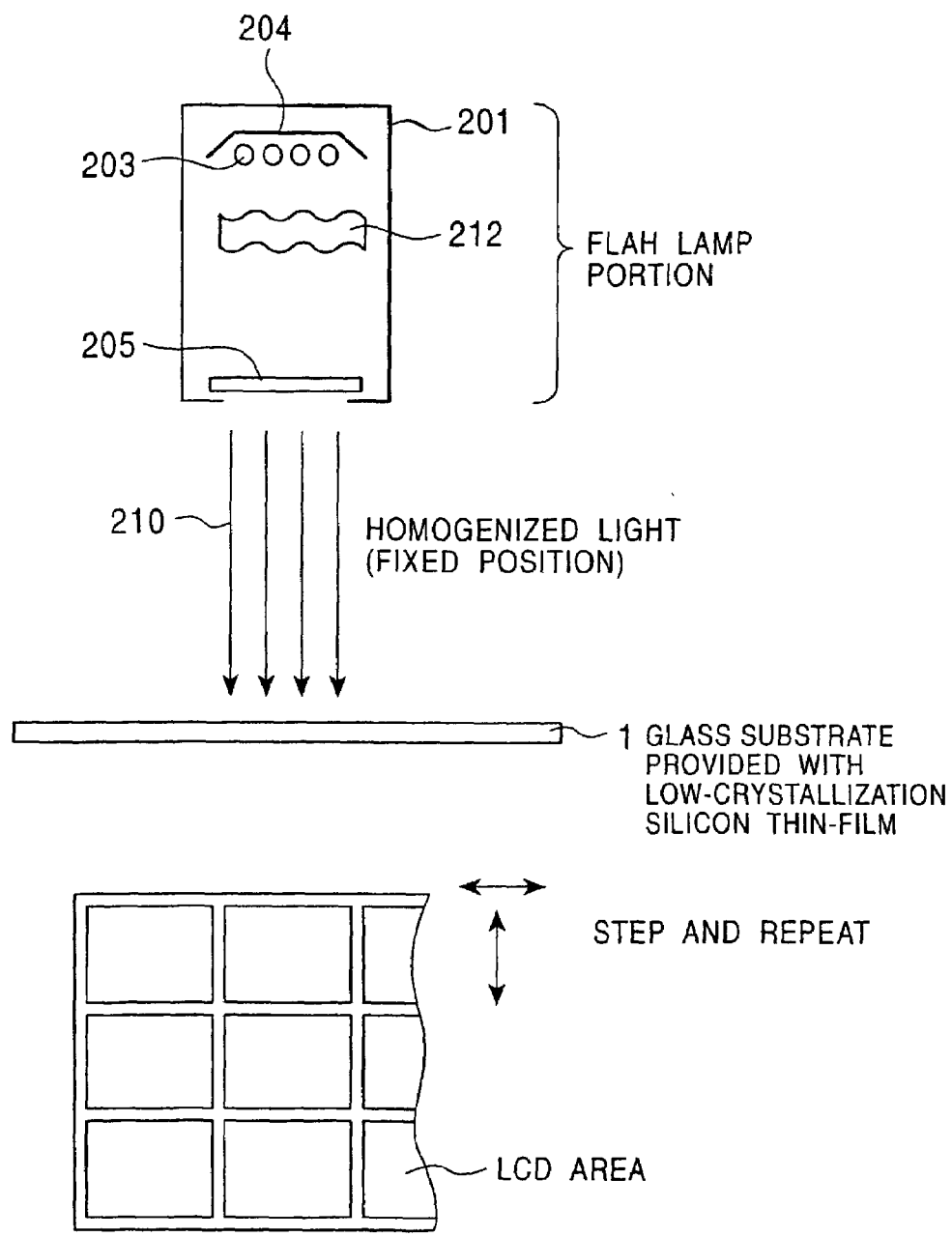
FIG. 11 includes a schematic cross-sectional view and a plan view showing another example of a flash lamp annealing apparatus according to the first embodiment.

There are two reflecting mirrors 204, i.e., for example, a concave type (A) and a flat type (B) as shown in FIG. 9, the former is suitable for performing flash emission in a strip form (improvement in illuminance) via a condensing lens 211, and the latter is suitable for performing flash emission having, for example, a large square or rectangular area (improvement in uniformity) via a light uniformer (light homogenizer) 212. In this case, when necessary, light may be emitted in a predetermined direction via the IR-reducing or the IR-blocking filter. In addition, this light uniformer (light homogenizer or the like) may be coated with an IR-reflecting film.

For example, when flash lamp annealing is performed for the glass substrate 1 having a size of 1,000 mm×1,000 mm, there are methods (1) to (3) described below, and among these, a suitable method may be optionally selected.

(1) As shown in FIG. 10(1), as in the example shown in FIG. 7, simultaneous flash emission is performed once or repeatedly as required for an entire large area of 1,000 mm×1,000 mm.

(2) As shown in FIG. 10(2), the substrate 1 is fixed, flash emission light 210, which is condensed and homogenized to form a square shape of 200 mm×200 mm, is scanned once or repeatedly as required in the same region by a galvanometer scanner, and in addition, when necessary, flash emission is performed by overlap scanning.

(3) As shown in FIG. 10(3), the position of flash emission is fixed in which flash emission light is condensed and homogenized to form a square shape of 200 mm×200 mm, the substrate 1 is precisely moved in the X-Y direction in a step & repeat manner, flash emission is performed once or repeatedly as required in the same region, and in addition, when necessary, flash emission is performed by overlap scanning.

In addition, when flash emission is performed by overlap scanning and in a step & repeat manner, in order to decrease variation in crystallinity caused by crosstalk of flash emission light emitted to an adjacent region, an intercepting plate inhibiting light leakage in the lateral direction is preferably provided so that the distance between the substrate and a lamp house (housing) or emission surface of a vacuum container is decreased (for example, 10 mm or less) as small as possible.

In addition, this flash lamp annealing conditions (emission light wavelength of a lamp, emission intensity, emission time, cooling rate, and the like) may be appropriately optimized in consideration of the thickness of a low-crystallization silicon, a heat resistant temperature of a glass substrate, and a grain size (carrier mobility) to be obtained. In addition, in flash lamp annealing, in order to form a uniform crystalline film by a constant and stable substrate temperature, to reduce stresses in a crystalline film and a substrate, and to decrease lamp emission power, the glass substrate 1 is preferably heated by the heater 209, an infrared lamp (halogen lamp), or the like to a strain point of the substrate 1 or less, for example, in the range of room temperature to 500° C., and preferably, in the range of 300 to 400° C.

In addition, as the ultraviolet lamp 203 which can be used in the present invention, light emission is preferably performed in a flashing manner and repeatedly, and for example, xenon lamps, xenon-mercury lamps, xenon-krypton lamps, krypton lamps, krypton-mercury lamps, xenon-krypton-mercury lamps, and metal halide lamps may be used. As the flash discharge mechanism which enables a lamp emit light in a flashing manner, as shown in FIG. 12, for example, a discharge lamp circuit is formed of a DC power supply 214, a capacitor C for storing charges, an inductance L formed of an inductance of a wire between the lamp power supply 214 and the lamp 203, an internal inductance of the capacitor C, and an inductance for adjusting pulse width, and the like.

For example, in the case in which a lamp having the same shape is used, when a capacitor is charged at a higher charging voltage and is then discharged, a voltage peak value in discharging is increased, and as a result, spectral intensity in the ultraviolet region at a wavelength of 400 nm or less is relatively increased. In addition, in the case in which the charging voltage is constant, with decrease in inductance, ⅓ pulse width is decreased, the peak value of a discharge current waveform is increased, and as a result, spectral intensity in the ultraviolet region at a wavelength of 400 nm or less is relatively increased.

In order to facilitate the formation of a large grain size (polycrystallization having higher carrier mobility) and the formation of single crystal by graphoepitaxial or heteroepitaxial growth, since slow cooling is preferably performed after silicon is fused, a flash time (pulse width) and a peak value in flash lamp annealing, and repeating speed and frequency of lamp emission are optionally controlled. In particular, since the better result is obtained with increase in ⅓ pulse width, the ⅓ pulse width is, for example, 1 millisecond or more, and preferably, 1.5 milliseconds or more. In addition, it is preferable that the ⅓ pulse width be optionally changed in accordance with a manufacturing method for a low-crystallization semiconductor thin-film, the thickness thereof, and the like.

In addition, the configuration is formed so that the peak value and the pulse width of a charging current flowing through the lamp 203, and the repeating speed and the frequency of lamp emission can be optionally controlled. In this case, as a method for connecting lamps, for example, the methods described below may be optionally used.

(1) as shown in FIG. 12(1), two lamps 203 connected in series are connected to a corresponding lamp power supply 214, and four lamps in total are synchronized in parallel so as to emit light.

(2) as shown in FIG. 12(2), each lamp 203 is connected to a corresponding lamp power supply 214, and the lamps simultaneously emit light.

(3) as shown in FIG. 12(3), lamps 203 connected in series are connected to one lamp power supply 214, and the lamps simultaneously emit light.

As described above, when a plurality of lamps is used, and light is emitted by synchronizing the plurality of lamps, the efficiency is increased. In general, it is preferable that a plurality of lamps be synchronously triggered by using a trigger circuit (not shown) that enables the lamps emit light so as to simultaneously emit light. When a high-voltage pulse of, for example, ten and several kilovolts is applied by a trigger circuit via a trigger electrode, a thin streamer is formed along the trigger electrode in a xenon gas enclosed in a light-emitting tube, dielectric breakdown occurs locally, and main discharge grows along this part (in light emission by a simmer method, trigger electrodes are not provided).

For example, in a flash lamp structure shown in FIG. 13(1), for example, a pair of electrodes 216 and 217 is disposed to oppose each other in the vicinities of both ends of a straight light-emitting tube 215 having a diameter of 10 mm and a length of 150 mm, a trigger electrode assembly such as a trigger wire 218 is disposed in the form of, for example, a coil wound around the tube, on the external wall of the light-emitting tube. In addition to this structure, as shown in FIG. 13(2), the structure may be formed in which a pair or pairs of electrodes 216 and 217 are disposed so as to oppose each other in the vicinities of both ends of a parallel plate light-emitting tube 219 having, for example, a length of 150 mm, a width of 100 mm, and a height of 10 mm, and a trigger electrode thin-film pattern (or a trigger electrode assembly) 220 composed of a transparent conductive film (ITO (Indium Tin Oxide), ZnO, or the like) is provided on the external surface of the light-emitting tube. In this case, the uniformity of illuminance of flash emission light may be improved by processing (blast, etching, or the like) the wall surface (inside, outside, or both sides) to form minute irregularities thereon. In addition, in the case of the parallel plate light-emitting tube, it is preferable that the anodes 216, the cathodes 217, and the trigger metal electrodes (or a trigger electrode metal pattern) 220 be disposed so that the distances between anodes, between cathodes, and between the trigger metal wires are equivalent to each other.

Since the parallel plate (rectangular parallelepiped) light-emitting tube 219 described above has the structure in which the pair or the pairs electrodes 216 and 217 are disposed so as to oppose each other in the vicinities of both ends of the parallel plate light-emitting tube having, for example, a length of 150 mm, a width of 100 mm, and a height of 10 mm, and the trigger electrode assembly (or a trigger electrode thin-film pattern) 220 is provided on the external wall of the light-emitting tube, with increase in flash emission area, the illuminance of the flash emission light can be uniformed by improved discharge uniformity. In addition, since the individual electrodes 216 and 217 can be simultaneously or independently operated, when some electrodes are destroyed, the other electrodes can be normally operated, and hence, advantages can be obtained in view of maintenance of discharge intensity, life, and cost. Furthermore, in the case of the parallel plate light-emitting tube and the straight light-emitting tube, the uniformity of illuminance of flash emission light can be improved by processing (blast, etching, or the like) the wall surface (inside, outside, or both sides) to form minute irregularities thereon.

In addition, when the external wall of the light-emitting tube is additionally processed to have irregularities thereon, since the uniformity of illuminance of the flash emission light, adhesion of the transparent conductive film, and the adhesion of the metal wire having spring properties are improved, stable light emission and long life can be ensured. For example, although the parallel plate light-emitting tube 220 having a length of 150 mm, a width of 100 mm, and a height of 10 mm has an emission area equivalent to that of a plurality of straight light-emitting tubes (for example, 10 tubes) 150 mm long and 10 mm in diameter, since flash emission equivalent to or superior to that of the straight light-emitting tubes can be performed at a lower cost as a whole, the efficiency is high, the cost is low, the exchange frequency is low, and hence, cost reduction can be realized.

In this case, when the trigger wires formed by patterning a transparent electrode film or a metal film is provided in parallel at the opposite surface side of the parallel plate light-emitting tube from the light exit side, variation in discharge among the pairs of electrodes can be decreased, and as a result, stable light emission and longer life can be achieved.

When a reflecting member which is being cooled is provided at the rear side of a light-emitting tube, the temperature is not increased during operation, functions of the reflecting member are not degraded, the lamp performance is stabilized, and the conditions inside the housing are not degraded since undesired gases are not generated, whereby stable light emission and longer life can be achieved. In this case, the light-emitting tube and reflecting member may be air-cooled using fans or the like or water-cooled by circulating pure water (or ultrapure water).

<Continuous Process of Catalytic CVD (or Plasma CVD or the like) and Flash Lamp Annealing>

In order to prevent contamination and to improve productivity, it is preferable that the step of forming the low-crystallization semiconductor thin-film and the flash lamp annealing step be continuously or sequentially performed in accordance with, for example, an in-line (continuous chamber) method (linear type or rotation type), a multiple chamber method, or a cluster method in an apparatus in which means (plasma CVD, catalytic CVD, sputtering, or the like) and an annealer are provided.

The cluster method (1) or (2) described below is more preferable.

Figure 14:
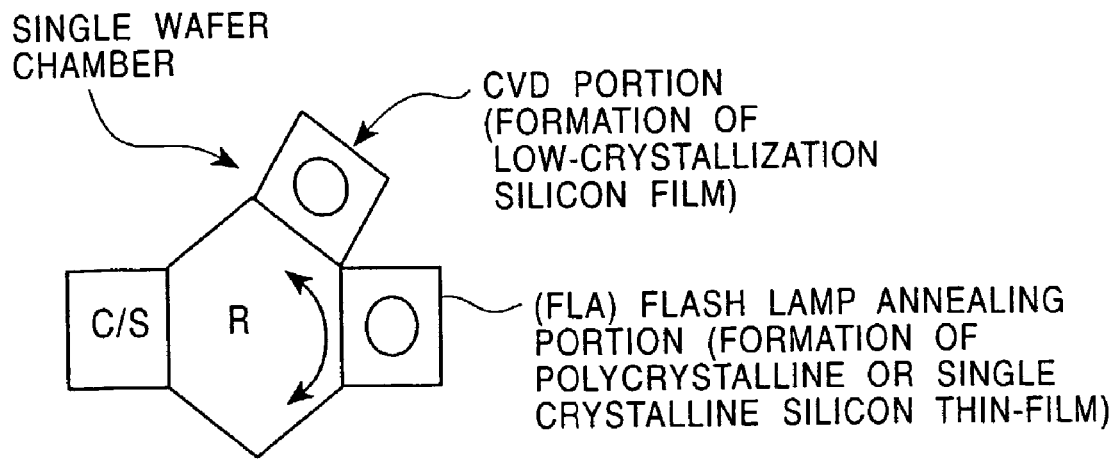
FIG. 14 is a schematic view of a cluster type apparatus for manufacturing a MOSTFT according to the first embodiment.
Figure 15:
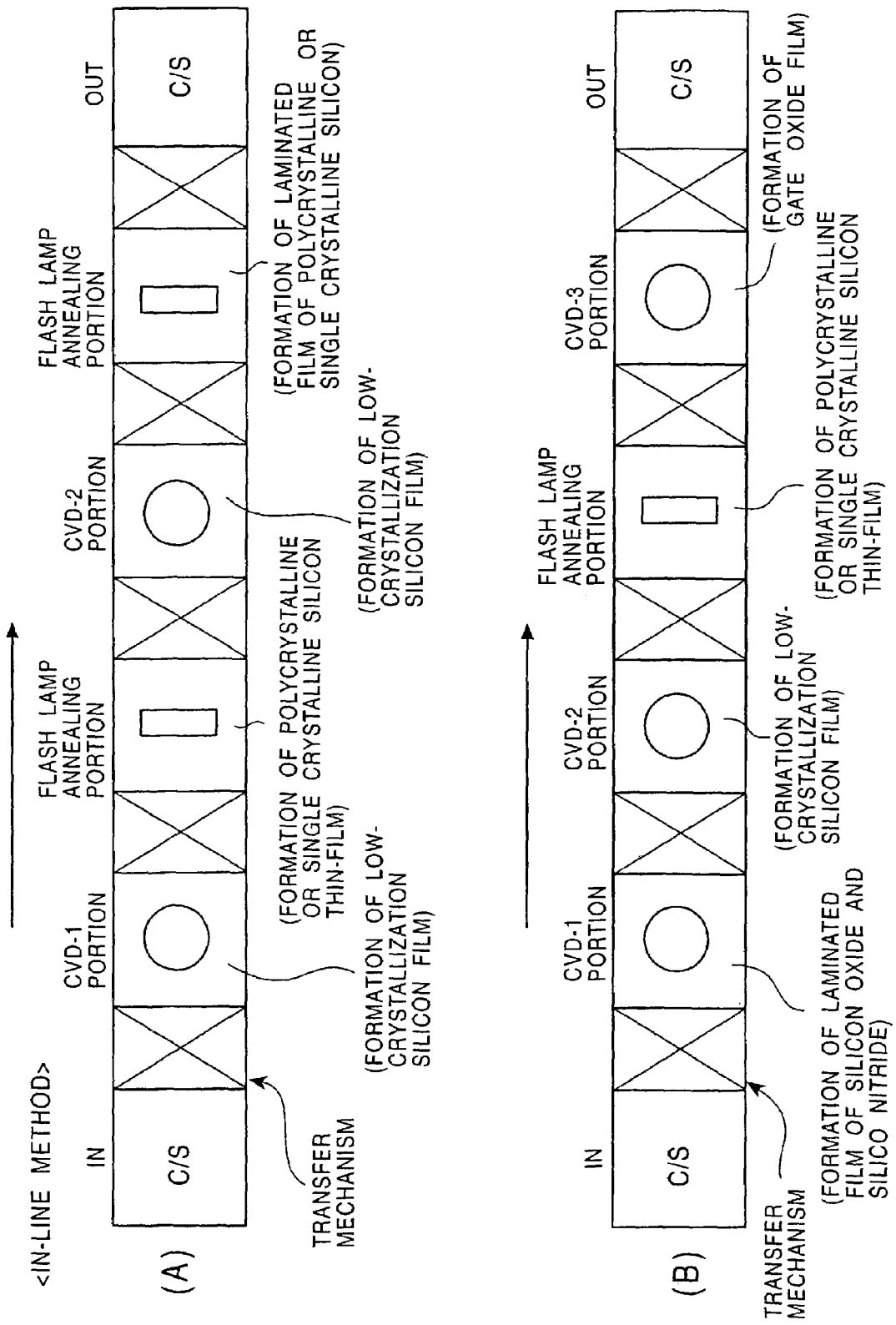
FIG. 15 includes schematic views of in-line type apparatuses for manufacturing a MOSTFT according to the first embodiment.

(1) For example, as shown in FIG. 14, a cluster type integrated apparatus may be an apparatus in which a step of forming a low-crystallization semiconductor thin-film in a CVD portion, a step of crystallizing the thin-film by flash lamp annealing in an annealer portion, a step of returning the annealed thin-film to the CVD portion, a step of forming a low-crystallization semiconductor thin-film on this annealed thin-film, and a step of again crystallizing this thin-film by flash lamp annealing in the annealer portion are repeatedly performed. In FIG. 15(A), the sequence of this in-line method is shown.

Figure 16:
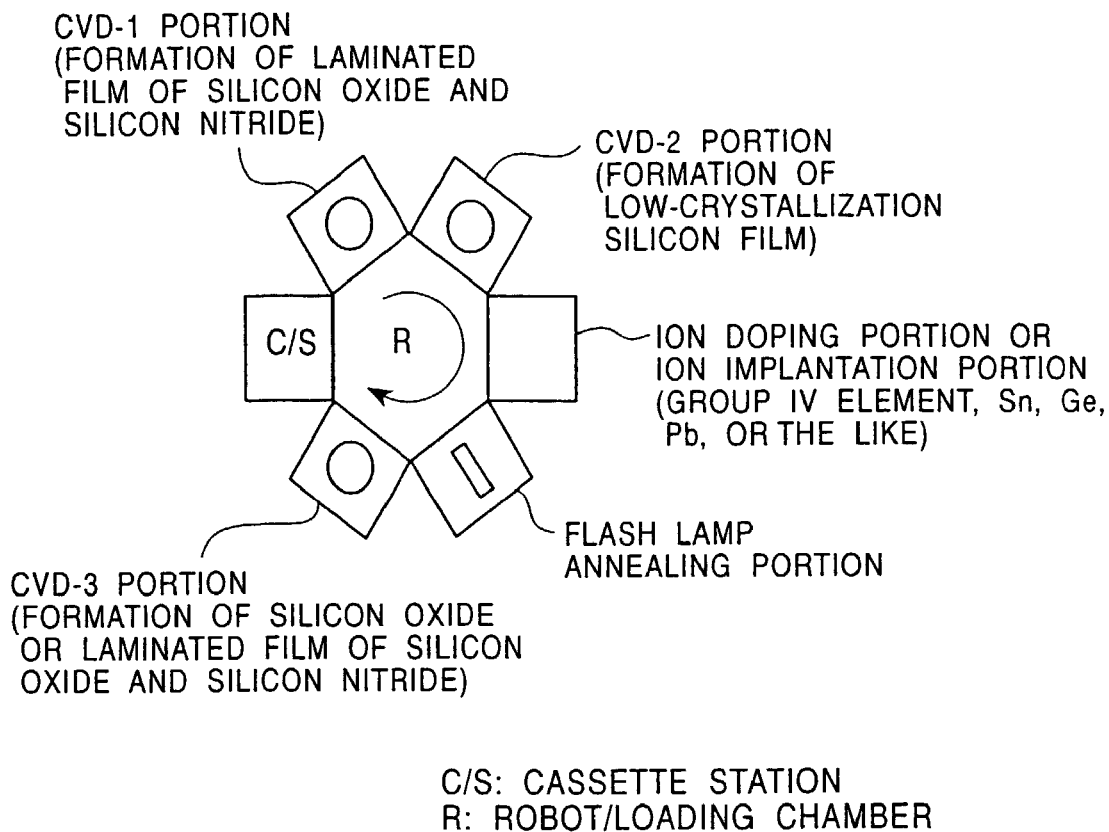
FIG. 16 is a schematic view showing another example of a cluster type apparatus for manufacturing a MOSTFT according to the first embodiment.

(2) In addition, as shown in FIG. 16, a cluster type integrated apparatus may be an apparatus in which a step of forming a substrate-protection film (a laminate of silicon oxide and silicon nitride, or the like) in a CVD-1 portion, a step of forming a low-crystallization semiconductor thin-film in a CVD-2 portion, a step of adding a Group IV element in a ion doping/ion implanting portion when necessary, a step of crystallizing the thin-film by flash lamp annealing in an annealer portion, and a step of forming a gate insulating film (a silicon oxide film or the like) in a CVD-3 portion are continuously performed. In FIG. 15(B), the sequence of this in-line method is shown.

In the method described above, the laminate composed of silicon oxide and silicon nitride, or the like formed in the CVD-1 portion may be used as a substrate-protection film of a top gate type MOSTFT or as a bottom gate insulating, protection film of a bottom gate type MOSTFT, and the silicon oxide film, the laminate composed of silicon oxide and silicon nitride, or the like formed in the CVD-3 portion may be used as a gate insulating film of a top gate type MOSTFT or as a protection film of a bottom gate type MOSTFT.

In addition, the CVD described above may be catalytic CVD, plasma CVD, or plasma CVD using TEOS, and instead of CVD, sputtering may be used. In this CVD process, it is preferable that plasma or catalytic AHA treatment be performed before film formation. For example, before a film is formed by plasma CVD, plasma AHA treatment is performed only by hydrogen-based carrier gas without using a source gas, contaminants (low-oxidation film, moisture, oxygen, nitrogen, carbon dioxide, or the like) on the surface of a formed polycrystalline silicon thin-film are removed by the effect of hydrogen-based active species (active hydrogen ions or the like) thus formed so that the interface is cleaned, and that a remaining amorphous silicon component is also etched, thereby forming a polycrystalline silicon thin-film having high crystallinity. Subsequently, by using this underlayer as a seed, a low-crystallization silicon thin-film is grown on this clean interface of this underlayer and is then formed into a superior polycrystalline semiconductor thin-film having a large grain size or a single crystalline semiconductor thin-film by the following flash lamp annealing.

In order to prevent oxidation and nitridation, flash lamp annealing is preferably performed in a hydrogen or a hydrogen-based gas atmosphere under a reduced-pressure or in a vacuum. As the atmosphere, hydrogen or a mixture of hydrogen and an inert gas (argon, helium, krypton, xenon, neon, or radon) is used, and the gas pressure is in the range of 1.33 Pa to less than atmospheric pressure and is preferably in the range of 133 Pa to $4 \times 10^4$ Pa. The degree of vacuum is in the range of 1.33 Pa to less than atmospheric pressure and is preferably in the range of 13.3 Pa to $1.33 \times 10^4$ Pa. However, when an insulating protection film (silicon oxide film, silicon nitride film, silicon oxinitride film, laminated film composed of silicon oxide and silicon nitride, or the like) is provided on the surface of a low-crystallization semiconductor thin-film, or when continuous operation is not performed, flash lamp annealing may be performed in an air or a nitrogen atmosphere at atmospheric pressure.

Since catalytic CVD and flash lamp annealing can be performed without generating plasma, there has been no damage caused by plasma, the film thus formed has a low stress, and in addition, compared to a plasma CVD method, a simple and inexpensive apparatus-can be realized.

In addition, in the flash lamp annealing described above, various modifications described below may be made.

In flash emission of a xenon lamp in a air or in a nitrogen atmosphere at atmospheric pressure, as is so-called thunder, an unnecessary impulsive sound occurs in addition to flash used for crystallization. Accordingly, as shading and noise-insulating measures, as shown in FIG. 17(A), the structure in which the lamps 203 are contained in an air-tight vacuum container 201, and the lamps 203 and the reflecting member 204 are fixed to the vacuum container 201 with springs 230 therebetween is formed. In addition to the springs 230, shock-absorbing materials may also be used.

In this case, as shown in FIG. 17(B), the downward emission type vacuum container 201, which is a lamp house, is fixed, and flash is emitted while the substrate 1 provided with a low-crystallization silicon thin-film is moved in a precise step & repeat manner. With respect to a plurality of the lamp houses 201, flash emission may be performed while the substrate 1 is moved in an in-line manner. In addition, the substrate is fixed, and while the downward emission type vacuum container 201 is moved in a precise step & repeat manner, flash emission may be performed.

However, in the case of an integrated apparatus such as a cluster type, since the lamp house composed of lamps, a reflecting member, and the like and the substrate are contained in the same vacuum container, and flash emission is performed therein, the shading measure has been made, and an impulsive sound has also been suppressed from the beginning.

In flash lamp annealing, in addition to flash emission performed at predetermined intervals, flash emission may be controlled in a time interval difference mode by using switching means.

FIG. 23 shows an example of a charge and discharge circuit configuration used for performing flash emission in a time interval difference mode by switching means as described above.

There are three ways of connecting xenon flash lamps 203.

(1) At least two lamps are connected to each other in series and are connected to a corresponding power supply.
(2) Each lamp is connected to a corresponding power supply.
(3) All lamps are connected in series and are connected to a common power supply. In this case, a plurality of lamps simultaneously emits light when being synchronously triggered.

Subsequently, control is performed in a time interval difference mode as described below by switching means performing ON-OFF operation.

(1) When $SW_1$ is first turned on, a high-voltage pulse having a pulse height of several to several tens of kilovolts is applied to a trigger electrode, and simultaneously, $SW_1'$ is cooperatively turned on. A streamer is formed on the inside wall of the flash lamp along the trigger electrode, dielectric breakdown of a gas (xenon) enclosed in the lamp occurs in a moment along the streamer, electrical energy stored in a capacitor $C_1$ is emitted thereby in an extremely short time, and at this time, intensive flash is emitted.

(2) After an elapse of a predetermined time, $SW_2$ and $SW_2'$ are turned on, and flash emission is performed by $C_2$.

(3) After an elapse of a predetermined, $SW_3$ and $SW_3'$ are turned on, and flash emission is performed by $C_3$.

$SW_1$ and $SW_1'$, $SW_2$ and $SW_2'$, $SW_3$ and $SW_3'$ are turned off immediately after flashing. Next, almost at the same time as the discharge is complete, charging of a charging capacitor by a DC power supply starts. The time required for charging relates to a time constant $\tau$ which is determined by the product of the charging capacitance and charging current-suppressing resistance. This time constant $\tau$ and a discharge time $t$ generally has the relationship represented by $\tau \gg t$. In addition, flash emission energy E in flash emission can be obtained by the equation represented by $E=(½) \times C \times V^2$ (J) (where C is discharging capacitance (μF), and V is an applied voltage (V)).

As shown in FIG. 18(a), when one step & repeat movement is performed at each flash emission, the glass substrate 1 to be irradiated is divided into nine areas, and emission is performed in accordance with the sequence shown in the figure for each area.

When one step & repeat movement is performed at each flash emission as described above, for example, the following (1) to (3) are the conditions therefor.

(1) A low-crystallization silicon thin-film (50 nm thick) is formed on a glass substrate of 1 meter by 1 meter, and on the surface of the thin-film, a reflection reducing, protection silicon oxide film (10 to 50 nm thick) is formed. In addition, islands are formed in the regions where active elements (MOSTFT, diode, or the like) and passive elements (resistor, capacitor, or the like) are formed.

(2) The irradiation area of this glass substrate is divided into nine areas, and flash emission light having an emission area of 330 mm×330 mm is emitted once for each area.

(3) A charging time for the charging capacitor and a step & repeat tact of the substrate are assumed to 20 seconds and less than 10 seconds, respectively.

In this case, using the discharge circuit shown in FIG. 23, the operations (a) to (d) described below are performed.

(a) A trigger switch $SW_1$ and the discharge switch $SW_1'$ are switched from On to Off, and when one flash emission is performed on an irradiation area ① by the discharging capacitor $C_1$, the discharging capacitor $C_1$ is simultaneously charged.

(b) Immediately after the above step, the substrate is moved so that an irradiation area ② is placed at an irradiation position, the trigger switch $SW_2$ and the discharge switch $SW_2'$ are switched from On to Off, and when one flash emission is performed on the irradiation area ② by the discharging capacitor $C_2$, the discharging capacitor $C_2$ is simultaneously charged.

(c) Immediately after the above step, the substrate is moved so that an irradiation area ③ is placed at the irradiation position, the trigger switch $SW_3$ and the discharge switch $SW_3'$ are switched from On to Off, and when one flash emission is performed on the irradiation area ③ by the discharging capacitor $C_3$, the discharging capacitor $C_3$ is simultaneously charged.

(d) Immediately after the above step, the substrate is moved so that an irradiation area ⑥ is placed at the irradiation position, the trigger switch $SW_1$ and the discharge switch $SW_1'$ are switched from On to Off, and when one flash emission is performed on the irradiation area ⑥ by the discharging capacitor $C_1$, the discharging capacitor $C_1$ is simultaneously charged.

The operations described above are repeated, thereby performing flash lamp annealing for the glass substrate of 1 meter by 1 meter. Accordingly, when the charging time of the discharging capacitor is short, it is naturally understood that the productivity can be further improved. However, the melting point of a low-crystallization semiconductor thin-film, for example, the melting point (approximately 1,200° C., slightly changed by a film-forming method, such as CVD, sputtering, or the like) of an amorphous silicon film, is assumed to approximately correspond to three fourths of the peak value P. Accordingly, when the peak value P is low, it may correspond to ⅘ pulse width or the like in some cases.

In flash emission used for conventional DVD bonding or the like, the peak value (P) of a discharge current and ⅓ pulse width or ½ pulse width have been controlled; however, in the present invention, in fusion and cooling of a low-crystallization semiconductor thin-film, for example, a peak value over the melting point (approximately 1,200° C.) of an amorphous silicon film, and a long fusion and a cooling time as long as possible are required to obtain a large grain size and high crystallinity. Accordingly, in the present invention, the control of the peak value (P) of the discharge current and the pulse width are preferably performed as described below.

Conventional method: the peak value and the ⅓ pulse width (or the ½ pulse width)

The present invention:
(1) the peak value and the ⅓ pulse width (or the ½ pulse width)
(2) the peak value and the ⅓ pulse width (or the ½ pulse width) and the ⅔ pulse width (or the ¾ pulse width)
(3) the peak value and the ⅔ pulse width (or the ¾ pulse width)

However, since the ¾ pulse width is in the vicinity of, for example, the melting point of an amorphous silicon film, and when the peak value is low, it may be changed to the ⅘ pulse width or the like.

The control of flash emission conditions are performed by control of an applied voltage V and a charging capacitor C, which determine emission energy $E=(½)CV^2$(J), the peak value determined by an inductor L, and the pulse width (time span) described below.

$\tau_1=⅓$ pulse width is a time span between a point of ⅓ of the peak value on an ascending curve, starting from zero, of an input current waveform and to a point of ⅓ of the peak value on a descending curve thereof, and in the present invention, 1.5 milliseconds or more is preferable. $\tau_2=½$ pulse width is a time span between a point of ½ of the peak value on an ascending curve, starting from zero, of an input current waveform and to a point of ½ of the peak value on a descending curve thereof, and in the present invention, 1.0 milliseconds or more is preferable.

$\tau_3=⅔$ pulse width is a time span between a point of ⅔ of the peak value on an ascending curve, starting from zero, of an input current waveform and to a point of ⅔ of the peak value on a descending curve thereof, and in the present invention, 0.8 milliseconds or more is preferable.

$\tau_4=¾$ pulse width is a time span between a point of ¾ of the peak value on an ascending curve, starting from zero, of an input current waveform and to a point of ¾ of the peak value on a descending curve thereof, and in the present invention, 0.5 milliseconds or more is preferable.

In this embodiment, this ¾ pulse width is assumed to be in the vicinity of the melting point of a low-crystallization semiconductor thin-film.

In addition, when flash emission is repeatedly performed for the same region, it is performed as shown in FIG. 19(b).

For example, when the melting point (although the melting point of an amorphous silicon is slightly changed by film-forming conditions, it is approximately 1,200° C.) of an amorphous silicon is assumed to correspond to the ¾ pulse width, by discharge of $C_1$, the P (peak value) and a fusion time represented by $\tau_{41}$ are maintained; by discharge of $C_2$ performed just before time $\tau_{41}$ elapses, a fusion time represented by $\tau_{42}$ is maintained; by discharge of $C_3$ performed just before time $\tau_{42}$ elapses, a fusion time represented by $\tau_{43}$ is maintained; and after the fusion time as a whole represented by $\tau_0 = \tau_{41} + \tau_{42} + \tau_{43}$ (for example, 1.5=0.5+0.5+0.5 milliseconds) is maintained, crystallization occurs while slow cooling (this sequence is shown below) is performed. Accordingly, in this case, $C_1 \geq C_2 \geq C_3$ is satisfied, and the relationship of the applied voltages is represented by $E_1 \geq E_2 \geq E_3$.

Figure 20:
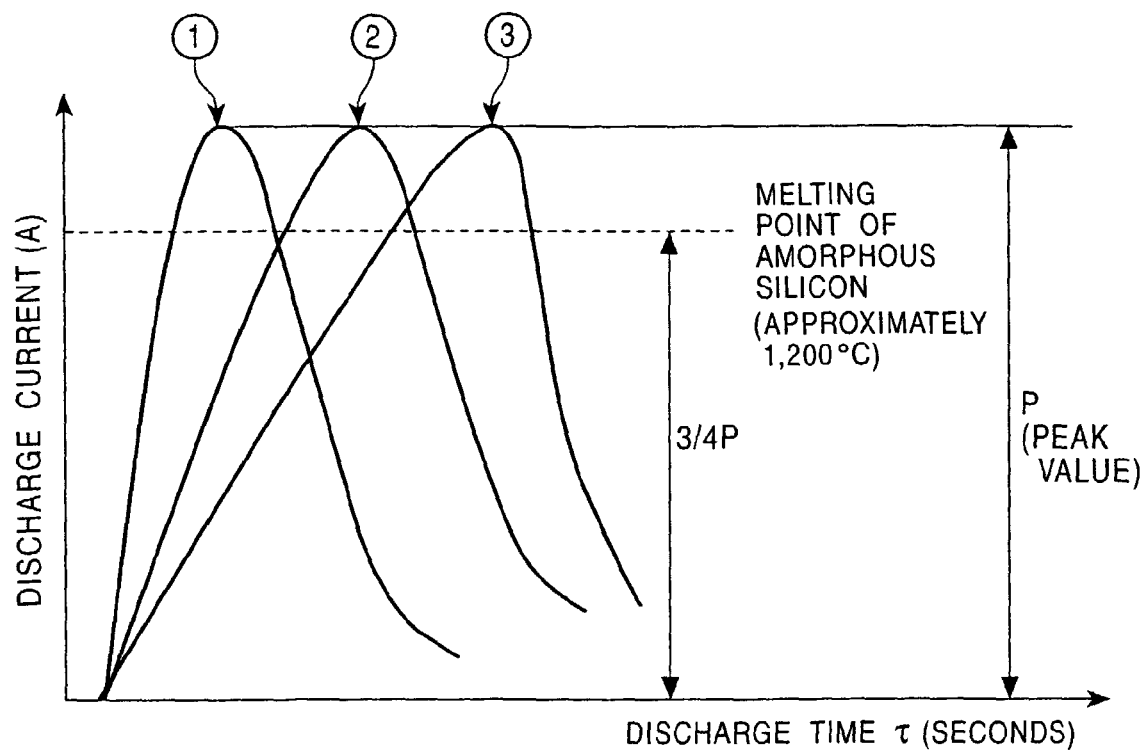
FIG. 20 is a graph showing various discharge current waveforms in flash emission according to the first embodiment.

$SW_1/SW_1'$ ON→OFF $\tau_{41}$
Within 0.5 milliseconds $SW_2/SW_2'$ ON→OFF $\tau_{42}$
Within 0.5 milliseconds $SW_3/SW_3'$ ON→OFF $\tau_{43}$ In addition, as shown in FIG. 20, the discharge current waveform may be variously modified in one flash emission.

The curve ① in the figure is equivalent to that in FIG. 19 and is composed of a generally steep ascending waveform and a relatively steep descending waveform. In addition, by the adjustment of the discharge circuit (C, L, R, and the like), curve ② is composed of a gentle ascending and a gentle descending waveform, and by the effects of preheating and slow cooling, a high-crystallization polycrystalline semiconductor thin-film having a large grain size or a single crystalline semiconductor thin-film are formed. Furthermore, by the adjustment of the discharge circuit (C, L, R, and the like), curve ③ is composed of a gentler ascending waveform than that of the curve ② and a relatively steep descending waveform similar to that of the curve ①, and by the effect of preheating (improvement in uniformity of crystallization), a uniform polycrystalline or a single crystalline semiconductor thin-film are formed.

Next, referring to FIG. 21, the case in which preheating is performed by flash emission will be describe. By discharge of $C_1$, preheating time $\tau_{31}$ (⅔ pulse width) is maintained; by discharge of $C_2$, fusion time $\tau_{41}$ (¾ pulse width) is maintained; and by discharge of $C_3$, fusion time $\tau_{42}$ (¾ pulse width) is maintained. In this case, $C_1 < C_2 \geq C_3$ is satisfied, and the relationship of the applied voltages is represented by $E_1 < E_2 \geq E_3$. By this preheating, the uniformity of crystallization is improved, a polycrystalline or a single crystalline semiconductor thin-film having uniform properties is formed.

In the case described above, $\tau_{31}$: a time span (pulse width) between a point at which a discharge current, which is increased from zero due to discharge of the charging capacitor $C_1$, reaches a level in the range of ⅔ to less than ¾ of ¾ (melting point) of the peak value in $\tau_{41} \cong \tau_{42}$ and a point at which the discharge current is then decreased, without reaching the melting point, to the level in the range of ⅔ to less than ¾ mentioned above.

$\tau_{41}$: a time span (pulse width) between a point at which a discharge current, which is increased from zero due to the discharge of a charging capacitor $C_2$, reaches ¾ of the peak value and a point at which the discharge current is then decreased to ¾ mentioned above.

$\tau_{42}$: a time span (pulse width) between a point at which a discharge current, which is increased from zero due to the discharge of a charging capacitor $C_3$, reaches ¾ of the peak value and a point at which the discharge current is then decreased to ¾ mentioned above.

Referring to FIG. 22, the case in which slow cooling is performed by flash emission will be described. By discharge of $C_1$, fusion time $\tau_{41}$ is maintained; by discharge of $C_2$, post-baking time $\tau_{32}$ is maintained, and by discharge of $C_3$, post-baking time $\tau_{33}$ is maintained. Concerning $\tau_{41}$ (¾ pulse width), and $\tau_{32}$ and $\tau_{33}$ (⅔ pulse width), $C_1 > C_2 \geq C_3$ and $E_1 > E_2 \geq E_3$ are satisfied. By this slow cooling, a polycrystalline semiconductor thin-film having a large grain size and high crystallinity or a superior single crystalline semiconductor thin-film is formed.

In the case described above, $\tau_{41}$: a time span (pulse width) between a point at which a discharge current, which is increased from zero due to the discharge of a charging capacitor $C_1$, reaches ¾ (melting point) of the peak value, and a point at which the discharge current is then decreased to ¾ mentioned above.

$\tau_{32}$: a time span (pulse width) between a point at which a discharge current, which is increased from zero due to the discharge of a charging capacitor $C_2$, reaches a level in the range of ⅔ to less than ¾ of ¾ (melting point) of the peak value in $\tau_{41}$, and a point at which the discharge current is then decreased to the level in the range of ⅔ to less than ¾ mentioned above.

$\tau_{33}$: a time span (pulse width) between a point at which a discharge current, which is increased from zero due to the discharge of a charging capacitor $C_3$, reaches a level in the range of ⅔ to ¾ of ¾ (melting point) of the peak value in $\tau_{41}$, and a point at which the discharge current is then decreased to the level in the range of ⅔ to ¾ mentioned above.

Figure 24:
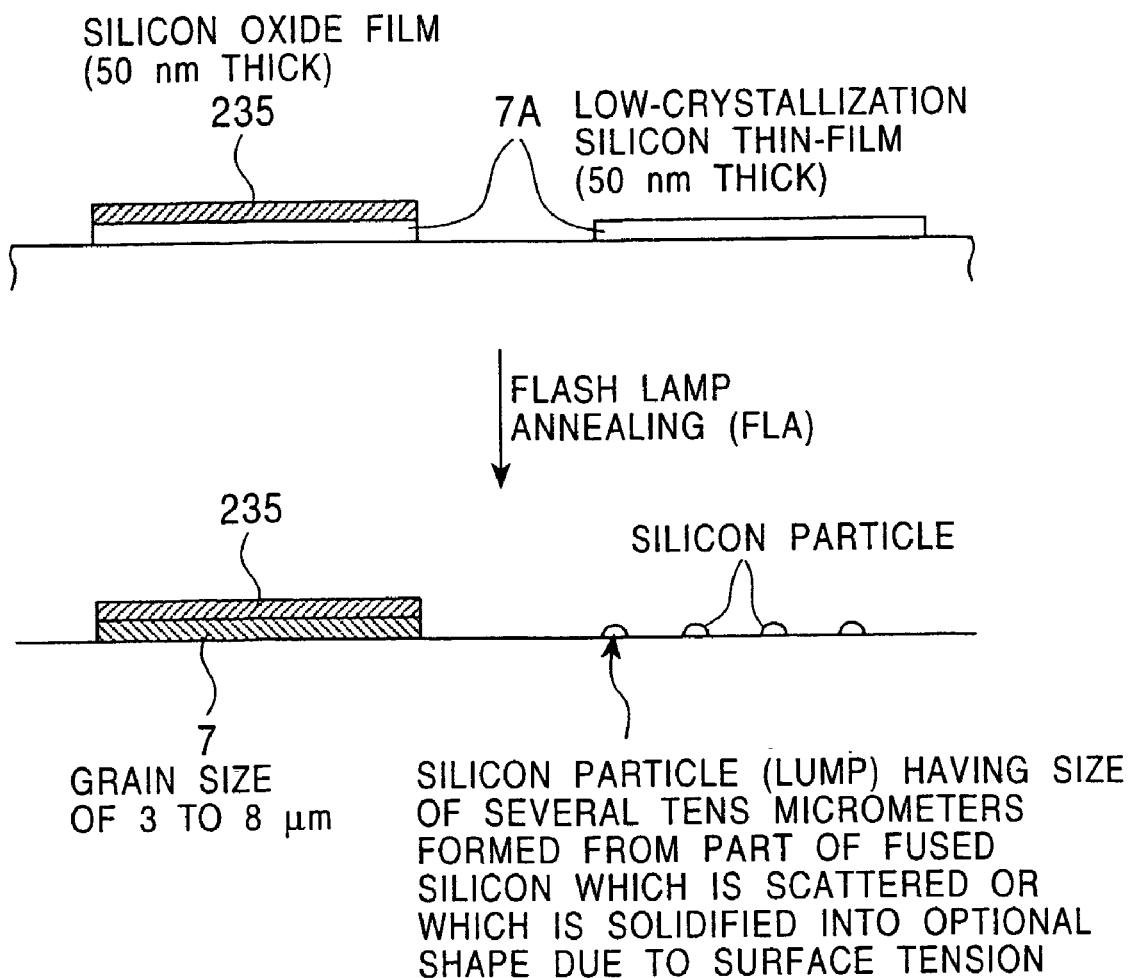
FIG. 24 includes cross-sectional views showing another mode in flash lamp annealing according to the first embodiment.

Next, in flash lamp annealing, as shown in FIG. 24, when the surface of a low-crystallization semiconductor thin-film 7A is covered with an insulating protection film 235, such as a silicon oxide film, a silicon nitride film, a silicon oxinitride film, a laminated film composed of silicon oxide and silicon nitride, or a laminated film composed of silicon oxide, silicon nitride, and silicon oxide, and is then processed by flash lamp annealing in this state, a desired polycrystalline silicon thin-film 7 is reliably formed in the case described above. However, in the case in which a low-crystallization silicon thin-film is not covered, since fused silicon may be scattered, or silicon particle may remain due to surface tension, a polycrystalline silicon thin-film may not be formed in some cases. In addition, in the step described above, a polycrystalline silicon thin-film is easily formed from an amorphous silicon thin-film formed by plasma CVD or the like, and when crystalline nuclei (seed), such as an amorphous silicon thin-film containing microcrystals, or a microcrystalline silicon thin-film containing amorphous silicon formed by reduced-pressure CVD, catalytic CVD, or the like, are present, a polycrystalline silicon thin-film having a large grain size or a single crystalline silicon thin-film is easily formed.

Next, the Hall effect carrier mobility of polycrystalline silicon thin-films formed by flash lamp annealing of the present invention was evaluated, and in addition, evaluation of polycrystalline grain sizes by SEM and crystallinity by Raman spectroscopy were also evaluated.

<Conditions for Preparing Sample A>
Substrate: Quartz glass 20×20×0.7 mm
Low-Crystallization Semiconductor Thin-film: Amorphous silicon film (200 nm thick) by RF plasma CVD
Conditions of Flash Lamp Annealing: Emission energy: approximately 20 J/cm² (relative value); Applied voltage: approximately 2,500 V; ⅓ Pulse Width: 1.5 milliseconds; Distance between a lamp and a substrate: 50 mm; Nitrogen atmosphere at atmospheric pressure; Substrate temperature: 350° C.
Hall Element: 5×5 mm, 2×2 mm, 1×1 mm; Al electrodes (measurement terminals) provided at four corners thereof Ion Implantation and Activation Treatment: Phosphorus ion at 10 keV; Dose rate: $3 \times 10^{14}$ atoms/cm$^2$; Annealing at 550 to 580° C. for 30 minutes <Principle of Hall Effect>

The Hall effect is a phenomenon in which when an electric field and a magnetic filed perpendicular to each other are applied to a sample, carriers move in the direction perpendicular to both the electric field and the magnetic field, and as a result, an electromotive force is generated. A Hall measurement is a measurement method using this effect, and a type of carrier in a sample, density (density of holes or electrons), and mobility can be easily measured thereby.

<Hall Effect Measurement>

Apparatus: Bio-Rad HL5500 Hall System

Measurement Conditions: I-means: 10 µA DC, room temperature,

Magnetic field: 0.320 Tesla,

Targ. V: 20 mV

<Measurement Data>

Sheet Resistance Rs=619 Ω/cm$^2$, Resistivity R=0.0124 Ω·cm

Electron Impurity Concentration N $7.68 \times 10^{18}$ atoms/cc

Hall Effect Electron Mobility µe=65.7 cm /V·sec

According to these results, compared to µe=40 to 45 cm$^2$/V·sec which is the Hall effect electron mobility of a polycrystalline silicon thin-film obtained by an XeCl excimer laser annealing method under the same conditions as those described above, the Hall effect electron mobility of the polycrystalline silicon thin-film obtained by the flash lamp annealing of the present invention is that µe=65.7 cm$^2$/V·sec, and is approximately 1.5 times that mentioned above. When this flash lamp annealing conditions are optimized, a larger crystal grain and higher carrier mobility may be obtained.

In addition, in SEM observation (×5,000) shown in FIG. 25, it is understood that particles of sample A, which contain polycrystalline silicon, are relatively large such as several micrometers.

Figure 28:
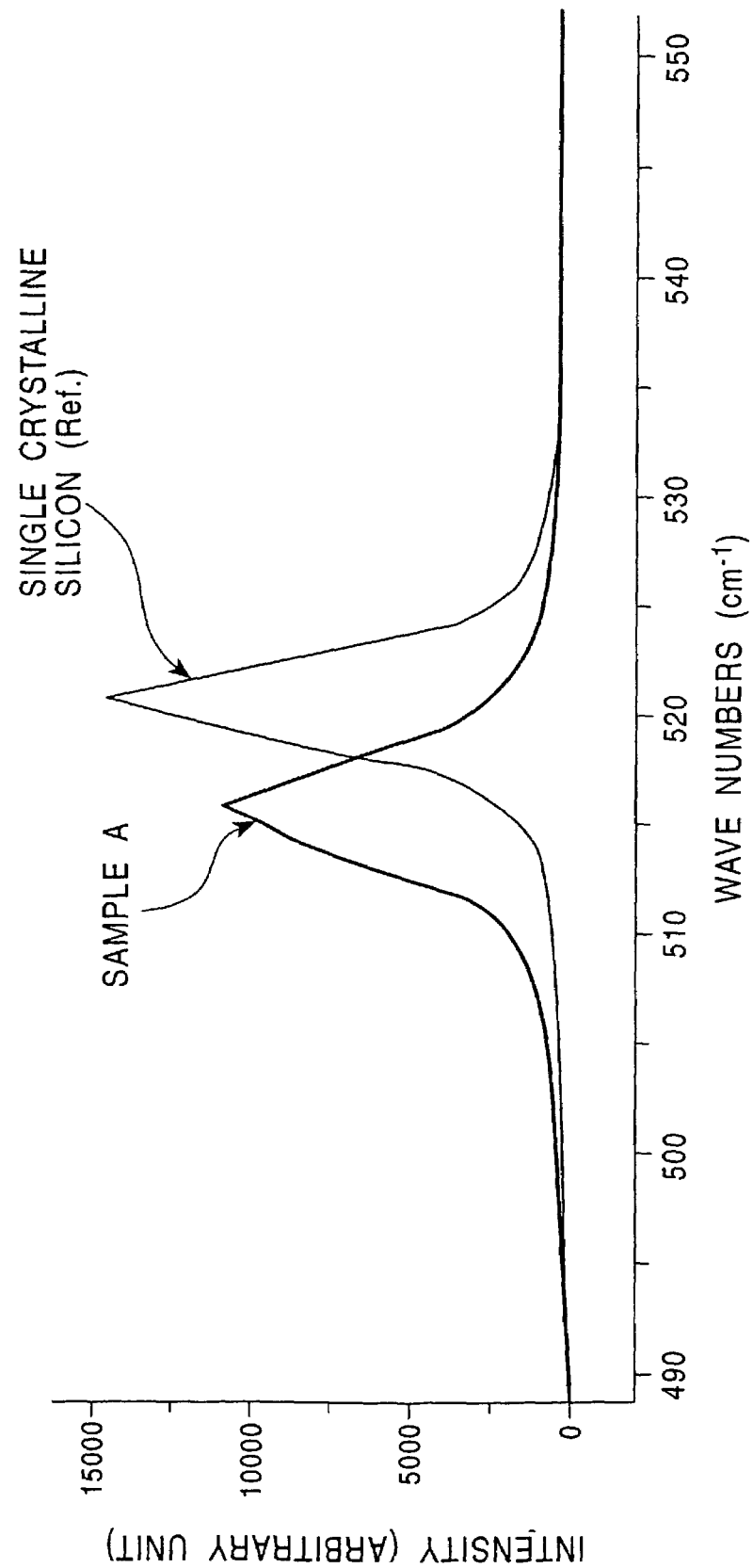
FIG. 28 is a Raman spectrum of sample A according to the first embodiment.

Furthermore, as shown in FIG. 28, according to microscopic observation by a Raman scattering spectroscopic method (Ar laser (a wavelength of 514.53 nm), a beam diameter of 1 µm, compared with single crystalline silicon: hereinafter, the same as described above), sample A has crystallinity almost equivalent to that of single crystalline silicon; however, due to slight different structure, such as grain size, grain boundary, stress, and the like, the Raman spectrum is slightly shifted to a smaller wave number side (amorphous silicon side).

<Conditions for Preparing Samples B and C>

Substrate: Borosilicate Glass Substrate 20×20×0.7 mm

Low-Crystallization Semiconductor Thin-film: Amorphous Silicon film (50 nm thick) by RF plasma CVD Protective, Insulating Film: Silicon oxide film (50 nm thick) (however, a half of the protective, insulating is removed, a region covered with this silicon oxide film is used as sample B, and the other region without this silicon oxide film is used as sample C)

Conditions of Flash Lamp Annealing: Emission energy: approximately 20 J/cm$^2$ (relative value); Applied voltage: approximately 2,500 V; ⅓ Pulse Width: 1.5 milliseconds; Distance between a lamp and a substrate: 50 mm; Air atmosphere; Substrate temperature: 350° C.

According to SEM observation (×5,000) of sample B, as shown in FIG. 26, since the protective, reflection-reducing silicon oxide film is provided thereon (see FIG. 24), and silicon fused in flash lamp annealing is trapped between the protective, reflection-reducing silicon oxide film and the glass substrate and is crystallized using an optional crystal nucleus as a seed, a polycrystalline silicon thin-film approximately 50 nm thick having a large grain size of 3 to 8 µm is formed so as to have a dispersed domain structure.

Figure 29:
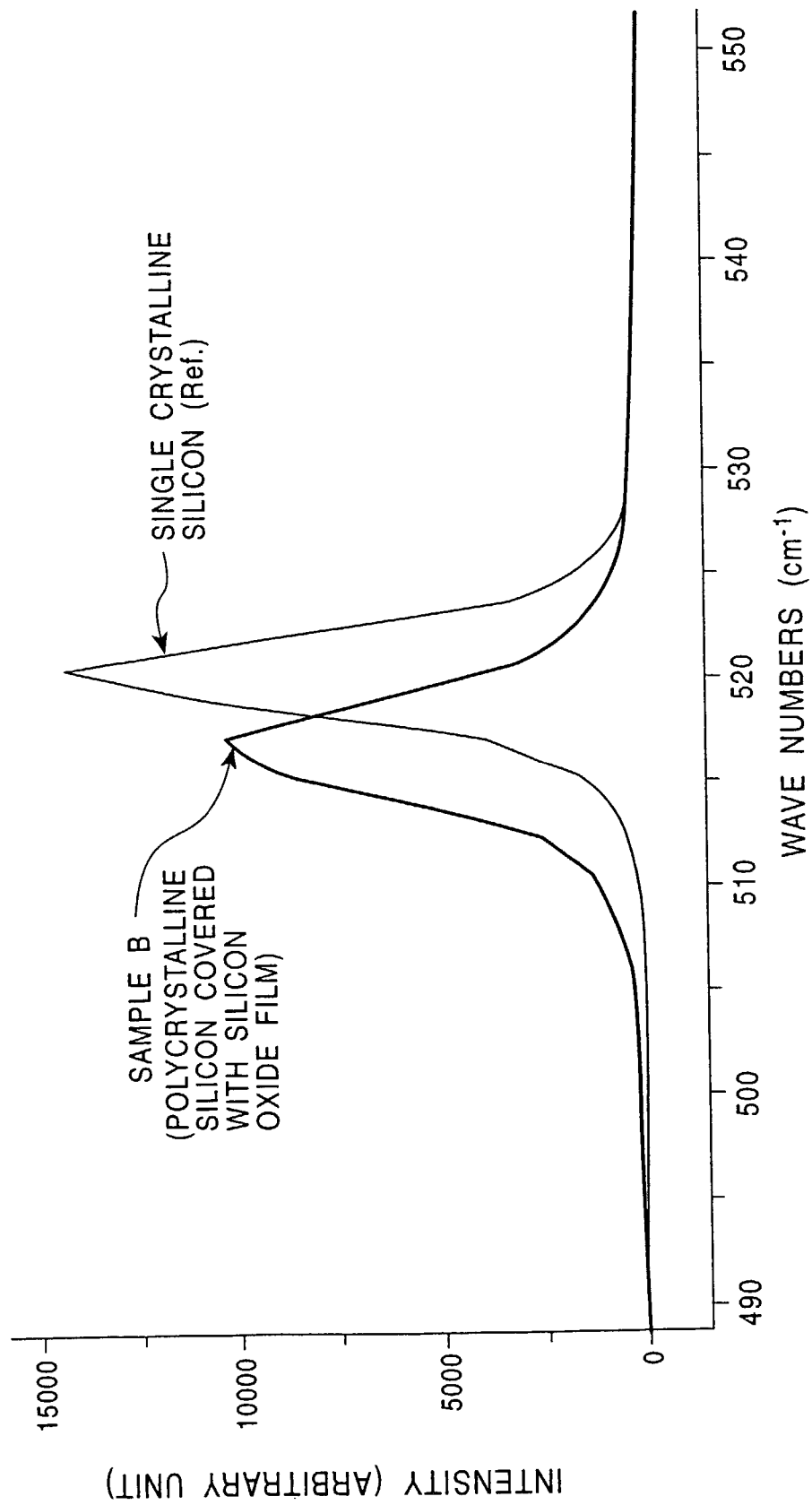
FIG. 29 is a Raman spectrum of sample B according to the first embodiment.

In addition, as shown in FIG. 29, according to microscopic observation by a Raman scattering spectroscopic method, in sample B (provided with the protective, reflection-reducing silicon film thereon), a polycrystalline silicon thin-film having a large grain size of 3 to 8 µm is formed, and hence, a polycrystalline silicon thin-film having crystallinity equivalent to that of a single crystalline silicon is obtained.

Figure 27:
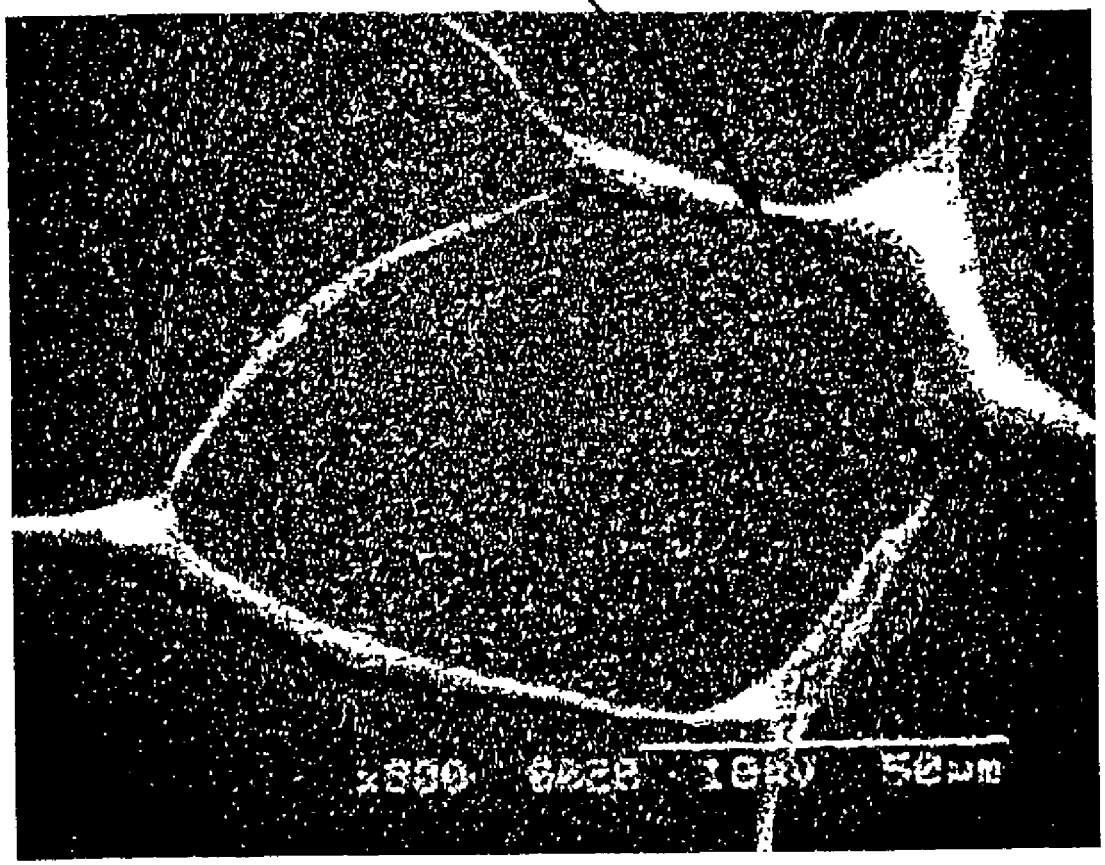
FIG. 27 is a SEM photograph of sample C according to the first embodiment.

In addition, according to SEM observation of sample C, as shown in FIG. 27, since the protective, reflection-reducing silicon oxide film is not provided thereon (see FIG. 24), a part of silicon fused in flash lamp annealing is scattered or is solidified in an optional shape due to surface tension, and as a result, silicon particles (lumps) having a size of several ten micrometers are formed.

Figure 30:
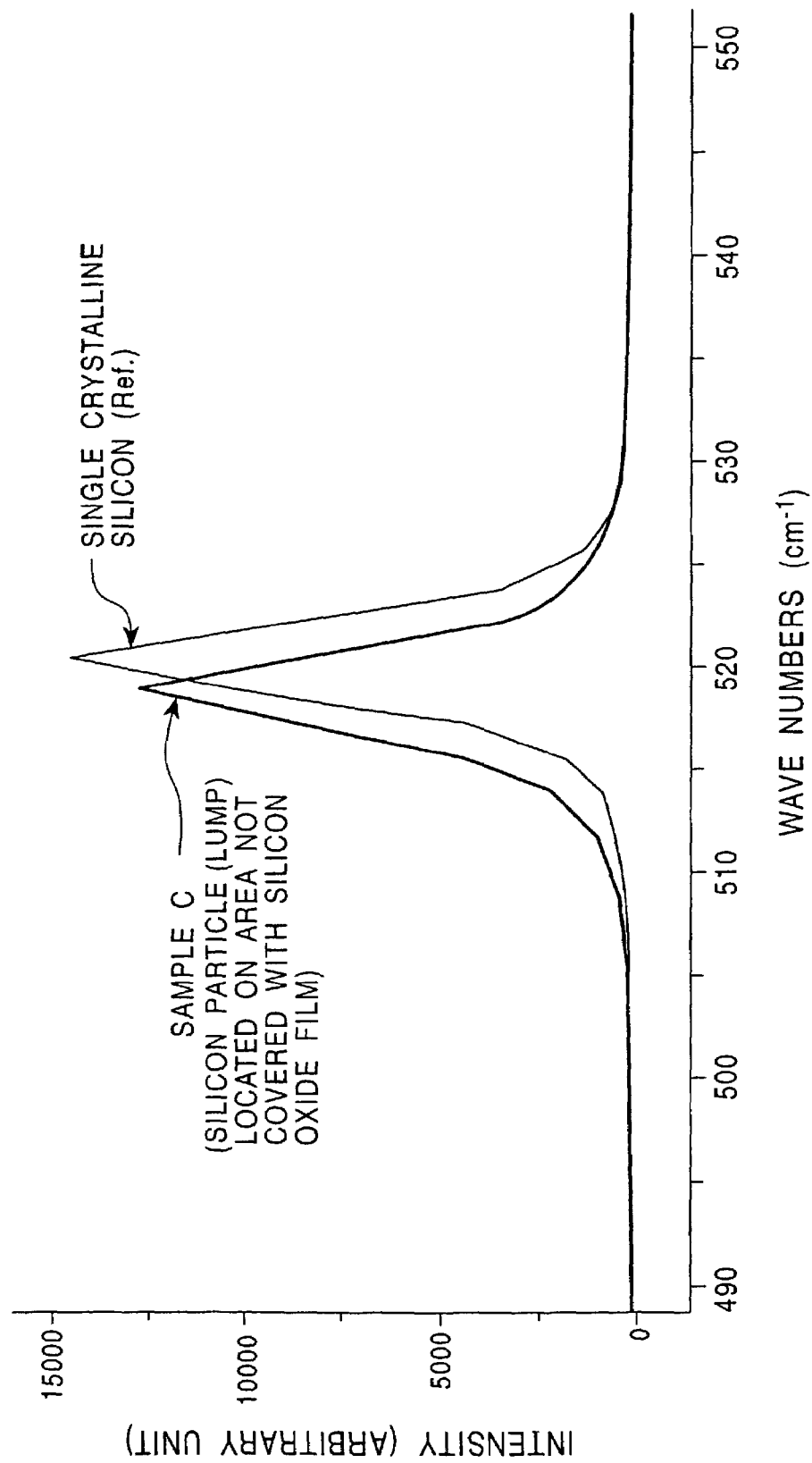
FIG. 30 is a Raman spectrum of sample C according to the first embodiment.

In addition, as shown in FIG. 30, according to microscopic observation by a Raman scattering spectroscopic method, in sample C (no protective, reflection-reducing silicon film is provided thereon), a silicon particle (lump) having an optional shape of several ten micrometers is formed, and this silicon has crystallinity approximately equivalent to that of single crystalline silicon.

In addition, a Raman scattering spectroscopic method has the following features.

Measurement Principle: Inelastic scattering (Raman scattering) light is detected when excited (laser) light irradiates a material. By spectroscopically measuring the change in wavelength of excited light when it interacts with various elementary excitations in the material, various information on atoms, molecules, and electron structures of the material is obtained.

Features: Information of a material at a predetermined position (>1 µm in diameter) can be obtained in a non-destructive manner.

Information to be obtained: Information on the symmetric property and the homogeneity of energy crystals of various elementary excitations in a solid (crystalline and amorphous material)

In addition, as shown in FIGS. 28 and 29, in the obtained Raman spectrum, a peak having asymmetrical broad shoulders is observed, and this difference in shape reflects slight difference in structure such as grain sizes, grain boundaries, stresses, and the like of a silicon thin-film and also has close relationship with electrical properties. Based on the relationship described above, conversely, by finding out the conditions for obtaining an Si:TO-phonon peak having the most suitable shape for a polycrystalline silicon TFT, the process may be optimized.

In addition, during crystallization of a low-crystallization semiconductor thin-film by flash lamp annealing, when annealing is performed in a magnetic field, an electric field, or a magnetic field and an electric field, the crystal orientation of crystal grains may be aligned.

For example, when a magnetic field is applied, as shown in FIG. 31, around the periphery of the vacuum container 201 in which the flash lamp apparatus and the substrate 1 are contained, permanent magnets 231 or electromagnets 232 are provided, and flash lamp annealing is performed in the magnetic field thus formed.

As described above, for example, when flash lamp annealing is performed in a magnetic field for the low-crystallization silicon thin-film 7A, electron spins of silicon atoms of the silicon thin-film 7A, which is once fused, interact with the magnetic field and are aligned in a predetermined direction, and when the silicon thin-film in this state is solidified by cooling, the crystal orientations therein are aligned. Since the crystal orientations in the film thus crystallized are almost aligned, electron potential barriers of grain boundaries are decreased, and hence, carrier mobilities are increased. In this step, it is important that the crystal orientations be aligned in a predetermined direction, and in accordance with the structure of the outer-shell orbit of a silicon atom, the crystal may be aligned perpendicular or parallel to the obtained polycrystalline silicon thin-film 7. Since the crystal grains are aligned, irregularities on the surface of a polycrystalline silicon thin-film are not formed, and the surface of the thin-film is planarized. Accordingly, a good condition of the interface between the thin-film and a gate insulating film or the like is obtained, and hence, the carrier mobilities are improved.

In addition, since the flash lamps 203 used for flash lamp annealing in a magnetic field are contained in the vacuum container 201, the emission efficiency is superior, and hence, the particular advantages of the flash lamp can be fully obtained.

Figure 32:
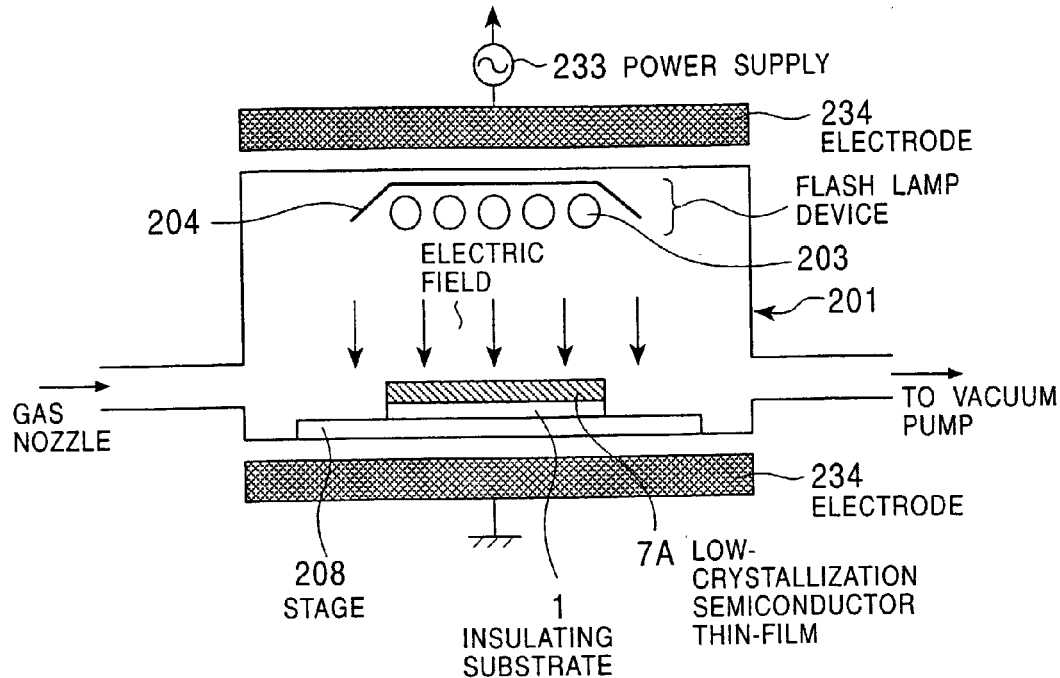
FIG. 32 is a schematic cross-sectional view showing another example of a flash lamp annealing apparatus according to the first embodiment.

FIG. 32 is a view showing the in which an electric filed by a power supply 233 is applied instead of the magnetic field, and in particular, around the periphery of the vacuum container 201 in which the flash lamp apparatus and the substrate 1 are contained, electrodes 234 are provided for applying a high-frequency voltage (a DC voltage or both voltages), thereby performing flash lamp annealing in an electric field.

In this step, electron spins of silicon atoms of the low-crystallization silicon thin-film 7A, which is once fused, interact with the electric field and are aligned in a predetermined direction, and when the silicon thin-film in this state is solidified by cooling, the crystal orientations therein are aligned in a predetermined direction. Accordingly, as in the case of the magnetic field described above, the crystal grains are aligned in a predetermined direction, the carrier mobilities are increased, and the irregularities on the surface are also decreased. In addition, the emission efficiency of the flash lamp 203 is also superior.

Figure 33:
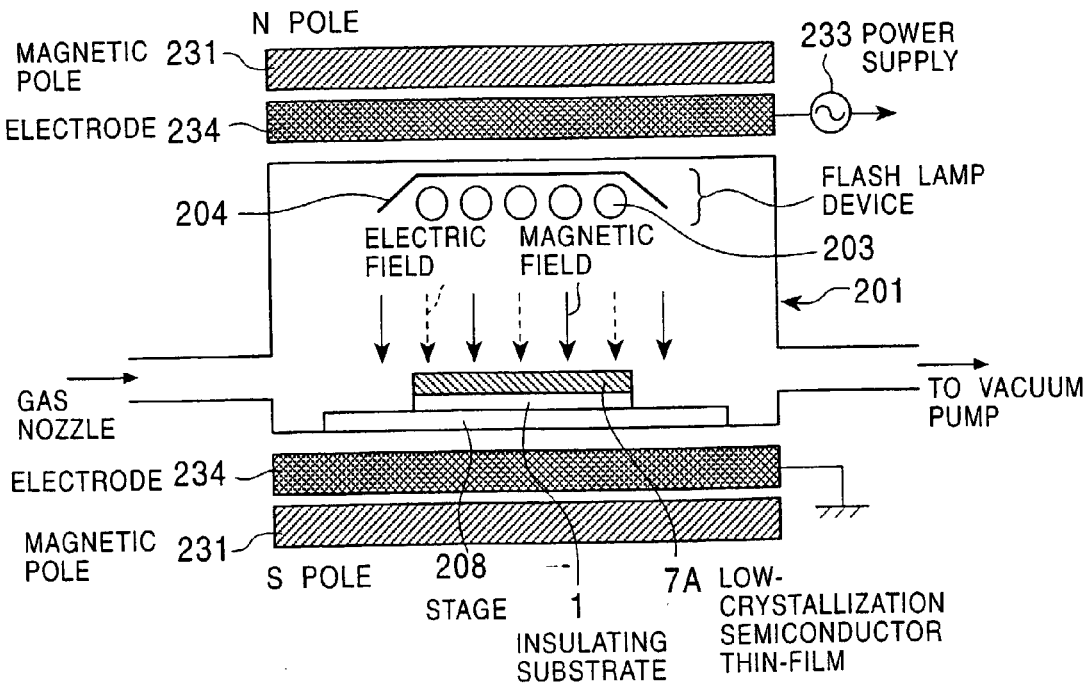
FIG. 33 is a schematic cross-sectional view showing another example of a flash lamp annealing apparatus according to the first embodiment.

FIG. 33 is a view showing the case in which the magnetic field and the electric field are simultaneously applied, and in this example, flash lamp annealing is performed on the condition that the magnetic field by the permanent magnets 231 (electromagnets may be used instead), provided around the periphery of the vacuum container 201 in which the flash lamp apparatus and the substrate 1 are contained, and the electric field by the electrodes 234 which apply a high-frequency voltage (a DC voltage or both voltages) are simultaneously applied.

In this step, electron spins of silicon atoms of the low-crystallization silicon thin-film 7A, which is once fused, interact with the magnetic field and the electric field and are aligned thereby in a predetermined direction, and when the silicon thin-film in this state is solidified by cooling, the crystal orientations therein are further sufficiently aligned in a predetermined direction by the multiplier effect of the magnetic field and the electric field. Accordingly, the crystal grains are more easily aligned in a predetermined direction, the carrier mobilities are further increased, and the irregularities on the surface are also further decreased. In addition, the emission efficiency of the flash lamp 203 is also superior.

<Formation of Top Gate Type CMOSTFT>

Next, an example of formation of a top gate type CMOSTFT using flash lamp annealing of this embodiment will be described.

First, as shown in FIG. 1(1), at least on a TFT-forming region of the insulating substrate 1 composed of, for example, borosilicate glass, aluminosilicate glass, quartz glass, crystallized glass, or the like, a substrate-protection film 100, which is a laminate composed of a protective silicon nitride film and a silicon oxide film formed by vapor-phase growth, such as plasma CVD, catalytic CVD, or reduced-pressure CVD (hereafter, the same as described above).

In the case described above, a glass substrate may be selected in accordance with a process temperature for TFT formation.

The case at a low temperature of 200 to 500° C.: a glass substrate (for example, 500×600×0.5 to 1.1 mm thick), such as borosilicate glass or aluminosilicate glass, or a heat resistant resin substrate such as polyimide may be used.

The case at a high temperature of 600 to 1,000° C.: a heat resistant glass substrate (for example, 6 to 12 inches in diameter and 700 to 800 μm thick), such as quartz glass or crystallized glass, may be used.

The protective silicon nitride film is formed for stopping Na ions from a glass substrate; however, it is not necessary when synthetic quartz glass is used.

In addition, when catalytic CVD is used, an apparatus similar to that shown in FIGS. 5 and 7 may be used; however, in order to protect the catalyst from being oxidized, it is necessary that the catalyst be heated to a predetermined temperature (approximately 1,600 to 1,800° C., for example approximately 1,700° C.) with supply of a hydrogen-based carrier gas and that, after the film formation, the supply of the hydrogen-based carrier gas be stopped when the catalyst is cooled to a temperature at which oxidation will not occur.

As the film-forming conditions, a hydrogen-based carrier gas (hydrogen, argon+hydrogen, helium+hydrogen, neon+hydrogen, or the like) is always supplied in a chamber, and the flow volume, pressure, susceptor temperature are controlled as described below.

Chamber Pressure: approximately 0.1 to 10 Pa, for example 1 Pa

Susceptor Temperature: 350° C.

Flow Volume of Hydrogen-Based Carrier Gas (when a mixed gas is used, hydrogen concentration is 80 to 90 mole %): 100 to 200 sccm In addition, the silicon nitride film 50 to 200 nm thick is formed by the following conditions.

Hydrogen is used as a carrier gas, and as a source gas, monosilane ($SiH_4$) and ammonia ($NH_3$) are mixed together at an appropriate ratio.

Flow Volume of $H_2$: 100 to 200 sccm, Flow Volume of $SiH_4$: 1 to 2 sccm, and Flow Volume of $NH_3$: 3 to 5 sccm In addition, the silicon oxide film 50 to 200 nm thick is formed by the following conditions.

Hydrogen is used as a carrier gas, and as a source gas, monosilane ($SiH_4$) and $O_2$ diluted with He are mixed together at an appropriate ratio.

Flow Volume of $H_2$: 100 to 200 sccm, Flow Volume of $SiH_4$: 1 to 2 sccm, Flow Volume of $O_2$ diluted with He: 0. to 1 sccm The film-forming conditions by RF plasma CVD are shown below.

The silicon oxide film is formed under the conditions in which the $SiH_4$ flow is 5 to 10 sccm, the $N_2O$ flow is 1,000 sccm, the gas pressure is 50 to 70 Pa, the RF power is 1,000 W, and the substrate temperature is 350° C.

In addition, the silicon nitride film is formed under the conditions in which the $SiH_4$ flow is 50 to 100 sccm, the $NH_3$ flow is 200 to 250 sccm, the $N_2$ flow is 700 to 1,000 sccm, the gas pressure is 50 to 70 Pa, the RF power is 1,300 W, and the substrate temperature is 250° C.

Next, as shown in FIG. 1(2), by catalytic CVD or plasma CVD, the low-crystallization silicon thin-film 7A doped with, for example, a Group IV element such as tin at a concentration of $10^{17}$ to $10^{22}$ atoms/cc, or preferably, $10^{18}$ to $10^{20}$ atoms/cc (doping may be performed in a CVD step or in an ion implantation step after film formation) is formed to have a thickness of 50 nm. However, tin doping is not always necessary (hereafter, the same as described above). Next, a protective, reflection-reducing silicon oxide film 10 to 30 nm thick is formed.

In this case, the apparatus shown in FIGS. 5 and 6 is used, a low-crystallization semiconductor thin-film, such as a tin-doped low-crystallization silicon thin-film, is formed by the catalytic CVD under the conditions described below.

Film Formation of Microcrystalline Silicon Containing Amorphous Silicon by Catalytic CVD: hydrogen as a carrier gas and a mixture of monosilane ($SiH_4$) and hydrogenated tin ($SnH_4$) at an appropriate mixing ratio are used for this film formation, in which the $H_2$ flow is 150 sccm, the $SiH_4$ flow is 15 sccm, and the $SnH_4$ flow is 15 sccm. In this step, a tin-doped silicon thin-film at an optional n or p-type dopant concentration may be formed by adding an appropriate amount of an n-type dopant, such as phosphorus, arsenic, or antimony, or a p-type dopant such as boron to a silane-based gas (silane, disilane, trisilane, or the like) used as a source gas.

The case of n-type: $PH_3$ (phosphine), $AsH_3$ (arsine), $SbH_3$ (stibine)

The case of p-type: $B_2H_6$ (diborane)

When the individual films are formed in the same chamber, while a hydrogen-based carrier gas is always supplied, and the catalyst is heated to a predetermined temperature so that the chamber is in a standby state, the following may be processed.

After a silicon nitride film having a predetermined thickness is formed by mixing monosilane and ammonia at an appropriate ratio, and the source gases or the like used for this film formation are sufficiently evaluated, a silicon oxide film having a predetermined thickness is continuously formed by mixing monosilane and $O_2$ diluted with He, and the source gases or the like used for this film formation are sufficiently evaluated. Subsequently, after a tin-doped microcrystalline silicon film, containing amorphous silicon and having a predetermined thickness, is continuously formed by mixing monosilane and $SnH_4$ at an appropriate ratio, and the source gases or the like used for this film formation are sufficiently evaluated, a silicon oxide film having a predetermined thickness is continuously formed by mixing monosilane and $O_2$ diluted with He. After the film formation, the supply of the source gases is stopped, the catalyst is cooled to a temperature at which any problem may not occur, and the supply of the hydrogen-based carrier gas is then stopped. In this step, the flow volume of a source gas for forming the insulating film may be gradually decreased or gradually increased so as to form an insulating film having a gradient junction.

In addition, when the individual films are formed in the different chambers, while a hydrogen-based carrier gas is always supplied into each chamber, and-the catalysts are heated to a predetermined temperature so that each chamber is in a standby state, the following may be processed. After being transferred to a chamber A, a silicon nitride film having a predetermined thickness is formed by mixing monosilane and ammonia at an appropriate ratio. Next, after the film thus formed is transferred to a chamber B, a silicon oxide film having a predetermined thickness is formed by mixing monosilane and $O_2$ diluted with He at an appropriate ratio. Next, after the film thus formed is transferred to a chamber C, a tin-doped microcrystalline silicon film, containing amorphous silicon and having a predetermined thickness, is formed by mixing monosilane and $SnH_4$ at an appropriate ratio. Next, after the film thus formed is transferred to the chamber B, a silicon oxide film is formed by mixing monosilane and $O_2$ diluted with He at an appropriate ratio. After the film formation, the supply of the source gases is stopped, the catalyst is cooled to a temperature at which any problem may not occur, and the supply of the hydrogen-based carrier gas is the stopped. In this step, the hydrogen-based carrier gas and the source gases for forming the individual films may be always supplied into the individual chambers so that the chambers are in a standby state.

The conditions for forming a low-crystallization silicon thin-film by RF plasma CVD are that the $SiH_4$ flow is 100 sccm, the $H_2$ flow is 100 sccm, the gas pressure is $1.33 \times 10^4$ Pa, the RF power is 100 W, and the substrate temperature is 350° C.

Next, as shown in FIG. 1(3), in a nitrogen atmosphere at atmospheric pressure, by flash emission 221 performed once or repeatedly using a xenon flash lamp (or is called pulsed xenon lamp), a microcrystalline silicon thin-film containing amorphous silicon 7A is fused, and the polycrystalline silicon thin-film 7, having a thickness of 50 nm thick and a large grain size, is formed by slow cooling. In addition, in accordance with the substrate size, the substrate is moved precisely in a step & repeat manner or the like, and flash emission is performed on a predetermined area of the substrate.

This flash lamp annealing may be performed using any apparatus among those shown in FIGS. 7 to 13, and the annealing conditions are shown below by way of example.

Lamp: xenon flash lamp (20 xenon lamps having a diameter of 10 mm and an effective arc length of 200 mm)

Irradiation Area: one flash emission performed on an area having a square shape of 200×200 mm in a step & repeat manner Emission energy: approximately 20 j/cm² (relative value)

Distance between Lamp and Glass Substrate: 50 mm

Applied Voltage: approximately: 2.5 kV

⅓ Pulse Width: 1.5 milliseconds

Substrate Temperature: 300 to 400° C.

In this flash lamp annealing, when a protection film, such as a silicon oxide film, a silicon nitride film, a silicon oxinitride film, a laminated film composed of silicon oxide and silicon nitride, or the like, is present on the surface of the low-crystallization semiconductor thin-film, a silicon fused in annealing is not scattered, silicon particles (lumps) are not-formed due to surface tension, and as a result, a polycrystalline silicon thin-film is preferably formed. In addition, when necessary, by using an IR-reducing or an IR-blocking film, the crystallinity may be improved, and substrate damages may be decreased; however, in this case, the emission energy must be increased.

In order to decrease the rise of substrate temperature and to facilitate the crystallization, when flash lamp annealing is performed after islands are formed on a low-crystallization silicon thin-film or are formed on a low-crystallization silicon thin-film covered with a protective silicon oxide film, a superior polycrystalline silicon thin-film can also be obtained.

In addition, when this flash lamp annealing is performed under appropriate conditions after the regions of gate channels, sources, and drains, which will be described later, are formed, in addition to improved crystallization, an n-type or a p-type dopant (phosphorus, arsenic, boron, or the like) implanted into the regions of the gate channels, sources, and drains is also activated, and hence, the productivity may be improved in some cases.

Next, a MOSTFT having the polycrystalline silicon thin-film 7, which is used for the regions of the gate channels, sources, and drains, is formed.

That is, in the case of a high temperature process, as shown in FIG. 2(4), after a protective, reflection-reducing silicon oxide film is removed by common photolithographic and etching techniques, and in addition, islands are formed on the polycrystalline silicon thin-film 7, in order to optimize the threshold value ($V_{th}$) by dopant concentration control in the channel region of an n-type MOSTFT, after p-type MOSTFT portions are masked with a photoresist 9, p-type dopant ions (such as boron ions) 10 are doped at a dose rate of, for example, $5 \times 10^{11}$ atoms/cm$^2$ by ion implantation or ion doping so as to have an acceptor concentration of $1 \times 10^{17}$ atoms/cc, thereby forming a p-conductive type polycrystalline silicon thin-film 11 from the polycrystalline silicon thin-film 7.

Next, as shown in FIG. 2(5), in order to optimize the threshold value ($V_{th}$) by dopant concentration control in the channel region of the p-type MOSTFT, the n-type MOSTFT portions are masked with a photoresist 12 in this case, and n-type dopant ions (such as phosphorus ions) 13 are doped at a dose rate of, for example, $1 \times 10^{12}$ atoms/cm$^2$ by ion implantation or ion doping so as to have a donor concentration of $2 \times 10^{17}$ atoms/cc, thereby forming an n-conductive type polycrystalline silicon thin-film 14 from the polycrystalline silicon thin-film 7.

Subsequently, as shown in FIG. 3(6), after a silicon oxide film (50 nm thick) 8 is formed for a gate insulating film by catalytic CVD or the like, a phosphorus-doped polycrystalline silicon film 15 used for a gate electrode material is formed by catalytic CVD, which is the same method as described above, with supply of 2 to 20 sccm of PH$_3$ and 20 sccm of SiH$_4$ so as to have a thickness of, for example, 400 nm.

Next, as shown in FIG. 3(7), a photoresist 16 is formed so as to have a predetermined pattern, the phosphorus-doped polycrystalline silicon film 15 is patterned by using the photoresist described above as a mask into a gate electrode shape, and in addition, after the photoresist 16 is removed, as shown in FIG. 3(8), a silicon oxide film 17 having a thickness of 20 nm is formed by, for example, catalytic CVD.

Subsequently, as shown in FIG. 3(9), the p-type MOSTFT portions are masked by a photoresist 18, an n-type dopant, such as phosphorus ions 19, is doped at a dose rate of, for example, $1 \times 10^{15}$ atoms/cm$^2$ by ion implantation or ion doping so as to have a donor concentration of $2 \times 10^{20}$ atoms/cc, thereby forming an n$^+$-type source region 20 and drain region 21 of the n-type MOSTFT.

Next, as shown in FIG. 4(10), the n-type MOSTFT portions are masked by a photoresist 22, a p-type dopant, such as boron ions 23, is doped at a dose rate of, for example, $1 \times 10^{15}$ atoms/cm$^2$ by ion implantation or ion doping so as to have an acceptor concentration of $2 \times 10^{20}$ atoms/cc, thereby forming a p$^+$-type source region 24 and drain region 25 of the p-type MOSTFT. Subsequently, by performing annealing at approximately 900° C. for approximately 5 minutes in an N$_2$ atmosphere, the dopant ions doped in the individual regions are activated so as to have the dopant concentration as determined beforehand.

The gate, the source, and the drain are formed as described above; however, these may be formed by methods except those described above.

That is, in the case of a low temperature process, after the step shown in FIG. 1(2), islands are formed on the polycrystalline silicon thin-film 7 so that p-type MOSTFT and n-type MOSTFT regions are formed. This process is performed by steps of removing the protective, reflection-reducing silicon oxide film by common photolithographic and etching techniques using a fluorinated etching solution, selectively removing the microcrystalline silicon thin-film containing amorphous silicon by plasma etching using CF$_4$, SF$_4$, or the like, removing the photoresist using an organic solvent, and washing. Since the polycrystalline silicon thin-film, which will be formed, is easily cracked by stresses generated when silicon is fused by abrupt temperature increase by flash emission in the following flash lamp annealing and is then cooled, in order to decrease the rise of substrate temperature, the formation of islands is also an important point. The aims of this island formation before lamp annealing are to facilitate crystal growth of fused silicon by slow cooling due to decreased heat dissipation and to suppress unnecessary increase in substrate temperature while silicon is fused.

Next, in a manner similar to that described above, after flash lamp annealing is performed for the low-crystallization silicon thin-film 7A, the protective, reflection-reducing silicon oxide film is removed. Subsequently, as in a manner similar to that described above, by using photoresist masks, an n-type dopant, such as phosphorus ions, is doped at a dose rate of $1 \times 10^{12}$ atoms/cm$^2$ in the p-type MOSTFT regions by ion implantation or ion doping so as to have a donor concentration of $2 \times 10^{17}$ atoms/cc, and a p-type dopant, such as boron ions, is doped at a dose rate of $5 \times 10^{11}$ atoms/cm$^2$ in the n-type MOSTFT regions so as to have an acceptor concentration of $1 \times 10^{17}$ atoms/cc, so that the dopant concentrations of the individual regions are controlled and that the $V_{th}$s are optimized.

Next, by common photolithographic technique, using photoresist masks, the individual source and drain regions are formed. In the case of an n-type MOSTFT, an n-type dopant, such as arsenic or phosphorus ions, is doped at a dose rate of $1 \times 10^{15}$ atoms/cm$^2$ by ion implantation or ion doping so as to have a donor concentration of $2 \times 10^{20}$ atoms/cc, and in the case of a p-type MOSTFT, a p-type dopant, such as boron ions, is doped at a dose rate of $1 \times 10^{15}$ atoms/cm$^2$ so as to have an acceptor concentration of $2 \times 10^{20}$ atoms/cc.

Subsequently, for activating the n-type and p-type dopants in the polycrystalline silicon thin-film, by using flash lamp annealing having emission energy lower than that for crystallization or RTA (Rapid Thermal Anneal) using an infrared lamp such as a halogen lamp, activation of the dopant ions in the gate channel region, and the source and the drain regions is performed by heat treatment at approximately 1,000° C. for approximately 30 seconds. Subsequently (or before dopant activation), a silicon oxide film is formed as a gate insulating film, and when necessary, a silicon nitride film and a silicon oxide film are continuously formed. That is, by catalytic CVD, a silicon oxide film 8 having a thickness of 40 to 50 nm is formed by using a hydrogen-based carrier gas and monosilane mixed with O$_2$ diluted with helium at an appropriate ratio, a silicon nitride film 10 to 20 nm thick is formed, when necessary, by using a hydrogen-based carrier gas and monosilane mixed with NH$_3$ at an appropriate ratio, and in addition, a silicon oxide film 40 to 50 nm thick is further formed under the same conditions as described above.

Next, in the high temperature process, as shown in FIG. 4(11), by catalytic CVD equivalent to that described above, a silicon oxide film 26 having a thickness of, for example, 50 nm is formed by supplying 150 sccm of a hydrogen-based carrier gas, which is also used for the other CVD processes, 1 to 2 sccm of $O_2$ diluted with helium, and 15 to 20 sccm of monosilane; a phosphine silicate glass (PSG) film 28 having a thickness of, for example, 400 nm is formed by supplying 1 to 20 sccm of $PH_3$, 1 to 2 sccm of $O_2$ diluted with helium, and 15 to 20 sccm of monosilane; and a silicon nitride film 27 having a thickness of, for example, 200 nm is formed by supplying 50 to 60 sccm of $NH_3$ and 15 to 20 sccm of monosilane.

Subsequently, as shown in FIG. 4(12), contact widow holes are formed at predetermined positions in the insulating film described above. That is, window positions for the gate, the sources, the drain electrodes of the n-type MOSTFT and the p-type MOSTFT are formed by a photoresist pattern using common photolithographic and etching techniques; the silicon nitride film for passivation is etched by plasma etching using $CF_4$, $SF_6$, or the like; the silicon oxide film and the PSG film are etched using a fluorinated etching solution; and the photoresist is removed by washing using an organic solvent or the like, thereby forming exposed gate, source, drain regions of the n-type MOSTFT and the p-type MOSTFT.

Next, an electrode material such as 1%-silicon-containing aluminum is formed on the entire surface including the individual contact holes by sputtering at 150° C. so as to have a thickness of 1 µm and is then patterned to form a source or a drain electrode 29 (S or D) and a gate lead electrode or a wire 30 (G) of each of-the p-type MOSTFT and the n-type MOSTFT, thereby forming each top gate type MOSTFT. Next, hydrogenating treatment and sintering treatment is performed in a forming gas at 400° C. for 1 hour. In this step, by catalytic CVD, aluminum may be formed by supplying an aluminum compound gas (such as $AlCl_3$).

Instead of the formation of the gate electrode described above, a film (100 to 500 nm thick) composed of a heat resistant metal such as a Mo—Ta alloy is formed by sputtering over the entire surface, and subsequently, the gate electrodes of the n-type MOSTFT and the p-type MOSTFT may be formed by common photolithographic and etching techniques.

In addition, a liquid-phase growth of a fused silicon alloy and flash lamp annealing, applied to a method for manufacturing a top gate type polycrystalline silicon CMOSTFT, will be described. First, after the substrate-protection film described above is formed, a microcrystalline silicon layer, which may contain tin, containing amorphous silicon is (precipitated) grown (hereinafter, the case in which tin is contained will be described) by one of the methods described below, and subsequently, a low melting point metal film, such as tin, provided thereon is removed.

The substrate is coated with a fused low melting point metal such as tin that contains silicon and is then cooled.

The substrate is immersed into a fused low melting point metal such as tin that contains silicon and is then pulled out therefrom for cooling.

A low melting point metal film composed of, for example, tin that contains silicon is fused by heating and is then cooled.

A low melting point metal film composed of, for example, tin that contains silicon is formed on a silicon film and is then fused by heating followed by cooling.

A silicon film is formed on a low melting metal film composed of tin or the like and is then fuses by heating followed by cooling.

Next, islands are formed on the microcrystalline silicon layer, which may or may not contain tin, containing amorphous silicon so as to divide into the p-type MOSTFT portions and the n-type MOSTFT portions, and the dopant concentrations of the channel regions are controlled by ion implantation or ion doping so as to optimize the $V_{th}$ (the conditions are equivalent to those described above). Subsequently, the sources and the drains of the p-type MOSTFT portions and the n-type MOSTFT portions are formed by ion implantation or ion doping (the conditions are equivalent to those described above).

Next, flash lamp annealing is performed to facilitate the crystallization and to activate ions (the conditions are equivalent to those described above). A silicon oxide film used as a gate insulating film is continuously formed by catalytic CVD, and when necessary, a silicon nitride film and a silicon oxide film are continuously formed (the conditions are equivalent to those described above). The processes hereafter to be performed are the same as those described above. In addition, the method using this liquid-phase growth may be applied to a bottom gate type, a dual gate type CMOSTFT or the like, which will be described later, in a manner similar to that described above.

A method for manufacturing a top gate type polycrystalline silicon CMOSTFT using flash lamp annealing performed for a low-crystallization silicon thin-film formed by sputtering will be described. First, the substrate-protection film described above is formed by sputtering. That is, on the entire surface of an insulating substrate, a silicon nitride film (50 to 200 nm thick) is formed by sputtering performed at an argon pressure of 0.133 to 1.33 Pa in a vacuum using a silicon nitride target, and on the entire surface of this silicon nitride film, a silicon oxide film (100 to 200 nm thick) is formed by sputtering performed at an argon pressure of 0.133 to 1.33 Pa in a vacuum using a silicon oxide target.

Next, by sputtering performed at an argon pressure of 0.133 to 1.33 Pa in a vacuum using a silicon target which may or may not contain 0.1 to 1 at % of tin, an amorphous silicon film, which may or may not contain tin, having a thickness of 50 nm is formed at least in the TFT forming regions of the insulating substrate.

Next, by sputtering performed at an argon pressure of 0.133 to 1.33 Pa in a vacuum using a silicon oxide target, a silicon oxide film having a thickness of 10 to 30 nm is formed.

Alternatively, by using one common silicon target, a silicon nitride film using an argon gas and a nitrogen gas (5 to 10 mole %), a silicon oxide film using an argon gas and an oxygen gas (5 to 10 mole %), an amorphous silicon film using an argon gas, and a silicon oxide film using an argon gas and an oxygen gas (5 to 10 mole %) may be continuously deposited by sputtering to form a laminate.

Next, islands are formed on the amorphous silicon layer, which may or may not contain tin, so as to divide into the p-type MOSTFT portions and the n-type MOSTFT portions (the conditions are equivalent to those described in the vapor-phase growth). Subsequently, the gate channels, the sources, and the drains are formed by ion implantation or ion doping (the conditions are equivalent to those described in the vapor-phase growth).

Next, flash lamp annealing is performed for the amorphous silicon thin-film which may or may not contain tin. By this flash lamp annealing, a polycrystalline silicon thin-film is formed, and simultaneously, the n-type or the p-type dopant processed by ion implantation of ion doping are activated, thereby achieving optimum dopant concentrations in the gate channel, the source, and the drain regions (flash lamp annealing conditions are equivalent to those described above). In addition, as is the case described above, it is naturally understood that flash lamp annealing for crystallization and flash lamp annealing or RTA treatment for ion activation may be separately performed.

Subsequently, a silicon oxide film is formed as a gate insulating film, and when necessary, a silicon nitride film and a silicon oxide film are continuously formed. That is, by catalytic CVD, a silicon oxide film 40 to 50 nm, a silicon nitride film 10 to 20 nm, and a silicon oxide film 40 to 50 nm are continuously formed (the film forming conditions are equivalent to those described above).

The processes hereafter to be performed are the same as those described above. In addition, the method using the films formed by sputtering may be applied to a bottom gate type, a dual gate type CMOSTFT or the like, which will be described later, in a manner equivalent to that described above.

In addition, when the formation of the low-crystallization silicon thin-film and the flash lamp annealing, which are described above, are repeated as required, since a polycrystalline silicon thick film can be formed having a large grain size, which has qualities close to those of single crystalline silicon having high crystallinity and high purity, this polycrystalline silicon thick film may be preferably used for forming CCD area/liner sensors, bipolar LSIs, solar cells, and the like, which are preferably formed from a thick film. That is, at a first flash lamp annealing, a polycrystalline silicon thin-film having a large grain size and having a thickness of, for example, 200 to 300 nm is formed. Next, by a second flash lamp annealing, on the polycrystalline silicon thin-film described above, a polycrystalline silicon thin-film having a large grain size and having a thickness of, for example, 200 to 300 nm is formed using the underlayer as a seed, thereby forming a polycrystalline silicon thin-film having a large grain size and having a thickness of approximately 400 to 600 nm. By repeating the step described above as required, a polycrystalline silicon thick film having a laminated structure and having a thickness in the order of micrometers can be formed. This thick film is also included in the concept of "polycrystalline silicon thin-film" of the present invention.

In the case of this laminate, since the underlying polycrystalline silicon thin-film having a large grain size is used as a seed at the following flash lamp annealing, and a polycrystalline silicon thin-film having a larger grain size is sequentially formed on the underlayer, a polycrystalline silicon thick film having a large grain size can be formed in which polycrystalline silicon located closer to the top surface of this thick film has qualities close to those of single crystalline silicon which has high crystallinity and high purity. Accordingly, in addition to MOSLSIs, this polycrystalline silicon thick film is preferably used for forming devices, such as CCD area/liner sensors, bipolar LSIs, or solar cells, in which active and passive element regions are formed on the surface of the thick film.

[I] In addition, as described above, in the case in which flash lamp annealing is performed after the islands are formed, one of the treatments (1) to (4) described below is preferably performed.

(1) In a low temperature process (A), an amorphous silicon film provided with a laminated film composed of silicon oxide (hereinafter referred to as $SiO_2$) and silicon nitride (hereinafter referred to as $SiN_x$) is patterned, so that islands are formed. After polycrystalline silicon is formed by flash lamp annealing, the $SiN_x$ film is only removed, and a $SiO_2$ film or a laminate composed of $SiO_2$ and $SiN_x$ is then formed, thereby forming a gate insulating film formed of the $SiO_2$ film or the laminate of $SiO_2$, $SiN_x$, and $SiO_2$. The low temperature process is a process in which a low strain point glass such as borosilicate glass or aluminosilicate glass or a heat resistant resin such as polyimide is used for a substrate (hereinafter, the same as described above). In addition, since being formed by a low temperature film formation such as plasma CVD, the silicon nitride film is not ideal $Si_3N_4$ and is represented by $SiN_x$ (hereinafter, the same as described above).

(2) In a low temperature process (B), an amorphous silicon film provided with a $SiO_2$ (or $SiN_x$) film is patterned, so that islands are formed. After polycrystalline silicon is formed by flash lamp annealing, a $SiO_2$ (or $SiN_x$) film is removed, and a $SiO_2$ film or a laminate composed of $SiO_2$, $SiN_x$, and $SiO_2$ is formed for a gate insulating film.

(3) In a low temperature process (C), an amorphous silicon film is patterned, so that islands are formed. After flash lamp annealing is performed, a laminate composed of $SiO_2$, $SiN_x$, and $SiO_2$ is subsequently formed for a gate insulating film.

(4) In a high temperature process (A), after an amorphous silicon film is patterned so that islands are formed, flash lamp annealing is performed, and the surface of a polycrystalline silicon film is then oxidized by thermal oxidation at a high temperature (1,000° C. for 30 minutes, thereby forming a gate insulating film. The high temperature process is a process in which heat resistant glass such as quartz glass or crystallized glass or ceramic is used (hereafter, the same as described above).

[II] In addition, in the case in which flash lamp annealing is performed before the islands are formed, one of the treatments (1) to (4) described below is preferably performed.

(1) In a low temperature process (D), an amorphous silicon film provided with a laminated film composed $SiO_2$ and $SiN_x$ is processed by flash lamp annealing and is then patterned, so that islands are formed. After the process described above, the $SiN_x$ film is only removed, and a $SiO_2$ film or a laminated film composed $SiO_2$ and $SiN_x$ is then formed thereon, so that the $SiO_2$ film or the laminated film composed of $SiO_2$, $SiN_x$, and $SiO_2$ is formed for a gate insulating film.

(2) In a low temperature process (E), an amorphous silicon film provided with a $SiO_2$ (or $SiN_x$) film is processed by flash lamp annealing and is then patterned, so that islands are formed. After the process described above, the $SiN_x$ film (or $SiN_x$) is removed, and a $SiO_2$ film or a laminated film composed $SiO_2$, $SiN_x$, and $SiO_2$ is then formed thereon, so that individual films are used for a gate insulating film.

(3) In a low temperature process (F), an amorphous silicon film is processed by flash lamp annealing and is then patterned, so that islands are formed. After the process described above, a $SiO_2$ film or a laminated film composed $SiO_2$, $SiN_x$, and $SiO_2$ is then formed thereon, so that individual films are used for a gate insulating film.

(4) In a high temperature process (B), an amorphous silicon film is processed by flash lamp annealing and is then patterned, so that islands are formed. Subsequently, a polycrystalline silicon film is thermally oxidized by thermal oxidation at a high temperature (1,000° C. for 30 minutes, thereby forming a gate insulating film.

In both [I] and [II], in the low temperature process, $SiO_2$ is formed by catalytic CVD, plasma CVD, plasma CVD using TEOS, low temperature and high pressure annealing (thermal oxidation is performed by a so-called subcritical water reaction or supercritical water reaction in which steam is used at a temperature in the range of room temperature to not more than a strain point of the substrate in a high pressure container reliably used up to 30 MPa), or the like, and $SiN_x$ is formed by catalytic CVD, plasma CVD, or the like. The high temperature process forms a high quality $SiO_2$ film and a polycrystalline silicon thin-film by thermally oxidizing a polycrystalline silicon thin-film using a high temperature thermal oxidation method as described above. Accordingly, polycrystalline silicon must be formed so that the thickness thereof is relatively large. In accordance with required properties, in both the low temperature and the high temperature processes, a reflection-reducing, protective, insulating film ($SiO_2$, $SiN_x$, SiON, or the like) on the low-crystallization silicon thin-film used in flash lamp annealing may be used as a gate insulating film after crystallization is performed by flash lamp annealing.

As described above, according to this embodiment, superior advantages (a) to (j) described below can be obtained.

(a) By flash lamp annealing which can perform flash emission once or repeatedly in an optionally short period of time in the range of microseconds to milliseconds, high emission energy is given to a low-crystallization semiconductor thin-film such as low-crystallization silicon so that the semiconductor thin-film is heated and cooled to a fusion, a semi-fusion, or a non-fusion state, and hence, a polycrystalline semiconductor thin-film such as a polycrystalline silicon thin-film having a large grain size, high carrier mobility, and high quality, or a single crystalline semiconductor thin-film is obtained, whereby the productivity is significantly increased, and considerable cost reduction can be realized.

(b) In flash lamp annealing, by combining an optional number of lamps with a flash discharge mechanism therefor, for example, (1) the entire large area of 1,000 mm×1,000 mm can be simultaneously irradiated once or repeatedly as required with flash emission light, (2) flash emission light which is condensed and homogenized to have a square emission area of 200 mm×200 mm is scanned by a galvanometer scanner, and when necessary, flash emission is performed by overlap scanning, or (3) under the conditions in which the emission position of flash emission light which is condensed and homogenized to have a square emission area of 200 mm×200 mm is fixed, and a substrate is moved in a step & repeat manner, flash emission is performed and, when necessary, is performed by overlap scanning. As described above, since the substrate or flash emission light can be moved in an optional direction at an optional speed, heating and cooling rate can be controlled, an optional large area of a low-crystallization silicon thin-film or the like can be crystallized in an extremely short time, and hence, significantly high productivity and considerable cost reduction can be realized.

(c) Since flash emission light is condensed and homogenized to have a strip, a rectangular, a square, or circular form and is then emitted, the emission intensity, that is, fusion efficiency and throughput, is improved, and variation in carrier mobility can be decreased by improvement in uniformity of crystallized film properties.

(d) By repeating the method in which a film composed of low-crystallization silicon or the like is formed on a film composed of polycrystalline silicon or the like previously crystallized by flash lamp annealing, and crystallization is again performed by flash lamp annealing, a polycrystalline silicon film or the like, which has a large grain size, high carrier mobility, and high quality, can be formed having a laminated structure and a thickness in the order of micrometers. Accordingly, in addition to MOSLSIs, high performance and high quality bipolar LSIs, CMOS sensors, CCD area/linear sensors, solar cells, and the like can be formed.

(e) Since adjustment of wavelength (change of an enclosed gas, use of an IR-reducing or an IR-blocking filter, change of discharge conditions, and the like) and control of emission intensity, emission time, and the like in flash lamp annealing can be easily performed in accordance with the film thickness of a low-crystallization semiconductor thin-film, a heat resistant temperature of a substrate such as glass, and a desired grain size (carrier mobility), a polycrystalline silicon film or the like having high carrier mobility and high quality can be reproducibly obtained at high productivity rate.

(f) Lamps used for flash lamp annealing, such as xenon lamps, xenon-mercury lamps, krypton lamps, krypton-mercury lamps, xenon-krypton lamps, xenon-krypton-mercury lamps, and metal halide lamps, are much inexpensive than an excimer laser oscillator of an excimer laser annealing apparatus using XeCl, KrF, or the like, have longer life, and require easier maintenance, and hence, significant cost reduction can be achieved by increase in productivity rate and reduction in running cost.

(g) Since a flash lamp annealing apparatus primarily composed of flash lamps and a discharge circuit has a simple structure compared to that of an excimer laser annealing apparatus, it is inexpensive, and hence, cost reduction can be realized.

(h) Since excimer laser annealing performed by XeCl, KrF, or the like uses a pulse oscillating laser in the order of nanoseconds, there has been a problem of output stability, and hence, there have been variation in energy distribution in an irradiation area, variation in quality of obtained crystallized semiconductor films, and variation in element performance between MOSTFTs. Accordingly, a method in which excimer laser pulse is emitted many times, such as 5 times or 30 times, is performed while a temperature of approximately 400° C. is applied; however, properties of crystallized semiconductor films and TFT elements vary due to the emission variation, and the cost is increased by decrease in productivity rate caused by decrease in throughput. In contrast, in flash lamp annealing, as described in the above (b), since the entire large area of, for example, 1,000 mm×1,000 mm can be simultaneously irradiated with flash emission light using a pulse in the range of microseconds to milliseconds, variation in energy distribution in the irradiation area, variation in quality of obtained crystallized semiconductor films, and variation in element performance between MOSTFTs are small, and cost reduction can be realized due to high productivity rate caused by high throughput.

(i) In particular, flash lamp annealing by intensive ultraviolet rays, using an IR-reducing or an IR-blocking filter, can be performed at a low temperature (200 to 400° C.), a low strain point glass or a heat resistant resin substrate, which is inexpensive and can be formed into a large size, may be used, and hence, reduction in weight and cost can be achieve.

(j) In addition to a top gate type MOSTFT, since a polycrystalline semiconductor film having high carrier mobility or a single crystalline semiconductor film can be formed for a bottom gate type, a dual gate type, and a back gate type MOSTFTs, high speed, high current density semiconductor devices, electrooptic devices, and highly efficient solar cells can be formed by using this high-performance semiconductor films. For example, there may be mentioned silicon semiconductor devices, silicon semiconductor integrated circuit devices, field emission display (FED) devices, silicon-germanium semiconductor devices, silicon-germanium semiconductor integrated circuit devices, silicon carbide semiconductor devices, silicon carbide semiconductor integrated circuit devices, III-V and II-VI compound semiconductor devices, III-V and II-VI compound semiconductor integrated circuit devices, polycrystalline or single crystalline diamond semiconductor devices, polycrystalline or single crystalline diamond semiconductor integrated circuit devices, liquid crystal display devices, electroluminescent (organic or inorganic) display devices, light-emitting polymer display devices, light-emitting diode display devices, light sensor devices, CCD area/linear sensor devices, CMOS sensor devices, and solar cells.

Second Embodiment

<LCD Manufacturing Example 1>

In this embodiment, the present invention is applied to an LCD (liquid crystal display device) using a polycrystalline silicon MOSTFT formed by a high temperature process, and hereinafter, a manufacturing example therefor will be described.

Figure 34:
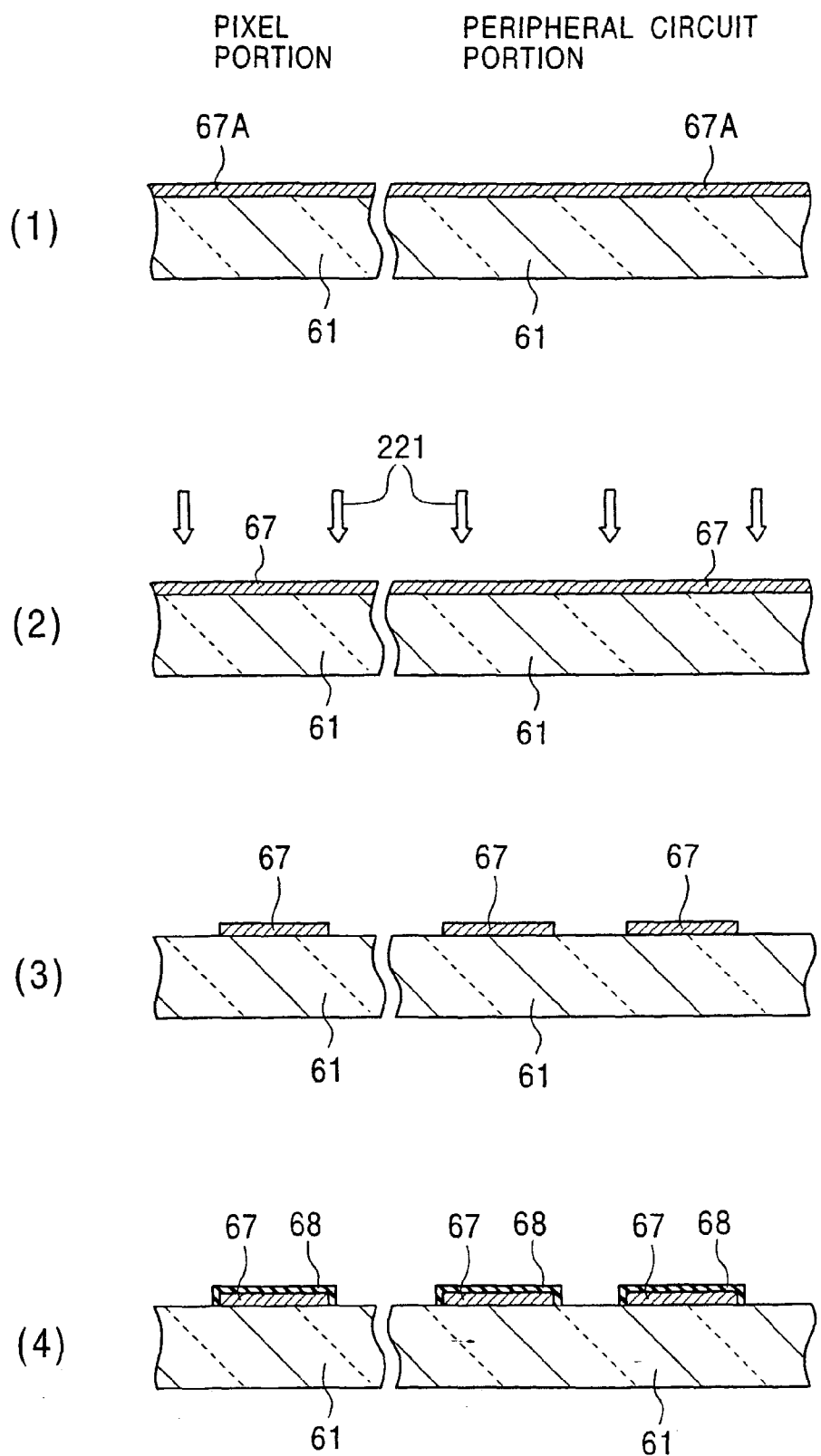
FIG. 34 includes cross-sectional views of a process for manufacturing an LCD sequentially shown by steps according to a second embodiment of the present invention.

First, as shown in FIG. 34(1), in a pixel portion and a peripheral circuit portion, a substrate-protection film 100 (not shown in the figure, and hereafter, the same as described above) is formed on one major surface of a heat resistant substrate 61 (a strain point of approximately 800 to 1,100° C., and a thickness of 50 µm to several millimeters) composed of quartz glass or crystallized glass by the catalytic CVD or the like described above, and on this protection film, a low-crystallization silicon thin-film 67A is formed by the catalytic CVD or the like described above. In addition, when necessary, a protective, reflection-reducing silicon oxide film (10 to 30 nm thick) is formed (not shown in this figure).

Next, as shown in FIG. 34(2), the flash lamp annealing described above is performed for the low-crystallization silicon thin-film 67A, thereby forming a polycrystalline silicon thin-film 67 having a thickness of, for example, 50 nm.

Next, as shown in FIG. 34(3), after the protective, reflection-reducing silicon oxide film is removed, by common photolithographic and etching techniques, the polycrystalline silicon thin-film 67 is patterned (island formation), so that active layers for active elements, such as transistors and diodes, and for passive elements, such as resistors, capacitors, or inductances, are formed. The process performed hereinafter will be described about TFT manufacturing; however, it is naturally understood that the process be the same as that for forming the other elements.

Next, after ion implantation or ion doping is performed using a predetermined dopant such as boron or phosphorus, which are the same as described above, in order to optimize the $V_{th}$ by controlling dopant concentrations in individual channel regions of the polycrystalline silicon thin-film 67, as shown in FIG. 34(4), a silicon oxide film 68 having a thickness of, for example, 50 nm used for a gate insulating film is formed on the surface of the polycrystalline silicon thin-film 67 by, for example, catalytic CVD, similar to that described above. When the silicon oxide film 68 used for a gate insulating film is formed by catalytic CVD or the like, the substrate temperature and the catalyst temperature are the same as those described above, and a oxygen gas flow of 1 to 2 sccm, a monosilane gas flow of 15 to 20 sccm, and a hydrogen-based gas flow of 150 sccm may be used.

Figure 35:
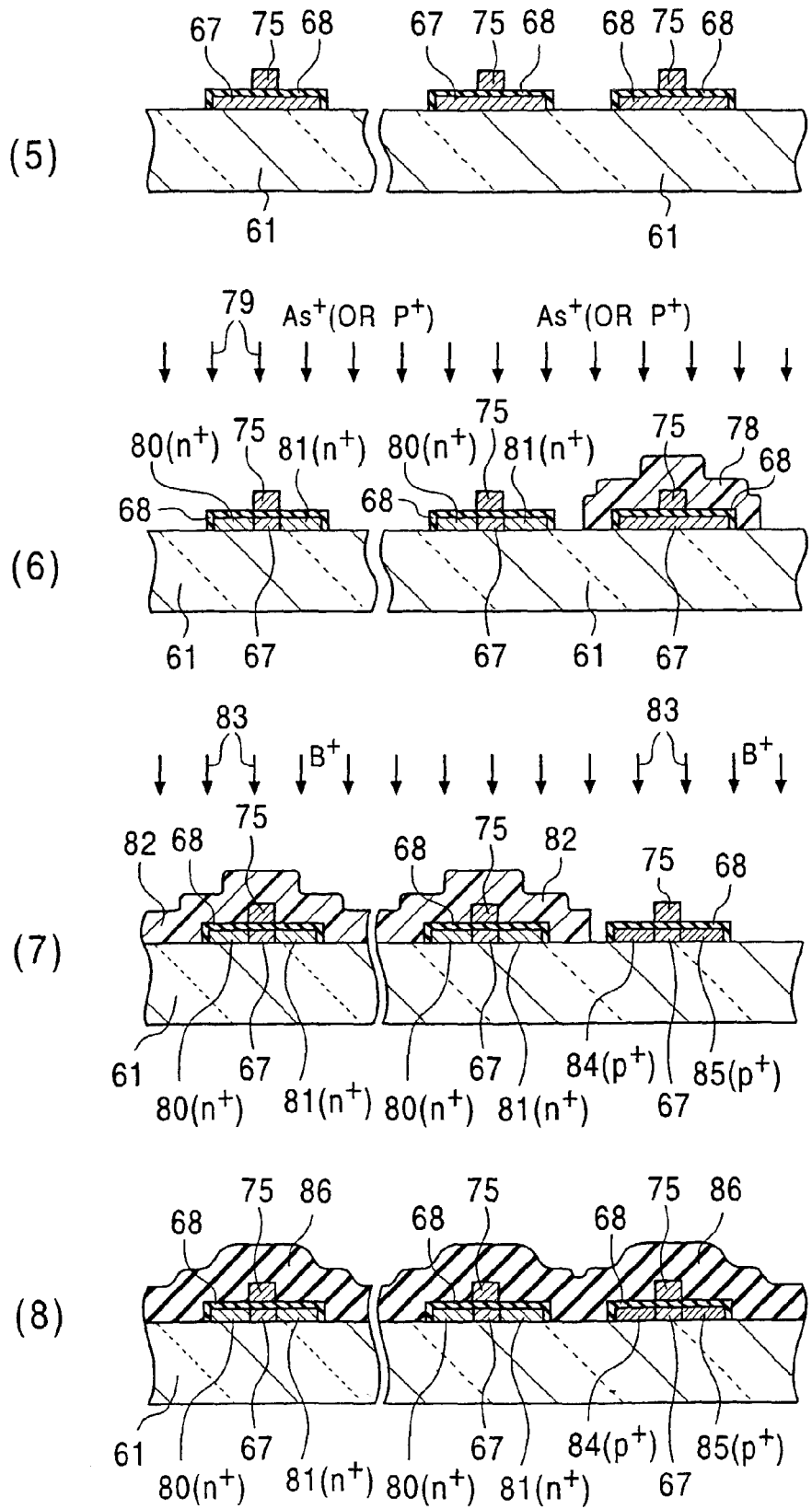
FIG. 35 includes cross-sectional views of the manufacturing process sequentially shown by steps according to the second embodiment.

Next, as shown in FIG. 35(5), as a gate electrode and a gate line material, for example, a Mo—Ta alloy having a thickness of, for example, 400 nm is formed by sputtering, or a phosphorus-doped polycrystalline silicon film having a thickness of, for example, 400 nm is formed by catalytic CVD or the like, similar to that described above, by supplying, for example, 150 sccm of a hydrogen-based carrier gas, 2 to 20 sccm of $PH_3$, and 20 sccm of monosilane gas. In addition, by common photolithographic and etching techniques, the gate electrode material layer is patterned so as to form gate electrodes 75 and gate lines. In the case of the phosphorus-doped polycrystalline silicon film, after a photoresist mask is removed, a silicon oxide film is formed on the phosphorus-doped polycrystalline silicon film 75 in $O_2$ atmosphere by oxidation treatment at, for example, 900° C. for 60 minutes.

Next, as shown in FIG. 35(6), a p-type MOSTFT portion is masked with a photoresist 78, an n-type dopant such as arsenic (or phosphorus) ions 79 is doped at a dose rate of, for example, $1 \times 10^{15}$ atoms/cm$^2$ by ion implantation or ion doping so as to have a donor concentration of $2 \times 10^{20}$ atoms/cc, thereby forming a n$^+$-type source regions 80 and drain region 81 of the n-type MOSTFT.

Next, as shown in FIG. 35(7), n-type MOSTFT portions are masked with a photoresist 82, a p-type dopant such as boron ions 83 is doped at a dose rate of, for example, $1 \times 10^{15}$ atoms/cm$^2$ by ion implantation or ion doping so as to have an acceptor concentration of $2 \times 10^{20}$ atoms/cc, thereby forming a p$^+$-type source region 84 and drain region 85 of the p-type MOSTFT. Subsequently, by annealing in an $N_2$ atmosphere at approximately 900° C. for approximately 5 minutes, the dopant ions doped in the individual regions are activated so that the dopant concentrations are controlled as determined beforehand. In addition, in order to improve the switching properties, n$^-$-type LDDs (Lightly Doped Drain) may be formed in the n-type MOSTFT portion in the display region.

Subsequently, as shown in FIG. 35(8), by catalytic CVD or the like similar to that described above, a silicon oxide film having a thickness of, for example, 50 nm is formed by supplying 150 sccm of a hydrogen-based carrier gas, which is also used for the other CVD processes, 1 to 2 sccm of $O_2$ diluted with helium, and 15 to 20 sccm of $SiH_4$; a phosphine silicate glass (PSG) film having a thickness of, for example, 600 nm is formed by supplying 1 to 20 sccm of $PH_3$, 1 to 2 sccm of $O_2$ diluted with helium, and 15 to 20 sccm of $SiH_4$; and a silicon nitride film having a thickness of, for example, 200 nm is formed by supplying 50 to 60 sccm of $NH_3$ and 15 to 20 sccm of $SiH_4$, thereby forming a laminate, composed of insulating films, which is used for an interlayer insulating film 86. However, the interlayer insulating film may also be formed by a method different from that described above.

Next, as shown in FIG. 36(9), contact widow holes are formed at predetermined positions in the insulating film 86 described above, and an electrode material such as aluminum 1 µm thick is deposited over the entire surface including the individual contact holes at 150° C. by sputtering or the like and is then patterned, thereby forming a source electrode 87 and a data line of the n-type MOSTFT in the pixel portion, and source electrodes 88 and 90 and drain electrodes 89 and 91 of the p-type MOSTFT and the n-type MOSTFT in the peripheral circuit portion, respectively. In this case, aluminum may be deposited by catalytic CVD.

Next, on the surface, an interlayer insulating film 92 composed of a silicon oxide film or the like is formed by CVD or the like, and hydrogenating and sintering treatment is performed in a forming gas at 400° C. for 30 minutes. Subsequently, as shown in FIG. 36(10), a contact hole is formed in the insulating films 92 and 86 in the drain region of the n-type MOSTFT in the pixel portion, and for example, ITO (Indium-tin Oxide: a transparent electrode material formed by doping tin into an indium oxide) is deposited over the entire surface by vacuum deposition and is then patterned, thereby forming a transparent pixel electrode 93 connected to the drain region 81 of the n-type MOSTFT in the pixel portion. Subsequently, heat treatment (at 200 to 250° C. for 1 hour in a forming gas) is performed in order to decrease in contact resistance and improve in ITO transparency.

As described above, an active matrix substrate is formed, and hence, a transmissive type LCD may be formed. As shown in FIG. 36(11), this transmissive type LCD has the structure in which on the transparent pixel electrode 93, an alignment film 94, liquid crystal 95, an alignment film 96, a transparent electrode 97, and a counter substrate 98 are laminated to each other.

The steps described above may also be applied to manufacturing of a reflective type LCD. In FIG. 41(A), an example of this reflective type LCD is shown, and in the figure, reference numeral 101 indicates a reflection mirror formed of aluminum or the like which cover the insulating film 92 having irregularities thereon, and this reflection mirror is connected to a drain of a MOSTFT.

When a liquid crystal cell of this LCD is manufactured by double-side assembly (suitably applied to a medium and a large liquid crystal panel of 2 inches or more), on element mounting surfaces of the TFT substrate 61 and the counter substrate 98 entirely covered with ITO (Indium Tin Oxide) electrode 97, alignment films 94 and 96 composed of polyimide are formed, respectively. These alignment film composed of polyimide are formed by roll coating, spin coating, or the like so as to have a thickness of 50 to 100 nm and is then cured at 180° C. for 2 hours.

Next, the TFT substrate 61 and the counter substrate 98 are processed by rubbing or optical alignment treatment. As a rubbing buff material, there may be mentioned cotton, rayon, or the like, and cotton is reliably used in terms of buff leavings (litter), retardation properties, and the like. Optical alignment is a non-contact alignment technique for liquid crystal using linearly polarized ultraviolet light emission. In alignment, in addition to rubbing treatment, a polymer alignment film may be formed by polarized or non-polarized light which is diagonally incident (as the polymeric compound described above, for example, a polymethyl methacrylate polymer having azobenzene may be mentioned by way of example).

Subsequently, after washing, a common material and a sealing material are applied to the TFT substrate 61 side and the counter substrate 98 side, respectively. In order to remove rubbing buff leavings, washing is performed using water or IPA (isopropyl alcohol). The common material may be an acrylic, an epoxy acrylate, or an epoxy-based adhesive containing conductive fillers, and the sealing material may be an acrylic, an epoxy acrylate, or an epoxy-based adhesive.

A hat curable, ultraviolet curable, and ultraviolet and heat curable type may be used; however, in view of bonding accuracy and workability, a ultraviolet and heat curable type is preferably used.

Next, spacers are scattered at the counter substrate 98 side so as to secure a predetermined gap, and subsequently, the counter substrate is bonded to the TFT substrate 61 at a predetermined position. After alignment marks on the counter substrate 98 side and alignment marks on the TFT substrate 61 side are precisely corresponded to each other, the sealing material is pre-cured by ultraviolet irradiation, and then heat curing is thoroughly performed.

Next, by a scribe and break method, single liquid crystal panels formed of the TFT substrate 61 and the counter substrate 98 bonded thereto are formed.

Next, the liquid crystal 95 is injected in the gap between both substrates 61 and 98, an inlet therefor is sealed with an ultraviolet curable adhesive, and subsequently, washing is performed using IPA. Any type of liquid crystal may be used, and, for example, a high-speed response TN (twisted nematic) mode using nematic liquid crystal is generally used.

Next, by heating and rapid cooling, the liquid crystal 95 is oriented.

Next, flexible wire is connected to a panel electrode lead portion of the TFT substrate 61 by thermal compression bonding of an anisotropic conductive film, and a polarizer is further bonded to the counter substrate 98.

When single-side assembly of a liquid crystal panel (suitably used for a small liquid crystal panel of 2 inches or less) is used, as is the case described above, on element mounting surfaces of the TFT substrate 61 and the counter substrate 98, the alignment films 94 and 96 formed of polyimide are formed, respectively, and both substrates are processed by rubbing or non-contact optical alignment treatment using linearly polarized ultraviolet rays.

Next, each of the TFT substrate 30 and the counter substrate 32 is cut by dicing or a scribe and break method, and then washed with water or IPA. The common agent and the sealing agent containing spacers are applied to the TFT substrate 61 and the counter substrate 98, respectively, and then both substrates are bonded together. The subsequent process may be carried out in accordance with those described above.

In the LCD described above, the counter substrate 98 is a CF (color filter) substrate in which a color filter layer (not shown) is provided below the ITO electrode 97. Incident light from the counter substrate 98 side is efficiently reflected by the reflecting film 93, and may be emitted from the counter substrate 98 side.

On the other hand, when the TFT substrate 61 is provided with a color filter layer so as to serve as a TFT substrate having an on-chip color filter (OCCF) structure, the ITO electrode is bonded to the entire surface of the counter substrate 98 (or the ITO electrode provided with a black mask is bonded to the entire surface).

In the case of a transmissive LCD, by the procedure described below, the on-chip color filter (OCCF) structure and an on-chip black (OCB) structure can be formed.

That is, as shown in FIG. 36(12), an aluminum buried layer for the drain electrode is formed after a window is formed in the insulating film 86 composed of phosphine silicate glass and silicon oxide. Subsequently, individual colors R, G, and B composed of photoresist 99, which contains pigments dispersed therein and has a predetermined thickness (1 to 1.5 μm), are formed in the corresponding segments and are then patterned by common photolithographic technique so that the colors R, G, and B remain at predetermined positions (individual pixel portions) in the corresponding segments, thereby forming individual color filters 99(R), 99(G), and 99(B) (on-chip color filter structure). In this step, windows are formed at the drain portions. An opaque ceramic substrate or glass and heat resistant resin substrates having a low transmittance cannot be used.

Next, a shading layer 100' used as a black mask is formed by patterning metal on the color filter layer including contact holes extending to the drain of a display TFT. For example, a molybdenum film 200 to 250 nm thick is formed by sputtering and is then patterned to form a predetermined shape covering the display MOSTFT for shading (on-chip black structure).

Next, a planarizing film 92 composed of a transparent resin is formed, and in addition, an ITO transparent electrode 93 is formed in a through-hole provided in this planarizing film so as to be in contact with the shading layer 100'.

As described above, by forming color filter 99 and a black mask 100' on the display array portion, the aperture ratio of the liquid crystal display panel is improved, and a lower power consumption of a display module including a backlight can be realized.

Figure 37:
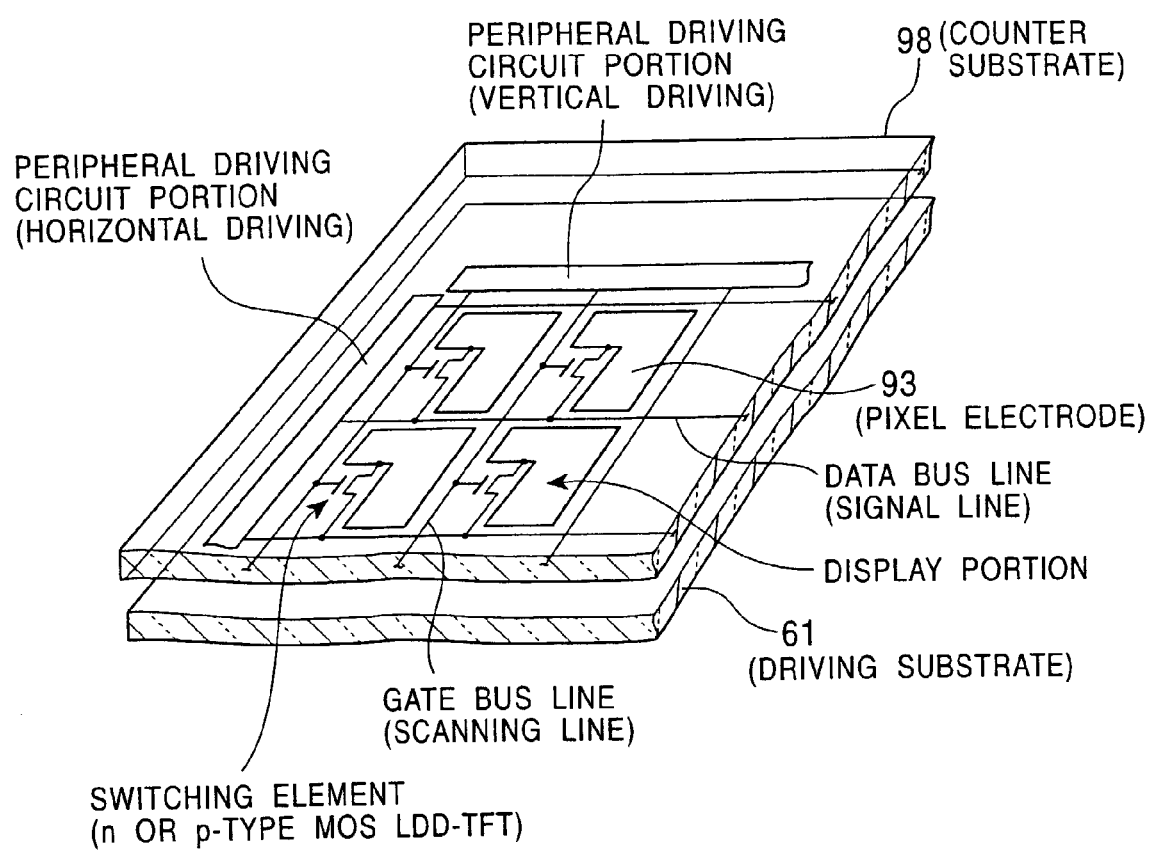
FIG. 37 is a perspective view schematically showing the structure of the entire LCD according to the second embodiment.

FIG. 37 is a schematic view showing the entire active matrix liquid crystal display device (LCD) integrated with a driving circuit including the top gate type MOSTFTs described above. This active matrix LCD has a flat panel configuration in which the main substrate 61 (this forms an active matrix substrate) is bonded to the counter substrate 98 with spacers (not shown) therebetween, and between both substrates 61 and 98, liquid crystal (not shown in this figure) is enclosed. On the surface of the main substrate 61, there are provided display portion composed of pixel electrodes 93 disposed in a matrix and switching elements driving these pixel electrodes and the peripheral driving circuit portion connected to this display portion.

The switching element in the display portion is formed of one of the n-type MOS, p-type MOS, and CMOS described above, these devices being a top gate type MOSTFT having an LDD structure. In addition, in the peripheral driving circuit portion, as circuit elements, one of the CMOS, n-type MOS, and p-type MOSTFT having a top gate type MOSTFT may be used, or the combination thereof may also be used. One of the peripheral driving circuit portions is a horizontal driving circuit which supplies a data signal and drives MOSTFTs of individual pixels on each horizontal line, the other peripheral driving circuit portion is a vertical driving circuit which drives gates of MOSTFTs of individual pixels on each scanning line, and these circuit portions are generally provided at two sides of the display portion. These driving circuits may be a dot-sequential analog system or a line-sequential digital system.

Figure 38:
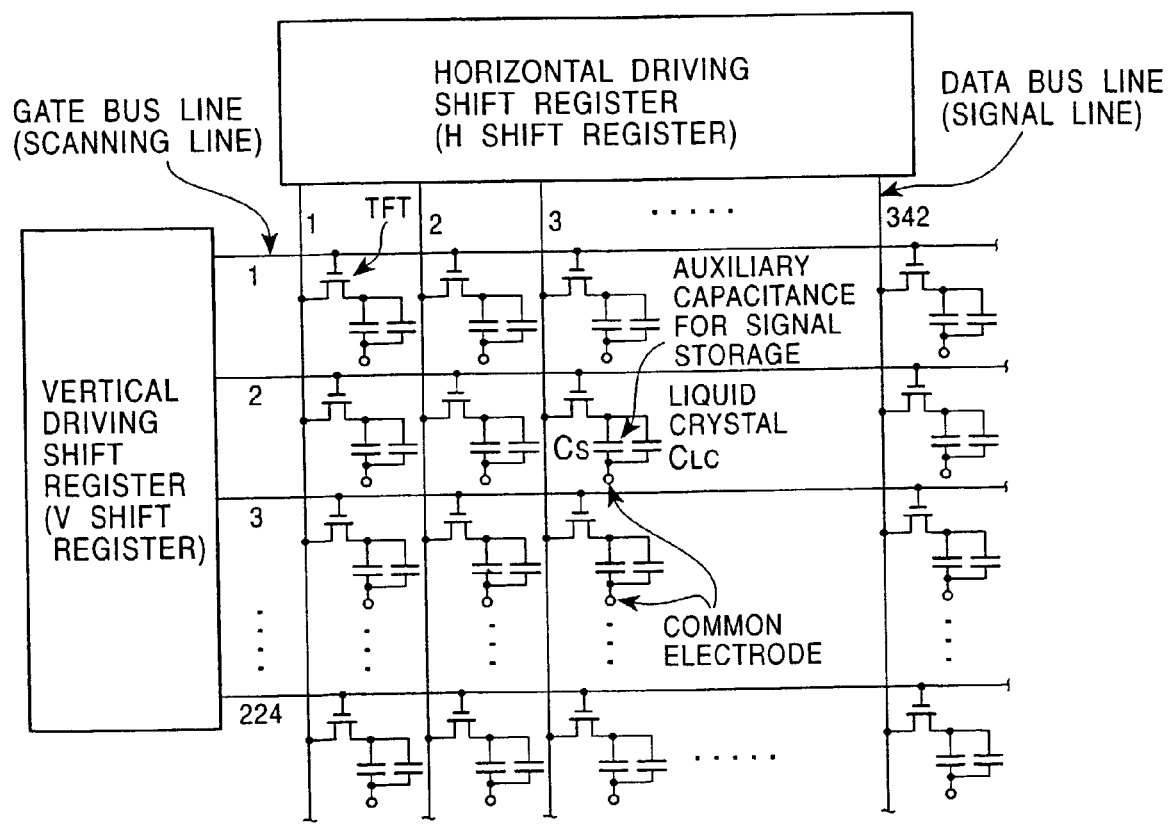
FIG. 38 is an equivalent circuit diagram of the LCD according to the second embodiment.

As shown in FIG. 38, the MOSTFTs are disposed at the intersections of gate bus lines and data bus lines, which intersect each other at right angles, so that image information is written in a liquid crystal capacity ($C_{LC}$) via the MOSTFT, and the charge is retained until next information is input. In this case, since only the channel resistance of TFT is insufficient for retaining the information, in order to compensate for the insufficient channel resistance, a storage capacity (auxiliary capacity) ($C_s$) may be added in parallel with the liquid crystal capacity for suppressing a decrease in the liquid crystal voltage due to a leakage current. Of the MOSTFTs for forming an LCD, characteristics required for TFTs used in the display portion differ from those of TFTs used in the peripheral driving circuit portion, and in particular, for the MOSTFTs in the pixel portion, it is important to control an Off current and to ensure an On current. Accordingly, by forming the MOSTFTs each having an LDD structure in the display portion so that an electric field is not easily applied across the gate and drain, an effective electric field applied to the channel region can be decreased, an off current can be decreased, and the change in properties can also be decreased. However, since problems may arise in that the process therefor becomes complicated, the element size is also increased, and the On current is decreased, an optimum designing must be performed in accordance with individual applications.

As liquid crystal which may be used, in addition to TN liquid crystal (nematic liquid crystal used in a TN mode of active matrix drive), STN (super-twisted nematic), GH (guest-host), PC (phase change), FLC (ferroelectric liquid crystal), AFLC (antiferroelectric liquid crystal), PDLC (polymer dispersion-type liquid crystal), and the like may be used.

<LCD Manufacturing Example 2>

Next, a manufacturing example of an LCD (liquid crystal display device) using a polycrystalline silicon MOSTFT, formed by a low temperature process, of this embodiment will be described (this manufacturing example may be applied to display regions or the like of an organic EL or an FED, which will be described later).

In this embodiment, a low strain point glass, such as aluminosilicate glass or borosilicate glass, or a heat resistant resin such as polyimide is used as the substrate 61, and the steps shown in FIGS. 34(1) and (2) are performed in a manner similar to that in the manufacturing example 1 described above. That is, the polycrystalline silicon thin-film 67 which may (or may not) contain tin is formed on the substrate 61 by catalytic CVD and flash lamp annealing and are then processed so that islands are formed thereon, and subsequently, n-type MOSTFT portions in the display region, and n-type MOSTFT portions and p-type MOSTFT portions in the peripheral driving circuit region are formed. In this case, at the same time, regions of diodes, capacitors, inductances, resistors, and the like are formed. As is the case described above, the process performed hereinafter will be described about MOSTFT; however, it is naturally understood that the process be the same as that for forming the other elements.

Figure 39:
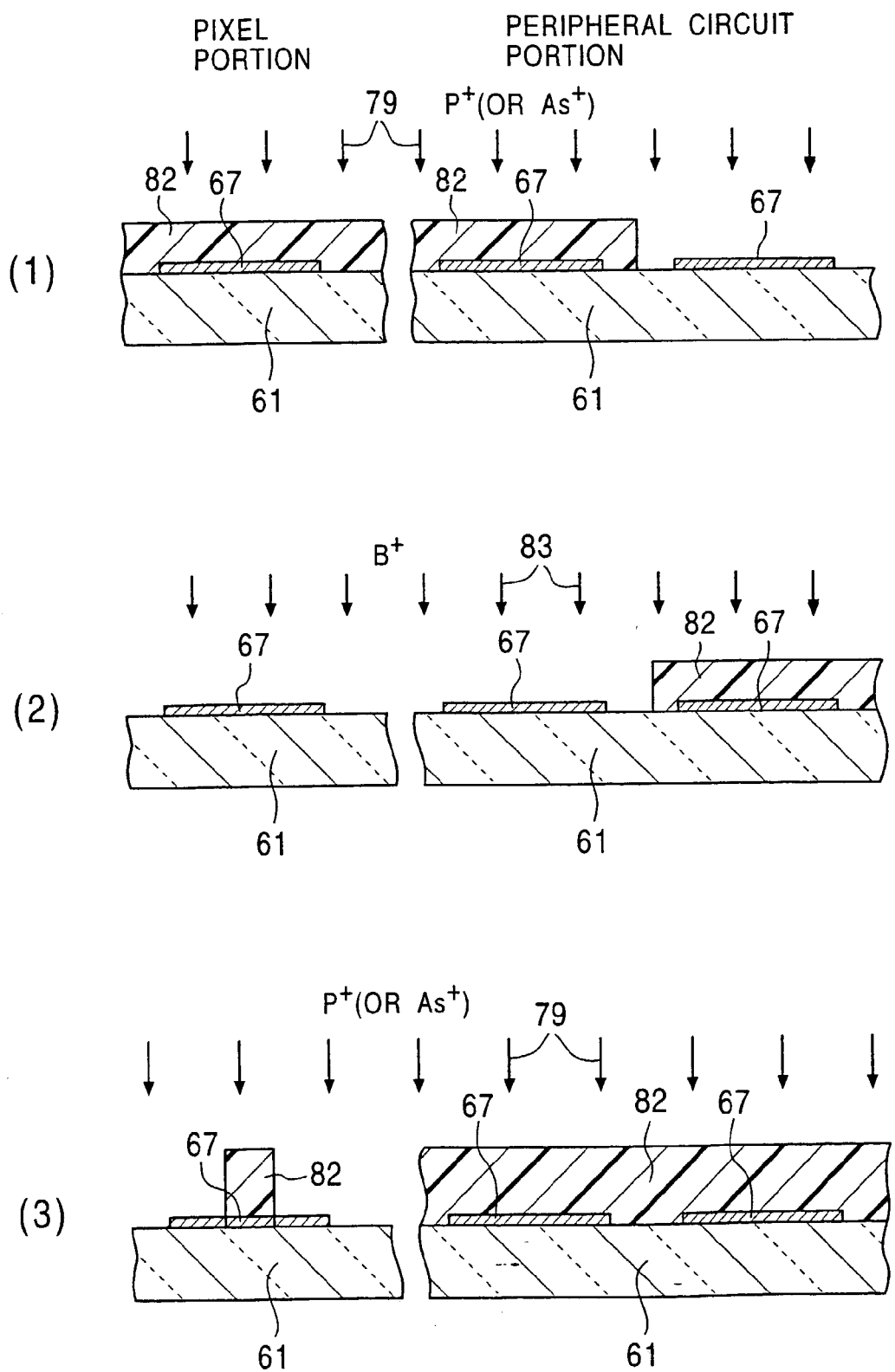
FIG. 39 includes cross-sectional views of another process for manufacturing an LCD sequentially shown by steps according to the second embodiment.

Next, as shown in FIG. 39(1), in order to optimize the $V_{th}$ by controlling dopant concentrations in gate channel regions of the individual MOSTFTs, the n-type MOSTFT portion in the display region and the n-type MOSTFT portion in the peripheral driving circuit region are covered with the photoresist 82, and the n-type dopant 79, such as phosphorus or arsenic, is then doped in the p-type MOSTFT portion in the peripheral driving circuit region at a dose rate of $1\times10^{12}$ atoms/cm$^2$ by ion implantation or ion doping so as to have a donor concentration of $2\times10^{17}$ atoms/cc. In addition, as shown in FIG. 39(2), the p-type MOSTFT portion in the peripheral driving circuit region is covered with the photoresist 82, and the p-type dopant 83 such as boron is then doped in the n-type MOSTFT portion in the display region and the n-type MOSTFT portion in the peripheral driving circuit region at a dose rate of $5\times10^{11}$ atoms/cm$^2$ by ion implantation or ion doping so as to have an acceptor concentration of $1\times10^{17}$ atoms/cc.

Next, as shown in FIG. 39(3), in order to form n$^-$-type LDD (Lightly Doped Drain) of the n-type MOSTFT in the display region for improving switching properties, by common photolithographic technique, the gate portion of the n-type MOSTFT in the display region and the entire p-type MOSTFT and the n-type MOSTFT in the peripheral driving circuit region are covered with the photoresist 82, and in the exposed source and drain regions of the n-type MOSTFT in the display region, the n-type dopant 79 such as phosphorus is dopes at a dose rate of $1\times10^{13}$ atoms/cm$^2$ by ion implantation or ion doping so as to have a donor concentration of $2\times10^{18}$ atoms/cc, thereby forming the n⁻-type LDD portions.

Next, as shown in FIG. 40(4), the entire n-type MOSTFT portion in the display region and the gate portion of the p-type MOSTFT portion in the peripheral driving circuit region are covered with the photoresist 82, and in the exposed source and drain regions, the p-type dopant 83 such as boron is dopes at a dose rate of $1\times10^{15}$ atoms/cm² by ion implantation or ion doping so as to have an acceptor concentration of $2\times10^{20}$ atoms/cc, thereby forming p⁺-type source portion 84 and drain portion 85.

Next, as shown in FIG. 40(5), the p-type MOSTFT portion in the peripheral driving circuit region is covered with the photoresist 82, the gate and the LDD portions of the n-type MOSTFT in the display region and the gate portion of the n-type MOSTFT portion in the peripheral driving circuit region are covered with the photoresist 82, and in the exposed source and drain regions of the n-type MOSTFTs in the display region and in the peripheral driving region, the n-type dopant 79 such as phosphorus or arsenic is dopes at a dose rate of $1\times10^{15}$ atoms/cm² by ion implantation or ion doping so as to have a donor concentration of $2\times10^{20}$ atoms/cc, thereby forming n⁺-type source portions 80 and drain portions 81.

Next, as shown in FIG. 40(6), by plasma CVD, reduced-pressure CVD, catalytic CVD, or the like, as the gate insulating film 68, a laminated film composed of a silicon oxide film (40 to 50 nm thick), a silicon nitride film (10 to 20 nm thick), and a silicon oxide film (40 to 50 nm thick) is formed. Subsequently, RTA treatment is performed at, for example, approximately 1,000° C. for 10 to 20 seconds using halogen lamps or the like so as to activate the n-type and the p-type dopants, thereby obtaining individual dopant concentrations determined beforehand.

Next, an aluminum film containing 1% Si is formed by sputtering over the entire surface to have a thickness of 400 to 500 nm and is then formed into the gate electrodes 75 and gate lines of all MOSTFTs by common photolithographic and etching techniques. Furthermore, by plasma CVD, catalytic CVD, or the like, the insulating film 86, which is a laminate, composed of a silicon-oxide film (100 to 200 nm thick), and a phosphine silicate glass film (PSG) film (200 to 300 nm thick) is formed.

Subsequently, by common photolithographic and etching technique, widow holes are formed in the source and the drain portions of all MOSTFTs of the peripheral driving circuit and in the source portions of the display n-type MOSTFTs. The silicon nitride film is processed by plasma etching using $CF_4$, and the silicon oxide film and the phosphine silicate glass film are etched using a fluorinated etching solution.

Next, as shown in FIG. 40(7), an aluminum film containing 1% Si is formed by sputtering over the entire surface to have a thickness of 400 to 500 nm and is then formed into the source and the drain electrodes 88, 89, 90, and 91 of all MOSTFTs in the peripheral driving circuit by common photolithographic and etching techniques, and simultaneously, the source electrodes 87 of the display n-type MOSTFT and data lines are formed.

Next, although no shown in the figure, by plasma CVD, reduced-pressure CVD, catalytic CVD, or the like, a silicon oxide film (100 to 200 nm thick), a phosphine silicate glass film (200 to 300 nm thick), and a silicon nitride film (100 to 300 nm thick) are formed over the entire surface, and hydrogenating and sintering treatment is then performed in a forming gas at approximately 400° C. for 1 hour. Subsequently, windows are formed at the drain portions of the display n-type MOSTFTS.

In the step described above, when a silicon nitride film (500 to 600 nm) for passivation, containing a large amount of hydrogen, is formed by plasma CVD for forming the laminate structure, by hydrogenating treatment at 420° C. for approximately 30 minutes in a nitrogen or a forming gas, the carrier mobility can be improved due to improvement in interface properties by hydrogen diffusion in the silicon nitride film for passivation and improvement in crystallinity at dangling bonds of the polycrystalline silicon thin-film. In this step, since a silicon nitride film tends to trap hydrogen therein, in order to improve the effect of hydrogenating treatment, the structure in which a polycrystalline silicon thin-film is sandwiched between silicon nitride films, as in this embodiment, that is, a laminate formed of a glass substrate, a protective silicon nitride film for blocking Na ions+a silicon oxide film, a polycrystalline silicon thin-film, a gate insulating film (a silicon oxide film or the like), a gate electrode, a silicon oxide film, and a silicon nitride film for passivation, is preferably use (this structure is also preferable in other examples). In this case, by hydrogenating treatment, silicon sintering treatment of the aluminum alloy films containing 1% Si and silicon in the source and drain regions are simultaneously performed, thereby obtaining ohmic contacts.

When the LCD is a transmissive type, the silicon oxide film, the phosphine silicate glass film, and the silicon nitride film in the pixel aperture portions are removed, and when the LCD is a reflective type, it is not necessary to remove the silicon oxide film, the phosphine silicate glass film, and the silicon nitride film in the pixel aperture portions (these are applied to the LCDs described above or below).

In the case of transmissive type, as is the case shown in FIG. 36(10), after an acrylic transparent resin planarizing film 2 to 3 μm thick is formed over the entire surface by spin coating or the like, and windows are formed in the transparent resin at the drain side of the display MOSTFTs by common photolithographic and etching techniques, an ITO sputtering film 130 to 150 nm thick is formed over the entire surface, and ITO transparent electrodes connected to the drain portions of the display MOSTFTs are formed by common photolithographic and etching techniques. In addition, heat treatment (200 to 250° C. for 1 hour in a forming gas) is performed so that the contact resistance is decreased, and that the ITO transparency is improved.

In the case of reflective type, after a photosensitive resin film 2 to 3 μm thick is formed over the entire surface by spin coating or the like, by common photolithographic and etching techniques, an irregular pattern is formed at least in the pixel portions, and an irregular underlying portion is formed by reflow. Simultaneously, windows are formed in the photoresist resin film at the drain portions of the display n-type MOSTFTS. Subsequently, an aluminum sputtering film 300 to 400 nm thick containing 1% Si is formed over the entire surface, and by common photolithographic and etching techniques, the entire aluminum film other than that provided on the pixel portions is removed, thereby forming an aluminum reflecting portions having irregular shape connected to the drain electrodes of the display n-type MOSTFTS. Subsequently, sintering treatment is performed at 300° C. for 1 hour in a forming gas.

In the case described above, when flash lamp annealing is performed after the sources and the drains of the MOSTFTs are formed, the film temperature of the low-crystallization silicon thin-film is locally increased, the crystallization is facilitated, and hence, a high quality polycrystalline silicon thin-film having high mobility can be formed. At the same time, since phosphorus, arsenic, boron ions, or the like doped in the gate channel, source, and drain regions are activated, and hence, the productivity may be improved in some cases.

<Bottom Gate Type or Dual Gate Type MOSTFT>

In LCDs or the like incorporating MOSTFTs, instead of the top gate type described above, an example of manufacturing a transmissive type LCD using bottom gate type and dual gate type MOSTFTs will be described (however, a reflective type LCD can also be manufactured by the same method as described below).

As shown in FIG. 41(B), bottom gate type MOSTFTs are provided in the display portion and in the peripheral portion, or as shown in FIG. 41(C), in the display portion and in the peripheral portion, dual gate type MOSTFTs are provided. Of these bottom gate and the dual gate MOSTFTs, in particular, in the case of the dual gate type, since the driving capability can be improved by the top and the bottom gates, the dual gate type is suitably used for a high-speed switching and a high-current driving large panel and, in addition, may be operated as a top gate type or a bottom gate type by selectively using one of the top and the bottom gates.

In a bottom gate type MOSTFT shown in FIG. 41(B), reference numeral 102 in the figure indicates a gate electrode composed of heat resistant Mo or Mo—Ta alloy, reference numeral 103 indicates a silicon nitride film, reference numeral 104 indicates a silicon oxide film, these two films forming a bottom gate insulating film, and on this gate insulating film, a channel region or the like using the polycrystalline silicon thin-film 67 equivalent to that used for the top gate type MOSTFT is formed. In addition, in the dual gate type MOSTFT shown in FIG. 41(C), the bottom gate portion thereof is equivalent to that of the bottom gate type MOSTFT; however, in the top gate portion, a gate insulating film 106 is formed of a silicon oxide film, a laminate composed of silicon oxide and silicon nitride, or a laminate of silicon oxide, silicon nitride, and silicon oxide film, and on this insulating film, the top gate electrode 75 is formed.

<Manufacturing of Bottom Gate Type MOSTFT>

First, a sputtering film of heat resistant Mo or an Mo—Ta alloy having a thickness of 300 to 400 nm is formed on the entire surface of the glass substrate 61 and is then processed by taper etching at an angle of 20 to 45° by common photolithographic and etching techniques so as to form bottom gate electrodes 102 at least in the TFT forming regions, and at the same time, gate lines are also formed. The selection of a glass material may be performed in accordance with the case of the top gate type described above.

Next, by vapor-phase growth, such as plasma CVD, catalytic CVD, or reduced-pressure CVD, the silicon nitride film 103 and the silicon oxide film 104, which are used as a protective, gate insulating film, and the microcrystalline silicon thin-film 67A, which may or may not contain tin and contains amorphous silicon, are formed. In addition, this film is formed into the polycrystalline silicon thin-film 67 which may or may not contain tin by performing flash lamp annealing, as in the case described above. These vapor-phase film forming conditions are equivalent to those for the top gate type described above. In addition, the silicon nitride film used as the bottom gate insulating film and the protection film is formed so as to stop sodium ions from the glass substrate; however, when synthetic quartz glass is used, the silicon nitride film is not necessary. As is the case described above, the reflection-reflecting, protective film (a silicon oxide film or the like) may be formed on the low-crystallization silicon thin-film 67A and may be processed by flash lamp annealing. In addition, after islands are formed for MOSTFT forming regions or the like, flash lamp annealing may be performed.

Subsequently, as is the case described above, in order to optimize the $V_{th}$ by controlling the dopant concentrations in individual channel regions after islands (however, one of the regions is only shown in the figure: hereafter, the same as above) are formed for the p-type MOSTFT and the n-type MOSTFT regions by common photolithographic and etching techniques, an appropriate amount of an n-type or a p-type dopant is doped by ion implantation or ion doping, and furthermore, in order to form the source and the drain regions of the individual MOSTFTs, an appropriate amount of an n-type or a p-type dopant is doped by ion implantation or ion doping. Subsequently, annealing is performed by RTA or the like for activating these dopants.

The process performed hereinafter is equivalent to that described above.

<Manufacturing of Dual Gate Type MOSTFT>

As is the bottom gate type described above, the bottom gate electrodes 102, bottom gate lines, the bottom gate insulating films 103 and 104, the polycrystalline silicon thin-film 67 which may or may not contain tin are formed. The silicon nitride film 103 used as the bottom gate insulating film and the protection film is formed so as to serve stopping sodium ions from the glass substrate; however, when synthetic quartz glass is used, the silicon nitride film is not necessary. As is the case described above, the reflection-reflecting, protective film (a silicon oxide film or the like) may be formed on the low-crystallization silicon thin-film 67A and may be processed by flash lamp annealing. In addition, after islands are formed for the MOSTFT forming regions or the like, flash lamp annealing may be performed.

Subsequently, as in the case described above, after islands are formed for the p-type MOSTFT and the n-type MOSTFT regions by common photolithographic and etching techniques, in order to optimize the $V_{th}$ by controlling the dopant concentrations in individual channel regions, an appropriate amount of an n-type or a p-type dopant is doped by ion implantation or ion doping, and furthermore, in order to form the source and the drain regions of the individual MOSTFTs, an appropriate amount of an n-type or a p-type dopant is doped by ion implantation or ion doping. Subsequently, annealing is performed by RTA or the like for activating these dopants.

Next, a silicon oxide film, a laminate of silicon oxide film and a silicon nitride film, or a laminate of silicon oxide film, a silicon nitride film, and a silicon oxide film is formed as the top gate insulating film 106. The vapor-phase deposition conditions are equivalent to those for the top gate type.

Next, an aluminum film containing 1% Si is formed by sputtering over the entire surface to have a thickness of 400 to 500 nm and is then formed into the top gate electrodes 75 and top gate lines of all MOSTFTs by common photolithographic and etching techniques. Subsequently, by plasma CVD, catalytic CVD, or the like, a silicon oxide film (100 to 200 nm thick), a phosphine silicate glass (PSG) film (200 to 300 nm thick), and a silicon nitride film (100 to 300 nm thick) are deposited so as to form the multilayer insulating film 86. Subsequently, windows are formed at the source and the drain electrode portions of all MOSTFTs in the peripheral driving circuit and at the source electrode portions of the display n-type MOSTFTs.

Next, an aluminum film containing 1% Si is formed by sputtering over the entire surface to have a thickness of 400 to 500 nm, and by common photolithographic and etching techniques, the aluminum electrodes 87 and 88 of the sources and drains of all MOSTFTS in the peripheral driving circuit and the aluminum electrodes 89, source lines, and wires of the display n-type MOSTFTs are formed. Subsequently, sintering treatment is performed at approximately 400° C. for 1 hour in a forming gas. Next, as in the case described above, after an insulating film is formed over the entire surface, transparent pixel electrodes composed of ITO film or the like connected to the drain electrode portions of the display n-type MOSTFTs are formed.

As described above, according to this embodiment, as in the first embodiment described above, by a vapor-phase growth such as catalytic CVD or plasma CVD and flash lamp annealing, the polycrystalline silicon thin-film can be formed, in which the carrier mobility is high, the control of the $V_{th}$ is easily performed, and high speed operation can be performed at low resistance. In addition, the gate channel, source, and drain regions of the MOSTFTs of the display portion and the peripheral driving circuit portion of the LCD are formed of this polycrystalline silicon thin-film. According to the top gate type, bottom gate type, and the dual gate type liquid crystal devices using this polycrystalline silicon thin-film, the configuration in which a display portion provided with an LDD structure having superior switching properties and low leakage current is integrated with peripheral circuits, such as high-performance driving circuits, image signal processing circuits, memory circuits or the like can be realized, and as a result, an inexpensive liquid crystal panel having high image quality, highly fine display, narrow picture frame, and high efficiency can be realized.

In addition, since formation can be performed at a low temperature (300 to 400° C.), a low strain point glass or a heat resistant resin substrate, which is inexpensive and is easily formed into large substrates, can be used, and hence, cost reduction can be realized. In addition, by forming color filters and a black mask on the array portions, the aperture ratio, illuminance, and the like of the liquid crystal panel are improved, no color filter substrate is required, and cost reduction can be realized due to improvement in productivity.

<LCD Manufacturing Example 3>

Figure 42:
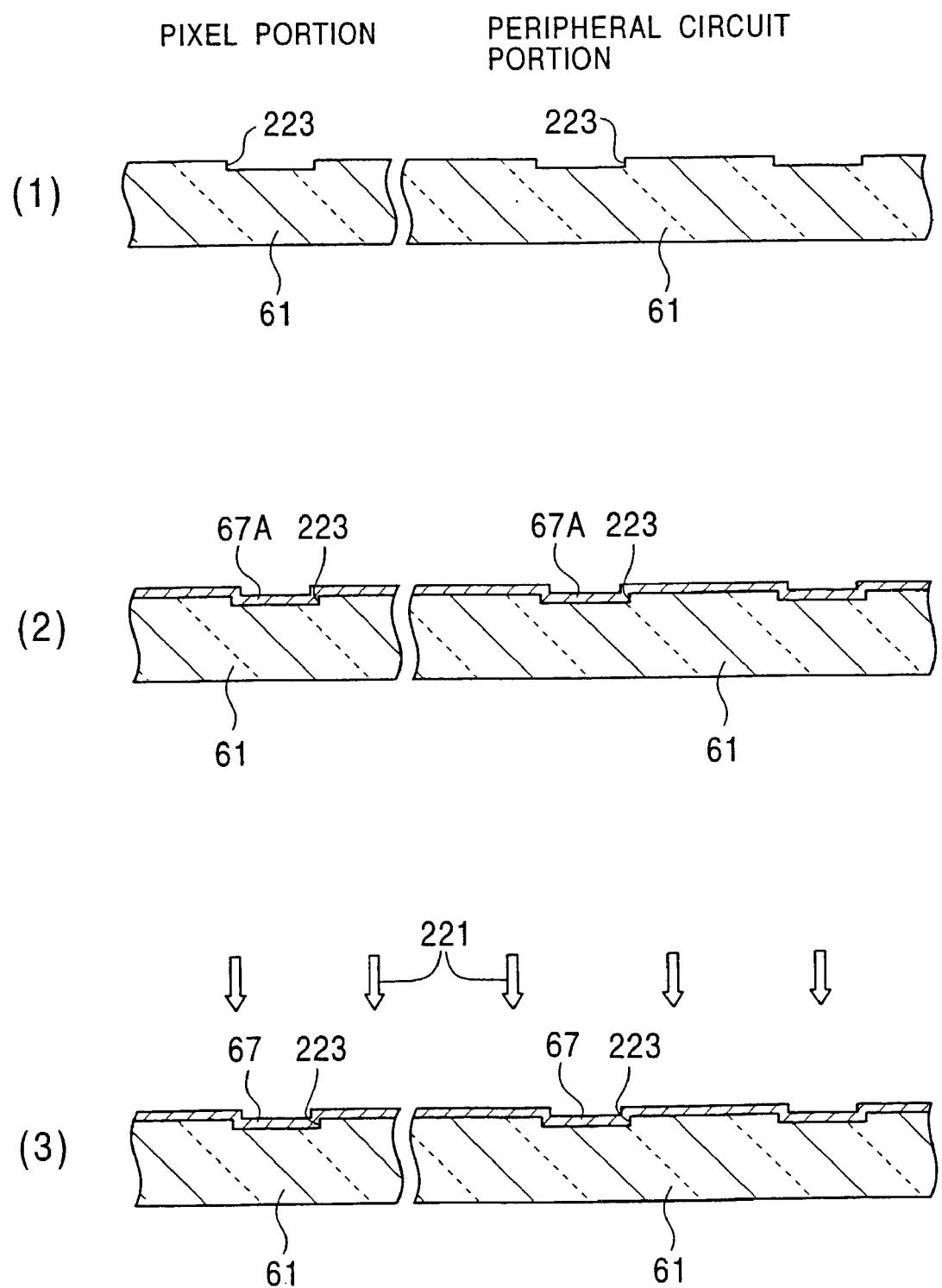
FIG. 42 includes cross-sectional views of another process for manufacturing an LCD sequentially shown by steps according to the second embodiment.

FIGS. 42 to 44 include views showing another manufacturing example of an active matrix LCD.

First, as shown in FIG. 42(1), at least in the TFT forming regions on one major surface of the insulating substrate 61 composed of borosilicate glass, aluminosilicate glass, quartz glass, transparent crystallized glass, or the like, a photoresist having a predetermined pattern is formed. Subsequently, by using common photolithographic and etching techniques such as reactive ion etching (RIE), the substrate is irradiated with $F^+$ ions formed by $CF_4$ plasma using the photoresist as a mask, and as a result, a plurality of recess portions, which is provided with a step 223 and has an appropriate shape and dimensions, are formed in the substrate 61.

The step 223 is a seed used for graphoepitaxial growth of single crystalline silicon described below. The step may have a depth d of 0.01 to 0.03 μm, a width w of 1 to 5 μm, and a length of (direction perpendicular to the plane) 5 to 10 μm, and the angle (base angle) of the step, which is formed by the bottom surface and the side surface thereof, is a right angel. In addition, in order to prevent diffusion of Na ions or the like from the glass substrate, a silicon nitride film (50 to 200 nm thick) and a silicon oxide film (300 to 400 nm thick) are continuously formed beforehand on the surface of the substrate 1, and the plurality of recess portions, which are provided with steps and which have an appropriate shape and dimensions, may be formed in this silicon oxide film.

Next, as shown in FIG. 42(2), after the photoresist is removed, the low-crystallization silicon thin-film 67A having a thickness of 50 nm, which may or may no contain a Group IV element such as tin, is formed over the entire one major surface of the insulating substrate 61 including the steps 223.

Next, as shown in FIG. 43(3), while the low-crystallization silicon thin-film 67A is placed in a fusion state by flash emission 221 performed for flash lamp annealing and is then slowly cooled, single crystalline silicon thin-film 67 is grown in accordance with graphoepitaxial growth from the corners of the bottom surface of the steps 223, which are used as a seed, not only in the recesses but also on the peripheral portions thereof in the lateral direction. In the above step, as in the case described above, after the low-crystallization silicon thin-film is covered with a reflection-reducing, protective, insulating film and is further processed so that islands are formed thereon, this flash lamp annealing may be performed. By repeating this flash lamp annealing and formation of the low-crystallization semiconductor thin-film so as to form a laminate, a single crystalline semiconductor thick film having a thickness in the order of micrometers may be formed (hereafter, the same as described above).

As described above, for example, the (100) plane of the single crystalline silicon thin-film 67 is grown on the substrate in accordance with graphoepitaxial growth. In this case, the step 223 serves as a seed for epitaxial growth, which is called graphoepitaxial growth, by high energy of flash lamp annealing and facilitates the growth, thereby forming the single crystalline silicon thin-film 67 (approximately 50 nm thick) having higher crystallinity. Related to this, as shown in FIG. 43, when a vertical wall similar to the above step 223 is formed on the amorphous substrate (glass) 61, and an epitaxy layer is formed thereon, although crystals having random plane directions as shown in FIG. 43(a) are grown as shown in FIG. 43(b), that is, the (100) plane thereof is epitaxially grown along the surface of the step 223. In addition, by changing the shape of step described above as shown in FIGS. 44(a) to (f), the plane orientation of grown layers can be controlled. When MOS transistors are formed, the (100) plane is mostly used. That is, concerning the cross-sectional shape of the step 223, the angle (base angle) at the corner of the bottom surface may be a right angle or may be inclined inwardly or outwardly from the top edge to the bottom edge, and after all, the step may have a specific plane direction so that the crystal is easily grown. It is preferably that the base angle of the step 223 be 90° or less in general, and that the corner portions of the bottom surface have a slight curvature.

As described above, after the single crystalline silicon thin-film 67 is formed on the substrate 61 by graphoepitaxial growth in flash lamp annealing, a top gate type MOSTFT in which the single crystalline silicon thin-film 67 (approximately 50 nm thick) is used as an active layer is formed in a manner equivalent to that described above.

In addition, after a heat resistant resin substrate such as polyimide is used as the substrate 61, recesses which are provided with steps 223 having a predetermined size and dimensions are formed at least in the TFT forming regions on the substrate, the same process as described above may be performed. For example, a mold provided with protrusions having predetermined dimensions and a shape, for example, 0.03 to 0.05 μm high, 5 μm wide, and 10 μm long is stamped on a polyimide substrate 100 μm thick, thereby forming recesses having the dimensions and shape approximately equivalent to those of the mold. Alternatively, a heat resistant resin film (5 to 10 µm thick) such as polyimide is formed on a metal plate such as stainless steel used as a reinforcing material by coating, screen printing, or the like, and a mold provided with protrusions having predetermined dimensions and a shape, for example, 0.03 to 0.05 µm high, 5 µm wide, and 10 µm long, is stamped on the resin film described above, thereby forming recesses having the dimensions and shape approximately equivalent to those of the mold. Hereinafter, the formation of the single crystalline silicon thin-film and the formation of the MOSTFTs are performed by the steps similar to those described above.

As described above, according to this embodiment, by forming the recesses provided with the steps 223 having a predetermined shape and dimensions in the substrate 61, and by performing graphoepitaxial growth by flash lamp annealing using the recesses as a seed, the single crystalline silicon thin-film 67 having high carrier mobility can be obtained, and hence, an LCD incorporating a high performance driver therein can be manufactured.

<LCD Manufacturing Example 4>

Figure 45:
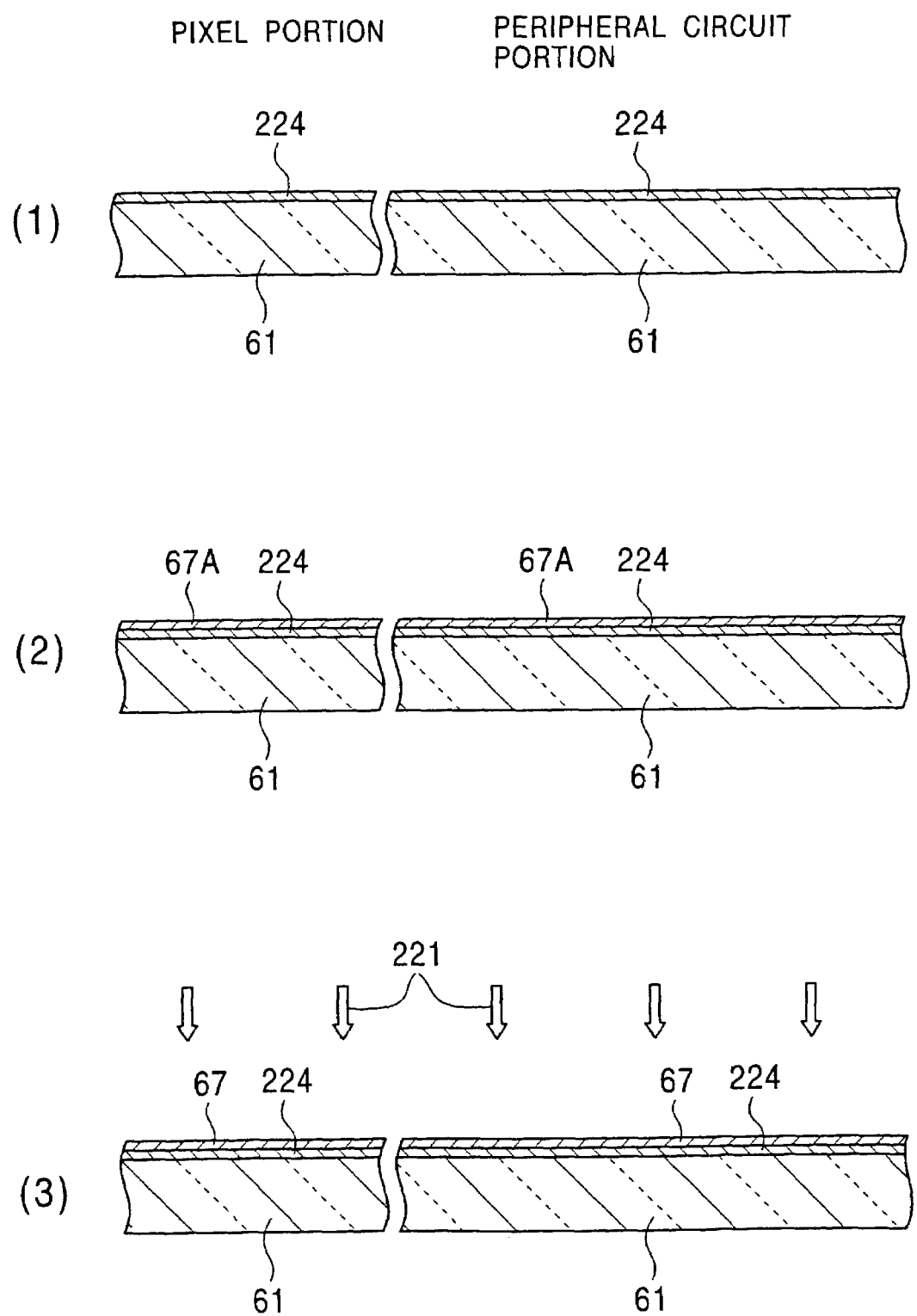
FIG. 45 includes cross-sectional views of another process for manufacturing an LCD sequentially shown by steps according to the second embodiment.

FIG. 45 includes views showing still another manufacturing example of an active matrix LCD.

First, as shown in FIG. 45(1), at least in the FTF forming regions on one major surface of an insulating substrate 61, a crystalline sapphire thin-film (a thickness of 10 to 200 nm) 224 having good lattice matching properties with single crystalline silicon is formed. By high density plasma CVD, catalytic CVD, or the like, this crystalline sapphire thin-film 224 is formed by oxidizing trimethyl aluminum with an oxidizing gas (oxygen, moisture, ozone, or the like) followed by crystallization. As the insulating substrate 61, a high heat resistant glass substrate formed of quartz glass or the like, a low strain point glass substrate formed of borosilicate glass, aluminosilicate glass, or the like, a heat resistant resin substrate formed of polyimide or the like, or the like may be used.

Next, as shown in FIG. 45(2), by catalytic CVD, plasma CVD, or the like, a low-crystallization silicon thin-film 67A having a thickness of, for example, 50 nm is formed on the crystalline sapphire thin-film 224.

Next, as shown in FIG. 45(3), while the low-crystallization silicon thin-film 67A is placed in a fusion state by flash emission 221 performed in flash lamp annealing and is then slowly cooled, single crystalline silicon thin-film 67 is grown in accordance with heteroepitaxial growth using the crystalline sapphire thin-film 224 as a seed. In the above step, as in the case described above, after the low-crystallization silicon thin-film is covered with a reflection-reducing, protective, insulating film and is further processed so that islands are formed thereon, this flash lamp annealing may be performed. That is, since the crystalline sapphire thin-film 224 has good lattice matching properties with single crystalline silicon, a specific plane, such as the (100) plane, of the single crystalline silicon is effectively grown on the substrate in accordance with heteroepitaxial growth by using the sapphire thin-film 224 as a seed. In the case described above, when the step 223 described above is formed, and the crystalline sapphire thin-film 224 is grown on a surface including the step 223, by heteroepitaxial growth in cooperation with graphoepitaxial growth starting from the step 223, the single crystalline silicon thin-film 67 having higher crystallinity can be obtained. In addition, by repeating flash lamp annealing and formation of a low-crystallization semiconductor thin-film so as to form a laminate, a single crystalline semiconductor thick film having a thickness in the order of micrometers may be formed.

As described above, after the single crystalline silicon thin-film 67 is formed on the substrate 61 by heteroepitaxial growth in flash lamp annealing, a top gate type MOSTFT in which the single crystalline silicon thin-film 67 (approximately 50 nm thick) is used as an active layer is formed in a manner equivalent to that described above.

As described above, according to this embodiment, by performing heteroepitaxial growth by flash lamp annealing using the crystalline sapphire thin-film 224 provided on the substrate 61 as a seed, the single crystalline silicon thin-film 67 having high carrier mobility can be obtained, and hence, an LCD incorporating a high performance driver therein can be manufactured.

In addition, since the above-mentioned material layer, such as the crystalline sapphire thin-film 224, serves as a barrier against diffusion of various atoms, the diffusion of impurities from the glass substrate 61 can be prevented. Since this crystalline sapphire thin-film has a sodium ion stopping effect, when the thickness thereof is sufficiently large, at least a silicon nitride film among the underlying protection films can be omitted.

Instead of the crystalline sapphire thin-film, a material layer, having a function substantially equivalent thereto, formed of at least one selected from the group consisting of a spinel material, calcium fluoride, strontium fluoride, barium fluoride, boron phosphide, yttrium oxide, and zirconium oxide may be formed.

Third Embodiment

In this embodiment, the present invention is applied to an organic or an inorganic electroluminescent (EL) display devices, such as an organic EL display device. Hereinafter, the structural examples and the manufacturing examples will be described. In this embodiment, a top gate type MOSTFT will be described, and it is naturally understood that the present invention be applied to a bottom gate type or a dual gate type MOSTFT.

<Structural Example I of Organic EL Element>

As shown in FIGS. 46(A) and (B), according to this structural example I, by using a polycrystalline silicon thin-film (or a single crystalline silicon thin-film: hereinafter, the polycrystalline silicon thin-film will be described by way of example; however, the same description thereof can also be applied to the single crystalline silicon thin-film), which may or may not contain tin and which has a large grain size and high crystallinity, formed on a substrate 111 composed of glass or the like by the method described above according to the present invention, gate channel regions 117, source regions 120, and drain regions 121 of a switching MOSTFT 1 and a current driving MOSTFT 2 are formed. In addition, gate electrodes 115 are formed on the gate insulating film 118, on the source and the drain regions, the source electrodes 127 and the drain electrodes 128 and 131 are formed. The drain of the MOSTFT 1 is connected to the gate of the MOSTFT 2 via the drain electrode 128, capacitor C is formed between drain of the MOSTFT 1 and the source electrode 127 of the MOSTFT 2 with an insulating film 136 therebetween, and the drain electrode 131 of the MOSTFT 2 extends to a cathode 138 of an organic EL element. In this case, an LDD portion may be formed in the switching MOSTFT 1 so as to improve the switching properties.

The individual MOSTFTs are covered with an insulating film 130, on this insulating film, for example, a green organic light-emitting layer 132 (or a blue organic light-emitting layer 133, or a red organic light-emitting layer, not shown in the figure) of the organic EL element is formed so as to cover the cathode, an anode (first layer) 134 is formed so as to cover this organic light-emitting layer, and in addition, a common anode (second layer) 135 is further formed over the entire surface. In this embodiment, a method for manufacturing a peripheral driving circuit, an image signal processing circuit, a memory circuit, or the like formed of CMOSTFTs is performed in a manner equivalent to that for the liquid crystal display device described above (hereafter, the same as described above).

In the organic EL display portion of this structure, the organic EL light-emitting layer is connected to the drain of the current driving MOSTFT 2, the cathode (Li—Al, Mg—Ag, or the like) 138 is provided on the surface of the substrate 111 compose of glass or the like, and the anodes (ITO film or the like) 134 and 135 are provided thereon, so that an upper surface emission 136 type is formed. In addition, when the cathode covers the MOSTFTs, the light emission area is increased, and the cathode serves as a shading film in this case so that emission light does not enter the MOSTFTS, degradation of TFT properties does not occur.

In addition, as show in FIG. 46(C), when a black mask portion (chromium, chromium dioxide, or the like) 140 is formed around the periphery of each pixel portion, light leakage (crosstalk or the like) can be prevented, and the contrast can be improved.

In addition, by a method for using three color light-emitting layers, that is, green, blue, and red, in the pixel display portions, a method for using color conversion layers, and a method for using a color filter for a white light-emitting layer, superior full color organic EL display device can be realized. In addition, by a spin coating method for polymer materials used as individual light-emitting materials or vacuum heating deposition of a metal complex, full color organic EL portions having longer life, high accuracy, high quality, and high reliability can be formed at a good productivity rate, and hence, cost reduction can be realized (hereafter, the same as described above).

Figure 47:
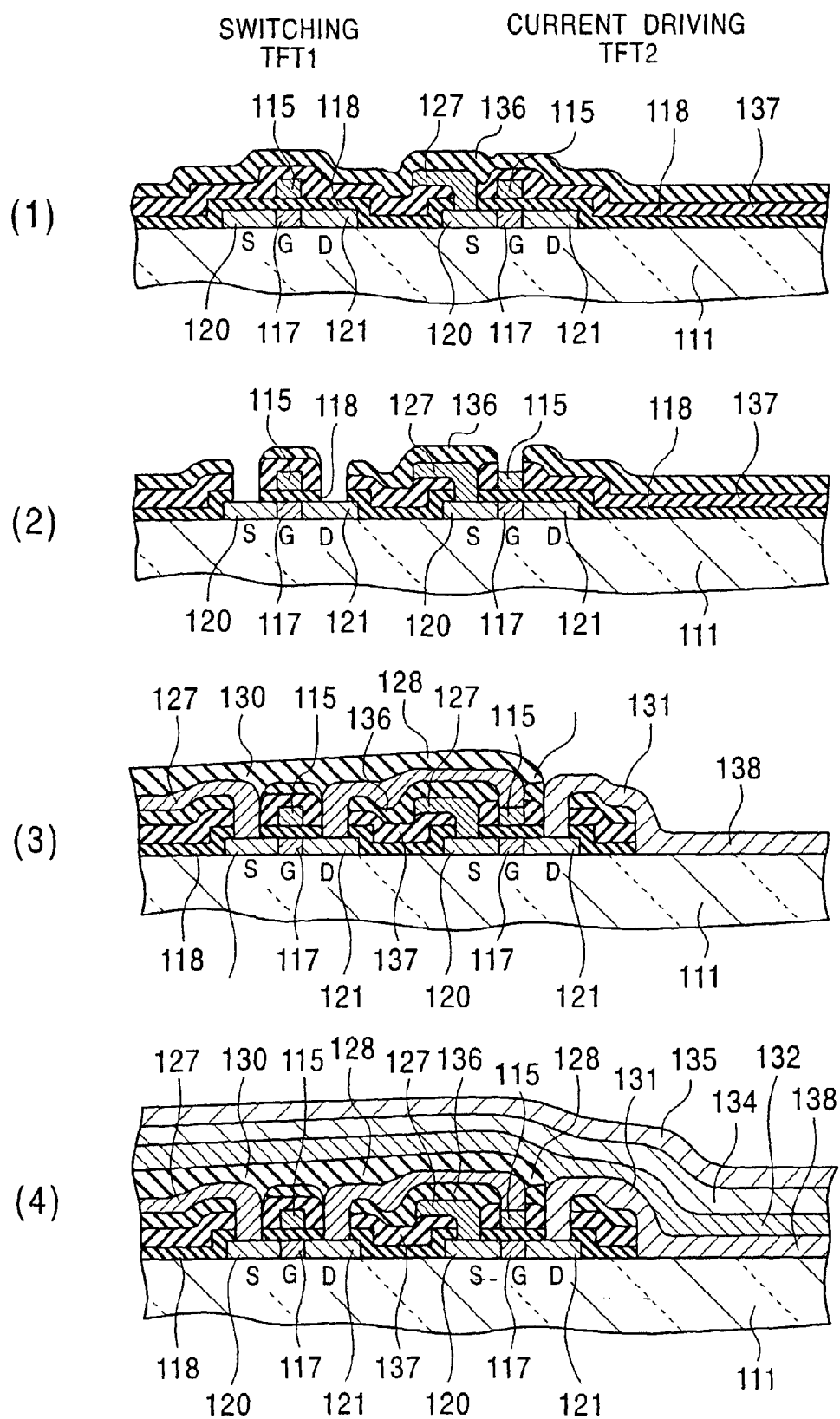
FIG. 47 includes cross-sectional views of a process for manufacturing the organic EL display device sequentially shown by steps according to the third embodiment.

Next, a process for manufacturing this organic EL element will be described. First, as shown in FIG. 47(1), after the source regions 120, the channel regions 117, and the drain regions 121 are formed from the polycrystalline silicon thin-film by the steps described above, the gate insulating film 118 is formed, the gate electrodes 115 of the MOSTFTs 1 and 2 are formed on the insulating film 118 by sputtering of a Mo—Ta alloy or the like and by common photolithographic and etching techniques, and at the same time, a gate line connected to the gate electrode of the MOSTFT 1 is formed. Next, after an overcoat film (a silicon oxide film or the like) 137 is formed by vapor-phase growth such as catalytic CVD (hereafter, the same as above), the source electrode 127 and an earth line of the MOSTFT 2 are formed by sputtering of a Mo—Ta alloy or the like and by common photolithographic and etching techniques, and in addition, an overcoat film (a laminate of silicon oxide and silicon nitride) 136 is formed. By RTA (Rapid Thermal Anneal) treatment (for example, approximately 1,000° C. for 30 seconds) using a halogen lamp or the like, an n-type or a p-type dopant, which has been ion-doped, is activated.

Next, as shown in FIG. 47(2), after windows are provided at the source and the drain portions of the MOSTFT 1 and the gate portion of the MOSTFT 2, as shown in FIG. 47(3), by a sputtering film-forming technique using Al containing 1% Si and by common photolithographic and etching techniques, the drain electrode of the MOSTFT 1 and the gate electrode of the MOSTFT 2 are connected to each other by an Al wire 128 containing 1% Si, and at the same time, the source electrode of the MOSTFT 1 and a source line, which is formed of Al containing 1% Si and is connected to this electrode, are formed. Next, an overcoat film (a laminated film of silicon oxide, phosphine silicate glass, and silicon nitride, or the like) 130 is formed, a window is formed at the drain portion of the MOSTFT 2, and the cathode 138 in the light-emitting portion connected to the drain proton of the MOSTFT 2 is formed. Next, hydrogenating and sintering treatment is performed.

Next, as shown in FIG. 47(4), the organic light-emitting layer 132 or the like and the anodes 134 and 135 are formed.

In the element shown in FIG. 46(B), instead of the (Rapid Thermal Treatment) organic light-emitting layer, a known light-emitting polymer is used, a active matrix drive light-emitting polymer display device (LEPD) can be formed (hereafter, the same as described above).

<Structural Example II of Organic EL Element>

As shown in FIGS. 48(A), (B), according to this structural example II, as is the structural example I described above, by using the polycrystalline silicon thin-film, which may or may not contain tin and which has a large grain size and high crystallinity, formed on the substrate 111 composed of glass or the like by the method described above according to the present invention, the gate channels 117, the source regions 120, and the drain regions 121 of the switching MOSTFT 1 and the current driving MOSTFT 2 are formed. In addition, the gate electrodes 115 are formed on the gate insulating film 118, on the source and the drain regions, the source electrodes 127 and the drain electrodes 128 and 131 are formed. The drain of the MOSTFT 1 is connected to the gate of the MOSTFT 2 via the drain electrode 128, the capacitor C is formed between drain of the MOSTFT 1 and the drain electrode 131 with the insulating film 136 therebetween, and the source electrode 127 of the MOSTFT 2 extends to an anode 144 of the organic EL element. In this case, an LDD portion may be formed in the switching MOSTFT 1 so as to improve the switching properties.

The individual MOSTFTs are covered with the insulating film 130, on this insulating film, for example, the green organic light-emitting layer 132 (or the blue organic light-emitting layer 133, or a red organic light-emitting layer, not shown in the figure) of the organic EL element is formed so as to cover the anode, a cathode (first layer) 141 is formed so as to cover this organic light-emitting layer, and in addition, a common cathode (second layer) 142 is further formed over the entire surface.

In the organic EL display portion of this structure, the organic EL light-emitting layer is connected to the source of the current driving MOSTFT 2 and is formed so as to cover the anode 144 provided on the surface of the substrate 111 composed of glass or the like, the cathode 141 is formed so as to cover the organic EL light-emitting layer, and the cathode 142 is formed over the entire surface, so that a bottom surface emission 136 type is formed. In addition, the cathode is provided between the organic EL light-emitting layers and over the MOSTFTS. That is, for example, after the green organic light-emitting EL layer is formed by vacuum heating deposition or the like, and the green organic light-emitting EL portion is formed by a photolithographic and a dry etching method, the blue and the red organic light-emitting EL portions are continuously formed in a manner as described above, and the cathode (electron injection layer) 141 is finally formed on the individual portions from a magnesium-silver alloy or an aluminum-lithium alloy. Since this entire surface is tightly sealed with the cathode (electron injection layer) 142, the intrusion of moisture between the organic EL layers from the outside is prevented particularly by the cathode 142 covering the entire surface, and degradation of the organic EL layers having poor resistance against moisture and oxidation of the electrodes are prevented, so that a longer life, higher quality, and high reliability can be achieved (since the entire surface is covered with the anode in the structural example I shown in FIG. 46, the same advantages described above can also be obtained). In addition, since the heat dissipation effect is improved by the cathodes 141 and 142, the change in structure (fusion or recrystallization) of the organic EL thin-film caused by heat generation is reduced, so that a longer life, higher quality, and high reliability can be achieved. Furthermore, accordingly, full color organic EL layer having high accuracy and high quality can be manufactured at a good productivity rate, and hence, cost reduction can be realized.

In addition, as show in FIG. 48(C), when the black mask portion (chromium, chromium dioxide, or the like) 140 is formed around the periphery of each pixel portion, light leakage (crosstalk or the like) can be prevented, and the contrast can be improved. This black mask portion 140 is covered with an insulating film, for example, a silicon oxide film 143 (this may be simultaneously formed when the gate insulating film 118 is formed and may also be formed of the same layer as that therefor).

Figure 49:
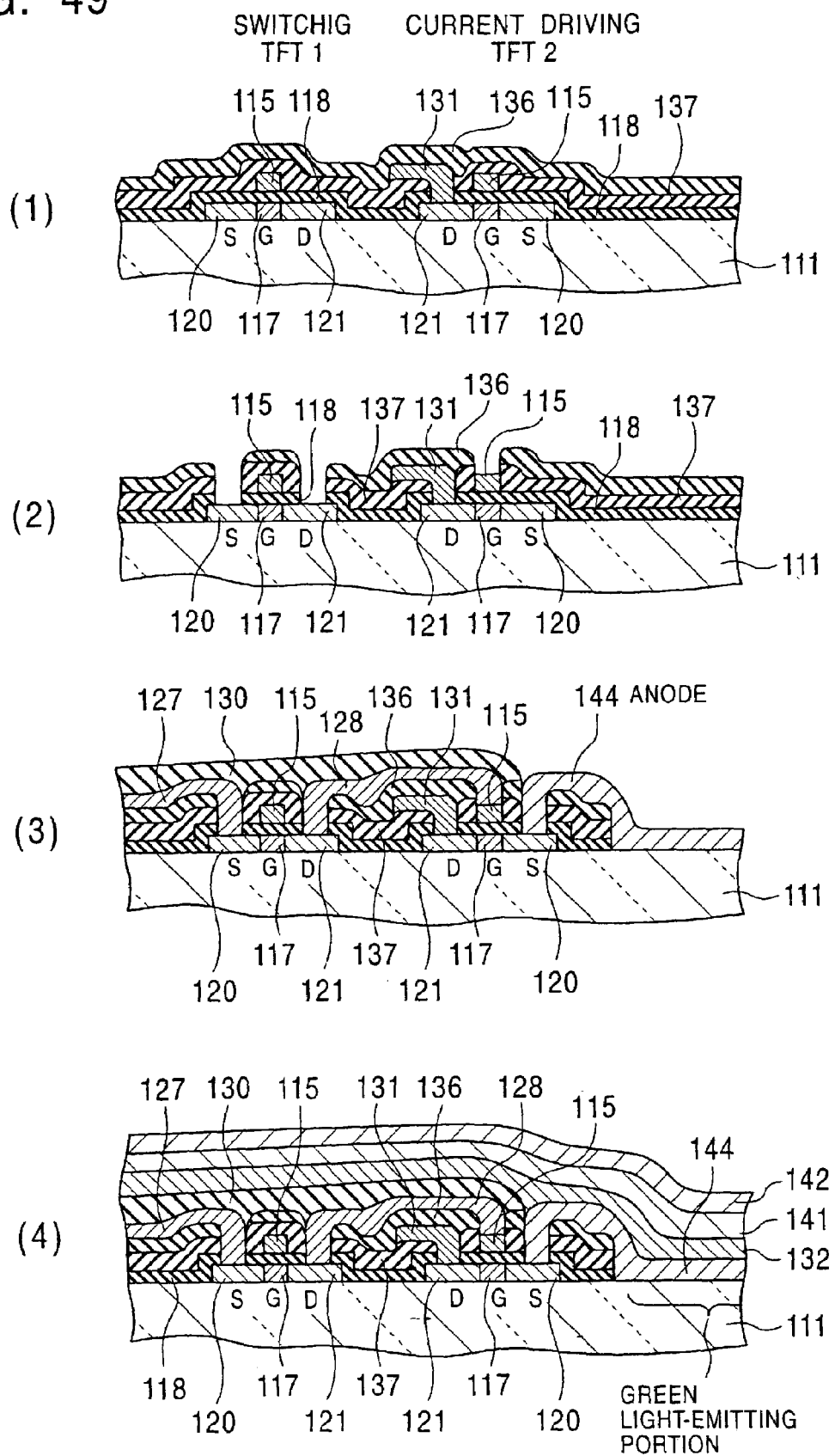
FIG. 49 includes cross-sectional views of a process for manufacturing the organic EL display device sequentially shown by steps according to the third embodiment.

Next, a process for manufacturing this organic EL element will be described. First, as shown in FIG. 49(1), after the source regions 120, the channel regions 117, and the drain regions 121 are formed from the polycrystalline silicon thin-film by the steps described above, the gate insulating film 118 is formed by vapor-phase growth such as catalytic CVD, the gate electrodes 115 of the MOSTFTs 1 and 2 are formed on this insulating film 118 by sputtering of a Mo—Ta alloy or the like and by common photolithographic and etching techniques, and at the same time, a gate line connected to the gate electrode of the MOSTFT 1 is formed. Next, after an overcoat film (a silicon oxide film or the like) 137 is formed by vapor-phase growth such as catalytic CVD, the drain electrode 131 and a $V_{dd}$ line of the MOSTFT 2 are formed by sputtering of a Mo—Ta alloy or the like and by common photolithographic and etching techniques, and in addition, the overcoat film (a laminate of silicon oxide and silicon nitride) 136 is formed. By RTA (Rapid Thermal Anneal) treatment (for example, approximately 1,000° C. for 10 to 30 seconds) using a halogen lamp or the like, dopants, which have been ion-doped, are activated.

Next, as shown in FIG. 49(2), after windows are provided at the source and the drain portions of the MOSTFT 1 and the gate portion of the MOSTFT 2, as shown in FIG. 49(3), by a sputtering film-forming technique using Al containing 1% Si and by common photolithographic and etching techniques, the drain of the MOSTFT 1 and the gate of the MOSTFT 2 are connected to each other by the Al wire 128 containing 1% Si, and at the same time, the source line, which is formed of Al containing 1% Si and is connected to the source of the MOSTFT 1, is formed. Next, the overcoat film (a laminated film of silicon oxide, phosphine silicate glass, and silicon nitride, or the like) 130 is formed, and hydrogenating and sintering treatment is then performed. Subsequently, a window is formed at the source portion of the MOSTFT 2 by common photolithographic and etching techniques, and the anode 144 in the light-emitting portion connected to the source proton of the MOSTFT 2 is formed by sputtering of ITO or the like and common photolithographic and etching techniques.

Next, as shown in FIG. 49(4), the organic light-emitting layer 132 or the like and the cathodes 141 and 142 are formed.

Figure 46:
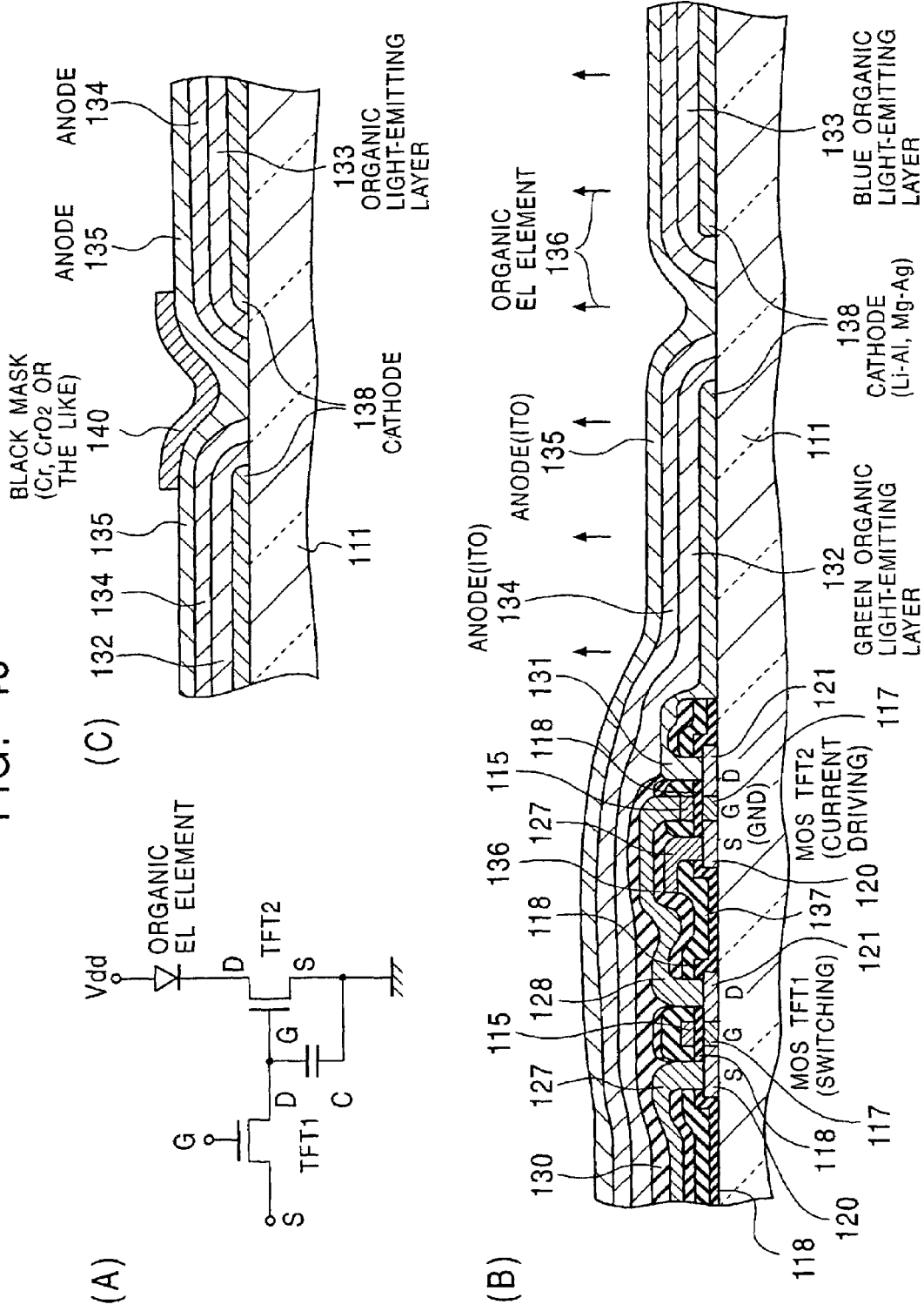
FIG. 46 includes an equivalent circuit diagram (A) of a major portion of an organic EL display device according to a third embodiment of the present invention, an enlarged cross-sectional view (B) of the same major portion, and a cross-sectional view (C) showing the vicinity of a pixel of the same major portion.
Figure 48:
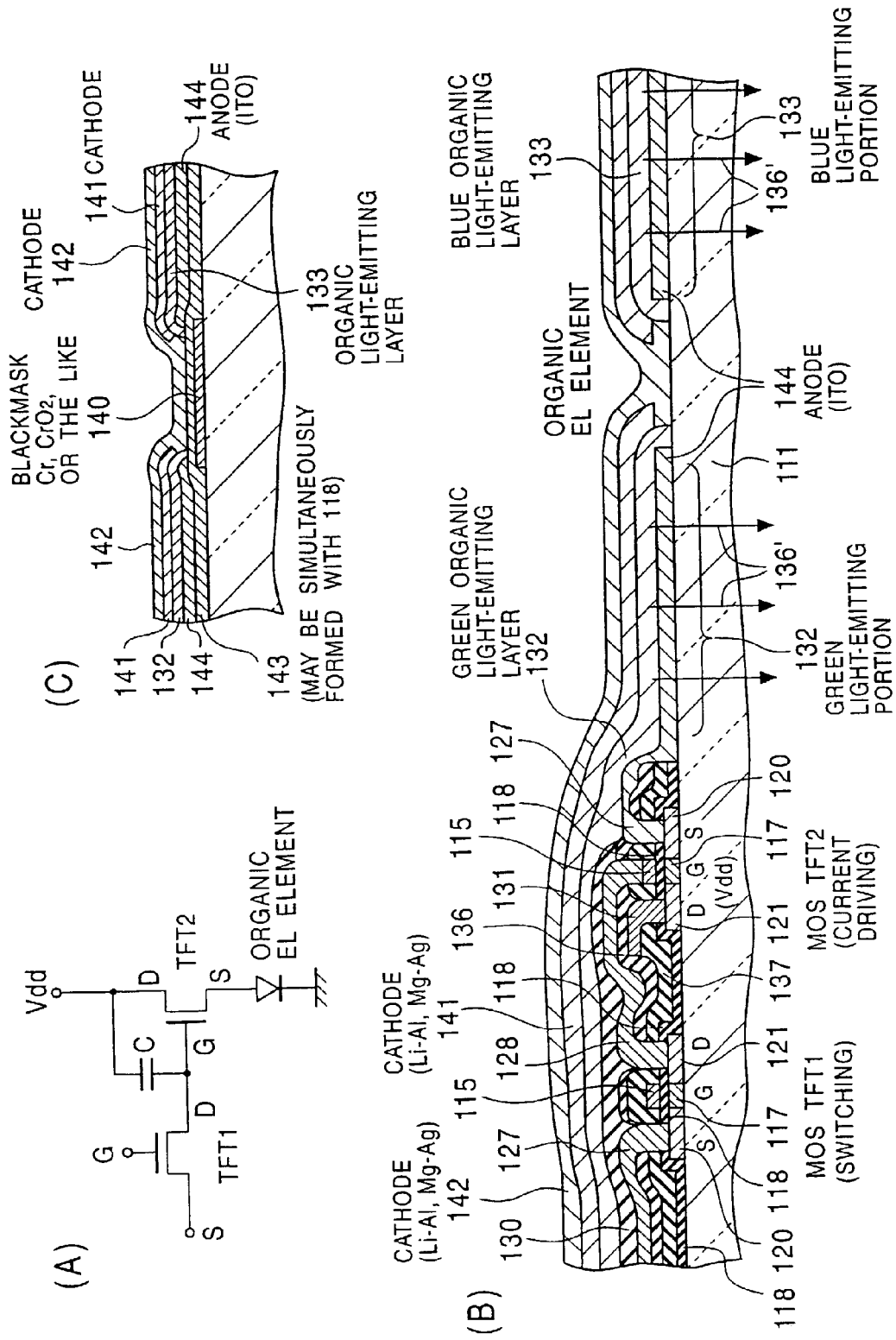
FIG. 48 includes an equivalent circuit diagram (A) of a major portion of another organic EL display device according to the third embodiment of the present invention, an enlarged cross-sectional view (B) of the same major portion, and a cross-sectional view (C) showing the vicinity of a pixel of the same major portion.

The materials forming the individual layers of the organic EL and the manufacturing method therefor is applied to the example shown in FIG. 48 and, in addition, may be applied to the example shown in FIG. 46.

In a conventional active matrix type organic El display device integrated with a peripheral driving circuit, a pixel is identified by an X direction signal line and a Y direction signal line, and at the identified pixel, a corresponding switching MOSTFT is turned on, so that image data is stored in a corresponding signal storing capacitor. Accordingly, a current controlling MOSTFT is turned on, a bias current passes through the organic EL element via a power supply line in accordance with the image data, and emission is then performed. However, in the step described above, in the case of an amorphous silicon MOSTFT, the current is likely to vary due to the change in $V_{th}$, and hence, the image quality tends to easily vary. In addition, since the carrier mobility is low, driving current for high-speed response has been limited, and furthermore, since formation of a p-type channel has been difficult, it has been difficult to manufacture a small-scale CMOS circuit configuration.

In contrast, according to the present invention described above, a polycrystalline silicon TFT having high reliability, high carrier mobility, can be easily formed, the TFTs can be formed in a relatively large area, and a CMOS circuit configuration can be realized by this TFT described above.

In addition, the individual green (G) organic light-emitting EL layer, blue (B) organic light-emitting EL layer, and red (R) organic light-emitting EL layer are formed having a thickness of 100 to 200 nm. When low molecular weight materials are used therefor, these organic EL layers are formed by vacuum heating deposition, and when a polymer material is used, R, G, B light-emitting polymers are aligned by a coating method such as dip coating, spin coating, or roll coating, or an ink-jet method.

As the organic EL layer, for example, there may be mentioned a single layer type, a double-layer type, and a triple-layer type, and in this embodiment, a triple-layer type using low molecular weight compounds will be described by way of example.

Single-Layer; anode/bipolar light-emitting layer/cathode

Double-Layer; anode/hole transfer layer/electron transfer light-emitting layer/cathode, or anode/hole transfer light-emitting layer/electron transfer layer/cathode Triple-Layer; anode/hole transfer layer/light-emitting layer/electron transfer layer/cathode, or anode/hole transfer light-emitting layer/carrier block layer/electron transfer light-emitting layer/cathode When used for forming the green organic light-emitting EL layer, a low molecular weight compound is continuously processed by vacuum heating deposition to form the light-emitting layer mentioned above on an ITO transparent electrode, which is an anode (a hole injection layer) on a glass substrate, connected to the source portion of a current driving MOSTFT.

1) A hole transfer layer is formed of an amine compound (such as tiraryamine derivatives, arylamine oligomers, or aromatic triamines) or the like.

2) A light-emitting layer is formed of tris(8-hydroxyquinoline)Al complex (Alq), which is a green light-emitting material, or the like.

3) An electron transfer layer is formed of 1,3,4-oxadiazole derivatives (OXD), 1,2,4-triazole derivatives (TAZ), or the like.

4) An electron injection layer, which is a cathode, is preferably formed of a material having a work function of 4 eV or less.

For example, a magnesium-silver alloy having an atomic ratio of 10 to 1 and a thickness of 10 to 30 nm an aluminum-Lithium (at a concentration of 0.5 to 1%) alloy having a thickness of 10 to 30 nm In this embodiment, in order to increase the adhesion at the interface between silver and an organic material, silver at a content of 1 to 10 atom % is contained in magnesium, and in order to improve the stability, lithium at a concentration of 0.5 to 1% is contained in aluminum.

In order to form the green pixel portions, the green pixel portions are masked with a photoresist, the aluminum-lithium alloy forming an electron injection layer, which is used as cathodes, is removed by plasma etching using $CCl_4$ or the like, and low molecular weight materials forming an electron transfer layer, a light-emitting layer, and a hole transfer layer, and the photoresist, are continuously removed by oxygen plasma etching, thereby forming the green pixel portions. In the steps described above, since the aluminum-lithium alloy is present under the photoresist, problems may not arise when the photoresist is etched. In addition, in the steps described above, the areas of the low molecular weight compound layers forming the electron transfer layer, the light-emitting layer, and the hole transfer layer are formed larger than that of the ITO transparent electrode, which is the hole injection layer, so that electrical short-circuiting will not occur with the cathode, i.e., the electron injection layer (a magnesium-silver alloy), which is formed over the entire surface in a subsequent step.

Next, when used for forming the blue organic light-emitting EL layer, a low molecular weight compound is continuously processed by vacuum heating deposition to form the light-emitting layer mentioned above on the ITO transparent electrode, which is the anode (a hole injection layer) on the glass substrate, connected to the source portion of the current driving TFT.

1) A hole transfer layer is formed of an amine compound (such as tiraryamine derivatives, arylamine oligomers, or aromatic triamines) or the like.

2) A light-emitting layer is formed of a distyryl derivative, such as DTVBi which is a blue light-emitting material.

3) An electron transfer layer is formed of 1,3,4-oxadiazole derivatives (OXD), 1,2,4-triazole derivatives (TAZ), or the like.

4) An electron injection layer, which is a cathode, is preferably formed of a material having a work function of 4 eV or less.

For example, a magnesium-silver alloy having an atomic ratio of 10 to 1 and a thickness of 10 to 30 nm an aluminum-lithium (at a concentration of 0.5 to 1%) alloy having a thickness of 10 to 30

In this embodiment, in order to increase the adhesion at the interface between silver and an organic material, silver at a content of 1 to 10 atom % is contained in magnesium, and in order to improve the stability, lithium at a concentration of 0.5 to 1% is contained in aluminum.

In order to form the blue pixel portions, the blue pixel portions are masked with a photoresist, the aluminum-lithium alloy forming an electron injection layer, which is used as cathodes, is removed by plasma etching using $CCl_4$ or the like, and low molecular weight materials forming an electron transfer layer, light-emitting layer, and hole transfer layer, and the photoresist, are continuously removed by oxygen plasma etching, thereby forming the blue pixel portions. In the steps described above, since the aluminum-lithium alloy is present under the photoresist, problems may not arise when the photoresist is etched. In addition, the areas of the low molecular weight compound layers forming the electron transfer layer, the light-emitting layer, and the hole transfer layer are formed larger than that of the ITO transparent electrode, which is the hole injection layer, so that electrical short-circuiting will not occur with the cathode, i.e., the electron injection layer (a magnesium-silver alloy), which is formed over the entire surface in a subsequent step.

Next, when used for forming the red organic light-emitting EL layer, a low molecular weight compound is continuously processed by vacuum heating deposition to form the light-emitting layer mentioned above on the ITO transparent electrode, which is the anode (a hole injection layer) on the glass substrate, connected to the source portion of the current driving TFT.

1) A hole transfer layer is formed of an amine compound (such as tiraryamine derivatives, arylamine oligomers, or aromatic triamines) or the like.

2) A light-emitting layer is formed of $Eu(Eu(DBM)_3$ (Phen) or the like.

3) An electron transfer layer is formed of 1,3,4-oxadiazole derivatives (OXD), 1,2,4-triazole derivatives (TAZ), or the like.

4) An electron injection layer, which is a cathode, is preferably formed of a material having a work function of 4 eV or less.

For example, a magnesium-silver alloy having an atomic ratio of 10 to 1 and a thickness of 10 to 30 nm an aluminum-lithium (at a concentration of 0.5 to 1%) alloy having a thickness of 10 to 30 nm In order to increase the adhesion at the interface between silver and an organic material, silver at a content of 1 to 10 atom % is contained in magnesium, and in order to improve the stability, lithium at a concentration of 0.5 to 1% is contained in aluminum.

In order to form the red pixel portions, the red pixel portions are masked with a photoresist, the aluminum-lithium alloy forming an electron injection layer, which is used as cathodes, is removed by plasma etching using $CCl_4$ or the like, and low molecular weight materials forming an electron transfer layer, light-emitting layer, and hole transfer layer, and the photoresist, are continuously removed by oxygen plasma etching, thereby forming the red pixel portions. In the steps described above, since the aluminum-lithium alloy is present under the photoresist, problems may not arise when the photoresist is etched. In addition, the areas of the low molecular weight compound layers forming the electron transfer layer, the light-emitting layer, and the hole transfer layer are formed larger than that of the ITO transparent electrode, which is the hole injection layer, so that electrical short-circuiting will not occur with the cathode, i.e., the electron injection layer (a magnesium-silver alloy), which is formed over the entire surface in a subsequent step.

Subsequently, the electron injection layer, which is a common electrode, is formed over the entire surface by vacuum heating deposition, and this electron injection layer used as the cathode is preferably formed from a material having a work function of 4 eV or less. For example, a magnesium-silver alloy having an atomic ratio of 10 to 1 and having a thickness of 10 to 30 nm, or an aluminum-lithium (at a concentration of 0.5 to 1%) having a thickness of 10 to 30 nm may be used. In this embodiment, in order to increase the adhesion at the interface between silver and an organic material, silver at a content of 1 to 10 atom % is contained in magnesium, and in order to improve the stability, lithium at a concentration of 0.5 to 1% is contained in aluminum. In addition, film formation may be performed by sputtering.

Fourth Embodiment

In this embodiment, the present invention is applied to a field emission type (FED) display devices. Hereinafter, the structural examples and the manufacturing examples thereof will be described. In this embodiment, a top gate type MOSTFT will be described, and it is naturally understood that the present invention be applied to a bottom gate type or a dual gate type MOSTFT.

<Structural Example I of FED>

Figure 50:
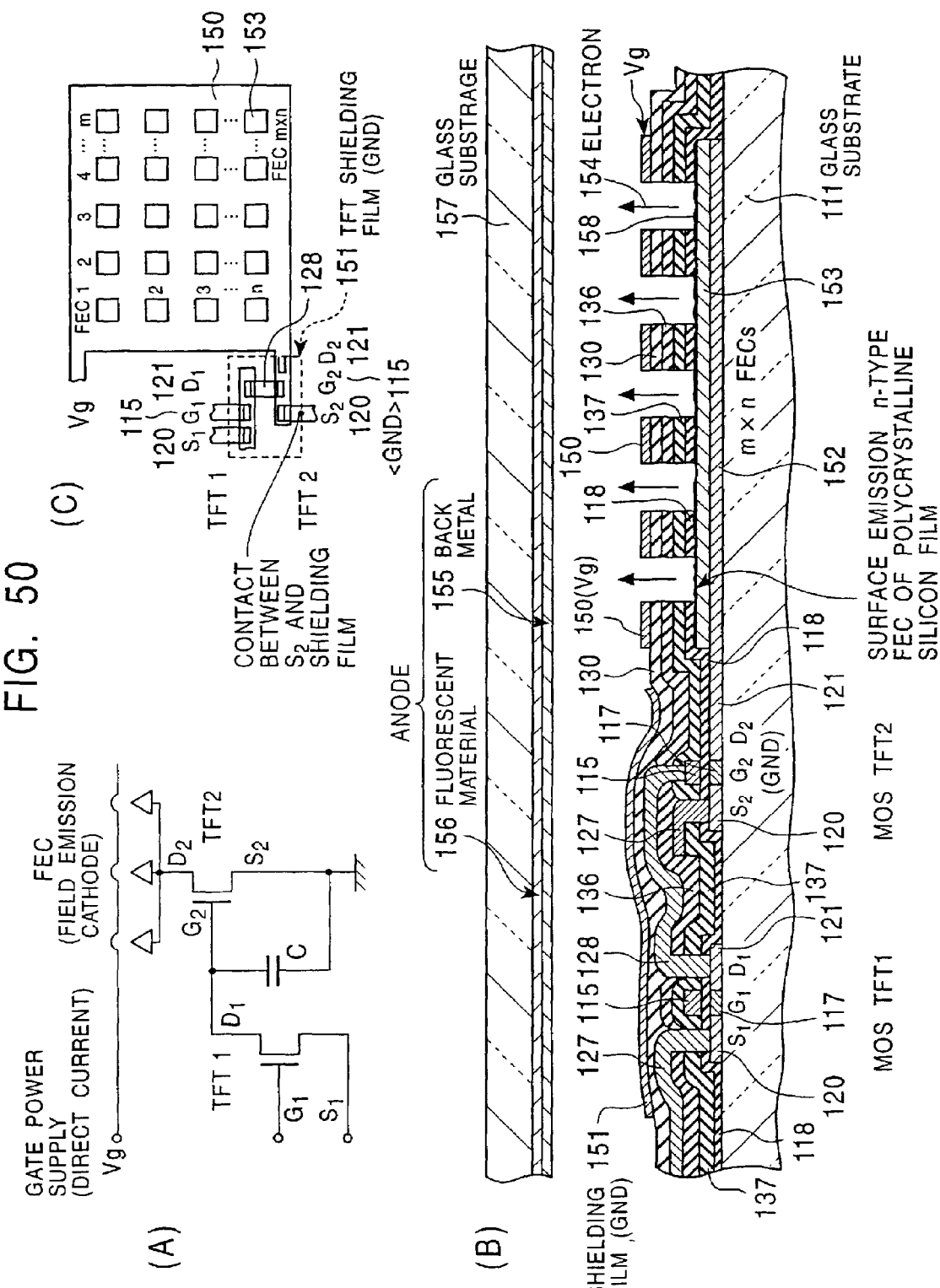
FIG. 50 includes an equivalent circuit diagram (A) of a major portion of an FED according to a fourth embodiment of the present invention, an enlarged cross-sectional view (B) of the same major portion, and a schematic plan view (C) of the same major portion.

As shown in FIGS. 50(A), (B), and (C), according to this structural example I, by using the polycrystalline silicon thin-film, which may or may not contain tin and which has a large grain size and high crystallinity, formed by the method described above according to the present invention on the substrate 111 composed of glass or the like, the gate channel regions 117, the source regions 120, and the drain regions 121 of the switching MOSTFT 1 and the current driving MOSTFT 2 are formed. In addition, the gate electrodes 115 are formed on the gate insulating film 118, and on the source and the drain regions, the source electrodes 127 and the drain electrode 128 are formed. The drain of the MOSTFT 1 is connected to the gate of the MOSTFT 2 via the drain electrode 128, a capacitor C is formed between drain of the MOSTFT 1 and the source electrode 127 of the MOSTFT 2 with the insulating film 136 therebetween, and the drain region 121 of the MOSTFT 2 extends to the FEC (Field Emission Cathode) of the FED element so as to serve as the emitter region 152. In this case, an LDD portion may be formed in the switching MOSTFT 1 so as to improve the switching properties.

The individual MOSTFTs are covered with the insulating film 130, on this insulating film, the metal shading film 151 is formed from the same material and in the same step as those for the gate lead electrodes 150 so as to cover the individual MOSTFTs. In the FEC, an n-type polycrystalline silicon film 153, which is formed into field emission emitters, is formed on the emitter region 152 composed of the polycrystalline silicon thin-film, and the insulating films 118, 137, 136, and 130 are patterned to form holes for defining m×n emitters, in which on the surfaces of the patterned insulating films, the gate lead electrodes 150 are provided.

In addition, at the position opposing this FEC, a substrate 157, such as a glass substrate, provided with an anode composed of a back metal 155 and a fluorescent material 156 is provided, and the space between the FEC and the substrate is maintained at a high vacuum.

In the FEC having this structure, at the bottoms of the holes formed in the gate lead electrodes 150, the n-type polycrystalline silicon film 153 grown on the polycrystalline silicon thin-film 152 formed according to the present invention is exposed, these areas at the bottom of the holes each serve as a surface emission thin-film emitter emitting electrons 154. That is, since the polycrystalline silicon thin-film 152 used as an underlayer of the emitter is formed of grains having a large diameter (a grain size of several hundred nanometers or more), when the n-type polycrystalline silicon film 153 is grown by catalytic CVD or the like using this underlayer as a seed, this polycrystalline silicon film 153 is also grown so as to have larger grains and is formed so as to have irregularities on the surface, which are advantages for emitting electrons. In addition to that described above, electron emitting material may be formed of a polycrystalline diamond film, a carbon thin-film which may or may not contain nitrogen, a number of minute protruding structures (for example, carbon nanotube) formed on a surface of a carbon thin-film which may or may not contain nitrogen.

Accordingly, since the emitter is a surface emission type thin-film, the formation thereof is easily performed, and in addition, the emitter properties are stable, thereby achieving a longer life.

In addition, since the metal shielding film 151 (this metal shielding film is preferably formed from the same material (Nb, Ti/Mo, or the like) and in the same step as those for the lead gate electrodes 150 in view of a manufacturing process) at the earth potential is formed over all the active elements (including the MOSTFTs and diodes in the peripheral driving circuit and the pixel display portions), the advantages (1) and (2) described below can be obtained, and a high quality and highly reliable field emission display (FED) can be realized.

(1) A gas in an air-tight container is positively charged by electrons emitted from the emitter (field emission cathode) 153 and is charged-up on an insulating film, this positive charges form an unnecessary conversion layer in the MOSTFT under the insulating layer, and an excessive current flows through an unnecessary current path formed of this conversion layer, resulting in an abrupt increase in emitter current. However, since the metal shielding film 151 is formed on the insulating layer provided on the MOSTFTs and is grounded to the earth, the charge-up can be prevented, and hence, an abrupt increase in emitter current can be prevented.

(2) The fluorescent material 156 emits light by collision of electrons emitted from the emitter (field emission cathode) 153; however, by the light mentioned above, electron and holes are generated in the gate channels of MOSTFTs, resulting in generation of leakage current. However, since the metal shielding film 151 is formed on the insulating layer provided on the MOSTFTs, entry of light into the TFTs can be prevented, and hence, operational defects of the TFTs do not occur.

Figure 51:
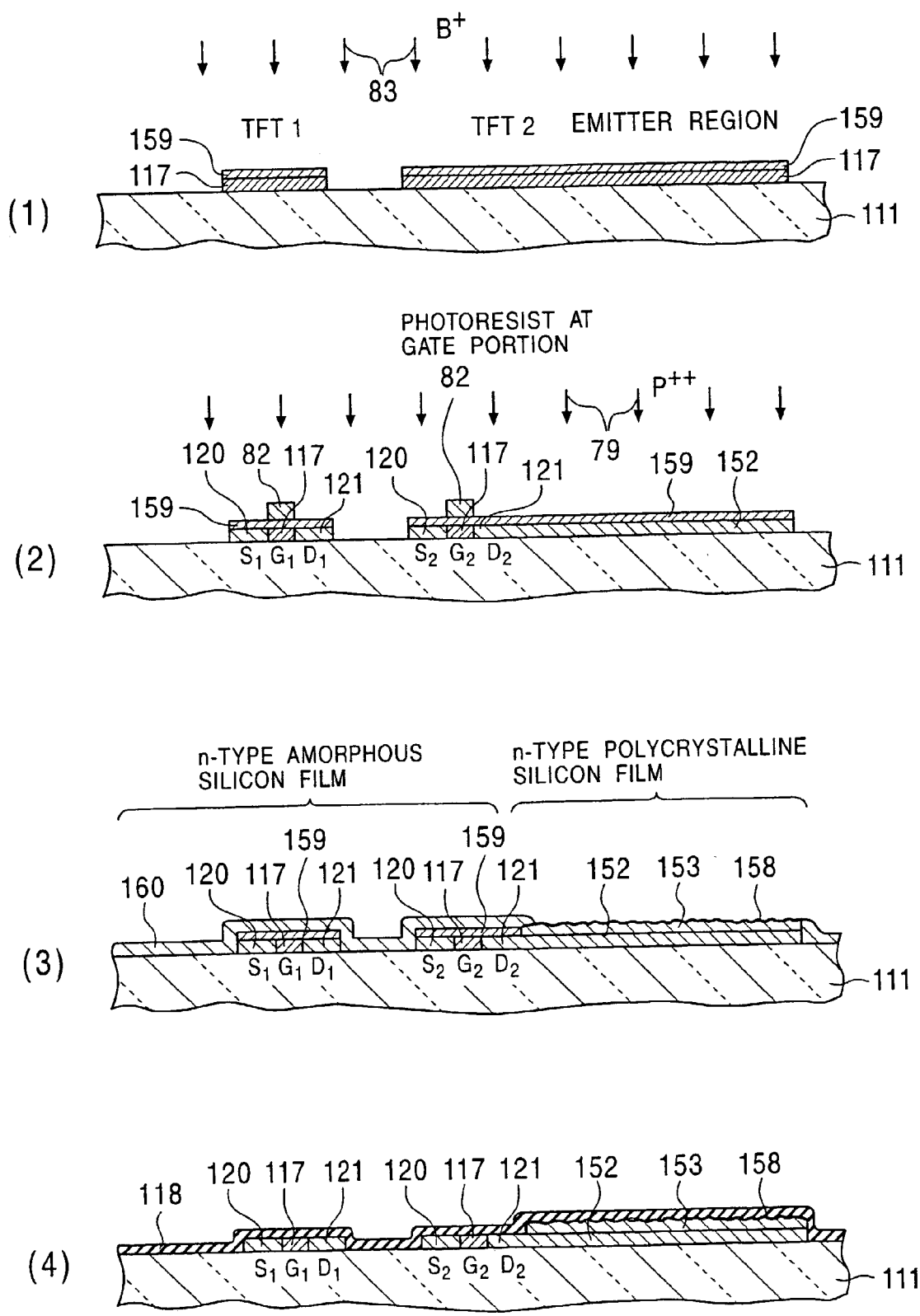
FIG. 51 includes cross-sectional views of a process for manufacturing the FED sequentially shown by steps according to the fourth embodiment.

Next, a process for manufacturing this FED will be described. First, as shown in FIG. 51(1), after the polycrystalline silicon thin-film 117 is formed over the entire surface by the steps described above, islands for the MOSTFT 1, the MOSTFT 2, and the emitter region are formed by common photolithographic and etching techniques, and a silicon oxide film 159 for protection is formed over the entire surface by plasma CVD, catalytic CVD, or the like. Related to this, after the formation of the silicon oxide film for protection, islands may be formed.

Next, to optimize the $V_{th}$ by the control of dopant concentrations in the gate channels of the MOSTFTs 1 and 2, boron ions 83 are doped into the entire surface thereof at a dose rate of $5 \times 10^{11}$ atoms/cm$^2$ by ion implantation or ion doping so as to have an acceptor concentration of $1 \times 10^{17}$ atoms/cc.

Next, as shown in FIG. 51(2), by using the photoresist 82 as a mask, phosphorus ions 79 are doped into the source and the drain regions of the MOSTFTs 1 and 2 and the emitter region at a dose rate of $1 \times 10^{15}$ atoms/cm$^2$ by ion implantation or ion doping so as to have a donor concentration of $2 \times 10^{20}$ atoms/cc, thereby forming the source regions 120, drain regions 121, and emitter region. 152. Subsequently, by common photolithographic and etching techniques, the silicon oxide film for protection in the emitter region is removed. In the step described above, an LDD region having a donor concentration of $(1 \text{ to } 5) \times 10^{18}$ atoms/cc may be formed so as to improve the switching properties.

Next, as shown in FIG. 51(3), by using the polycrystalline silicon thin-film 152 which forms the emitter region as a seed, the n-type polycrystalline silicon film 153, having a thickness of 1 to 5 μm and minute irregularities 158 on the surface thereof, is formed in the emitter region by catalytic CVD or bias catalytic CVD using a mixture of monosilane and dopant such as PH$_3$ at an appropriate ratio (for example, $10^{20}$ atoms/cc), and at the same time, an n-type amorphous silicon film 160 having a thickness of 1 to 5 μm is formed on the other silicon oxide film 159 and the glass substrate 111.

Next, as shown in FIG. 51(4), by activated hydrogen ions or the like in catalytic AHA treatment described above, the amorphous silicon film 160 is selectively removed by etching, and after the silicon oxide film 159 is removed by etching, the gate insulating film (a silicon oxide film) 118 is formed by catalytic CVD or the like.

Next, as shown in FIG. 52(5), the gate electrodes 115 of the MOSTFTs 1 and 2 and a gate line connected to the gate electrode of the MOSTFT 1 are formed by sputtering of a heat resistant metal, such as an Mo—Ta alloy, and after the overcoat film (a silicon oxide film or the like) 137 is formed, by RTA (Rapid Thermal Anneal) treatment using a halogen lamp or the like, the n-type or the p-type dopant, which has been doped previously, is activated. Next, after forming windows at the source portion of the MOSTFT 2, the source electrode 127 of the MOSTFT 1 and an earth line are formed by sputtering of a heat resistant metal, such as an Mo—Ta alloy. Furthermore, the overcoat film (a laminated film of silicon oxide and silicon nitride or the like) 136 is formed by plasma CVD, catalytic CVD, or the like.

Next, as shown in FIG. 52(6), after windows are provided at the source and the drain portions of the MOSTFT 1 and the gate portion of the MOSTFT 2, the drain of the MOSTFT 1 and the gate of the MOSTFT 2 are connected to each other by the Al wire 128 containing 1% Si, and at the same time, the source electrode of the MOSTFT 1 and a source line 127, which is connected to this electrode, are formed. Next, hydrogenation and sintering treatment is performed at 400° C. for 30 minutes in a forming gas.

Next, as shown in FIG. 52(7), after the overcoat film (a laminated film of silicon oxide, phosphine silicate glass, and silicon nitride, or the like) 130 is formed, a window is formed for a GND line, and as shown in FIG. 52(8), the lead electrodes 150 and the metal shielding film 151 are formed by Nb deposition followed by etching, the emitters 153 are exposed by forming windows in the field emission cathode portion, and cleaning is then performed by activated hydrogen ions or the like formed by plasma or catalytic AHA treatment described above.

A conventional field emission display device (FED) is roughly classified into passive-matrix and active-matrix drive. As the field emitter, for example, there may be mentioned a spinet type molybdenum emitter, a corn type silicon emitter, an MIM tunnel emitter, a porous silicon emitter, a diamond emitter, or a surface conduction emitter, and each emitter mentioned above may be collectively formed on a plane substrate. In the passive-matrix drive, a field emitter array disposed in the X-Y matrix is used as one pixel, and image display is performed by adjusting an emission amount of each pixel. In the active-matrix drive, an emission current of an emitter formed at the drain portion of a MOSTFT is controlled by a control gate. Since a process for forming this drive system is compatible with that for common silicon LSIs, a complicated processing circuit can be easily formed at the periphery of the field emission display device. However, since silicon single crystalline wafers are used, the substrate cost is high, and it has been difficult to form a display device having an area larger than the wafer size. A method has been proposed in which a conductive polycrystalline silicon is formed on a cathode surface by reduced-pressure CVD or the like, and on the surface thereof, an emitter composed of a crystalline diamond film formed by plasma CVD or the like is formed. However since a deposition temperature in reduced-pressure CVD is high such as 630° C., a low strain point glass cannot be used, and hence, cost reduction cannot be easily performed. In addition, a polycrystalline silicon film formed by the reduced-pressure has a small grain size, the crystalline diamond formed thereon also has a small grain size, and hence, the emitter properties are not good. Furthermore, sufficient reaction energy cannot be obtained by plasma CVD, it is difficult to form a diamond film having good crystallinity. In addition, since the matching properties between the conductive polycrystalline silicon film and a transparent electrode or a cathode formed of a metal, such as Al, Ti, or Cr, are not good, superior emission properties cannot be obtained.

In contrast, the polycrystalline silicon thin-film having a large grain size formed according to the present invention can be formed on a substrate such as a low strain point glass and is formed in the emitter region connected to the drain of the current driving TFT, and by using this polycrystalline silicon thin-film as a seed, the emitters composed of the n-type (or n$^+$-type) polycrystalline silicon film (or the polycrystalline diamond film described below) having a large grain size can be formed. In addition, by continuously and selectively etching the amorphous silicon film or an amorphous diamond film (DLC: Diamond Like Carbon) by reduction in catalytic AHA treatment or the like, an n-type (or n$^+$-type) polycrystalline silicon film, having high crystallinity and a large grain size, provided with an infinitude of irregularities on the surface is formed, and hence, emitters having superior electron emission efficiency can be formed. Furthermore, the matching properties between the drain and the emitter are superior, and hence, highly efficient emitter properties can be obtained. Accordingly, the conventional problems described above can be solved (hereafter, the same as above).

In addition, when the emitter region in one pixel display portion is divided into a plurality of areas, and a MOSTFT, which is a switching element, is connected to each area, even if one MOSTFT is out of order, since the other MOSTFTs work, electron emission is always performed in one pixel display portion. Accordingly, a high quality FED can be manufactured at high yield, and cost reduction can be realized (hereafter, the same as described above). As a general measure for improving the yield, among these MOSTFTs mentioned, a MOSTFT having a disconnection defect may not be a problem, and a MOSTFT having a short-circuiting defect is recovered by separation using laser repair. Since this measure can be applied to the above configuration according to the present invention, a high quality FED can be manufactured at high yield, and cost reduction can be realized (hereafter, the same as described above).

<Structural Example II of FED>

Figure 53:
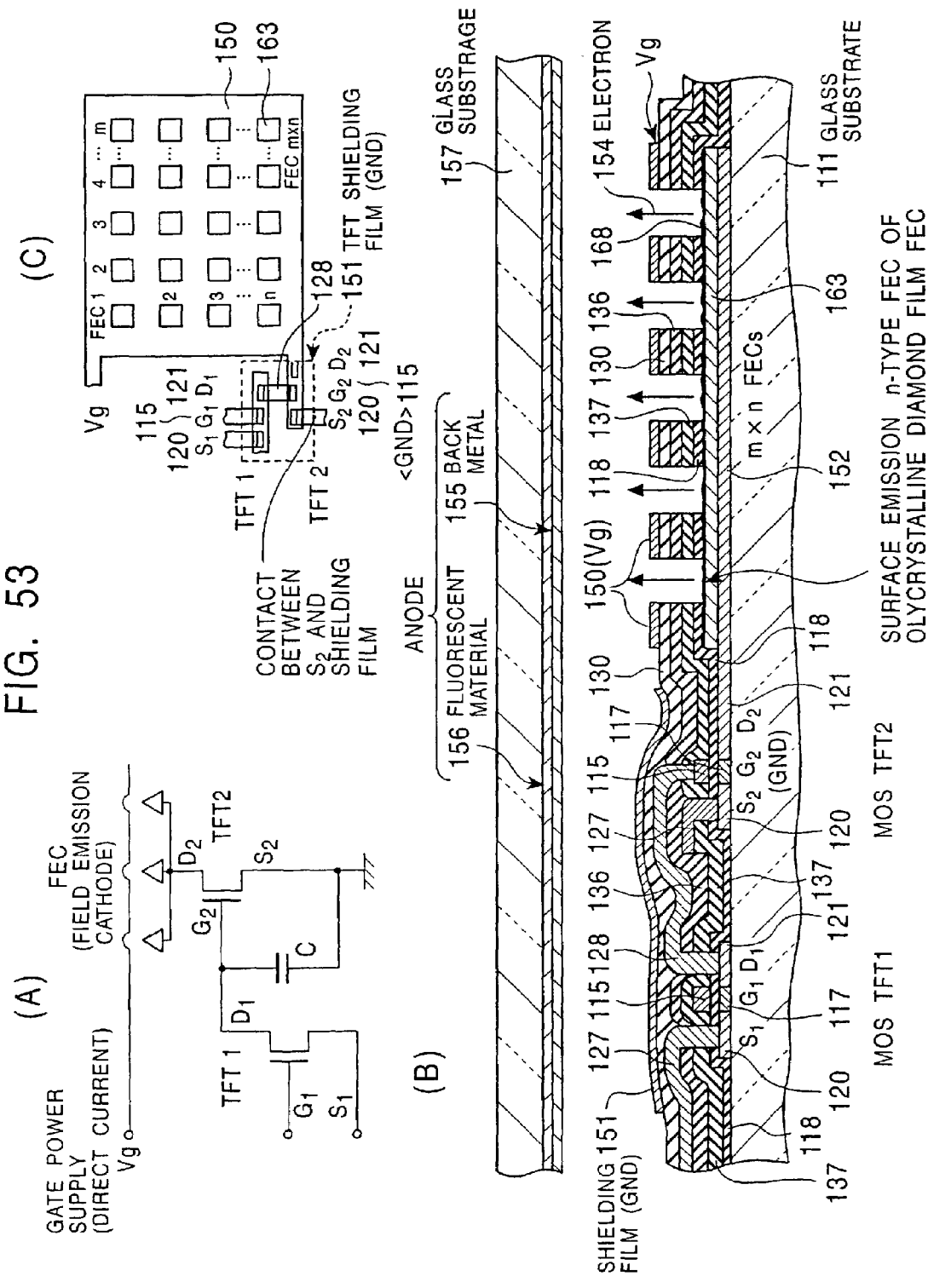
FIG. 53 includes an equivalent circuit diagram (A) of a major portion of another FED according to the fourth embodiment of the present invention, an enlarged cross-sectional view (B) of the same major portion, and a schematic plan view (C) of the same major portion.

As shown in FIGS. 53(A), (B), and (C), according to this structural example II, as is the structural example I described above, by using the polycrystalline silicon thin-film, which may or may not contain tin and which has a large grain size and high crystallinity, formed by the method described above according to the present invention on the substrate 111 composed of glass or the like, the gate channel regions 117, the source regions 120, and the drain regions 121 of the switching MOSTFT 1 and the current driving MOSTFT 2 are formed. In addition, the gate electrodes 115 are formed on the gate insulating film 118, and on the source and the drain regions, the source electrodes 127 and the drain electrode 128 are formed. The drain of the MOSTFT 1 is connected to the gate of the MOSTFT 2 via the drain electrode 128, the capacitor C is formed between the drain of the MOSTFT 1 and the source electrode 127 of the MOSTFT 2 with the insulating film 136 therebetween, and the drain region 121 of the MOSTFT 2 extends to the FEC (Field Emission Cathode) of the FED element so as to serve as the emitter region 152. In this case, an LDD portion may be formed in the switching MOSTFT 1 so as to improve the switching properties.

The individual MOSTFTs are covered with the insulating film 130, on this insulating film, the metal shading film 151 is formed from the same material and in the same step as those for the gate lead electrodes 150 so as to cover the individual MOSTFTs. In the FEC, an n-type polycrystalline diamond film 163, which is formed into field emission emitters, is formed on the emitter region 152 composed of the polycrystalline silicon thin-film, and the insulating films 118, 137, 136, and 130 are patterned to form holes for defining m×n emitters, in which on the surfaces of the patterned insulating films, the gate lead electrodes 150 are provided.

In addition, at the position opposing this FEC, the substrate 157, such as a glass substrate, provided with the anode composed of the back metal 155 and the fluorescent material 156 is provided, and the space between the FEC and the substrate is maintained at a high vacuum.

In the FEC having this structure, at the bottoms of the holes formed in the gate lead electrodes 150, the n-type polycrystalline diamond film 163 grown on the polycrystalline silicon thin-film 152, which is formed according to the present invention, is exposed, these areas at the bottom of the holes serve as surface emission thin-film emitters emitting electrons 154. That is, since the polycrystalline silicon thin-film 152 used as an underlayer of the emitter is formed of grains having a large diameter (a grain size of several hundred nanometers or more), when the n-type polycrystalline diamond film 163 is grown by catalytic CVD or the like using this underlayer as a seed, this polycrystalline diamond film 163 is also grown so as to have a larger grain and is also formed so as to have irregularities, which are advantages of electron emission, on the surface thereof. In addition to that described above, the emitter may be formed of a carbon thin-film which may or may not contain nitrogen, or a number of minute protruding structures (for example, carbon nanotube) formed on a surface of a carbon thin-film which may or may not contain nitrogen.

Accordingly, since the emitter is a surface emission thin-film, the formation thereof is easily performed, and in addition, the emitter properties are stable, thereby achieving a longer life.

In addition, since the metal shielding film 151 (this metal shielding film is preferably formed from the same material (Nb, Ti/Mo, or the like) and in the same step as those for the lead gate electrodes 150 in view of a manufacturing process) at the earth potential is formed over all the active elements (including the MOSTFTs and diodes in the peripheral driving circuit and the pixel display portion), as is the case of the described above, the insulating layer provided on the MOSTFTs is grounded to the earth by the metal shielding film 151 thus formed, and hence, charge-up can be prevented and an abrupt increase in emitter current can also be prevented. In addition, since the metal shielding film 151 is provided on the insulating layer on the MOSTFTS, entry of light into the MOSTFTs can be prevented, and hence, operation defects of the MOSTFTs do not occur. Accordingly, a high quality and highly reliable field emission display (FED) can be realized.

Figure 54:
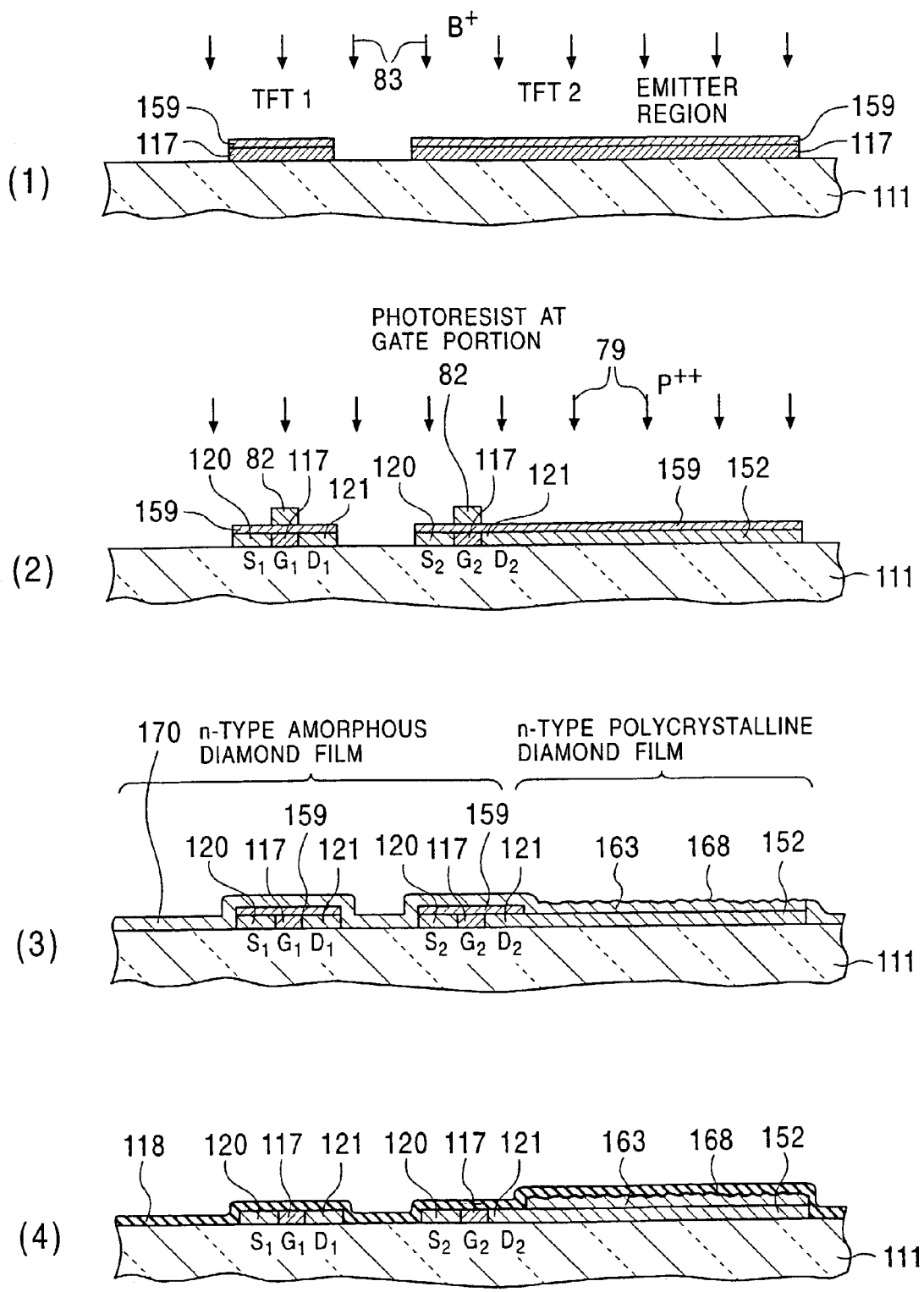
FIG. 54 includes cross-sectional views of a process for manufacturing the FED sequentially shown by steps according to the fourth embodiment.

Next, a process for manufacturing this FED will be described. First, as shown in FIG. 54(1), after the polycrystalline silicon thin-film 117 is formed over the entire surface by the steps described above, islands are formed for the MOSTFT 1, the MOSTFT 2, and the emitter region by common photolithographic and etching techniques, and the silicon oxide film 159 for protection is formed over the entire surface by plasma CVD, catalytic CVD, or the like. Related to this, after the formation of the silicon oxide film for protection, islands may be formed.

Next, to optimize the $V_{th}$ by the control of dopant concentrations in the gate channels of the MOSTFTs 1 and 2, boron ions 83 are doped into the entire surface thereof at a dose rate of $5\times10^{11}$ atoms/cm$^2$ by ion implantation or ion doping so as to have an acceptor concentration of $1\times10^{17}$ atoms/cc.

Next, as shown in FIG. 54(2), by using the photoresist 82 as a mask, phosphorus ions 79 are doped into the source and the drain regions of the MOSTFTs 1 and 2 and the emitter region at a dose rate of $1\times10^{15}$ atoms/cm$^2$ by ion implantation or ion doping so as to have a donor concentration of $2\times10^{20}$ atoms/cc, thereby forming the source regions 120, drain regions 121, and emitter region 152. Subsequently, by common photolithographic and etching techniques, the silicon oxide film for protection in the emitter region is removed.

Next, as shown in FIG. 54(3), by using the polycrystalline silicon thin-film 152 forming the emitter region as a seed, the n$^+$-type polycrystalline diamond film 163, having minute irregularities 168 on the surface thereof, is formed in the emitter region by catalytic CVD or bias catalytic CVD using a mixture of, for example, methane (CH$_4$) and an appropriate n-type dopant at an appropriate mixing ratio, and at the same time, an n$^+$-type amorphous diamond film 170 is formed on the other silicon oxide film 159 and the glass substrate 111. For example, the n$^+$-type polycrystalline diamond film 163 is formed by catalytic CVD or the like using the polycrystalline silicon thin-film 152 having a large grain size, and in this step, by adding an n-type doping gas (phosphine PH$_3$ for phosphorus, arsine AsH$_3$ for arsenic, stibine SbH$_3$ for antimony, or the like) such as phosphine PH$_3$ to methane (CH$_4$) at an appropriate amount, the n$^+$-type polycrystalline diamond film 163 (1,000 to 5,000 mm thick) having a dopant concentration of approximately $5\times10^{20}$ to $1\times10^{21}$ atoms/cc is formed. In the step described above, on the other silicon oxide film for protection, the n$^+$-type amorphous diamond film 170 is formed, and this amorphous diamond film is also called a DLC film (Diamond Like Carbon).

Next, as shown in FIG. 54(4), by activated hydrogen ions or the like in catalytic AHA treatment described above, the amorphous diamond film 170 is selectively removed by etching, and after the silicon oxide film 159 is removed by etching, the gate insulating film (a silicon oxide film or the like) 118 is formed by catalytic CVD or the like. In the steps described above, by catalytic AHA treatment, the amorphous diamond film is selectively etched by reduction using high temperature hydrogen molecules, hydrogen atoms, activated hydrogen ions, or the like, and at the same time, an amorphous component of the n$^+$-type polycrystalline diamond film 163 formed in the emitter region is selectively etched by reduction, thereby forming the n$^+$-type polycrystalline diamond film 163 having high crystallinity. By this selective etching by reduction, the emitter region composed of the n$^+$-type polycrystalline diamond film 163 having an infinitude of irregularities on the surface thereof is formed. By the step described above, the $n^+$-type amorphous diamond film on the other silicon oxide film for protection is selectively etched by reduction. Related to this, it is preferable that the catalytic CVD and the AHA treatment be continuously performed in order to prevent contamination and to improve productivity.

Next, as shown in FIG. 55(5), the gate electrodes 115 of the MOSTFTs 1 and 2 and the gate line connected to the gate electrode of the MOSTFT 1 are formed by sputtering of a heat resistant metal, such as an Mo—Ta alloy, and after the overcoat film (a silicon oxide film or the like) 137 is formed, by RTA (Rapid Thermal Anneal) treatment using a halogen lamp, the n-type or the p-type dopant doped previously is activated. Next, after forming a window at the source portion of the MOSTFT 2, the source electrode 127 of the MOSTFT 2 and the earth line are formed by sputtering of a heat resistant metal, such as an Mo—Ta alloy. Furthermore, the overcoat film (a laminated film of silicon oxide and silicon nitride, or the like) 136 is formed by plasma CVD, catalytic CVD, or the like.

Next, as shown in FIG. 55(6), after windows are provided at the source and the drain portions of the MOSTFT 1 and the gate portion of the MOSTFT 2, the drain of the MOSTFT 1 and the gate of the MOSTFT 2 are connected to each other by the Al wire 128 containing 1% Si, and at the same time, the source electrode of the MOSTFT 1 and the source line 127, which is connected to this electrode, are formed.

Next, as shown in FIG. 55(7), after the overcoat film (a laminated film of silicon oxide, phosphine silicate glass, and silicon nitride, or the like) 130 is formed, and a window is then formed for the GND line, hydrogenating and sintering treatment is performed at 400° C. for 30 minutes in a forming gas. Subsequently, as shown in FIG. 55(8), the lead electrodes 150 and the metal shielding film 151 are formed by Nb deposition followed by etching, the emitters 163 are exposed by forming windows at the field emission cathode portion, and cleaning is then performed by activated hydrogen ions or the like formed by catalytic AHA treatment described above. That is, by common photolithographic and etching techniques, a laminated film of titanium and molybdenum (Ti/Mo) or a niobium (Nb) film is wet-etched using an acidic etching solution, a silicon oxide film and a PSG film are etched using a fluorinated etching solution, and a silicon nitride film is removed by plasma etching using $CF_4$ or the like. In addition, the polycrystalline diamond film 163 of the field emission cathode (emitter) portion is cleaned by catalytic AHA treatment so that organic contamination, moisture, oxygen, nitrogen, carbon dioxide, or the like, which adhere to the minute irregularities on the film surface, are removed by high temperature hydrogen molecules, hydrogen atoms, activated hydrogen ions, or the like formed by catalytic AHA treatment, thereby improving the electron emission efficiency.

In addition, in the case described above, when the polycrystalline diamond film 163 is formed, as a carbon-containing compound used as a source gas, there may be mentioned, for example, 1) a paraffinic hydrocarbon, such as methane, ethane, propane, or butane;
2) an acetylenic hydrocarbon, such as acetylene or allylene-based material;
3) an olefinic hydrocarbon, such as ethylene, propylene, or butylene;
4) a diolefinic hydrocarbon such as butadiene;
5) an alicyclic hydrocarbon, such as cyclopropane, cyclobutane, cyclopentane, or cyclohexane;
6) an aromatic hydrocarbon, such as cyclobutadiene, benzene, toluene, xylene, or naphthalene;
7) a ketone, such as acetone, diethyl ketone, or benzophenone;
8) an alcohol, such as methanol or ethanol;
9) an amine, such as trimethyl amine or triethyl amine;
10) a material containing only carbon atoms, such as graphite, coal, or coke. There materials may be used alone or in combination.

In addition, as a usable inert gas, for example, argon, helium, neon, krypton, xenon, and radon are mentioned. As a dopant, for example, boron, lithium, nitrogen, phosphorus, sulfur, chlorine, arsenic, selenium, beryllium, or the compound thereof may be used, and the doping amount may be $10^{17}$ atoms/cc or more.

Fifth Embodiment

In this embodiment, the present invention is applied to a solar cell which is a photoelectric transfer device. A manufacturing example thereof will be described below.

Figure 56:
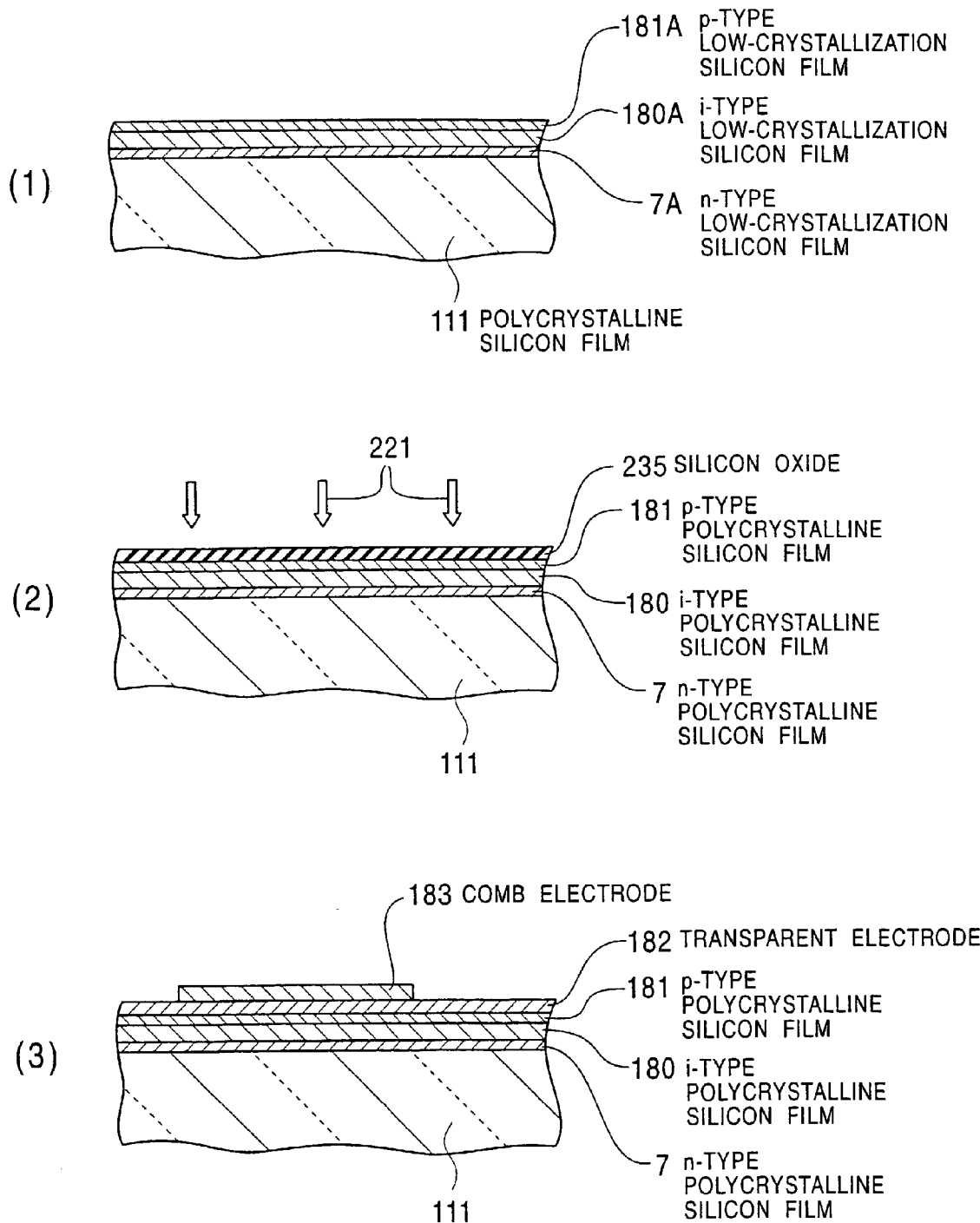
FIG. 56 includes cross-sectional views of a process for manufacturing a solar cell sequentially shown by steps according to a fifth embodiment of the present invention.

First, as shown in FIG. 56(1), the n-type low-crystallization silicon film 7A (100 to 200 nm thick) is formed by plasma CVD, catalytic CVD, or the like on the metal substrate 111 formed of stainless steel or the like. In this case, an n-type dopant such as $PH_3$ is appropriately contained in monosilane so as to have a concentration of $1\times10^{19}$ to $1\times10^{20}$ atoms/cc. In addition, when necessary, a thin-film (100 to 300 nm thick) of a high melting point metal (Ti, Ta, Mo, W, or an alloy thereof, such as a Mo—Ta alloy) or a metal silicide ($WSi_2$, $MoSi_2$, $TiSi_2$, $TaSi_2$, or the like) is formed on the metal substrate or a glass substrate by sputtering, CVD, or the like.

Continuously, by plasma CVD, catalytic CVD, or the like, an i-type low-crystallization silicon film 180A (2 to 5 μm thick) is formed so as to have a laminated structure. Continuously, by plasma CVD, catalytic CVD, or the like, a p-type low-crystallization silicon film 181A (100 to 200 nm thick) is formed. In this case, a p-type dopant such as $B_2H_6$ is appropriately contained in monosilane so as to have a concentration of $1\times10^{19}$ to $1\times10^{20}$ atoms/cc.

Next, as shown in FIG. 56(2), by plasma CVD, catalytic CVD, or the like, a covering, insulating film 235 (a silicon oxide film, a silicon nitride film, a silicon oxinitride film, a laminated film of silicon oxide and silicon nitride, or the like) having a thickness of 50 to 100 nm is formed.

Next, by annealing by flash emission 221 from flash lamps performed in the state described above, the entire low-crystallization silicon films 7A, 180A, and 181A are converted into the polycrystalline silicon film 7, 180, and 181, and simultaneously, the dopants in the individual films are activated. In this step, in accordance with the thickness of the low-crystallization silicon film, flash emission is performed repeatedly as required for a long flash emission time (⅓ pulse width=1.5 milliseconds or more). However, flash emission conditions must be optimized by, for example, using no IR-blocking filter, increasing a setting temperature, or the like.

Next, as shown in FIG. 56(3), the covering, insulating film 235 is removed, and hydrogenating treatment is then performed at 400° C. for 1 hour in a forming gas. Subsequently, a transparent electrode (ITO (Indium Tin Oxide), IZO (Indium Zinc Oxide), or the like) 182 having a thickness of 100 to 150 nm is formed over the entire surface, and on this film thus formed, a comb electrode 183, which is composed of, for example, silver, and has a thickness of 100 to 150 mm, is formed in a predetermined region by using a metal mask.

In addition, by adding an appropriate amount of Sn or another Group IV element (Ge, or Pb) to the low-crystallization silicon film 7A, 180A, and 181A so as to have a concentration in the range of, for example, $1\times10^{18}$ to $1\times10^{20}$ atoms/cc, irregularity present at the polycrystalline boundaries and film stress may be reduced.

In the solar cell of this embodiment, since a photoelectric transfer thin-film having high mobility and transfer efficiency can be formed from the polycrystalline silicon film having a large grain size according to the present invention, and a superior surface texture structure and rear surface texture structure are formed, a photoelectric transfer thin-film having a high light enclosing effect and conversion efficiency can be formed. In addition to the solar cell, this photoelectric thin-film can be advantageously applied to thin-film photoelectric devices such as a photosensitive drum for electrophotograph.

Other Embodiments

Figure 57:
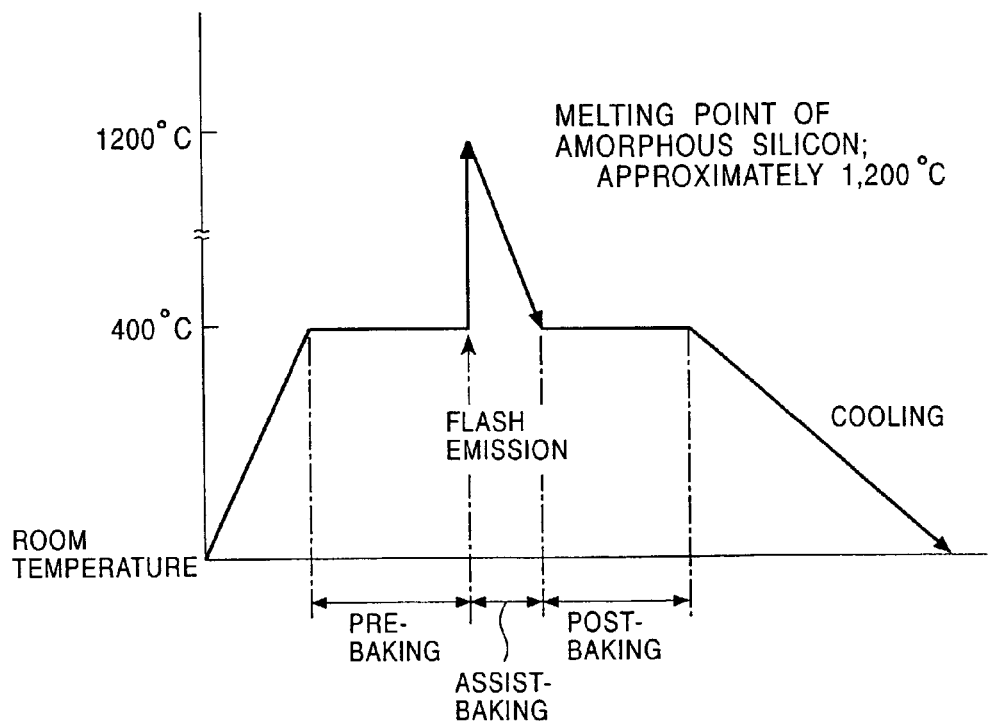
FIG. 57 is a diagram showing a sequence for heating a substrate in flash lamp annealing according to another embodiment of the present invention.

FIG. 57 is a graph for illustrating a method for forming a semiconductor thin-film or a method for manufacturing a semiconductor device by showing the sequence from a first step to a fourth step. The method mentioned above comprises the first step of forming a low-crystallization semiconductor thin-film, which may or may not contain at least one Group IV element such as tin, on a substrate; the second step of heating the substrate to a strain temperature thereof or less in pre-baking; the third step of heating and cooling the low-crystallization semiconductor thin-film to a fusion, a semi-fusion, or a non-fusion state to facilitate the crystallization thereof by flash lamp annealing in assist-baking; and the fourth step of heating the crystallized semiconductor thin-film until the temperature thereof is decreased to the stain point of the substrate or less. These steps are preferably repeated.

In the pre-baking described above, it is preferable that the temperature be in the range of room temperature to a strain temperature of the substrate, for example, from 300 to 500° C., by heating means such as a resistance heater or a halogen lamp, and that the heating time be optimized, for example, 5 to 20 minutes, in accordance with the film thickness and the film quality, determined by conditions (vapor-phase growth, sputtering, deposition, or the like) for forming the low-crystallization semiconductor thin-film, and a material, size, or the like of the substrate.

In addition, in the assist-baking described above, it is preferable that the temperature be in the range of room temperature to the strain temperature of the substrate, for example, from 300 to 500° C., and be optimized in accordance with the flash lamp annealing conditions, the film thickness and the film quality, determined by conditions (vapor-phase growth, sputtering, deposition, or the like) for forming the low-crystallization semiconductor thin-film, and a material, size, or the like of the substrate.

In addition, in the post-baking described above, it is preferable that the substrate and the crystallized semiconductor thin-film be held for a certain period of time, for example, 1 to 10 minutes, until the temperature thereof is decreased at least to the pre-baking temperature or the assist-baking temperature.

Figure 58:
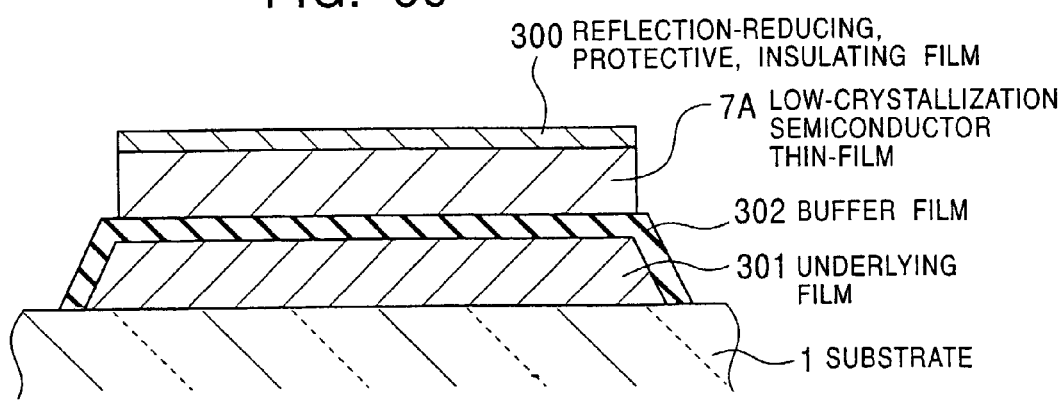
FIG. 58 is a cross-sectional view showing an example of an underlying film or the like formed under a low-crystallization semiconductor thin-film according to said another embodiment.

FIG. 58 is a schematic view for illustrating a method for forming a semiconductor thin-film or a method for manufacturing a semiconductor device. When a shading underlying film 301, which has thermal and electrical conductivities higher than those of the substrate, and which highly absorbs flash emission light or highly reflects the flash emission light, the flash emission light passing through a reflection-reducing, protective, insulating film 300 and the low-crystallization semiconductor thin-film 7A, is formed on the substrate 1 so as to have an area equivalent to or larger than that of the low-crystallization semiconductor thin-film 7A, and in addition, when a shading buffer film 302 having electrical insulating properties and transmittance properties is formed on the underlying layer when necessary, the method mentioned above comprises a step of forming the low-crystallization semiconductor thin-film 7A which may or may not contain at least one Group IV element such as tin on the buffer film in the underlying film region; a step of, when necessary, forming a reflection-reducing, protective, insulating film 300; a step of heating and cooling the low-crystallization semiconductor thin-film to a fusion, a semi-fusion, or a non-fusion state by appropriate flash lamp annealing of the substrate 1 in pre-baking, assist-baking, and post-baking so as to facilitate the crystallization of the low-crystallization semiconductor thin-film 7A.

When a bottom gate TFT, a back gate TFT, a dual gate TFT, or the like is formed, as a material for forming the high thermal and electrical conductive underlying film 301, which absorbs light passing through the reflection-reducing, protective, insulating film and the low-crystallization semiconductor thin-film and is heated thereby, for example, a coloring metal (chromium, copper, or the like), a high melting point metal (titanium, tantalum, molybdenum, tungsten, an alloy thereof, such as a molybdenum-tantalum alloy, or the like), or a metal silicide ($WSi_2$, $MoSi_2$, $TiSi_2$, $TaSi_2$, CoSi, $Pd_2Si$, $Pt_2Si$, $CrSi_2$, NiSi, RhSi, or the like) may be used. In this case, since the substrate temperature is increased to a relatively high level, a high strain point (heat resistant) glass such as quartz glass or crystallized glass, or a ceramic may be suitably used as a material for forming the substrate 1.

As a material for forming the high thermal and electrical conductive underlying film 301, which reflects light passing through the reflection-reducing, protective, insulating film and the low-crystallization semiconductor thin-film, for example, white color metal {aluminum, an aluminum alloy (aluminum containing 1% silicon), silver, nickel, platinum, or the like}, or a laminated film of white color metal and a high melting point metal (aluminum/molybdenum or the like) may be used. In this case, since the substrate temperature is increased to a relatively low level, a low strain point glass, such as borosilicate glass, aluminosilicate glass, or reinforced glass may be suitably used; however, a high strain point (heat resistant) glass, such as quartz glass or crystallized glass, a ceramic, or the like may also be used.

In order to prevent reaction between the underlying film 301 and the fused low-crystallization semiconductor thin-film 7A, the buffer film 302 is formed; however, when the underlying film 301 is formed of a material that will not react with the fused low-crystallization semiconductor thin-film 7A, the buffer film may be omitted. For example, when the underlying film is formed of aluminum covered with anodized insulating film, a high melting point metal (an Mo—Ta alloy or the like), or the like, the formation of an additional buffer film 302 is not necessary.

As the buffer film 302, an electrical insulating silicon oxide film, silicon oxinitride film, silicon nitride film, laminated film composed of silicon oxide and silicon nitride, laminated film composed of silicon nitride and silicon oxide, laminated film composed of silicon oxide, silicon nitride, and silicon oxide, or the like may be used.

As the substrate 1, when a low strain point glass such as borosilicate glass or aluminosilicate glass, fused quartz glass, crystallized glass, or a heat resistant resin is used, in order to prevent the diffusion of impurities (Na ions or the like) from the substrate, a silicon nitride-based film, such as a silicon oxinitride film, a silicon nitride film, a laminated film composed of silicon oxide and silicon nitride, a laminated film composed of silicon nitride and silicon oxide, or a laminated film composed of silicon oxide, silicon nitride, and silicon oxide, is preferably used.

In this example, by forming the low-crystallization semiconductor thin-film 7A only in the underlying film region, fused silicon is prevented from flowing out, and the polycrystalline or the single crystalline silicon thin-film can be formed only in the underlying film region.

Figure 59:
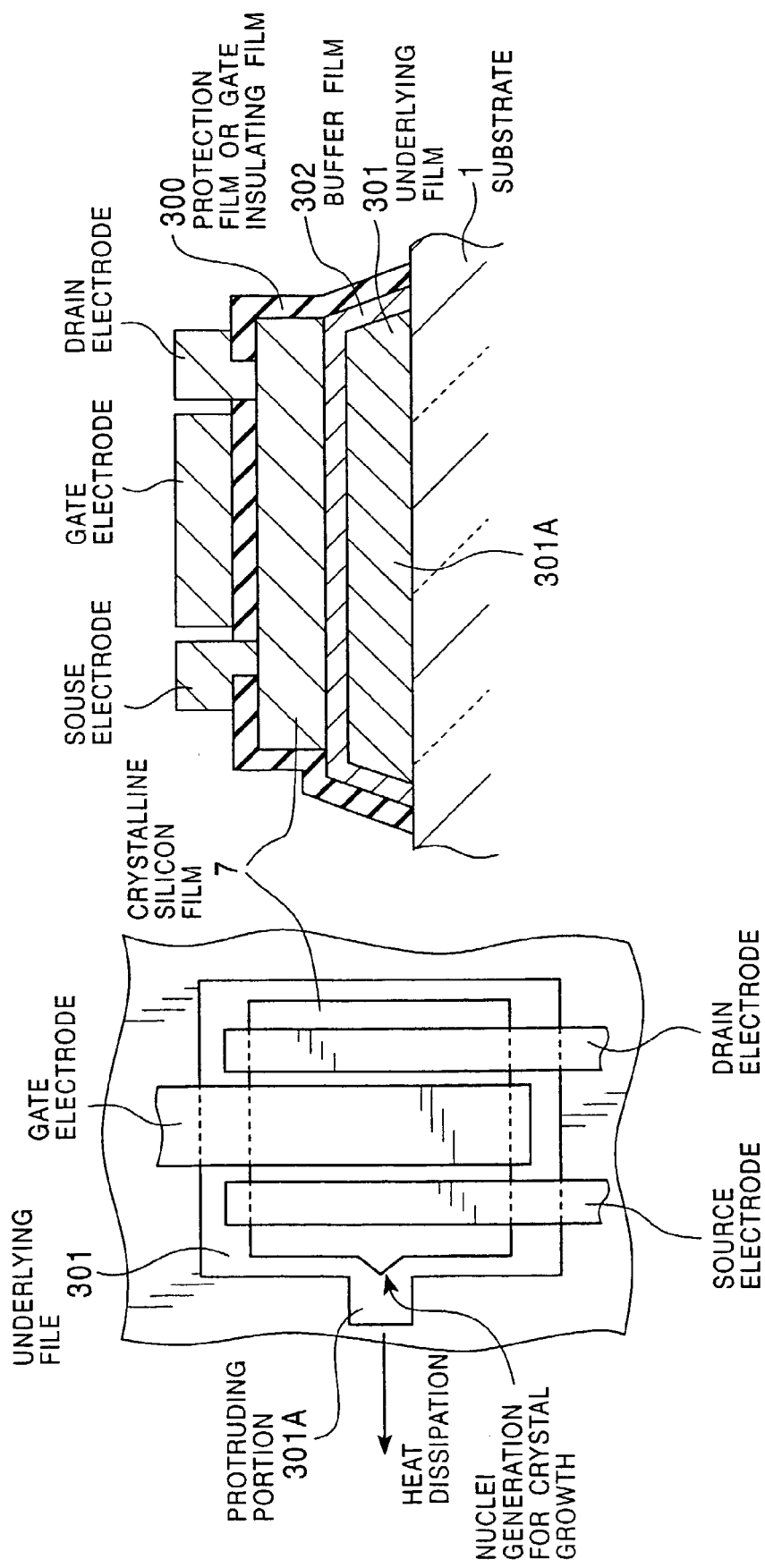
FIG. 59 includes a plan view and a cross-sectional view of a MOSTFT using a single crystalline film formed from a low-crystallization semiconductor thin-film according to said another embodiment.

FIG. 59 shows an example in which the underlying film 301 is patterned so as to have the area equivalent to or larger than that of the low-crystallization semiconductor thin-film 7A which may or may not contain at least one Group IV element such as tin and to have a linearly protruding shape 301A at a part of the underlying film. In this example, heat of the low-crystallization semiconductor thin-film 7A in a fusion, a semi-fusion, or a non-fusion state by flash lamp annealing is dissipated from this projecting portion 301A to form nuclei for crystal growth, so that the entire thin-film can be crystallized in an optional orientation direction.

In this case, since heat dissipation at the projecting portion 301 is more efficiently performed than that at the other portions, and conditions (formation of species or nuclei), which may start recrystallization, are prepared thereby, the entire low-crystallization semiconductor thin-film may be converted into the polycrystalline semiconductor thin-film having a large grain size or the single crystalline semiconductor thin-film 7, each having an optional crystal orientation.

In addition, the reflection-reducing, protective, insulating film 300 is an electrical insulating film which at least transmits ultraviolet rays therethrough and may be used as a gate insulating film.

As the electrical insulating film which at least transmits ultraviolet rays therethrough, for example, there may be mentioned a silicon oxide film, a silicon nitride film, a silicon oxinitride film, a laminated film composed of silicon oxide and silicon nitride, a laminated film composed of silicon nitride and silicon oxide, or a laminated film composed of silicon oxide, silicon nitride, and silicon oxide, and as the gate insulating film, there may be mentioned, for example, a silicon oxide film, a silicon nitride film, a silicon oxinitride film, a laminated film composed of silicon oxide and silicon nitride, a laminated film composed of silicon nitride and silicon oxide, or a laminated film composed of silicon oxide, silicon nitride, and silicon oxide.

In the example shown in FIG. 59, the reflection-reducing, protective, insulating film 300 may also be used as the gate insulating film. For example, when the low-crystallization semiconductor thin-film 7A which may or may not contain at least one Group IV element such as tin is converted into the crystal 7 by heating and cooling the thin-film to a fusion, a semi-fusion, or a non-fusion state in flash lamp annealing in an oxidizing atmosphere (air, oxygen, ozone, steam, NO, $N_2O$, or the like), the oxide insulating film (a silicon oxide film, a silicon oxinitride film, or the like) 300 is simultaneously formed on the surface of this polycrystalline or single crystalline semiconductor thin-film, and this oxide insulating film may be used as the gate insulating film or the protection film.

Alternatively, on the polycrystalline or single crystalline semiconductor thin-film, which may or may not contain at least one Group IV element such as tin and which is formed by flash lamp annealing on a low strain point glass substrate, a high strain point glass substrate, or a heat resistant resin substrate 1, the oxide insulating film (a silicon oxide film, a silicon nitride film, or the like) 300 may be formed in an oxidizing atmosphere (air, oxygen, ozone, steam, NO, $N_2O$, or the like) at low temperature in the range of room temperature to the strain point of the substrate and at a pressure in the range of 0.1 to 30 MPa, and this oxide insulating film may be used as the gate insulating film or the protection film.

Alternatively, on the polycrystalline or single crystalline semiconductor thin-film which may or may not contain at least one Group IV element such as tin and which is formed by flash lamp annealing on a high strain point glass substrate, the oxide-based insulating film (a silicon oxide film, a silicon nitride film, or the like) 300 may be formed by high temperature thermal oxidation in an oxidizing atmosphere (air, oxygen, ozone, steam, NO, $N_2O$, or the like), and this oxide insulating film may be used as the gate insulating film or the protection film.

Alternatively, on the polycrystalline or single crystalline semiconductor thin-film, which may or may not contain at least one Group IV element such as tin, which is provided with the reflection-reducing, protective, insulating film, and which is formed by flash lamp annealing on a high strain point glass substrate, the oxide-based insulating film (a silicon oxide film, a silicon nitride film, or the like) 300 may be formed by high temperature thermal oxidation in an oxidizing atmosphere (air, oxygen, ozone, steam, NO, $N_2O$, or the like), and this oxide insulating film may be used as the gate insulating film or the protection film.

The embodiments described above may be variously modified in accordance with the technical scope and spirit of the present invention.

For example, the vapor-phase growth method, such as catalytic CVD or plasma CVD, and the various conditions, such as the number of flash lamp annealing performed repeatedly, the flash emission time, the surface temperature, and the like may be variously changed, and the materials for the substrate or the like are not limited to those described above.

In addition, the present invention is preferably applied to MOSTFTs for internal circuits, peripheral driving circuits, image signal processing circuits, memory circuits, and the like in the display portions or the like; however, in addition to those described above, active regions for elements such as diodes, and passive regions for resistors, capacitors (capacitance), wires, inductances, and the like may be formed of the polycrystalline semiconductor thin-film or the single crystalline semiconductor thin-film of the present invention.

INDUSTRIAL APPLICABILITY

As described above, according to the present invention, since a polycrystalline or a single crystalline semiconductor thin-film is formed by forming a low-crystallization semiconductor thin-film on a substrate and by heating and cooling the low-crystallization semiconductor thin-film to a fusion, a semi-fusion, or a non-fusion state by flash lamp annealing to facilitate the crystallization thereof, the significant advantages (1) to (10) described below can be obtained.

(1) By flash lamp annealing in which flash emission can be performed once or repeatedly in an optional short period of time in the range of microseconds to milliseconds, high emission energy is given to a low-crystallization semiconductor thin-film such as low-crystallization silicon so that the semiconductor thin-film is heated and cooled to a fusion, a semi-fusion, or a non-fusion state, or is preferably slowly cooled, and as a result, a polycrystalline semiconductor thin-film such as a polycrystalline silicon thin-film having a large grain size, high carrier mobility, and high quality, or a single crystalline semiconductor thin-film is obtained, whereby the productivity rate is significantly increased, and considerable cost reduction can be realized.

(2) In flash lamp annealing, by combining an optional number of lamps with a flash discharge mechanism therefor, for example, ① the entire large area of 1,000 mm×1,000 mm can be simultaneously irradiated once or repeatedly as required with flash emission light, ② flash emission light which is condensed and homogenized to have a square emission area of 200 mm×200 mm is scanned by a galvanometer scanner, and when necessary, flash emission is performed by overlap scanning, or ③ under the conditions in which the emission position of flash emission light which is condensed and homogenized to have a square emission area of 200 mm×200 mm is fixed, and a substrate is moved in a step & repeat manner, flash emission is performed and, when necessary, is performed by overlap scanning. As described above, since the substrate or flash emission light can be moved in an optional direction at an optional speed, heating and cooling rate can be controlled, an optional large area of a low-crystallization silicon thin-film or the like can be converted into a polycrystalline thin-film or a single crystalline thin-film in an extremely short time, and hence, significantly high productivity and considerable cost reduction can be realized.

(3) Since flash emission light is condensed and homogenized to have an optional strip, rectangular, square, or circular form and is then emitted, the emission intensity, that is, fusion efficiency and throughput, is improved, and variation in carrier mobility can be decreased by improvement in uniformity of crystallization.

(4) By repeating the method in which a low-crystallization silicon film or the like is formed on a polycrystalline silicon film or the like crystallized by flash lamp annealing, and crystallization is again performed by flash lamp annealing, a polycrystalline silicon film or the like, which has a large grain size, high carrier mobility, and high quality, can be formed in a laminated shape having a thickness in the order of micrometers. Accordingly, in addition to MOSLSIs, high performance and high quality bipolar LSIs, CMOS sensors, CCD area/linear sensors, solar cells, and the like can be formed.

(5) Since adjustment of wavelength (change of an enclosed gas, use of an IR-reducing or an IR-blocking filter, change of discharge conditions, and the like) and control of emission intensity, emission time, and the like in flash lamp annealing can be easily performed in accordance with the film thickness of a low-crystallization semiconductor thin-film, a heat resistant temperature of a substrate such as glass, a desired grain size (carrier mobility), and the like, a polycrystalline silicon film or the like having high carrier mobility and high quality can be reproducibly obtained at high productivity rate.

(6) Lamps used for flash lamp annealing, such as xenon lamps, xenon-mercury lamps, krypton lamps, krypton-mercury lamps, xenon-krypton lamps, xenon-krypton-mercury lamps, and metal halide lamps, are much inexpensive than an excimer laser oscillator of an excimer laser annealing apparatus using XeCl, KrF, or the like, have longer life, and require easier maintenance, and hence, considerable cost reduction can be achieved.

(7) Since a flash lamp annealing apparatus primarily composed of flash lamps and a discharge circuit has a simple structure compared to that of an excimer laser annealing apparatus, it is inexpensive, and hence, cost reduction can be realized.

(8) Since excimer laser annealing performed by XeCl, KrF, or the like uses a pulse oscillating laser in the order of nanoseconds, there has been a problem of output stability, and hence, there have been variation in energy distribution in an irradiation area, variation in quality of obtained crystallized semiconductor films, and variation in element performance between TFTs. Accordingly, a method in which excimer laser pulse is emitted many times, such as 5 times or 30 times, is performed while a temperature of approximately 400° C. is applied; however, properties of crystallized semiconductor films and TFT elements vary due to the emission variation, and the cost is increased by decrease in productivity rate caused by decrease in throughput. In contrast, in flash lamp annealing, as described in the above (2), since the entire large area of, for example, 1,000 mm×1,000 mm can be simultaneously irradiated with flash emission light using a pulse in the range of microseconds to milliseconds, variation in energy distribution in the irradiation area, variation in quality of obtained crystallized semiconductor films, and variation in element performance between TFTs are small, and cost reduction can be realized due to high productivity rate caused by high throughput.

(9) In particular, since flash lamp annealing by intensive ultraviolet rays, using an IR-reducing or an IR-blocking filter, can be performed at a low temperature (200 to 400° C.), a low strain point glass, such as aluminosilicate glass or borosilicate glass, or a heat resistant resin such as polyimide, which is inexpensive and can be formed into a large size, may be used, and hence, reduction in weight and cost can be achieve.

(10) In addition to a top gate type, since a polycrystalline semiconductor film or a single crystalline semiconductor film having high carrier mobility can be used for forming a bottom gate type, a dual gate type, and a back gate type MOSTFTs, high speed, high current density semiconductor devices, electrooptic devices, and highly efficient solar cells can be formed using this high performance semiconductor films. For example, there may be mentioned silicon semiconductor devices, silicon semiconductor integrated circuit devices, field emission display (FED) devices, silicon-germanium semiconductor devices, silicon-germanium semiconductor integrated circuit devices, silicon carbide semiconductor devices, silicon carbide semiconductor integrated circuit devices, III-V and II-VI compound semiconductor devices, III-V and II-VI compound semiconductor integrated circuit devices, polycrystalline or single crystalline diamond semiconductor devices, polycrystalline or single crystalline diamond semiconductor integrated circuit devices, liquid crystal display devices, electroluminescent (organic or inorganic) display devices, light-emitting polymer display devices, light-emitting diode display devices, light sensor devices, CCD area/linear sensor devices, CMOS sensor devices, and solar cells.

The invention claimed is:

1. A method for manufacturing a semiconductor thin-film comprising:

forming a low-crystallization semiconductor thin-film on a substrate; and heating and cooling the low-crystallization semiconductor thin-film to a fusion, a semi-fusion, or a non-fusion state by flash lamp annealing with a flash lamp source apparatus, wherein,
the flash lamp source apparatus is selected from the group consisting of:
(b1) a flash lamp source apparatus comprising:
(b1$^{I}$) a housing,
(b1$^{II}$) a reflecting member in the housing, the reflecting member being at earth potential and optionally comprising irregularities on its surface, and
(b1$^{III}$) a lamp in said housing;
(b2) a flash lamp source apparatus comprising:
(b2$^{I}$) a housing,
(b2$^{II}$) a reflecting member in the housing,
(b2$^{III}$) an IR-blocking filter or an IR-reducing filter, and
(b2$^{IV}$) a lamp in the housing;
(b3) a flash lamp source apparatus comprising:
(b3$^{I}$) a housing,
(b3$^{II}$) a reflecting member in the housing,
(b3$^{III}$) a lamp in the housing, and
(b3$^{IV}$) a condesing lens or a light homogenizer;
(b4) a flash lamp source apparatus comprising:
(b4$^{I}$) a housing, and
(b4$^{II}$) a reflecting member,
wherein,
the housing and the reflecting are cooled by a circulating coolant, and
the configuration of the flash lamp source apparatus is selected from the group consisting of:
(1) a reflecting member is provided in a housing which contains a lamp and which is at the earth potential, arid when necessary, miiiute irregularities are formed on the surface of the reflecting member;
(2) a lamp and a reflecting member are provided in a housing having shading properties, and when necessary, flash emission light is transmitted through a transparent member having infrared-reducing properties or infrared-blocking properties;
(3) a lamp and a reflecting member are provided in a housing, and flash emission light reflected and condensed and flash emission light passing in the forward direction are transmitted through a condensing lens or a light homogenizer; and
(4) a reflecting member and a housing are cooled by a circulating coolant.

2. A method for manufacturing a semiconductor thin-film comprising:
forming a low-crystallization semiconductor thin-film on a substrate; and
heating and cooling the low-crystallization semiconductor thin-film to a fusion, a semi-fusion, or a non-fusion state by flash lamp annealing with a flash lamp source apparatus,
wherein,
the flash lamp source apparatus selected from the group consisting of:
(b1) a flash lamp source apparatus comprising:
(b1$^{I}$) a housing,
(b1$^{II}$) a reflecting member in the housing, the reflecting member being at earth potential and optionally comprising irregularities on its surface, and
(b1$^{III}$) a lamp in said housing;
(b2) a flash lamp source apparatus comprising:
(b2$^{I}$) a housing,
(b2$^{II}$) a reflecting member in the housing,
(b2$^{III}$) an IR-blocking filter or an IR-reducing fitter, and
(b2$^{IV}$) a lamp in the housing;
(b3) a flash lamp source apparatus comprising:
(b3$^{I}$) a housing,
(b3$^{II}$) a reflecting member in the housing,
(b3$^{III}$) a lamp in the housing, and
(b3$^{IV}$) a condesing lens or a light homogenizer;
(b4) a flash lamp source apparatus comprising:
(b4$^{I}$) a housing, and
(b4$^{II}$) a reflecting member,
wherein,
the housing and the reflecting member are cooled by a circulating coolant, and the lamp comprises:
(i) a parallel plate light-emitting tube,
(ii) at least a pair of counter electrodes in the light-emitting tube, and
(iii) a trigger electrode thin-film or a trigger electrode assembly for each pair of the counter electrodes, wherein the trigger electrode thin-film or the trigger electrode assembly is between the counter electrodes and on the external wall of the light emitting tube.

3. A field emission display device comprising a thin-film insulating gate type field effect transistor manufactured according to the method of claim 2,
wherein:
(a) the emitter of the field emission display device is connected to the drain of the thin-film insulating gate type field effect transistor via the polycrystalline or the single crystalline semiconductor thin-film and
(b) the emitter of the field emission display device is formed from a material selected from the group consisting of an n-type polycrystalline semiconductor film, a polycrystalline diamond film, a carbon thin-film optionally comprising nitrogen, nanotubes formed on a surface of a carbon thin-film optionally comprising nitrogen
wherein,
the material of (b) is formed on the polycrystalline or the single crystalline semiconductor thin-film.

4. A field emission display device according to claim 3, further comprising:
(a) a metal shielding film, said metal shielding film being at the earth potential and formed above the thin-film insulating gate type field effect transistor, and
(b) diode with an insulating film.

5. A field emission display device according to claim 4, wherein the metal shielding film is formed of the same material and in the same step as those of a gate lead electrode of the field emission display device.

6. A method for manufacturing a semiconductor thin-film comprising:
forming a low-crystallization semiconductor thin-film on a substrate; and
heating and cooling the low-crystallization semiconductor thin-film to a fusion, a semi-fusion, or a non-fusion state by flash lamp annealing with a flash lamp source apparatus,
the flash lamp source apparatus selected from the group consisting of:
(b1) a flash lamp source apparatus comprising:
(b1$^{I}$) a housing,
(b1$^{II}$) a reflecting member in the housing, the reflecting member being at earth potential and optionally comprising irregularities on its surface, and
(b1$^{III}$) a lamp in said housing;
(b2) a flash lamp source apparatus comprising:
(b2$^{I}$) a housing,
(b2$^{II}$) a reflecting member in the housing,
(b2$^{III}$) an IR-blocking filter or an IR-reducing filter, and
(b2$^{IV}$) a lamp in the housing;
(b3) a flash lamp source apparatus comprising:
(b3$^{I}$) a housing,
(b3$^{II}$) a reflecting member in the housing, ($b3^{III}$) a lamp in the housing, and
($b3^{IV}$) a condesing lens or a light homogenizer;
(b4) a flash lamp source apparatus comprising:
($b4^{I}$) a housing, and
($b4^{II}$) a reflecting member,
wherein,
the housing and the reflecting member are cooled by a circulating coolant, and the the flash lamp source apparatus further comprises
(i) a straight light-emitting tube,
(ii) at least a pairs of counter electrodes in the straight light-emitting tube, and
(iii) a trigger electrode thin-film or a trigger electrode assembly between the counter electrodes and on the external wall of the light-emitting tube.

7. A method for manufacturing a semiconductor thin-film comprising:
forming a low-crystallization semiconductor thin-film on a substrate; and
heating and cooling the low-crystallization semiconductor thin-film to a fusion, a semi-fusion, or a non-fusion state by flash lamp annealing with a flash lamp source apparatus,
wherein,
the flash lamp source apparatus selected from the group consisting of:
(b1) a flash lamp source apparatus comprising:
($b1^{I}$) a housing,
($b1^{II}$) a reflecting member in the housing, the reflecting member being at earth potential and optionally comprising irregularities on its surface, and
($b1^{III}$) a lamp in said housing;
(b2) a flash lamp source apparatus comprising:
($b2^{I}$) a housing,
($b2^{II}$) a reflecting member in the housing,
($b2^{III}$) an IR-blocking filter or an IR-reducing filter, and
($b2^{IV}$) a lamp in the housing;
(b3) a flash lamp source apparatus comprising:
($b3^{I}$) a housing,
($b3^{II}$) a reflecting member in the housing,
($b3^{III}$) a lamp in the housing, and
($b3^{IV}$) a condesing lens or a light homogenizer;
(b4) a flash lamp source apparatus comprising:
($b4^{I}$) a housing, and
($b4^{II}$) a reflecting member,
the housing and the reflecting member are cooled by a circulating coolant, and
the flash lamp source apparatus comprises a plurality of lamps, wherein the plurality of lamps simultaneously emit light when sinchronously triggered, and the plurality of lamps is selected from the group consisting of:
(i) a plurality of lamps wherein the lamps are provided in parallel in plan view, and at least two lamps are connected to each other in series and to a power supply,
(ii) a plurality of lamps wherein each lamp is connected to a corresponding power supply, and
(iii) a plurality of lamps wherein the lamps are connected in series and to a common power supply.

8. A method for manufacturing a semiconductor thin-film comprising:
forming a low-crystallization semiconductor thin-film on a substrate; and
heating and cooling the low-crystallization semiconductor thin-film to a fusion, a semi-fusion, or a non-fusion state by flash lamp annealing with a flash lamp source apparatus,
wherein,
the flash lamp source apparatus selected from the group consisting of:
(b1) a flash lamp source apparatus comprising:
($b1^{I}$) a housing,
($b1^{II}$) a reflecting member in the housing, the reflecting member being at earth potential and optionally comprising irregularities on its surface, and
($b1^{III}$) a lamp in said housing;
(b2) a flash lamp source apparatus comprising:
($b2^{I}$) a housing,
($b2^{II}$) a reflecting member in the housing,
($b2^{III}$) an IR-blocking filter or an IR-reducing filter, and
($b2^{IV}$) a lamp in the housing;
(b3) a flash lamp source apparatus comprising:
($b3^{I}$) a housing,
($b3^{II}$) a reflecting member in the housing,
($b3^{III}$) a lamp in the housing, and
($b3^{IV}$) a condesing lens or a light homogenizer;
(b4) a flash lamp source apparatus comprising:
($b4^{I}$) a housing, and
($b4^{II}$) a reflecting member,
the housing and the reflecting member are cooled by a circulating coolant, and
the flash lamp source apparatus further comprises:
(i) a vacuum container,
(ii) a lamp in the vacuum container, and
(iii) a reflecting member fixed to the vacuum container with a vibration-absorbing material provided therebetween.

9. A method for manufacturing a semiconductor thin-film comprising:
forming a low-crystallization semiconductor thin-film on a substrate;
heating and cooling the low-crystallization semiconductor thin-film to a fusion, a semi-fusion, or a non-fusion state by flash lamp annealing with a flash lamp source apparatus; and
forming a protective, insulating film on the low-crystallization semiconductor thin-film,
wherein,
the flash lamp annealing is performed in an air or in a nitrogen atmosphere at atmospheric pressure, and
the flash lamp source apparatus selected from the group consisting of:
(b1) a flash lamp source apparatus comprising:
($b1^{I}$) a housing,
($b1^{II}$) a reflecting member in the housing, the reflecting member being at earth potential and optionally comprising irregularities on its surface, and
($b1^{III}$) a lamp in said housing;
(b2) a flash lamp source apparatus comprising:
($b2^{I}$) a housing,
($b2^{II}$) a reflecting member in the housing,
($b2^{III}$) an IR-blocking filter or an IR-reducing filter, and
($b2^{IV}$) a lamp in the housing;
(b3) a flash lamp source apparatus comprising:
($b3^{I}$) a housing,
($b3^{II}$) a reflecting member in the housing,
($b3^{III}$) a lamp in the housing, and
($b3^{IV}$) a condesing lens or a light homogenizer;
(b4) a flash lamp source apparatus comprising:
($b4^{I}$) a housing, and
($b4^{II}$) a reflecting member,
wherein,
the housing and the reflecting member are cooled by a circulating coolant.

* * * * *